United States Patent
Na et al.

(10) Patent No.: US 10,739,443 B2
(45) Date of Patent: Aug. 11, 2020

(54) HIGH-SPEED LIGHT SENSING APPARATUS II

(71) Applicant: Artilux, Inc., Menlo Park, CA (US)

(72) Inventors: Yun-Chung Na, Zhubei (TW); Che-Fu Liang, Zhubei (TW); Szu-Lin Cheng, Zhubei (TW); Shu-Lu Chen, Zhubei (TW); Kuan-Chen Chu, Zhubei (TW); Chung-Chih Lin, Zhubei (TW); Han-Din Liu, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 50 days.

(21) Appl. No.: 15/908,300

(22) Filed: Feb. 28, 2018

(65) Prior Publication Data

US 2018/0188356 A1    Jul. 5, 2018

Related U.S. Application Data

(63) Continuation-in-part of application No. 15/338,660, filed on Oct. 31, 2016, now Pat. No. 10,254,389.

(Continued)

(51) Int. Cl.
*G01S 7/4863* (2020.01)
*H01L 27/146* (2006.01)
(Continued)

(52) U.S. Cl.
CPC ............ *G01S 7/4863* (2013.01); *G01S 17/10* (2013.01); *G01S 17/89* (2013.01);
(Continued)

(58) Field of Classification Search
CPC ... G01S 7/4863; G01D 5/35316; G01B 11/18; G01B 11/161; G01L 11/025; G01L 1/246
See application file for complete search history.

(56) References Cited

U.S. PATENT DOCUMENTS

| | | | |
|---|---|---|---|
| 3,621,466 A | * | 11/1971 | Toshio Misawa ...... H01L 29/00 331/107 R |
| 4,341,918 A | | 7/1982 | Evans, Jr. et al. |

(Continued)

FOREIGN PATENT DOCUMENTS

| | | |
|---|---|---|
| EP | 2081004 | 7/2009 |
| EP | 2330637 | 6/2011 |

(Continued)

OTHER PUBLICATIONS

Alsam et al: "What the Eye Did Not See—A Fusion Approach to Image Coding", Advances in Visual Computing, dated Jan. 1, 2012, pp. 199-208 (with partial english translation).

(Continued)

*Primary Examiner* — Tony Ko
(74) *Attorney, Agent, or Firm* — Fish & Richardson P.C.

(57) ABSTRACT

An optical apparatus including a semiconductor substrate; a first light absorption region supported by the semiconductor substrate, the first light absorption region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal. The one or more first switches include a first trench located between the first p-doped region and the first n-doped region. The one or more second switches include a second trench located between the second p-doped region and the second n-doped region.

14 Claims, 61 Drawing Sheets

Related U.S. Application Data

(60) Provisional application No. 62/617,317, filed on Jan. 15, 2018, provisional application No. 62/613,054, filed on Jan. 3, 2018, provisional application No. 62/561,266, filed on Sep. 21, 2017, provisional application No. 62/534,179, filed on Jul. 18, 2017, provisional application No. 62/511,977, filed on May 27, 2017, provisional application No. 62/504,531, filed on May 10, 2017, provisional application No. 62/485,003, filed on Apr. 13, 2017, provisional application No. 62/479,322, filed on Mar. 31, 2017, provisional application No. 62/465,139, filed on Feb. 28, 2017, provisional application No. 62/294,436, filed on Feb. 12, 2016, provisional application No. 62/271,386, filed on Dec. 28, 2015, provisional application No. 62/251,691, filed on Nov. 6, 2015.

(51) Int. Cl.
*H01L 31/103* (2006.01)
*G01S 17/10* (2020.01)
*G01S 17/89* (2020.01)

(52) U.S. Cl.
CPC .. *H01L 27/14629* (2013.01); *H01L 27/14643* (2013.01); *H01L 31/103* (2013.01); *H01L 31/1037* (2013.01)

(56) References Cited

U.S. PATENT DOCUMENTS

| | | |
|---|---|---|
| 4,604,527 A | 8/1986 | Chenevas-Paula et al. |
| 4,607,168 A | 8/1986 | Oritsuki et al. |
| 4,767,936 A | 8/1988 | Muakami et al. |
| 4,782,376 A | 11/1988 | Catalano |
| 4,926,231 A | 5/1990 | Hwang et al. |
| 5,453,611 A | 9/1995 | Oozu |
| 5,673,284 A | 9/1997 | Congdon et al. |
| 5,965,875 A | 10/1999 | Merrill |
| 6,384,462 B1 | 5/2002 | Pauchard et al. |
| 6,483,130 B1 | 11/2002 | Yang et al. |
| 6,894,267 B2 | 5/2005 | Kakinuma |
| 6,958,194 B1 | 10/2005 | Hopper |
| 7,090,133 B2 | 8/2006 | Zhu |
| 7,411,265 B2 * | 8/2008 | Sekiguchi ....... H01L 31/035281 257/461 |
| 7,456,874 B1 | 11/2008 | Ono |
| 7,557,368 B2 | 7/2009 | Hegarty et al. |
| 7,629,661 B2 | 12/2009 | Rafferty et al. |
| 7,750,958 B1 | 7/2010 | Dierickx |
| 7,826,058 B1 | 11/2010 | Ulrich et al. |
| 7,884,310 B2 | 2/2011 | Buettgen |
| 7,888,763 B2 | 2/2011 | Qian et al. |
| 7,961,301 B2 | 7/2011 | Earhart et al. |
| 7,972,885 B1 | 7/2011 | Dutta et al. |
| 8,129,813 B2 * | 3/2012 | Herz ................ G01S 7/4816 257/461 |
| 8,183,510 B2 | 5/2012 | Venezia et al. |
| 8,405,823 B2 | 3/2013 | Pfaff |
| 8,824,779 B1 | 9/2014 | Smyth |
| 8,860,083 B1 | 10/2014 | Trezza |
| 8,975,668 B2 | 3/2015 | Costello et al. |
| 9,236,520 B2 | 1/2016 | Okhonin |
| 9,239,626 B1 | 1/2016 | Wu et al. |
| 9,472,588 B1 | 10/2016 | Li |
| 9,635,351 B2 | 4/2017 | Dielacher et al. |
| 9,748,429 B1 | 8/2017 | Davids et al. |
| 9,786,715 B2 | 10/2017 | Na et al. |
| 9,893,112 B2 | 2/2018 | Na et al. |
| 1,026,985 A1 | 4/2019 | Sallin et al. |
| 10,418,407 B2 | 9/2019 | Na et al. |
| 10,564,718 B2 | 2/2020 | Na et al. |
| 2003/0042500 A1 | 3/2003 | Rhodes |
| 2003/0189159 A1 | 10/2003 | Inoue |
| 2004/0121507 A1 | 6/2004 | Bude et al. |
| 2005/0051730 A1 | 3/2005 | Kuijk et al. |
| 2005/0077588 A1 | 4/2005 | Kasuga |
| 2005/0167709 A1 | 8/2005 | Augusto |
| 2005/0186759 A1 | 8/2005 | So |
| 2005/0233495 A1 | 10/2005 | Yang et al. |
| 2006/0110844 A1 | 5/2006 | Lee et al. |
| 2006/0289957 A1 | 12/2006 | Morse et al. |
| 2007/0164767 A1 | 7/2007 | Herz |
| 2007/0187796 A1 | 8/2007 | Rafferty et al. |
| 2007/0218578 A1 | 9/2007 | Lee et al. |
| 2007/0218580 A1 | 9/2007 | Hsu et al. |
| 2008/0121866 A1 | 5/2008 | Yuan et al. |
| 2008/0157254 A1 | 7/2008 | Kang |
| 2008/0181452 A1 | 7/2008 | Kwon et al. |
| 2008/0303058 A1 | 12/2008 | Mori et al. |
| 2009/0050891 A1 | 2/2009 | Katoh |
| 2009/0152604 A1 | 6/2009 | Zhu et al. |
| 2009/0166684 A1 | 7/2009 | Yahav et al. |
| 2009/0200589 A1 | 8/2009 | Qian et al. |
| 2009/0237770 A1 | 9/2009 | Kim et al. |
| 2009/0242935 A1 | 10/2009 | Fitzgerald |
| 2010/0078680 A1 | 4/2010 | Cheng et al. |
| 2010/0102409 A1 | 4/2010 | Hansson |
| 2010/0184246 A1 | 7/2010 | Sakai |
| 2011/0031578 A1 | 2/2011 | Miura et al. |
| 2011/0102553 A1 | 5/2011 | Corcoran et al. |
| 2011/0109880 A1 | 5/2011 | Nummela |
| 2011/0128430 A1 | 6/2011 | Fossum |
| 2011/0155893 A1 | 6/2011 | Endo et al. |
| 2011/0181591 A1 | 7/2011 | Benitez |
| 2011/0188780 A1 | 8/2011 | Wang et al. |
| 2011/0255071 A1 | 10/2011 | Van Der Tempel |
| 2011/0304696 A1 | 12/2011 | Centen et al. |
| 2012/0080726 A1 | 4/2012 | Sakano |
| 2012/0133922 A1 | 5/2012 | Pfaff |
| 2012/0241769 A1 | 9/2012 | Katoh |
| 2012/0248514 A1 | 10/2012 | Korekado et al. |
| 2012/0287085 A1 | 11/2012 | Yuki et al. |
| 2012/0307232 A1 | 12/2012 | Mase et al. |
| 2013/0026548 A1 | 1/2013 | McCarten |
| 2013/0062506 A1 | 3/2013 | Hu |
| 2013/0062522 A1 | 3/2013 | Jiang et al. |
| 2013/0062663 A1 | 3/2013 | Yuan et al. |
| 2013/0075607 A1 | 3/2013 | Bikumandla et al. |
| 2013/0119234 A1 | 5/2013 | Lee et al. |
| 2013/0128070 A1 | 5/2013 | Ishikawa |
| 2013/0154918 A1 | 6/2013 | Vaught et al. |
| 2013/0214161 A1 | 8/2013 | Cazuax et al. |
| 2013/0248865 A1 | 9/2013 | Toriyama et al. |
| 2013/0278631 A1 | 10/2013 | Border et al. |
| 2013/0280879 A1 | 10/2013 | Stecher et al. |
| 2013/0283213 A1 | 10/2013 | Guendelman |
| 2013/0321271 A1 | 12/2013 | Bychkov |
| 2014/0002700 A1 | 1/2014 | Oishi |
| 2014/0043227 A1 | 2/2014 | Skogo et al. |
| 2014/0054444 A1 | 2/2014 | Sasaki |
| 2014/0054736 A1 | 2/2014 | Meade et al. |
| 2014/0111664 A1 | 4/2014 | Kumano |
| 2014/0117428 A1 | 5/2014 | Lee et al. |
| 2014/0159129 A1 | 6/2014 | Wang |
| 2014/0183549 A1 | 7/2014 | Park et al. |
| 2014/0184496 A1 | 7/2014 | Gribetz et al. |
| 2014/0206443 A1 | 7/2014 | Sharp et al. |
| 2014/0252437 A1 | 9/2014 | Ho et al. |
| 2014/0285404 A1 | 9/2014 | Takano et al. |
| 2014/0285420 A1 | 9/2014 | Kamimura et al. |
| 2014/0285641 A1 | 9/2014 | Kato et al. |
| 2014/0312206 A1 | 10/2014 | Okhonin et al. |
| 2014/0367740 A1 | 12/2014 | Morse |
| 2014/0368613 A1 | 12/2014 | Krupka |
| 2015/0001664 A1 | 1/2015 | Van Der Tempel |
| 2015/0014661 A1 | 1/2015 | Joo et al. |
| 2015/0022435 A1 | 1/2015 | Luebke |
| 2015/0041761 A1 | 2/2015 | Cheng et al. |
| 2015/0043826 A1 | 2/2015 | Ishimitsu |
| 2015/0092983 A1 | 4/2015 | Nguyen et al. |
| 2015/0171146 A1 | 6/2015 | Ooki et al. |
| 2015/0193938 A1 | 7/2015 | Freedman et al. |

(56) References Cited

U.S. PATENT DOCUMENTS

| | | |
|---|---|---|
| 2015/0331508 A1 | 9/2015 | Nho et al. |
| 2015/0281618 A1 | 10/2015 | Saito |
| 2015/0286340 A1 | 10/2015 | Send et al. |
| 2016/0027837 A1 | 1/2016 | Webster et al. |
| 2016/0049476 A1 | 2/2016 | Rachmady et al. |
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko et al. |
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0239974 A1 | 8/2016 | Wang |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Canon |
| 2017/0040362 A1 | 2/2017 | Na et al. |
| 2017/0062508 A1 | 3/2017 | Na et al. |
| 2017/0068319 A1 | 3/2017 | Viswanathan |
| 2017/0075421 A1 | 3/2017 | Na et al. |
| 2017/0084648 A1 | 3/2017 | Liu et al. |
| 2017/0123233 A1 | 5/2017 | Sabovic et al. |
| 2017/0131389 A1 | 5/2017 | Na et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru |
| 2018/0175084 A1 | 6/2018 | Na et al. |
| 2018/0175095 A1 | 6/2018 | Sallin |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0011984 A1 | 1/2019 | Na et al. |
| 2019/0033432 A1 | 1/2019 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |

FOREIGN PATENT DOCUMENTS

| | | |
|---|---|---|
| JP | H0548139 | 2/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2015-194838 | 11/2015 |
| WO | WO 2005/036647 | 4/2005 |
| WO | WO 2013-104718 | 7/2013 |
| WO | WO 2014-085789 | 6/2014 |
| WO | WO 2014-197226 | 12/2014 |
| WO | WO 2015-104307 | 7/2015 |
| WO | WO 2016/038416 | 3/2016 |
| WO | WO 2016/077791 | 5/2016 |
| WO | WO2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |

OTHER PUBLICATIONS

EP Search Report in European Application No. EP18189000, dated Jan. 9, 2019, 17 pages.

Zanuttigh et al: "ToF Depth Camera Components", Time-of-Flight and Structured Light Depth Cameras: Technology and Applications, dated May 24 2016, pp. 31-33.

Extended European Search Report in European Application No. 181760315, dated Aug. 27, 2018, 6 pages.

Extended European Search Report in European Application No. 16828622, dated Sep. 7, 2018, 6 pages.

Fussum et al., "A Review of the Pinned Photodiode for CCD and CMOS Image Sensors," IEEE J. Electron Devices Soc. May 1, 2014, 2(3):33-43.

Gulden et al., "Novel optical distance sensor based on MSM technology." IEEE Sensors Journal. Oct. 2004, 4(5):612-8.

Place et al., "Rad tolerant CMOS image sensor based on hole collection 4T pixel pinned photodiode." IEEE Transactions on Nuclear Science. Dec. 6, 2012, 59(6):2888-93.

Tseng et al., "High-performance silicon-on-insulator grating coupler with completely vertical emission," Sep. 21, 2015, 23(19):24433-9.

Hutchinson et al., "High-Resolution Aliasing-Free Optical Beam Steering," Optica, vol. 3, No. 8, dated Aug. 5, 2016, 4 pages.

Extended European Search Report in European Application No. 16833863, dated Jul. 18, 2018, 6 pages.

Extended European Search Report in European Application No. 181602004, dated Jul. 18, 2018, 6 pages.

Extended European Search Report in European Application No. 181602053, dated Jul. 18, 2018, 6 pages.

Extended European Search Report in European Application No. 168630325, dated Aug. 23, 2018, 5 pages.

International Preliminary Report on Patentability in International Application No. PCT/US2016/060493, dated May 8, 2018, 11 pages.

International Preliminary Report on Patentability in International Application No. PCT/US2016/066073, dated Jul. 12, 2018, 7 pages.

International Search Report and Written Opinion in International Application No. PCT/US2018/020262, dated Jun. 6, 2018, 14 pages.

International Search Report and Written Opinion in International Application No. PCT/US2018/025949, dated Jul. 10, 2018, 14 pages.

International Search Report and Written Opinion in International Application No. PCT/US2018/027369, dated Jul. 31, 2018, 14 pages.

Fang et al., "An Integration PIN/MISS OEIC for High Current Photoreceiver Applications," IEEE Transactions on Electron Devices, Jan. 1997, 44(1):34-38.

PCT International Search Report and Written Opinion in International Appln. PCT/US19/19167, dated May 14, 2019, 15 pages.

Extended European Search Report in European Application No. 16840192.5, dated Mar. 19, 2019, 7 pages.

Extended European Search Report in European Application No. 18189000.5. dated Apr. 2, 2019, 14 pages.

International Search Report and Written Opinion in International Application No. PCT/US2016/043609, dated Nov. 1, 2016, 21 pages.

International Search Report and Written Opinion in International Application No. PCT/US2016/045526, dated Nov. 22, 2016, 15 pages.

(56) References Cited

OTHER PUBLICATIONS

International Search Report and Written Opinion in International Application No. PCT/US2016/048915, dated Nov. 22, 2016, 17 pages.
International Search Report and Written Opinion in International Application No. PCT/US2016/060493, dated Jan. 10, 2017, 20 pages.
International Search Report and Written Opinion in International Application No. PCT/US2016/066073, dated Mar. 7, 2017, 16 pages.
International Preliminary Report on Patentability in International Application No. PCT/US2016/043609, dated Jan. 23, 2018, 12 pages.
International Preliminary Report on Patentability in International Application No. PCT/US2016/045526, dated Feb. 6, 2018, 10 pages.
International Preliminary Report on Patentability in International Application No. PCT/US2016/048915, dated Feb. 27, 2018, 8 pages.
Bamji et al., "A 0.13 µm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.
Bianco et al., "A Comparative Analysis between Active and Passive Techniques for Underwater 3D Reconstruction of Close-Range Objects," Sensors, Aug. 20, 2013, 13(8):11007-11031.
Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.
Dalla Betta et al., "Design and Characterization of Current-Assisted Photonic Demodulators in 0.18-µm CMOS Technology," IEEE Trans. Electron. Dev., Jun. 2011, 58(6):1702-1709.
Feng et al., "Vertical p-i-n germanium photodetector with high external responsivity integrated with large core Si waveguides," Optics Express, Jan. 4, 2010, 18(1):96-101.
Foix et al., "Lock-in Time-of-Flight (ToF) Cameras: A Survey," IEEE Sensors J., Sep. 2011, 11(9):1917-1926.
Geng, "Structured-light 3D surface imaging: a tutorial," Advances in Optics and Photonics, Jun. 30, 2011, 3(2):128-160.
Joo et al., "High-sensitivity 10 Gbps Ge-on-Si photoreceiver operating at λ-1.55 µm," Optics Express, Aug. 2, 2010, 18(16):16474-16479.
Kato et al., "320×240 Back-Illuminated 10-µm CAPD Pixels for High-Speed Modulation Time-of-Flight CMOS Image Sensor," IEEE J. Solid-State Circuits Apr. 2018, 53(4):1071-1078.
Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
Perenzoni et al., "Compact SPAD-Based Pixel Architectures for Time-Resolved Image Sensors," Sensors, May 23, 2016, 16(5):745, 12 pages.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "A self-assembled microbonded germanium/silicon heterojunction photodiode for 25 Gb/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 µm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.
PCT International Preliminary Report on Patentability in International Appln. No. PCT/US2018/020262, dated Sep. 3, 2019, 11 pages.
Extended European Search Report in European Application No. 18761724.6-1211, dated Feb. 27, 2020, 6 pages.
Ramireza et al, "Recent progress on the quantum-dot avalanche photodiode," 22nd Annual Meeting of the IEEE Lasers and Electro-optics Society, Oct. 4, 2009, 2 pages.
Wang et al, "35GB/s Ultralow-Voltage Three-Terminal Si-Ge Avalanche Photodiode," 2019 Optical Fiber Communications Conference and Exhibition, Mar. 3, 2019, 3 pages.

\* cited by examiner

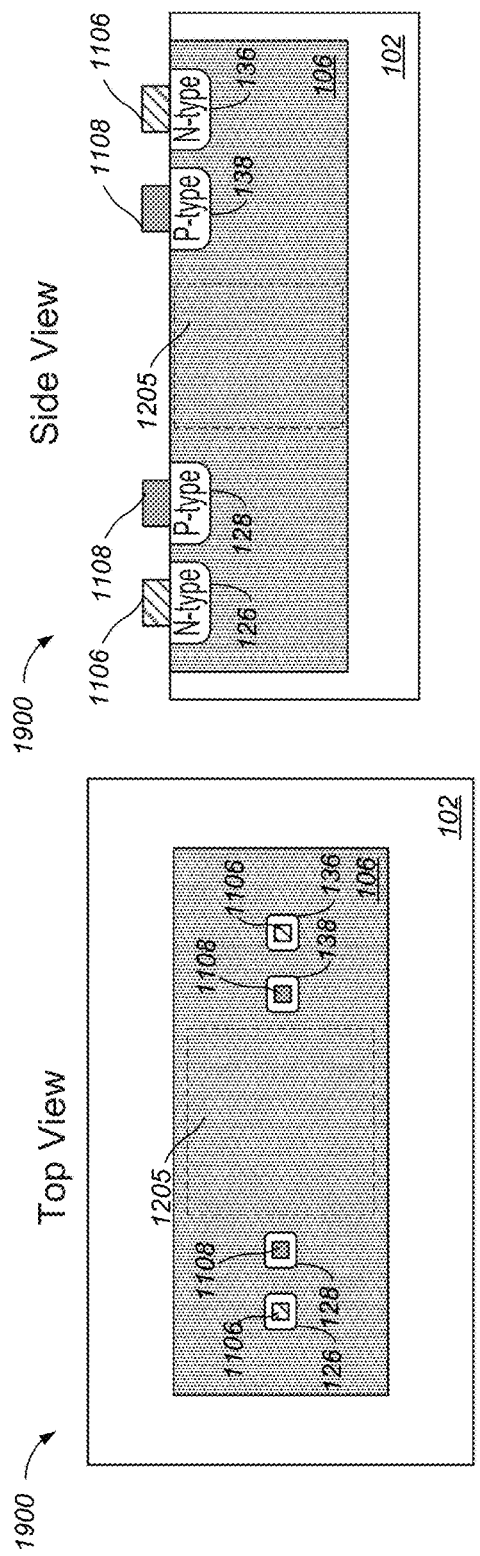
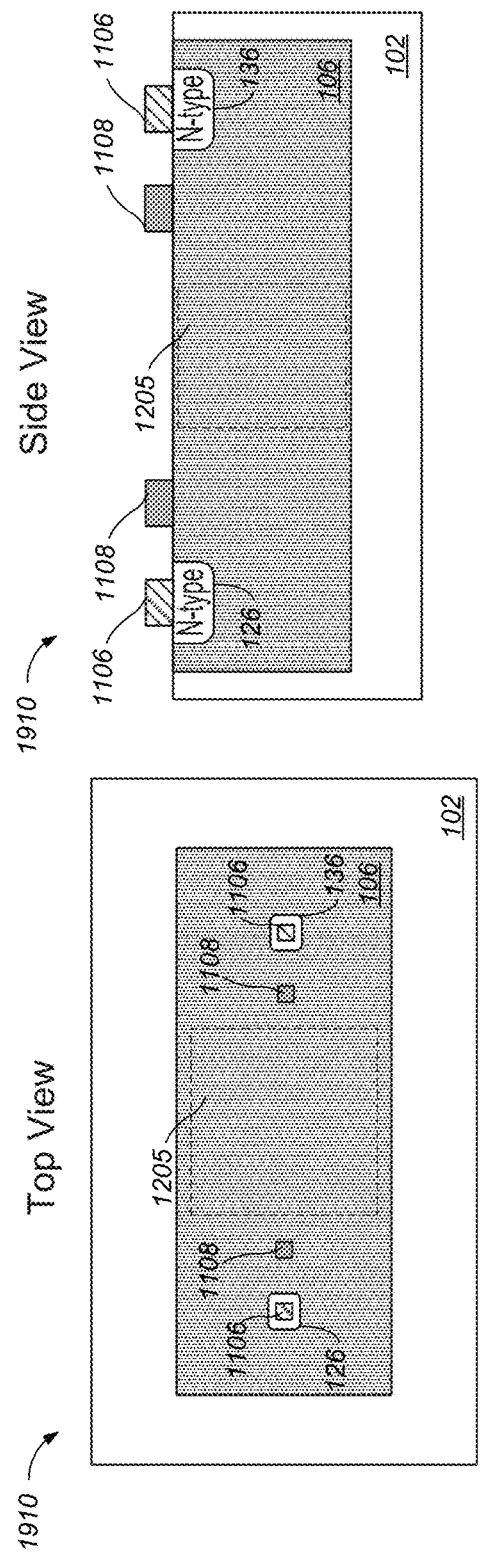
FIG. 19A
FIG. 19B
FIG. 19C
FIG. 19D

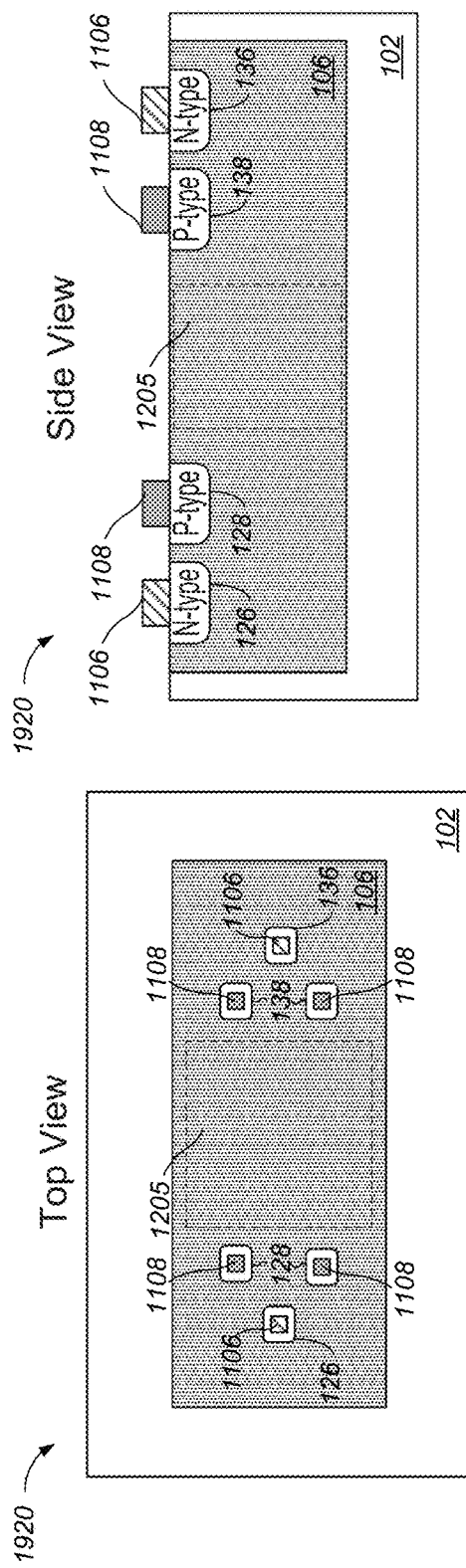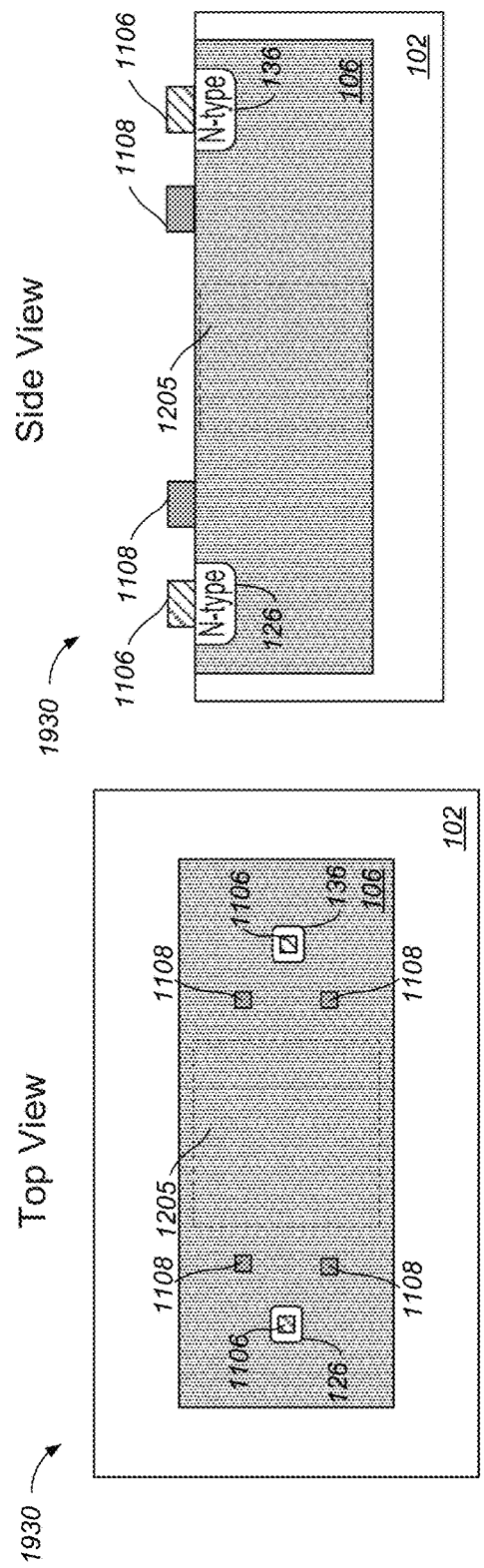
FIG. 19E
FIG. 19F
FIG. 19G
FIG. 19H

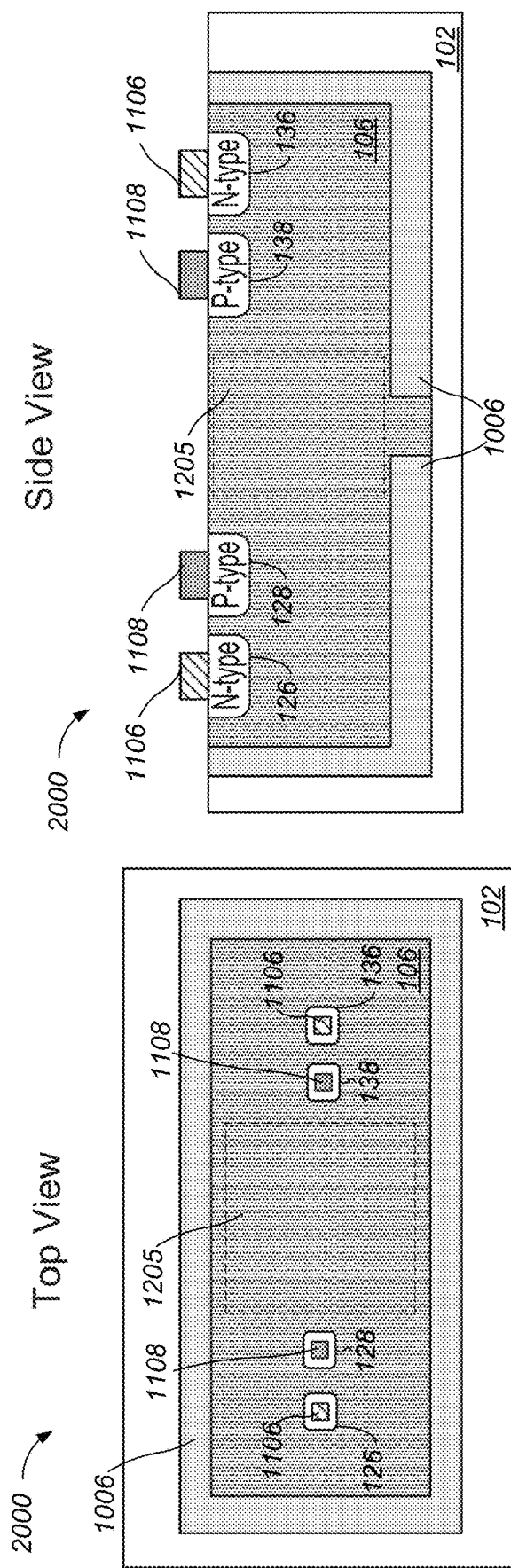

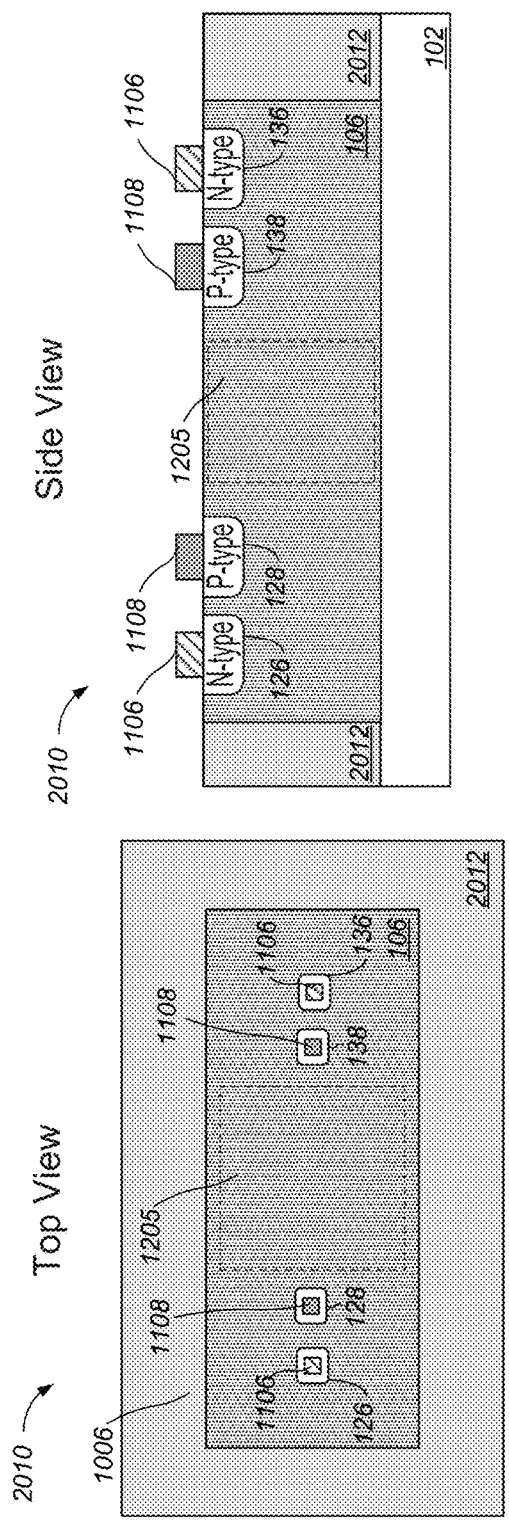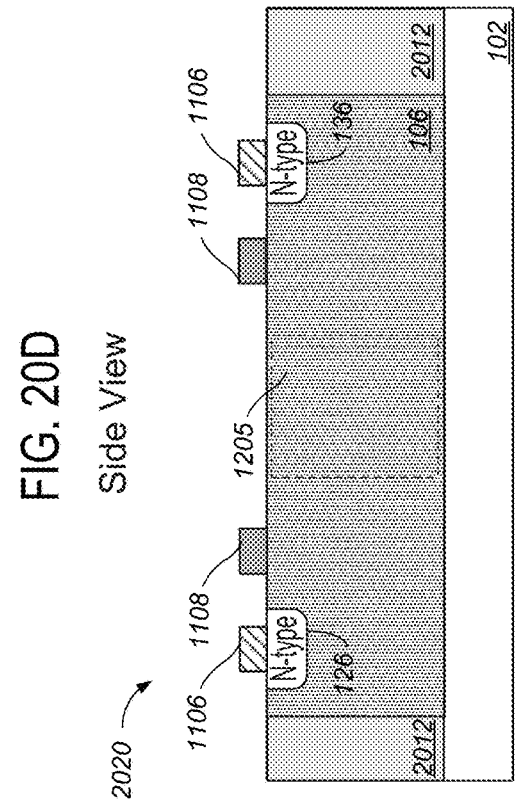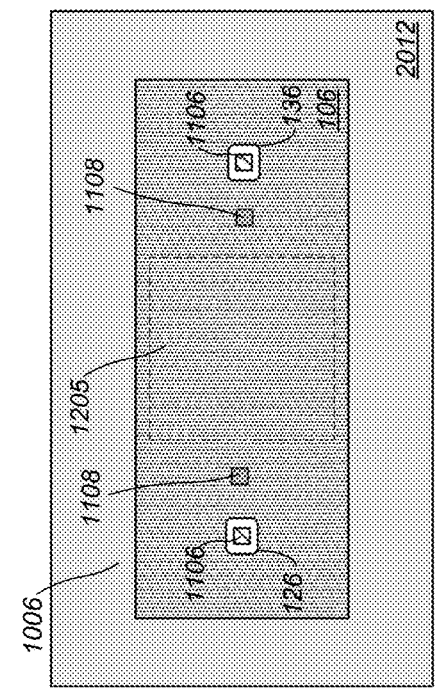
FIG. 20C  FIG. 20D  FIG. 20E  FIG. 20F

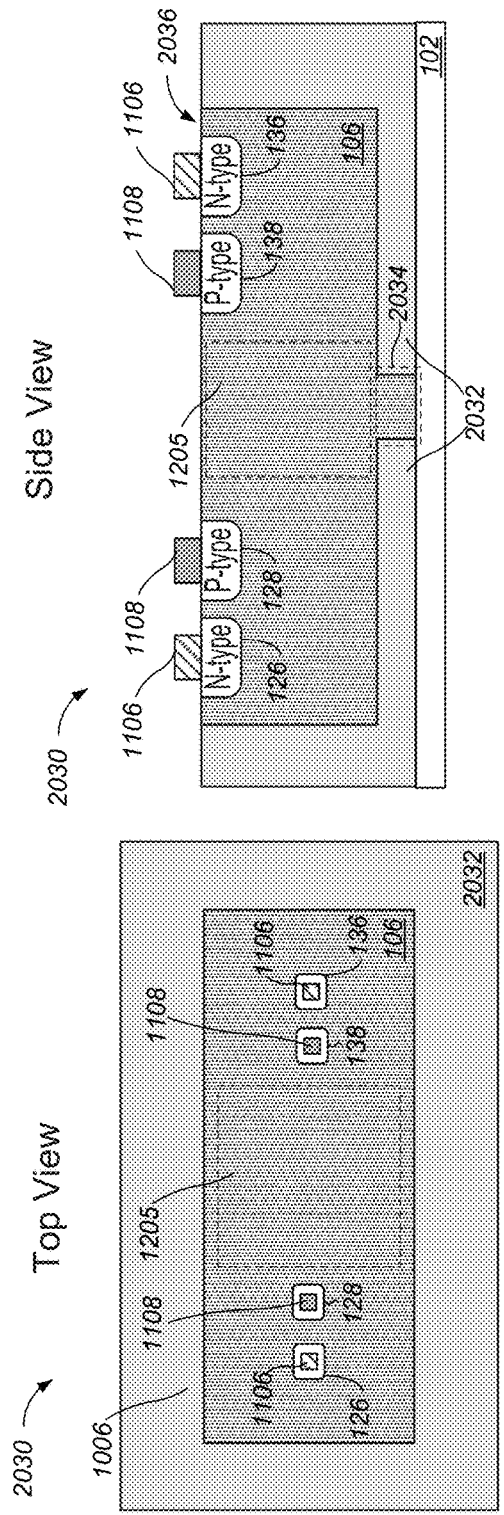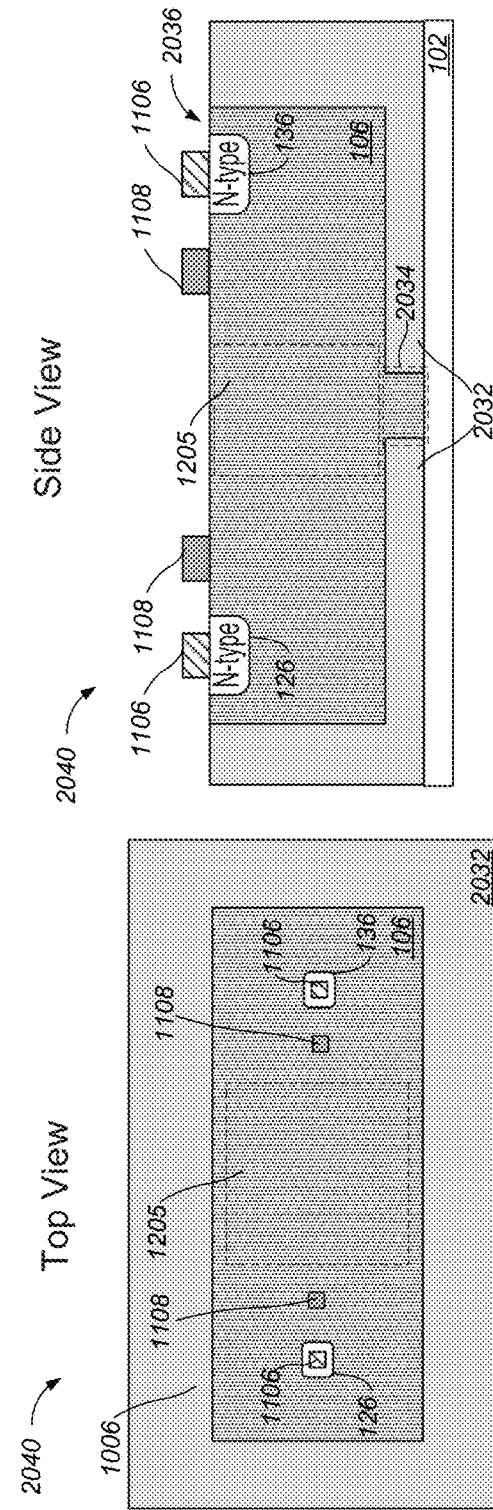

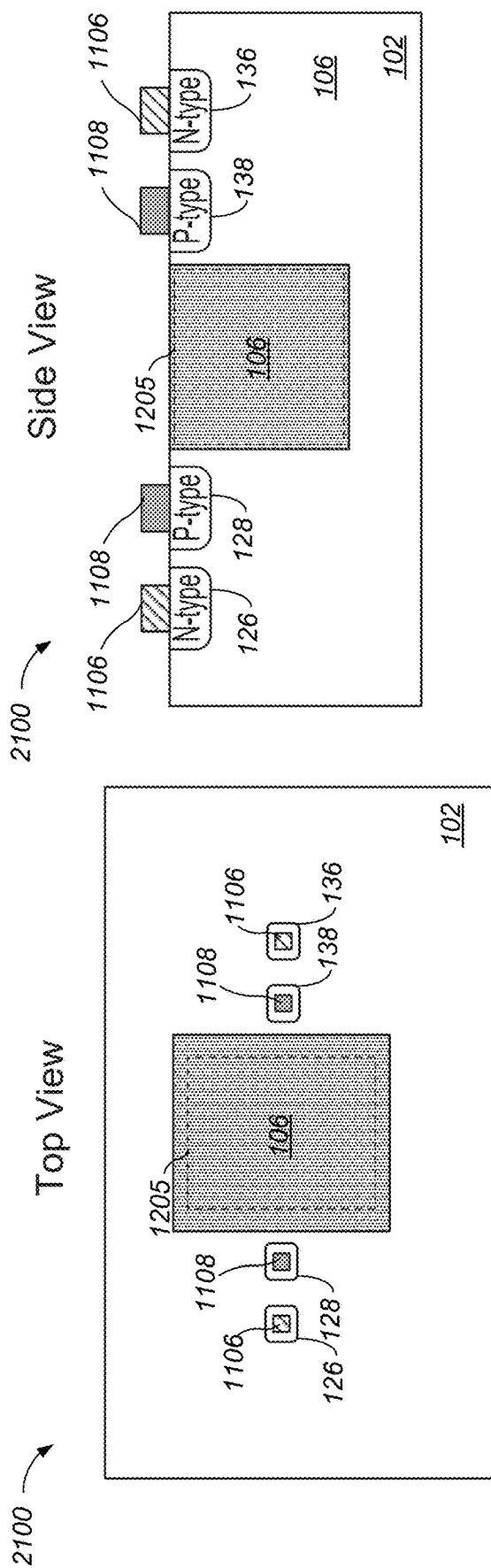

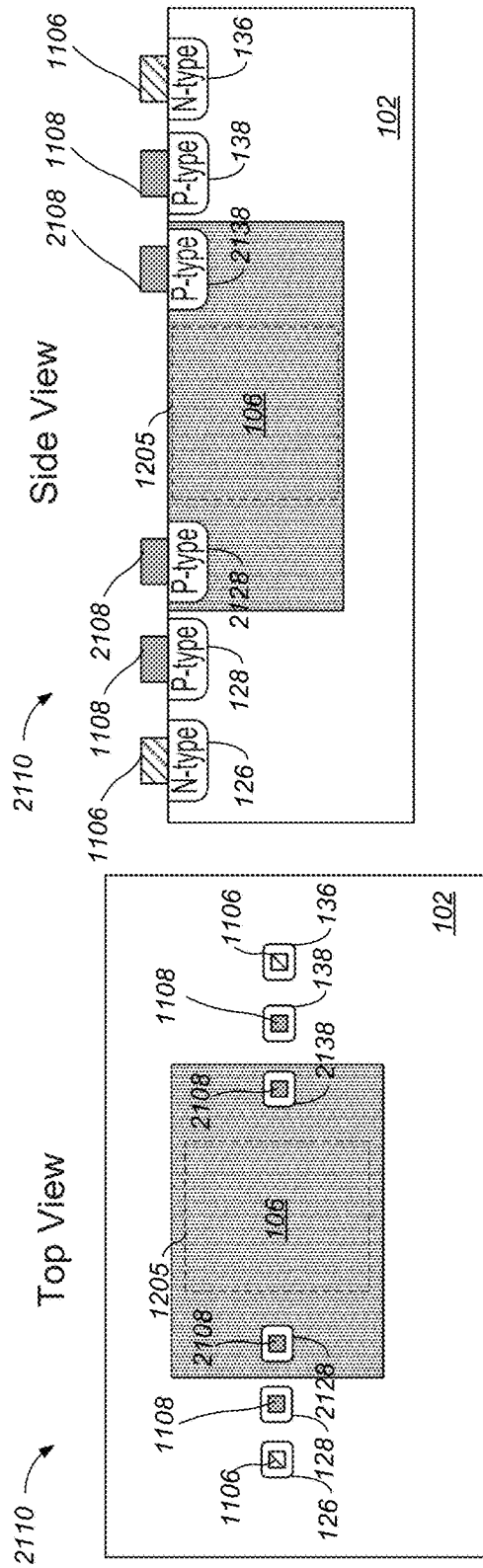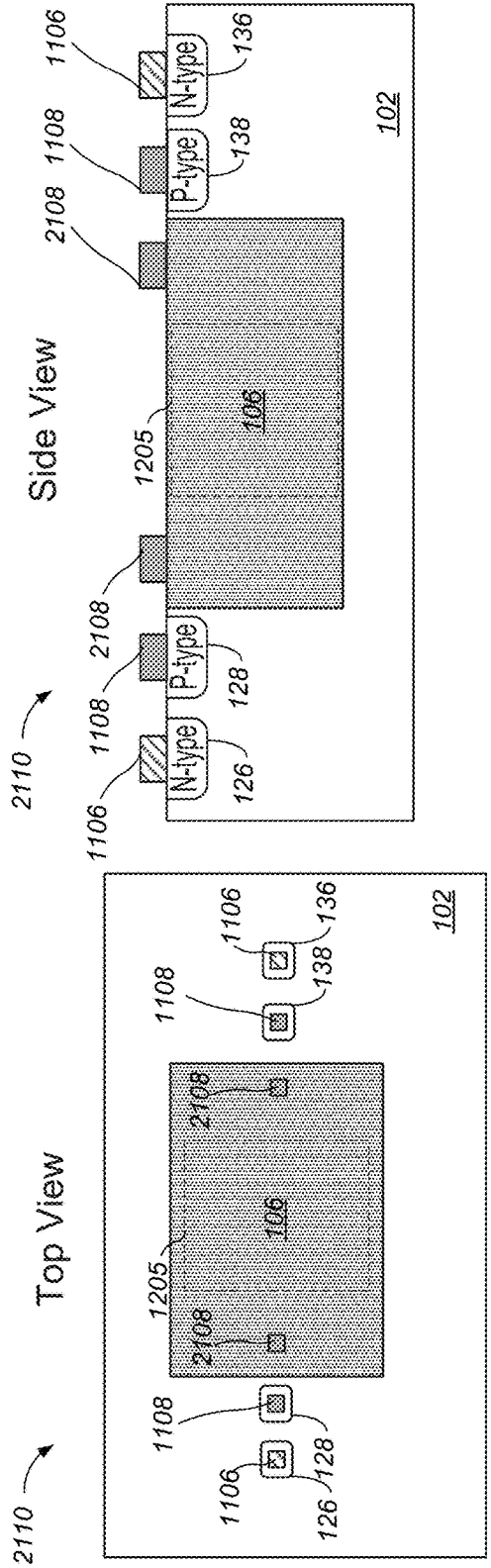

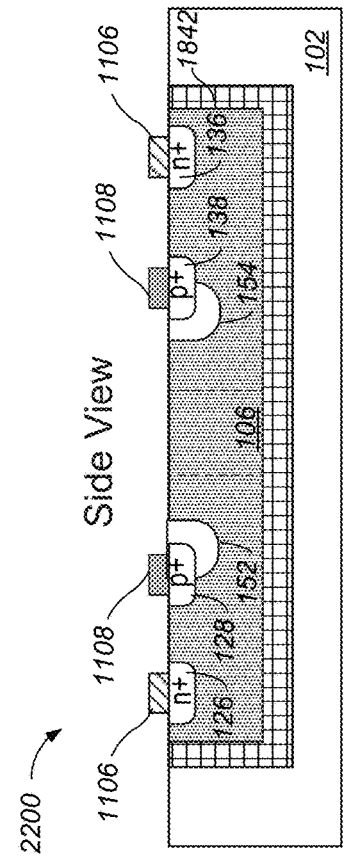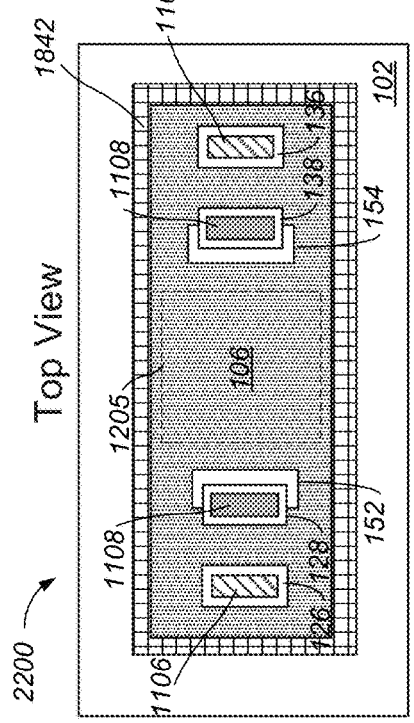
FIG. 22A
FIG. 22B
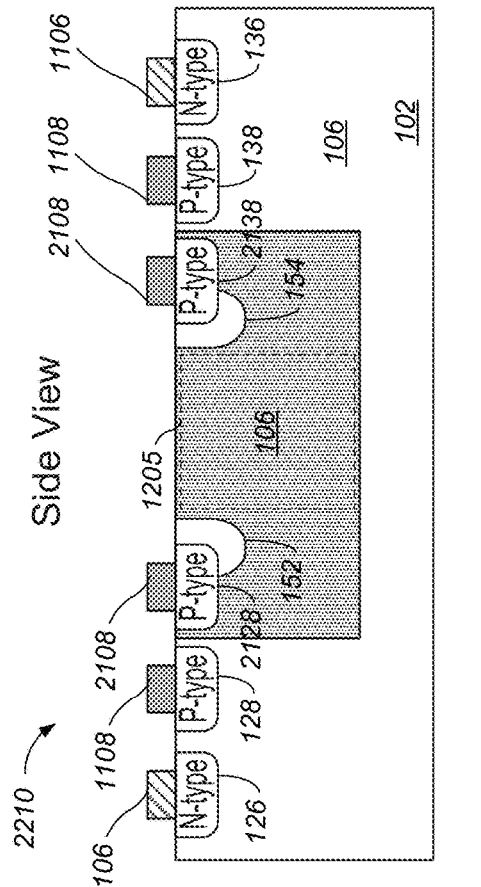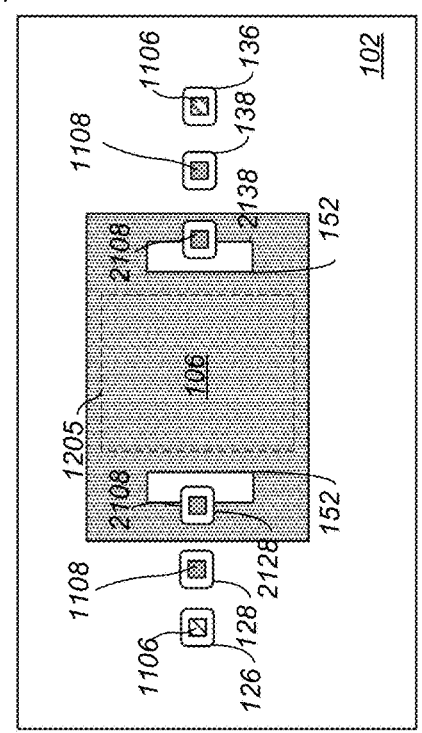
FIG. 22C
FIG. 22D

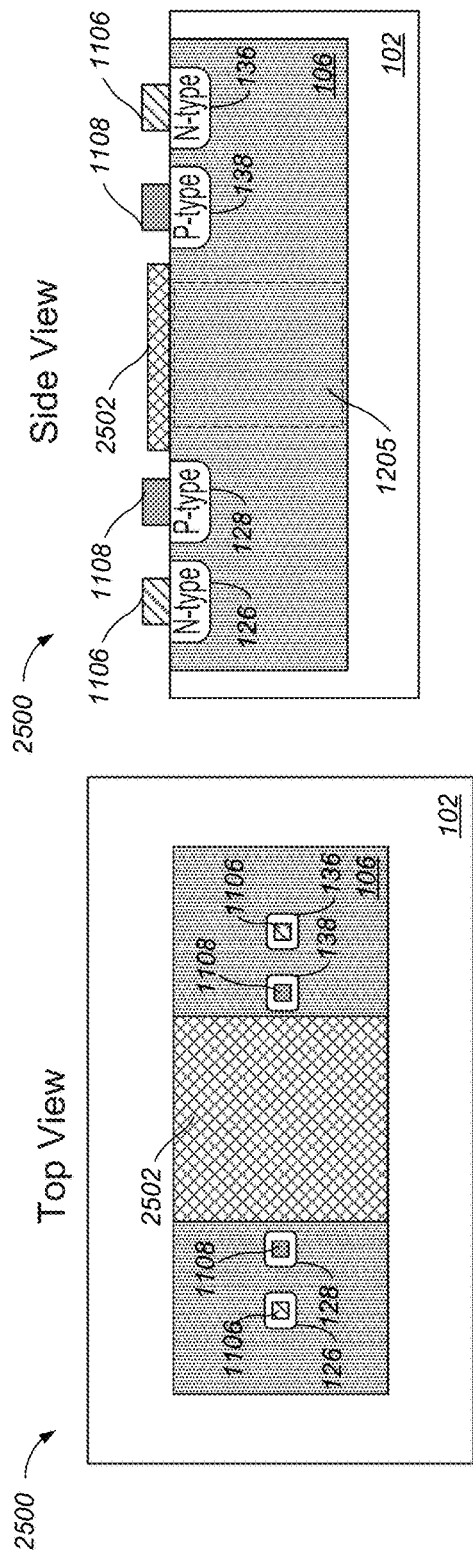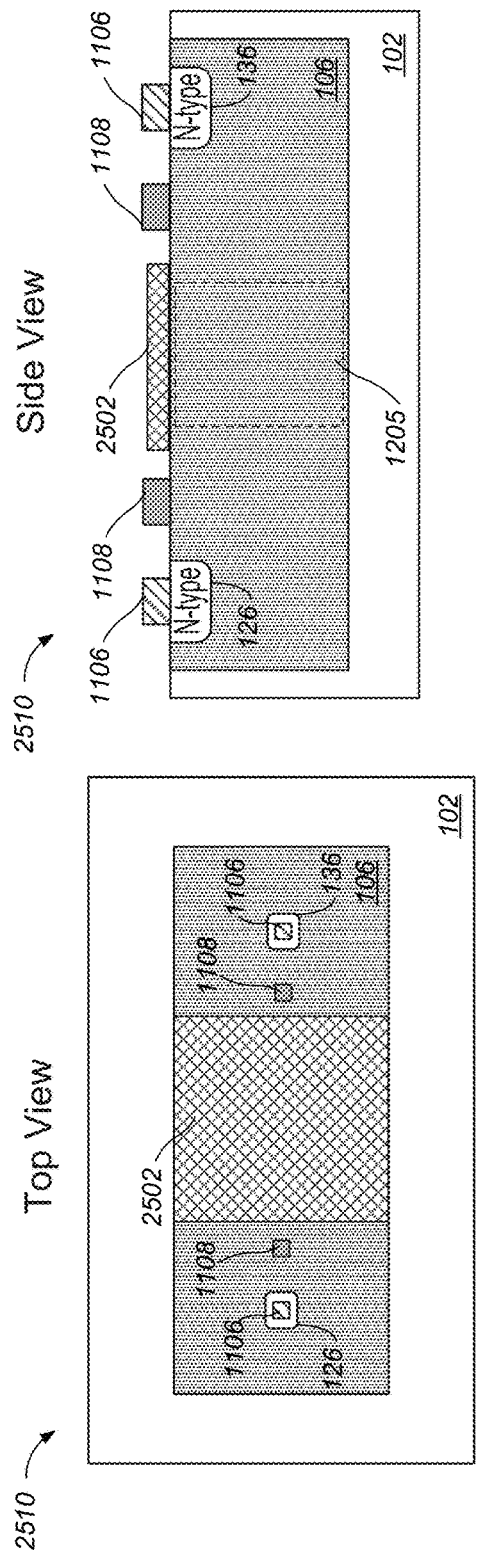
FIG. 25A  FIG. 25B  FIG. 25C  FIG. 25D

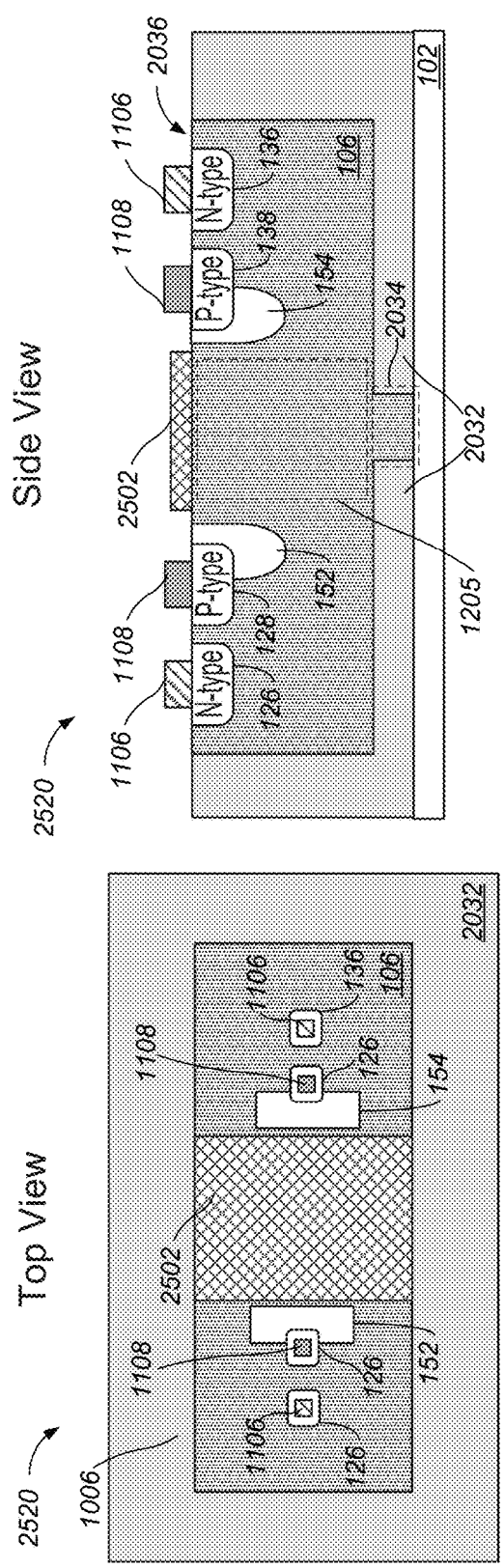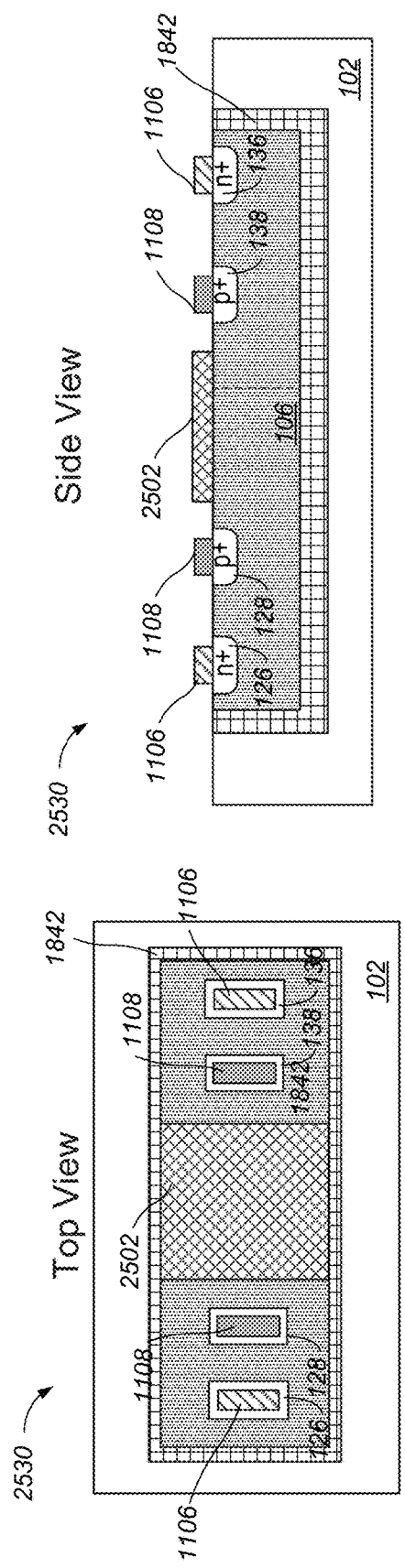

HIGH-SPEED LIGHT SENSING APPARATUS II

CROSS-REFERENCE TO RELATED APPLICATIONS

This application is a continuation-in-part of U.S. patent application Ser. No. 15/338,660 filed on Oct. 31, 2016, entitled "HIGH-SPEED LIGHT SENSING APPARATUS," and claims the benefit of U.S. Provisional Patent Application No. 62/465,139, filed on Feb. 28, 2017; U.S. Provisional Patent Application No. 62/479,322, filed on Mar. 31, 2017; U.S. Provisional Patent Application No. 62/504,531, filed on May 10, 2017; U.S. Provisional Patent Application No. 62/485,003, filed on Apr. 13, 2017; U.S. Provisional Patent Application No. 62/511,977, filed on May 27, 2017; U.S. Provisional Patent Application No. 62/534,179, filed on Jul. 18, 2017; U.S. Provisional Patent Application No. 62/561,266, filed on Sep. 21, 2017; U.S. Provisional Patent Application No. 62/613,054, filed on Jan. 3, 2018; and U.S. Provisional Patent Application No. 62/617,317, filed on Jan. 15, 2018, all of which are incorporated by reference in their entirety.

BACKGROUND

This specification relates to detecting light using a photodetector.

Light propagates in free space or an optical medium is coupled to a photodetector that converts an optical signal to an electrical signal for processing.

SUMMARY

According to one innovative aspect of the subject matter described in this specification, light reflected from a three-dimensional object may be detected by photodetectors of an imaging system. The photodetectors convert the detected light into electrical charges. Each photodetector may include two groups of switches that collect the electrical charges. The collection of the electrical charges by the two groups of switches may be altered over time, such that the imaging system may determine phase information of the sensed light. The imaging system may use the phase information to analyze characteristics associated with the three-dimensional object including depth information or a material composition. The imaging system may also use the phase information to analyze characteristics associated with eye-tracking, gesture recognition, 3-dimensional model scanning/video recording, motion tracking, and/or augmented/virtual reality applications.

In general, one innovative aspect of the subject matter described in this specification can be embodied in an optical apparatus that includes a semiconductor substrate; a germanium-silicon layer coupled to the semiconductor substrate, the germanium-silicon layer including a photodetector region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the germanium-silicon layer, where the first p-doped region is controlled by the first control signal; and a first n-doped region in the germanium-silicon layer, where the first n-doped region is coupled to a first readout integrated circuit. The one or more second switches include a second p-doped region in the germanium-silicon layer, where the second p-doped region is controlled by the second control signal; and a second n-doped region in the germanium-silicon layer, where the second n-doped region is coupled to a second readout integrated circuit.

This and other implementations can each optionally include one or more of the following features. The germanium-silicon layer may include a third n-doped region and a fourth n-doped region, where at least a portion of the first p-doped region may be formed in the third n-doped region, and where at least a portion of the second p-doped region may be formed in the fourth n-doped region. The germanium-silicon layer may include a third n-doped region, where at least a portion of the first p-doped region and a portion of the second p-doped region may be formed in the third n-doped region. The semiconductor substrate may include a third p-doped region and one or more n-doped regions, where the germanium-silicon layer may be arranged over the third p-doped region, and where the third p-doped region may be electrically shorted with the one or more n-doped regions.

The first control signal may be a fixed bias voltage, and the second control signal may be a variable bias voltage that is biased over the fixed voltage of the first control signal. The photons absorbed by the germanium-silicon layer may be reflected from a surface of a three-dimensional target, and the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in an optical apparatus including a semiconductor substrate; an absorption layer coupled to the semiconductor substrate, the absorption layer including a photodetector region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the semiconductor substrate, where the first p-doped region is controlled by the first control signal; and a first n-doped region in the semiconductor substrate, where the first n-doped region is coupled to a first readout integrated circuit. The one or more second switches include a second p-doped region in the semiconductor substrate, where the second p-doped region is controlled by the second control signal; and a second n-doped region in the semiconductor substrate, wherein the second n-doped region is coupled to a second readout integrated circuit.

This and other implementations can each optionally include one or more of the following features. The semiconductor substrate may include a third n-doped region and a fourth n-doped region, where at least a portion of the first p-doped region may be formed in the third n-doped region, and where at least a portion of the second p-doped region may be formed in the fourth n-doped region. The semiconductor substrate may include a third n-doped region, where at least a portion of the first p-doped region and a portion of the second p-doped region may be formed in the third n-doped region. The semiconductor substrate may include one or more p-well regions.

The first control signal may be a fixed bias voltage, where the second control signal may be a variable bias voltage that is biased over the fixed voltage of the first control signal. The photons absorbed by the absorption layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in an optical apparatus including a semiconductor substrate; an absorption layer coupled to the semiconductor substrate, the absorption layer including a photodetector region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include multiple first p-doped regions in the semiconductor substrate, where the multiple first p-doped regions are controlled by the first control signal; and multiple first n-doped regions in the semiconductor substrate, where the multiple first n-doped regions are coupled to a first readout integrated circuit. The one or more second switches include multiple second p-doped regions in the semiconductor substrate, where the multiple second p-doped regions are controlled by the second control signal; and multiple second n-doped regions in the semiconductor substrate, where the multiple second n-doped regions are coupled to a second readout integrated circuit.

This and other implementations can each optionally include one or more of the following features. The semiconductor substrate may include a third n-doped region, where at least a portion of the multiple first p-doped region and a portion of the multiple second p-doped region may be formed in the third n-doped region. The multiple first p-doped regions and the multiple second p-doped regions may be arranged in an interdigitated arrangement along a first plane in the semiconductor substrate, where the multiple first n-doped regions and the multiple second n-doped regions may be arranged in an interdigitated arrangement along a second plane in the semiconductor substrate that is different from the first plane. Each p-doped region of the multiple first p-doped regions may be arranged over a respective n-doped region of the multiple first n-doped regions, and each p-doped region of the multiple second p-doped regions may be arranged over a respective n-doped region of the multiple second n-doped regions. The semiconductor substrate may include one or more p-well regions.

The first control signal may be a fixed bias voltage, and the second control signal may be a variable bias voltage that is biased over the fixed voltage of the first control signal. The photons absorbed by the absorption layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in a time-of-flight system that includes a light source; and an image sensor comprising multiple pixels fabricated on a semiconductor substrate, where each pixel of the pixels includes a germanium-silicon layer coupled to the semiconductor substrate, the germanium-silicon layer including a photodetector region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal.

This and other implementations can each optionally include one or more of the following features. The light source may be configured to emit optical pulses having a duty cycle that is less than 50% but maintaining a same amount of energy per optical pulse.

Another innovative aspect of the subject matter described in this specification can be embodied in an optical apparatus that includes a semiconductor substrate; a germanium-silicon layer coupled to the semiconductor substrate, the germanium-silicon layer including a photodetector region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, where the second control signal is different from the first control signal. The one or more first switches include a first p-doped region in the germanium-silicon layer, where the first p-doped region is controlled by the first control signal; and a first n-doped region in the semiconductor substrate, where the first n-doped region is coupled to a first readout integrated circuit. The one or more second switches include a second p-doped region in the germanium-silicon layer, where the second p-doped region is controlled by the second control signal; and a second n-doped region in the semiconductor substrate, where the second n-doped region is coupled to a second readout integrated circuit.

This and other implementations can each optionally include one or more of the following features. The germanium-silicon layer may include a third n-doped region and a fourth n-doped region, where at least a portion of the first p-doped region is formed in the third n-doped region, and where at least a portion of the second p-doped region may be formed in the fourth n-doped region. The germanium-silicon layer may include a third n-doped region, where at least a portion of the first p-doped region and a portion of the second p-doped region may be formed in the third n-doped region. The semiconductor substrate may include one or more p-well regions.

The first control signal may be a fixed bias voltage, where the second control signal may be a variable bias voltage that is biased over the fixed voltage of the first control signal. The photons absorbed by the germanium-silicon layer may be reflected from a surface of a three-dimensional target, where the portion of the photo-carriers collected by the one or more first switches and the portion of the photo-carriers collected by the one or more second switches may be utilized by a time-of-flight system to analyze depth information or a material composition of the three-dimensional target.

Another innovative aspect of the subject matter described in this specification can be embodied in an optical apparatus that includes a semiconductor substrate; a first light absorption region supported by the semiconductor substrate, the first light absorption region including germanium and configured to absorb photons and to generate photo-carriers from the absorbed photons; a first layer supported by at least a portion of the semiconductor substrate and the first light absorption region, the first layer being different from the first light absorption region; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, wherein the second control signal is different from the first control signal. The one or more first switches include a first control contact coupled to a first control region of the first layer, wherein the first control region is controlled by the first control signal; and a first readout contact coupled to a first readout region of the first layer, wherein the first readout region is coupled to a first readout integrated circuit. The one or more second switches include a second control contact coupled to a second control region of the first layer, wherein the second control region is controlled by the second control signal; and a second readout contact coupled to a second readout region of the first layer, wherein the second readout region is coupled to a second readout integrated circuit.

Embodiments of the optical apparatus can include one or more of the following features. For example, the semiconductor substrate can include a recess, and at least a portion of the first light absorption region can be embedded in the recess. The first layer can be a silicon layer or a germanium-silicon layer. The first layer can include a CMOS process-compatible material.

The first light absorption region can be formed from germanium or germanium-silicon.

In some embodiments, the first readout region can include a first n-doped region and the second readout region can include a second n-doped region. The first readout region and the second readout region can be supported by the first light absorption region, and the first control region and the second control region can be supported by the first light absorption region. The first control region can include a first p-doped region and the second control region can include a second p-doped region. The first light absorption region can include a third n-doped region located beneath the first control region of the first layer and in contact with the first p-doped region; and a fourth n-doped region located beneath the second control region of the first layer and in contact with the second p-doped region. The first light absorption region can include a third p-doped region; and a fourth p-doped region.

In some embodiments, the first light absorption region can include a third n-doped region located beneath the first control region of the first layer; and a fourth n-doped region located beneath the second control region of the first layer.

In some embodiments, the first readout region and the second readout region can be supported by the semiconductor substrate, and the first control region and the second control region can be supported by the semiconductor substrate. The first control region can include a first p-doped region and the second control region can include a second p-doped region. The semiconductor substrate can include a third n-doped region located beneath the first control region of the first layer and in contact with the first p-doped region; and a fourth n-doped region located beneath the second control region of the first layer and in contact with the second p-doped region. The semiconductor substrate can include a third p-doped region; and a fourth p-doped region.

In some embodiments, the semiconductor substrate can include a third n-doped region located beneath the first control region of the first layer; and a fourth n-doped region located beneath the second control region of the first layer.

In some embodiments, the one or more first switches can further include a third control contact coupled to a third control region of the first layer, wherein the third control region is supported by the first light absorption region and controlled by a third control signal; and a fourth control contact coupled to a fourth control region of the first layer, wherein the fourth control region is supported by the first light absorption region and controlled by a fourth control signal. The third control region can include a third p-doped region and the fourth control region can include a fourth p-doped region. The semiconductor substrate can include a third n-doped region located beneath the first control region of the first layer and in contact with the first p-doped region; and a fourth n-doped region located beneath the second control region of the first layer and in contact with the second p-doped region. The first light absorption region can include a fifth n-doped region located beneath the third control region of the first layer and in contact with the third p-doped region; and a sixth n-doped region located beneath the fourth control region of the first layer and in contact with the fourth p-doped region. The semiconductor substrate can further include: a fifth p-doped region; and a sixth p-doped region.

In some embodiments, the semiconductor substrate can include a third n-doped region located beneath the first control region of the first layer and in contact with the first p-doped region; and a fourth n-doped region located beneath the second control region of the first layer and in contact with the second p-doped region. The first light absorption region can include a fifth n-doped region located beneath the third control region of the first layer; and a sixth n-doped region located beneath the fourth control region of the first layer.

In some embodiments, the optical apparatus can further include a first bipolar junction transistor and a second bipolar junction transistor. The first bipolar junction transistor can include a first electron emitter supported by the semiconductor substrate; the first p-doped region; and the first n-doped region. The second bipolar junction transistor can include a second electron emitter supported by the semiconductor substrate; the second p-doped region; and the second n-doped region.

Another innovative aspect of the subject matter described in this specification can be embodied in an optical apparatus that includes a semiconductor substrate; a first light absorption region supported by the semiconductor substrate, the first light absorption region configured to absorb photons and to generate photo-carriers from the absorbed photons; one or more first switches controlled by a first control signal, the one or more first switches configured to collect at least a portion of the photo-carriers based on the first control signal; one or more second switches controlled by a second control signal, the one or more second switches configured to collect at least a portion of the photo-carriers based on the second control signal, wherein the second control signal is different from the first control signal; and a counter-doped region formed in a first portion of the first light absorption region, the counter-doped region including a first dopant and having a first net carrier concentration lower than a second net carrier concentration of a second portion of the first light absorption region. The one or more first switches include a first control contact coupled to a first control region, wherein the first control region is controlled by the first control signal; and a first readout contact coupled to a first readout region, wherein the first readout region is coupled to a first readout integrated circuit. The one or more second switches include a second control contact coupled to a second control region, wherein the second control region is controlled by the second control signal; and a second readout contact coupled to a second readout region, wherein the second readout region is coupled to a second readout integrated circuit.

Embodiments of the optical apparatus can include one or more of the following features. For example, during operation, the counter-doped region can reduce a leakage current flowing between the first control contact and the second control contact relative to a comparable optical apparatus without the counter-doped region.

In some embodiments, the first control region, the first readout region, the second control region, and the second readout region can be supported by the first light absorption region, and the counter-doped region includes at least a portion of the first control region, the first readout region, the second control region, and the second readout region. The first readout region can include a first n-doped region and the second readout region can include a second n-doped region. The first control region can include a first p-doped region and the second control region can include a second p-doped region. The optical apparatus can further include a third n-doped region in contact with the first p-doped region; and a fourth n-doped region in contact with the second p-doped region, wherein a first lateral separation between the third n-doped region and the fourth n-doped region is smaller than a second lateral separation between the first p-doped region and the second p-doped region.

The first light absorption region can include germanium or germanium-silicon. The first dopant of the counter-doped region can be selected from the group consisting of phosphorous, arsenic, antimony, and fluorine. A doping concentration of the counter-doped region can be between $2*10^{13}/cm^3$ and $5*10^{14}/cm^3$. A doping concentration of the counter-doped region can be larger than a defect concentration of the germanium or the germanium-silicon.

In some embodiments, the optical apparatus can further include a first reflector supported by the semiconductor substrate. The first reflector can be one or more of a metal mirror; a dielectric mirror; and a distributed Bragg reflector. The optical apparatus can further include a second reflector supported by the semiconductor substrate, wherein the first reflector and the second reflector are located on opposite sides of the first light absorption region. The optical apparatus can further include a first anti-reflection layer supported by the semiconductor substrate, wherein the first reflector and the first anti-reflection layer are located on opposite sides of the first light absorption region.

In some embodiments, the optical apparatus can further include a lens supported by the semiconductor substrate. The lens can be integrally formed on the semiconductor substrate. The optical apparatus can further include a spacer layer supported by the semiconductor substrate, wherein, in a direction normal to a substrate surface, the spacer layer is arranged between the first light absorption region and the lens. The optical apparatus can further include a second anti-reflection layer supported by the semiconductor substrate and arranged between the semiconductor substrate and the lens. A refractive index of at least a portion of the second anti-reflection layer can be greater than 1.8. The second anti-reflection layer can include a CMOS process-compatible high-k material.

In some embodiments, the optical apparatus can further include a first layer supported by at least a portion of the semiconductor substrate and the first light absorption region, the first layer being different from the first light absorption region.

Another innovative aspect of the subject matter described in this specification can be embodied in an optical apparatus that include a semiconductor substrate; a first light absorption region supported by the semiconductor substrate, the first light absorption region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, wherein the second control signal is different from the first control signal. The one or more first switches include a first p-doped region in the first light absorption region, wherein the first p-doped region is controlled by the first control signal and has a first p-dopant concentration; a second p-doped region in the first light absorption region and in contact with at least a first portion of the first p-doped region, wherein the second p-doped region has a second p-dopant concentration lower than the first p-dopant concentration; and a first n-doped region in the first light absorption region, wherein the first n-doped region is coupled to a first readout integrated circuit and has a first n-dopant concentration. The one or more second switches include a third p-doped region in the first light absorption region, wherein the third p-doped region is controlled by the second control signal and has a third p-dopant concentration; a fourth p-doped region in the first light absorption region and in contact with at least a first portion of the third p-doped region, wherein the fourth p-doped region has a fourth p-dopant concentration lower than the third p-dopant concentration; and a second n-doped region in the first light absorption region, wherein the second n-doped region is coupled to a second readout integrated circuit and has a second n-dopant concentration.

Embodiments of the optical apparatus can include one or more of the following features. For example, during operation, the second p-doped region can reduce a first dark current flowing between the first p-doped region and the first n-doped region, and the fourth p-doped region can reduce a second dark current flowing between the third p-doped region and the second n-doped region relative to a comparable optical apparatus without the second and fourth p-doped regions.

In some embodiments, the one or more first switches can further include a third n-doped region in the first light absorption region and in contact with at least a portion of the first n-doped region, wherein the third n-doped region has a third n-dopant concentration lower than the first n-dopant concentration, and the one or more second switches can further include a fourth n-doped region in the first light absorption region and in contact with at least a portion of the second n-doped region, wherein the fourth n-doped region has a fourth n-dopant concentration lower than the second n-dopant concentration. During operation, the third n-doped region can reduce a first dark current flowing between the first p-doped region and the first n-doped region, and the fourth n-doped region can reduce a second dark current flowing between the third p-doped region and the second n-doped region relative to a comparable optical apparatus without the third and fourth n-doped regions.

In some embodiments, the first light absorption region can include germanium or germanium-silicon. The optical apparatus can further include a first layer supported by the first light absorption region, the first layer being different from the first light absorption region. The one or more first switches can further include a fifth n-doped region in contact with a second portion of the first p-doped region, and the one or more second switches can further include a sixth n-doped region in contact with a second portion the third p-doped region.

Another innovative aspect of the subject matter described in this specification can be embodied in an optical apparatus that includes a semiconductor substrate; a first light absorption region supported by the semiconductor substrate, the first light absorption region configured to absorb photons and to generate photo-carriers from the absorbed photons; one or more first switches controlled by a first control signal, the one or more first switches configured to collect at least a portion of the photo-carriers based on the first control signal; and one or more second switches controlled by a second control signal, the one or more second switches configured to collect at least a portion of the photo-carriers based on the second control signal, wherein the second control signal is different from the first control signal. The one or more first switches include a first p-doped region in the first light absorption region, wherein the first p-doped region is controlled by the first control signal and has a first p-dopant concentration; a first n-doped region in the first light absorption region, wherein the first n-doped region is coupled to a first readout integrated circuit and has a first n-dopant concentration; and a first trench located between the first p-doped region and the first n-doped region. The one or more second switches include a second p-doped region in the first light absorption region, wherein the second p-doped region is controlled by the second control signal and has a second p-dopant concentration; a second n-doped region in the first light absorption region, wherein the second n-doped region is coupled to a second readout integrated circuit and has a second n-dopant concentration; and a second trench located between the second p-doped region and the second n-doped region.

Embodiments of the optical apparatus can include one or more of the following features. For example, during operation, the first trench can reduce a first dark current flowing between the first p-doped region and the first n-doped region, and the second trench can reduce a second dark current flowing between the second p-doped region and the second n-doped region relative to a comparable optical apparatus without the first and second trenches.

In some embodiments, the first light absorption region can include germanium or germanium-silicon. The one or more first switches can further include a third p-doped region in the first light absorption region and in contact with at least a first portion of the first p-doped region, wherein the third p-doped region has a third p-dopant concentration lower than the first p-dopant concentration; and a third n-doped region in the first light absorption region and in contact with at least a portion of the first n-doped region, wherein the third n-doped region has a third n-dopant concentration lower than the first n-dopant concentration. The one or more second switches can further include a fourth p-doped region in the first light absorption region and in contact with at least a first portion of the second p-doped region, wherein the fourth p-doped region has a fourth p-dopant concentration lower than the second p-dopant concentration; and a fourth n-doped region in the first light absorption region and in contact with at least a portion of the second n-doped region, wherein the fourth n-doped region has a fourth n-dopant concentration lower than the second n-dopant concentration. During operation, the third n-doped region and the third p-doped region can reduce a first dark current flowing between the first p-doped region and the first n-doped region, and the fourth n-doped region and the fourth p-doped region can reduce a second dark current flowing between the second p-doped region and the second n-doped region relative to a comparable optical apparatus without the third and fourth n-doped regions and the third and fourth p-doped regions.

In some embodiments, the optical apparatus can further include a first layer supported by the first light absorption region, the first layer being different from the first light absorption region and covering the first trench and the second trench. The one or more first switches can further include a fifth n-doped region in contact with a second portion of the first p-doped region; and the one or more second switches can further include a sixth n-doped region in contact with a second portion the second p-doped region.

In some embodiments, the first trench and the second trench can be at least partially filled with a dielectric material.

Advantageous implementations may include one or more of the following features. Germanium is an efficient absorption material for near-infrared wavelengths, which reduces the problem of slow photo-carriers generated at a greater substrate depth when an inefficient absorption material, e.g., silicon, is used. For a photodetector having p- and n-doped regions fabricated at two different depths, the photo-carrier transit distance is limited by the depth, and not the width, of the absorption material. Consequently, if an efficient absorption material with a short absorption length is used, the distance between the p- and n-doped regions can also be made short so that even a small bias may create a strong field resulting into an increased operation speed. For such a photodetector, two groups of switches may be inserted and arranged laterally in an interdigitated arrangement, which may collect the photo-carriers at different optical phases for a time-of-flight system. An increased operation speed allows the use of a higher modulation frequency in a time-of-flight system, giving a greater depth resolution. In a time-of-flight system where the peak intensity of optical pulses is increased while the duty cycle of the optical pulses is decreased, the signal-to-noise ratio (and hence depth accuracy) can be improved while maintaining the same power consumption for the time-of-flight system. This is made possible when the operation speed is increased so that the duty cycle of the optical pulses can be decreased without distorting the pulse shape. In addition, by using germanium as the absorption material, optical pulses at a wavelength longer than 1 μm can be used. As longer NIR wavelengths (e.g. 1.31 μm, 1.4 μm, 1.55 μm) are generally accepted to be safer to the human eye, optical pulses can be output at a higher intensity at longer wavelengths to improve signal-to-noise-ratio (and hence a better depth accuracy) while satisfying eye-safety requirements.

The details of one or more implementations are set forth in the accompanying drawings and the description below.

Other potential features and advantages will become apparent from the description, the drawings, and the claims.

BRIEF DESCRIPTION OF THE DRAWINGS

FIGS. 19A-19H show top and side views of example switched photodetectors.

FIGS. 20A-20L show top and side views of example switched photodetectors.

FIGS. 21A-21F show top and side views of example switched photodetectors.

FIGS. 22A-22D show top and side views of example switched photodetectors.

FIGS. 25A-25H show top and side views of example switched photodetectors.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
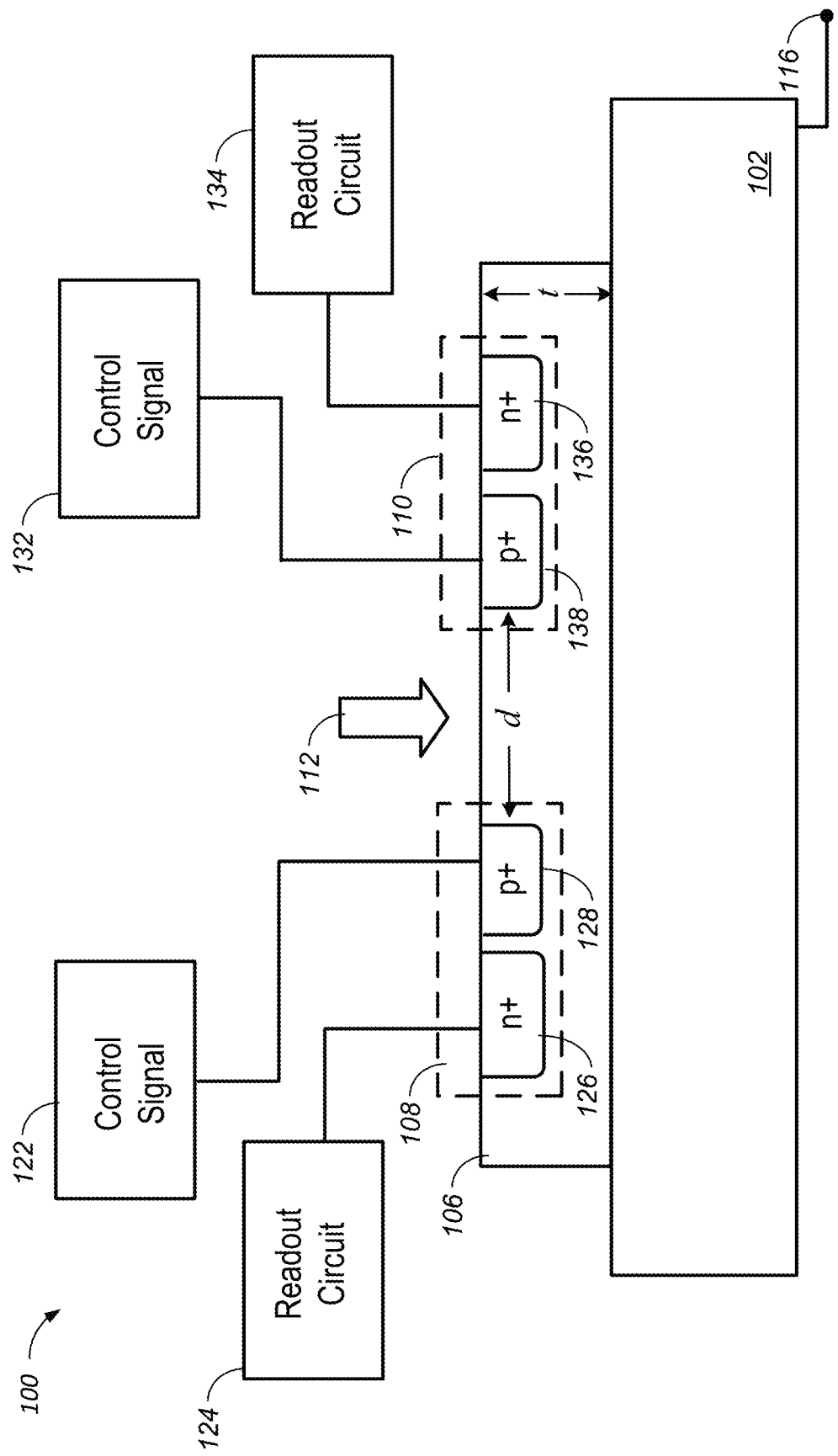
FIGS. 1A, 1B, 1C, and 1D are examples of a switched photodetector.

Photodetectors may be used to detect optical signals and convert the optical signals to electrical signals that may be further processed by another circuitry. In time-of-flight (TOF) applications, depth information of a three-dimensional object may be determined using a phase difference between a transmitted light pulse and a detected light pulse. For example, a two-dimensional array of pixels may be used to reconstruct a three-dimensional image of a three-dimensional object, where each pixel may include one or more photodetectors for deriving phase information of the three-dimensional object. In some implementations, time-of-flight applications use light sources having wavelengths in the near-infrared (NIR) range. For example, a light-emitting-diode (LED) may have a wavelength of 850 nm, 940 nm, 1050 nm, or 1.3 µm to 1.6 µm. Some photodetectors may use silicon as an absorption material, but silicon is an inefficient absorption material for NIR wavelengths. Specifically, photo-carriers may be generated deeply (e.g., greater than 10 µm in depth) in the silicon substrate, and those photo-carriers may drift and/or diffuse to the photodetector junction slowly, which results in a decrease in the operation speed. Moreover, a small voltage swing is typically used to control photodetector operations in order to minimize power consumption. For a large absorption area (e.g., 10 µm in diameter), the small voltage swing can only create a small lateral/vertical field across the large absorption area, which affects the drift velocity of the photo-carriers being swept across the absorption area. The operation speed is therefore further limited. For TOF applications using NIR wavelengths, a switched photodetector with innovative design structures and/or with the use of germanium-silicon (GeSi) as an absorption material addresses the technical issues discussed above. In this application, the term "photodetector" may be used interchangeably with the term "optical sensor". In this application, the term "germanium-silicon (GeSi)" refers to a GeSi alloy with alloy composition ranging from 1% germanium (Ge), i.e., 99% silicon (Si), to 99% Ge, i.e., 1% of Si. In this application, the GeSi material may be grown using a blanket epitaxy, a selective epitaxy, or other applicable techniques. Furthermore, an absorption layer comprising the GeSi material may be formed on a planar surface, a mesa top surface, or a trench bottom surface at least partially surrounded by an insulator (ex: oxide, nitrite), a semiconductor (ex: Si, Ge), or their combinations. Furthermore, a strained super lattice structure or a multiple quantum well structure including alternative layers such as GeSi layers with two or more different alloy compositions may be used for the absorption layer. Furthermore, a Si layer or a GeSi layer with a low Ge concentration (e.g., <10%) may be used to passivate the surface of a GeSi layer with a high Ge concentration (e.g., >50%), which may reduce a dark current or a leakage current at the surface of the GeSi layer with high Ge concentration.

FIG. 1A is an example switched photodetector 100 for converting an optical signal to an electrical signal. The switched photodetector 100 includes an absorption layer 106 fabricated on a substrate 102. The substrate 102 may be any suitable substrate where semiconductor devices can be fabricated on. For example, the substrate 102 may be a silicon substrate. The absorption layer 106 includes a first switch 108 and a second switch 110.

In general, the absorption layer 106 receives an optical signal 112 and converts the optical signal 112 into electrical signals. The absorption layer 106 may be intrinsic, p-type, or n-type. In some implementations, the absorption layer 106 may be formed from a p-type GeSi material. The absorption layer 106 is selected to have a high absorption coefficient at the desired wavelength range. For NIR wavelengths, the absorption layer 106 may be a GeSi mesa, where the GeSi absorbs photons in the optical signal 112 and generates electron-hole pairs. The material composition of germanium and silicon in the GeSi mesa may be selected for specific processes or applications. In some implementations, the absorption layer 106 is designed to have a thickness t. For example, for 850 nm or 940 nm wavelength, the thickness of the GeSi mesa may be approximately 1 µm to have a substantial quantum efficiency. In some implementations, the surface of the absorption layer 106 is designed to have a specific shape. For example, the GeSi mesa may be circular, square, or rectangular depending on the spatial profile of the optical signal 112 on the surface of the GeSi mesa. In some implementations, the absorption layer 106 is designed to have a lateral dimension d for receiving the optical signal 112. For example, the GeSi mesa may have a circular or a rectangular shape, where d can range from 1 µm to 50 µm.

A first switch 108 and a second switch 110 have been fabricated in the absorption layer 106. The first switch 108 is coupled to a first control signal 122 and a first readout circuit 124. The second switch 110 is coupled to a second control signal 132 and a second readout circuit 134. In general, the first control signal 122 and the second control signal 132 control whether the electrons or the holes generated by the absorbed photons are collected by the first readout circuit 124 or the second readout circuit 134.

In some implementations, the first switch 108 and the second switch 110 may be fabricated to collect electrons. In this case, the first switch 108 includes a p-doped region 128 and an n-doped region 126. For example, the p-doped region 128 may have a p+ doping, where the activated dopant concentration may be as high as a fabrication process may achieve, e.g., the peak concentration may be about $5\times10^{20}$ cm$^{-3}$ when the absorption layer 106 is germanium and doped with boron. In some implementation, the doping concentration of the p-doped region 128 may be lower than $5\times10^{20}$ cm$^{-3}$ to ease the fabrication complexity at the expense of an increased contact resistance. The n-doped region 126 may have an n+ doping, where the activated dopant concentration may be as high as a fabrication process may achieve, e.g., the peak concentration may be about $1\times10^{20}$ cm$^{-3}$ when the absorption layer 106 is germanium and doped with phosphorous. In some implementation, the doping concentration of the n-doped region 126 may be lower than $1\times10^{20}$ cm$^{-3}$ to ease the fabrication complexity at the expense of an increased contact resistance. The distance between the p-doped region 128 and the n-doped region 126 may be designed based on fabrication process design rules. In general, the closer the distance between the p-doped region 128 and the n-doped region 126, the higher the switching efficiency of the generated photo-carriers. However, reducing of the distance between the p-doped region 128 and the n-doped region 126 may increase a dark current associated with a PN junction formed between the p-doped region 128 and the n-doped region 126. As such, the distance may be set based on the performance requirements of the switched photodetector 100. The second switch 110 includes a p-doped region 138 and an n-doped region 136. The p-doped region 138 is similar to the p-doped region 128, and the n-doped region 136 is similar to the n-doped region 126.

In some implementations, the p-doped region 128 is coupled to the first control signal 122. For example, the p-doped region 128 may be coupled to a voltage source, where the first control signal 122 may be an AC voltage signal from the voltage source. In some implementations, the n-doped region 126 is coupled to the readout circuit 124. The readout circuit 124 may be in a three-transistor configuration consisting of a reset gate, a source-follower, and a selection gate, a circuit including four or more transistors, or any suitable circuitry for processing charges. In some implementations, the readout circuit 124 may be fabricated on the substrate 102. In some other implementations, the readout circuit 124 may be fabricated on another substrate and integrated/co-packaged with the switched photodetector 100 via die/wafer bonding or stacking.

The p-doped region 138 is coupled to the second control signal 132. For example, the p-doped region 138 may be coupled to a voltage source, where the second control signal 132 may be an AC voltage signal having an opposite phase from the first control signal 122. In some implementations, the n-doped region 136 is coupled to the readout circuit 134. The readout circuit 134 may be similar to the readout circuit 124.

The first control signal 122 and the second control signal 132 are used to control the collection of electrons generated by the absorbed photons. For example, when voltages are used, if the first control signal 122 is biased against the second control signal 132, an electric field is created between the p-doped region 128 and the p-doped region 138, and free electrons drift towards the p-doped region 128 or the p-doped region 138 depending on the direction of the electric field. In some implementations, the first control signal 122 may be fixed at a voltage value $V_i$, and the second control signal 132 may alternate between voltage values $V_i \pm \Delta V$. The direction of the bias value determines the drift direction of the electrons. Accordingly, when one switch (e.g., the first switch 108) is switched "on" (i.e., the electrons drift towards the p-doped region 128), the other switch (e.g., the second switch 110) is switched "off" (i.e. the electrons are blocked from the p-doped region 138). In some implementations, the first control signal 122 and the second control signal 132 may be voltages that are differential to each other.

In general, a difference (before equilibrium) between the Fermi level of a p-doped region and the Fermi level of an n-doped region creates an electric field between the two regions. In the first switch 108, an electric field is created between the p-doped region 128 and the n-doped region 126. Similarly, in the second switch 110, an electric field is created between the p-doped region 138 and the n-doped region 136. When the first switch 108 is switched "on" and the second switch 110 is switched "off", the electrons drift toward the p-doped region 128, and the electric field between the p-doped region 128 and the n-doped region 126 further carries the electrons to the n-doped region 126. The readout circuit 124 may then be enabled to process the charges collected by the n-doped region 126. On the other hand, when the second switch 110 is switched "on" and the first switch 108 is switched "off", the electrons drift toward the p-doped region 138, and the electric field between the p-doped region 138 and the n-doped region 136 further carries the electrons to the n-doped region 136. The readout circuit 134 may then be enabled to process the charges collected by the n-doped region 136.

In some implementations, a voltage may be applied between the p-doped and the n-doped regions of a switch to operate the switch in an avalanche regime to increase the sensitivity of the switched photodetector 100. For example, in the case of an absorption layer 106 including GeSi, when the distance between the p-doped region 128 and the n-doped region 126 is about 100 nm, it is possible to apply a voltage that is less than 7 V to create an avalanche gain between the p-doped region 128 and the n-doped region 126.

In some implementations, the substrate 102 may be coupled to an external control 116. For example, the substrate 102 may be coupled to an electrical ground, or a preset voltage less than the voltages at the n-doped regions 126 and 136. In some other implementations, the substrate 102 may be floated and not coupled to any external control.

Figure 1B:
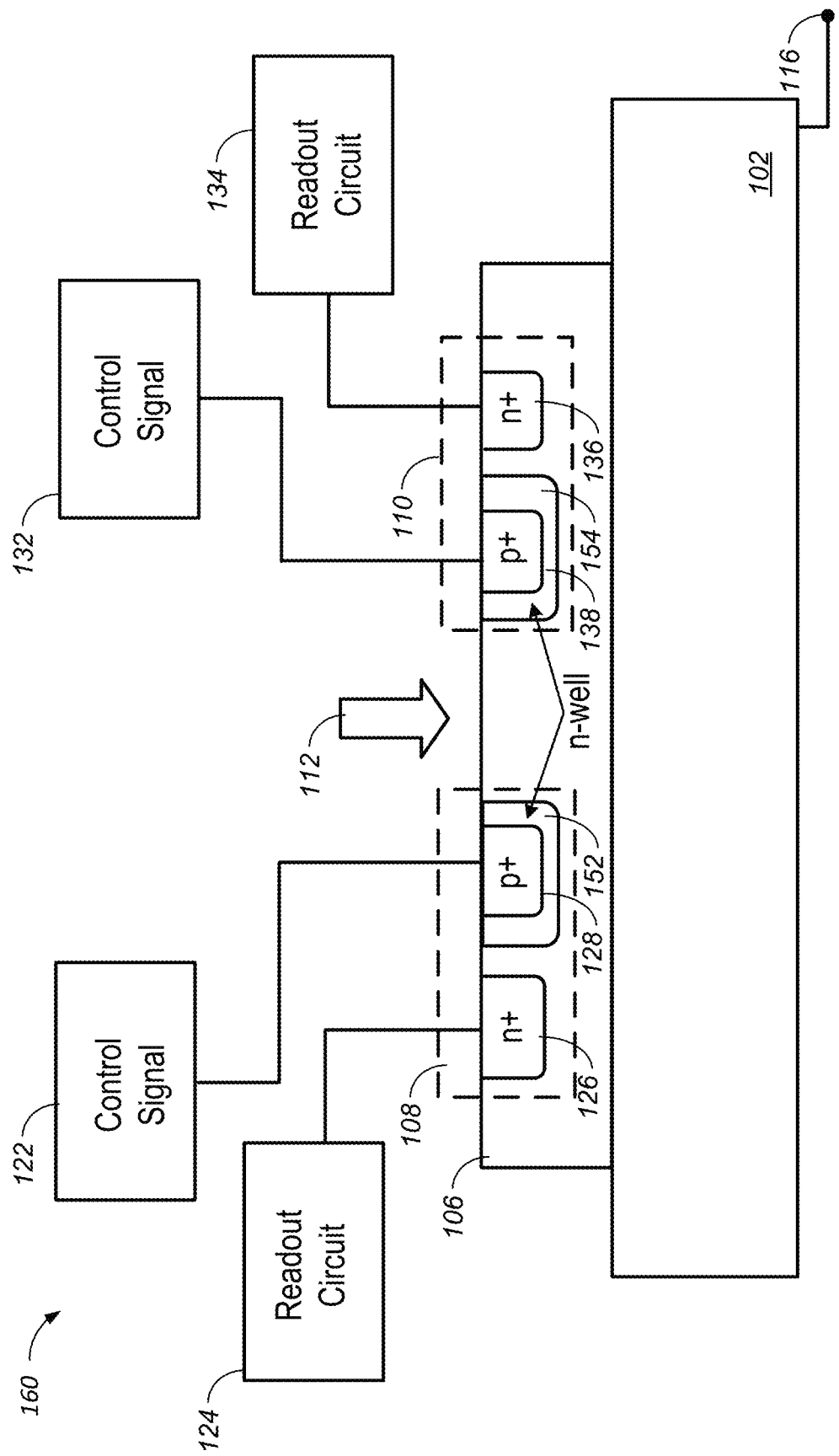

FIG. 1B is an example switched photodetector 160 for converting an optical signal to an electrical signal. The switched photodetector 160 is similar to the switched photodetector 100 in FIG. 1A, but that the first switch 108 and the second switch 110 further includes an n-well region 152 and an n-well region 154, respectively. In addition, the absorption layer 106 may be a p-doped region. In some implementations, the doping level of the n-well regions 152 and 154 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 152, the p-doped absorption layer 106, the n-well region 154, and the p-doped region 138 forms a PNPNP junction structure. In general, the PNPNP junction structure reduces a leakage current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124.

In some implementations, the p-doped region 128 is formed entirely within the n-well region 152. In some other implementations, the p-doped region 128 is partially formed in the n-well region 152. For example, a portion of the p-doped region 128 may be formed by implanting the p-dopants in the n-well region 152, while another portion of the p-doped region 128 may be formed by implanting the p-dopants in the absorption layer 106. Similarly, in some implementations, the p-doped region 138 is formed entirely within the n-well region 154. In some other implementations, the p-doped region 138 is partially formed in the n-well region 154. In some implementations, the depth of the n-well regions 152 and 154 is shallower than the p-doped regions 128 and 138.

Figure 1C:
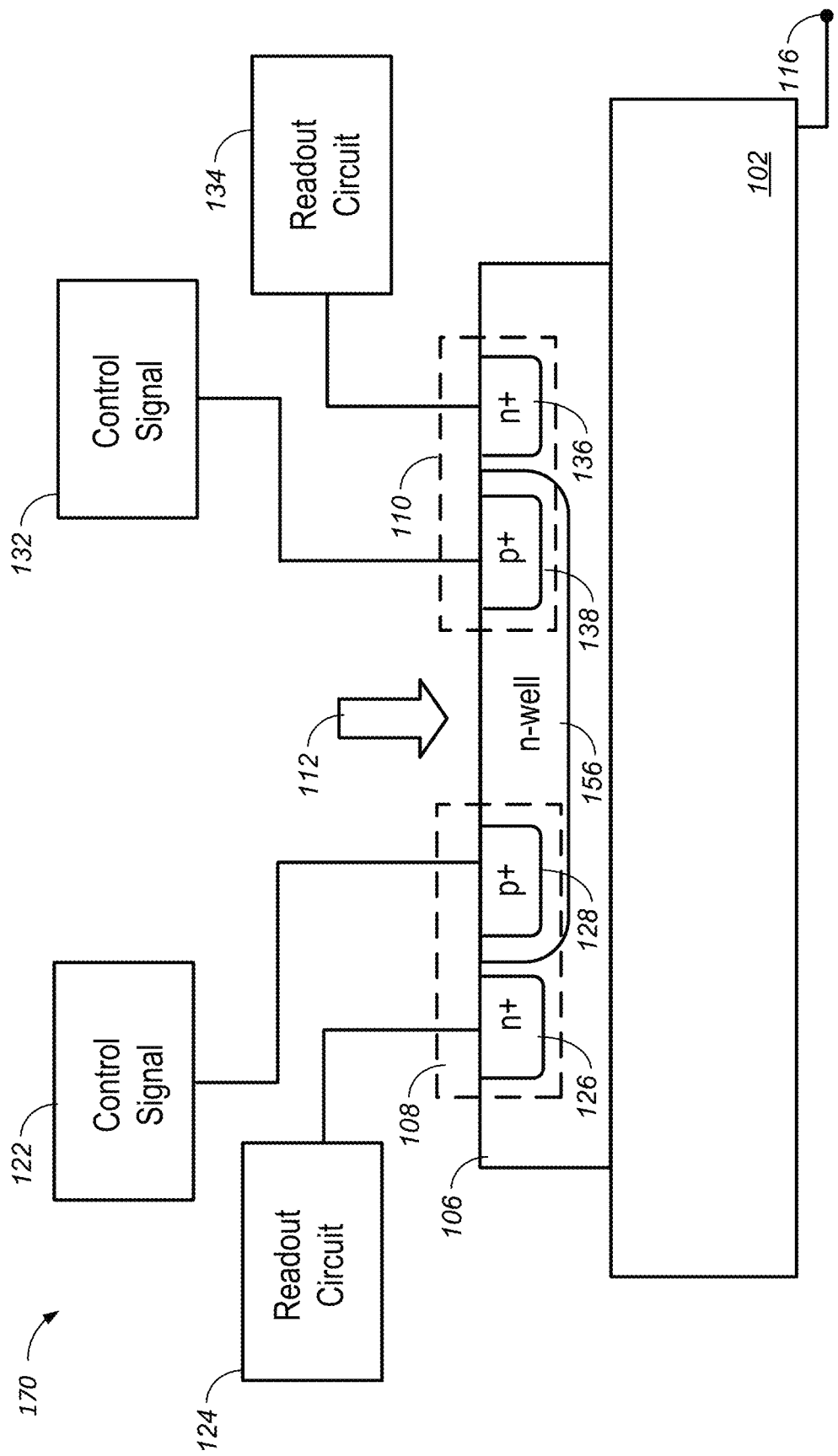

FIG. 1C is an example switched photodetector 170 for converting an optical signal to an electrical signal. The switched photodetector 170 is similar to the switched photodetector 100 in FIG. 1A, but that the absorption layer 106 further includes an n-well region 156. In addition, the absorption layer 106 may be a p-doped region. In some implementations, the doping level of the n-well region 156 may range from $10^{15}$ cm$^{-3}$ to $10^{17}$ cm$^{-3}$. The doping level of the absorption layer 106 may range from $10^{14}$ cm$^{-3}$ to $10^{16}$ cm$^{-3}$.

The arrangement of the p-doped region 128, the n-well region 156, and the p-doped region 138 forms a PNP junction structure. In general, the PNP junction structure reduces a leakage current from the first control signal 122 to the second control signal 132, or alternatively from the second control signal 132 to the first control signal 122. The arrangement of the n-doped region 126, the p-doped absorption layer 106, and the n-doped region 136 forms an NPN junction structure. In general, the NPN junction structure reduces a charge coupling from the first readout circuit 124 to the second readout circuit 134, or alternatively from the second readout circuit 134 to the first readout circuit 124. In some implementations, if the depth of the n-well region 156 is deep, the arrangement of the n-doped region 126, the p-doped absorption layer 106, the n-well region 156, the p-doped absorption layer 106, and the n-doped region 136 forms an NPNPN junction structure, which further reduces a charge coupling from the first readout circuit 124 to the second readout circuit 134, or alternatively from the second readout circuit 134 to the first readout circuit 124.

In some implementations, the p-doped regions 128 and 138 are formed entirely within the n-well region 156. In some other implementations, the p-doped regions 128 and 138 are partially formed in the n-well region 156. For example, a portion of the p-doped region 128 may be formed by implanting the p-dopants in the n-well region 156, while another portion of the p-doped region 128 may be formed by implanting the p-dopants in the absorption layer 106. In some implementations, the depth of the n-well region 156 is shallower than the p-doped regions 128 and 138.

Figure 1D:
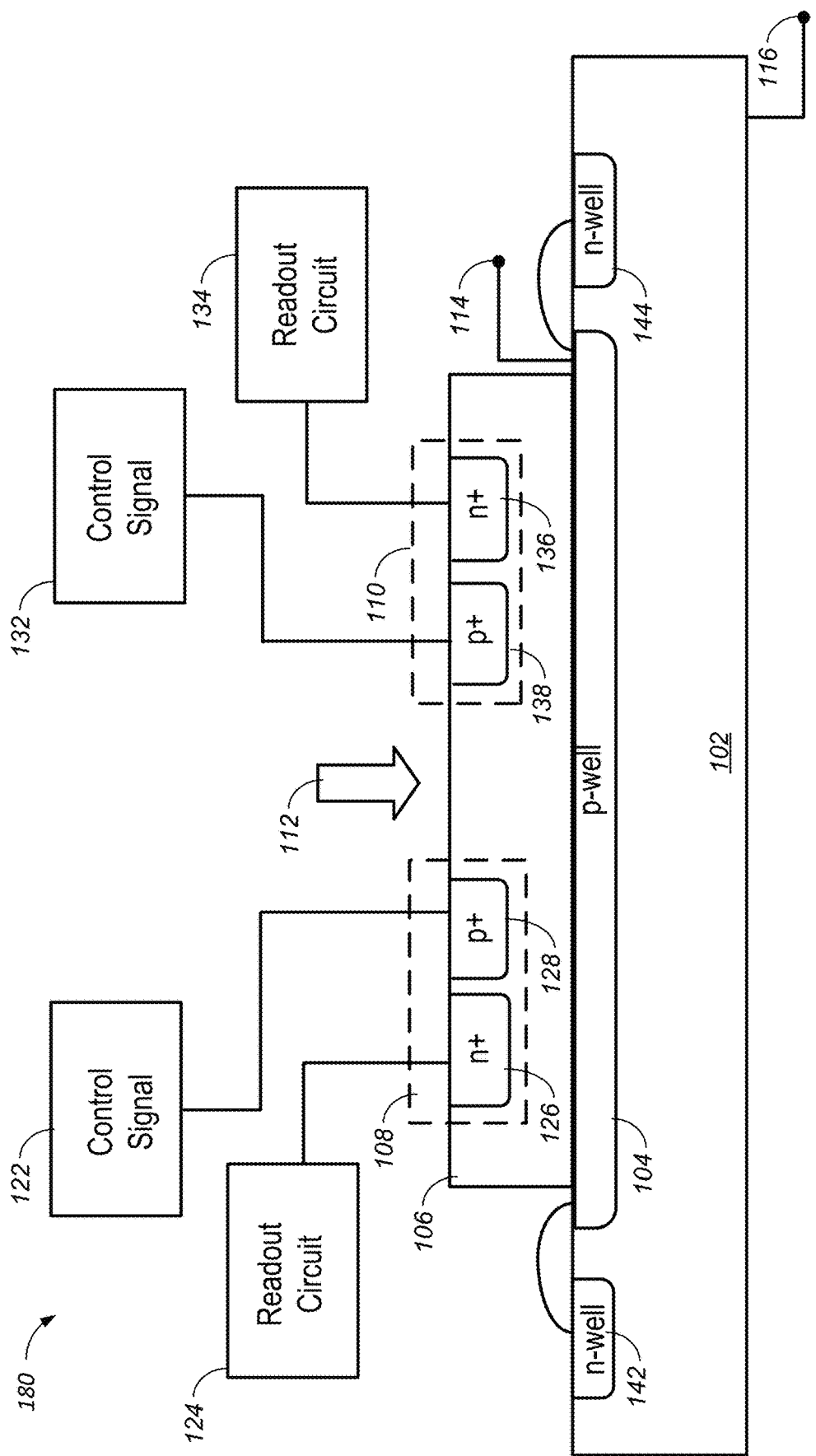

FIG. 1D is an example switched photodetector 180 for converting an optical signal to an electrical signal. The switched photodetector 180 is similar to the switched photodetector 100 in FIG. 1A, but that the switched photodetector 150 further includes a p-well region 104 and n-well regions 142 and 144. In some implementations, the doping level of the n-well regions 142 and 144 may range from $10^{16}$ cm$^{-3}$ to $10^{20}$ cm$^{-3}$. The doping level of the p-well region 104 may range from $10^{16}$ cm$^{-3}$ to $10^{20}$ cm$^{-3}$.

In some implementation, the absorption layer 106 may not completely absorb the incoming photons in the optical signal 112. For example, if the GeSi mesa does not completely absorb the incoming photons in the NIR optical signal 112, the NIR optical signal 112 may penetrate into the silicon substrate 102, where the silicon substrate 102 may absorb the penetrated photons and generate photo-carriers deeply in the substrate that are slow to recombine. These slow photo-carriers negatively affect the operation speed of the switched photodetector. Moreover, the photo-carries generated in the silicon substrate 102 may be collected by the neighboring pixels, which may cause unwanted signal cross-talks between the pixels. Furthermore, the photo-carriers generated in the silicon substrate 102 may cause charging of the substrate 102, which may cause reliability issues in the switched photodiode.

To further remove the slow photo-carriers, the switched photodetector 150 may include connections that short the n-well regions 142 and 144 with the p-well region 104. For example, the connections may be formed by a silicide process or a deposited metal pad that connects the n-well regions 142 and 144 with the p-well region 104. The shorting between the n-well regions 142 and 144 and the p-well region 104 allows the photo-carriers generated in the substrate 102 to be recombined at the shorted node, and therefore improves the operation speed and/or reliability of the switched photodetector. In some implementation, the p-well region 104 is used to passivate and/or minimize the electric field around the interfacial defects between the absorptive layer 106 and the substrate 102 in order to reduce the device dark current.

Although not shown in FIGS. 1A-1D, in some implementations, an optical signal may reach to the switched photodetector from the backside of the substrate 102. One or more optical components (e.g., microlens or lightguide) may be fabricated on the backside of the substrate 102 to focus, collimate, defocus, filter, or otherwise manipulate the optical signal.

Although not shown in FIGS. 1A-1D, in some other implementations, the first switch 108 and the second switch 110 may alternatively be fabricated to collect holes instead of electrons. In this case, the p-doped region 128 and the p-doped region 138 would be replaced by n-doped regions, and the n-doped region 126 and the n-doped region 136 would be replaced by p-doped regions. The n-well regions 142, 144, 152, 154, and 156 would be replaced by p-well regions. The p-well region 104 would be replaced by an n-well region.

Although not shown in FIGS. 1A-1D, in some implementations, the absorption layer 106 may be bonded to a substrate after the fabrication of the switched photodetector 100, 160, 170, and 180. The substrate may be any material that allows the transmission of the optical signal 112 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 112.

Although not shown in FIGS. 1A-1D, in some implementations, the switched photodetector 100, 160, 170, and 180 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 102. Adding such a mirror like metal layer may increase the absorption efficiency (quantum efficiency) of the absorption layer 106. For example, the absorption efficiency of photodetectors operating at a longer NIR wavelength between 1.0 μm and 1.6 μm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 108 and 110 can be added for interfacing control signals/readout circuits.

Although not shown in FIG. 1A-1D, in some implementations, the absorption layer 106 may be partially or fully embedded/recessed in the substrate 102 to relieve the surface topography and so ease the fabrication process. An example of the embedment technique is described in U.S. Patent Publication No. US20170040362 A1 titled "Germanium-Silicon Light Sensing Apparatus," which is fully incorporated by reference herein.

Figure 2A:
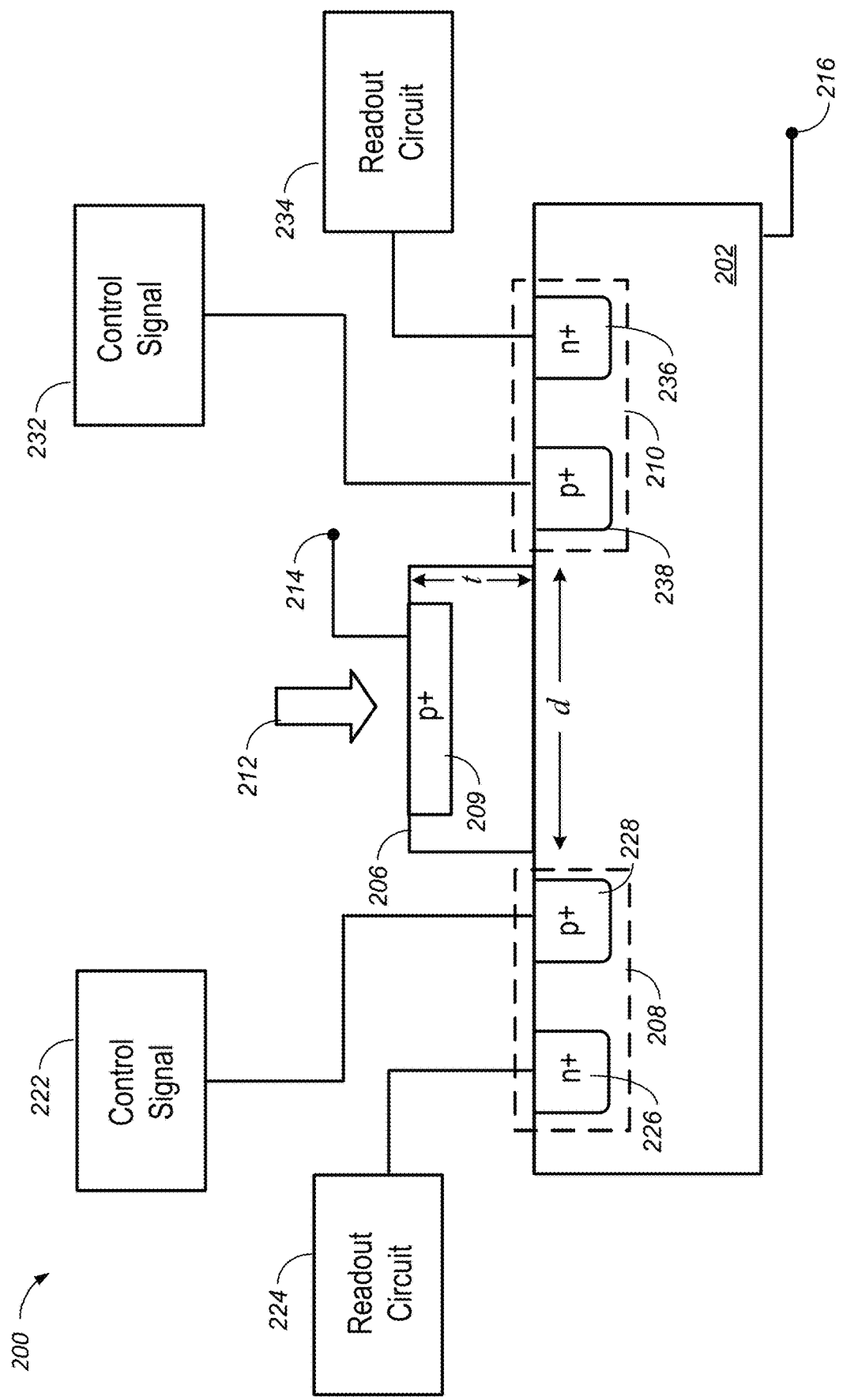
FIGS. 2A, 2B, 2C and 2D are examples of a switched photodetector.

FIG. 2A is an example switched photodetector 200 for converting an optical signal to an electrical signal, where the first switch 208 and the second switch 210 are fabricated on a substrate 202. The switched photodetector 200 includes an absorption layer 206 fabricated on a substrate 202. The substrate 202 may be any suitable substrate where semiconductor devices can be fabricated on. For example, the substrate 202 may be a silicon substrate.

In general, the absorption layer 206 receives an optical signal 212 and converts the optical signal 212 into electrical signals. The absorption layer 206 is similar to the absorption layer 106. The absorption layer 206 may be intrinsic, p-type, or n-type. In some implementations, the absorption layer 206 may be formed from a p-type GeSi material. In some implementations, the absorption layer 206 may include a p-doped region 209. The p-doped region 209 may repel the photo-electrons from the absorption layer 206 to the substrate 202 and thereby increase the operation speed. For example, the p-doped region 209 may have a p+ doping, where the dopant concentration is as high as a fabrication process may achieve, e.g., the peak concentration may be about $5 \times 10^{20}$ cm$^{-3}$ when the absorption layer 206 is germanium and doped with boron. In some implementation, the doping concentration of the p-doped region 209 may be lower than $5 \times 10^{20}$ cm$^{-3}$ to ease the fabrication complexity at the expense of an increased contact resistance. In some implementations, the p-doped region 209 may be a graded p-doped region.

A first switch 208 and a second switch 210 have been fabricated in the substrate 202. The first switch 208 is coupled to a first control signal 222 and a first readout circuit 224. The second switch 210 is coupled to a second control signal 232 and a second readout circuit 234. In general, the first control signal 222 and the second control signal 232 control whether the electrons or the holes generated by the absorbed photons are collected by the first readout circuit 224 or the second readout circuit 234. The first control signal 222 is similar to the first control signal 122. The second control signal 232 is similar to the second control signal 132. The first readout circuit 224 is similar to the first readout circuit 124. The second readout circuit 234 is similar to the second readout circuit 134.

In some implementations, the first switch 208 and the second switch 210 may be fabricated to collect electrons generated by the absorption layer 206. In this case, the first switch 208 includes a p-doped region 228 and an n-doped region 226. For example, the p-doped region 228 may have a p+ doping, where the activated dopant concentration may be as high as a fabrication process may achieve, e.g., the peak concentration may be about $2 \times 10^{20}$ cm$^{-3}$ when the substrate 202 is silicon and doped with boron. In some implementation, the doping concentration of the p-doped region 228 may be lower than $2 \times 10^{20}$ cm$^{-3}$ to ease the fabrication complexity at the expense of an increased contact resistance. The n-doped region 226 may have an n+ doping, where the activated dopant concentration may be as high as a fabrication process may achieve, e.g., the peak concentration may be about $5 \times 10^{20}$ cm$^{-3}$ when the substrate 202 is silicon and doped with phosphorous. In some implementation, the doping concentration of the n-doped region 226 may be lower than $5 \times 10^{20}$ cm$^{-3}$ to ease the fabrication complexity at the expense of an increased contact resistance. The distance between the p-doped region 228 and the n-doped region 226 may be designed based on fabrication process design rules. In general, the closer the distance between the p-doped region 228 and the n-doped region 226, the higher the switching efficiency of the generated photocarriers. The second switch 210 includes a p-doped region 238 and an n-doped region 236. The p-doped region 238 is similar to the p-doped region 228, and the n-doped region 236 is similar to the n-doped region 226.

In some implementations, the p-doped region 228 is coupled to the first control signal 222. The n-doped region 226 is coupled to the readout circuit 224. The p-doped region 238 is coupled to the second control signal 232. The n-doped region 236 is coupled to the readout circuit 234. The first control signal 222 and the second control signal 232 are used to control the collection of electrons generated by the absorbed photons. For example, when the absorption layer 206 absorbs photons in the optical signal 212, electron-hole pairs are generated and drift or diffuse into the substrate 202. When voltages are used, if the first control signal 222 is biased against the second control signal 232, an electric field is created between the p-doped region 228 and the p-doped region 238, and free electrons from the absorption layer 206 drift towards the p-doped region 228 or the p-doped region 238 depending on the direction of the electric field. In some implementations, the first control signal 222 may be fixed at a voltage value $V_i$, and the second control signal 232 may alternate between voltage values $V_i \pm \Delta V$. The direction of the bias value determines the drift direction of the electrons. Accordingly, when one switch (e.g., the first switch 208) is switched "on" (i.e., the electrons drift towards the p-doped region 228), the other switch (e.g., the second switch 210) is switched "off" (i.e., the electrons are blocked from the p-doped region 238). In some implementations, the first control signal 222 and the second control signal 232 may be voltages that are differential to each other.

In the first switch 208, an electric field is created between the p-doped region 228 and the n-doped region 226. Similarly, in the second switch 210, an electric field is created between the p-doped region 238 and the n-doped region 236. When the first switch 208 is switched "on" and the second switch 210 is switched "off", the electrons drift toward the p-doped region 228, and the electric field between the p-doped region 228 and the n-doped region 226 further carries the electrons to the n-doped region 226. The readout circuit 224 may then be enabled to process the charges collected by the n-doped region 226. On the other hand, when the second switch 210 is switched "on" and the first switch 208 is switched "off", the electrons drift toward the p-doped region 238, and the electric field between the p-doped region 238 and the n-doped region 236 further carries the electrons to the n-doped region 236. The readout circuit 234 may then be enabled to process the charges collected by the n-doped region 236.

In some implementations, a voltage may be applied between the p-doped and the n-doped regions of a switch to operate the switch in an avalanche regime to increase the sensitivity of the switched photodetector 200. For example, in the case of a substrate 202 including GeSi, when the distance between the p-doped region 228 and the n-doped region 226 is about 100 nm, it is possible to apply a voltage that is less than 7 V to create an avalanche gain between the p-doped region 228 and the n-doped region 226.

In some implementations, the p-doped region 209 may be coupled to an external control 214. For example, the p-doped region 209 may be coupled to ground. In some implementations, the p-doped region 209 may be floated and not coupled to any external control. In some implementations, the substrate 202 may be coupled to an external control 216. For example, the substrate 202 may be coupled to an electrical ground, or a preset voltage less than the voltages at the n-doped regions 226 and 236. In some other implementations, the substrate 202 may be floated and not coupled to any external control.

Figure 2B:
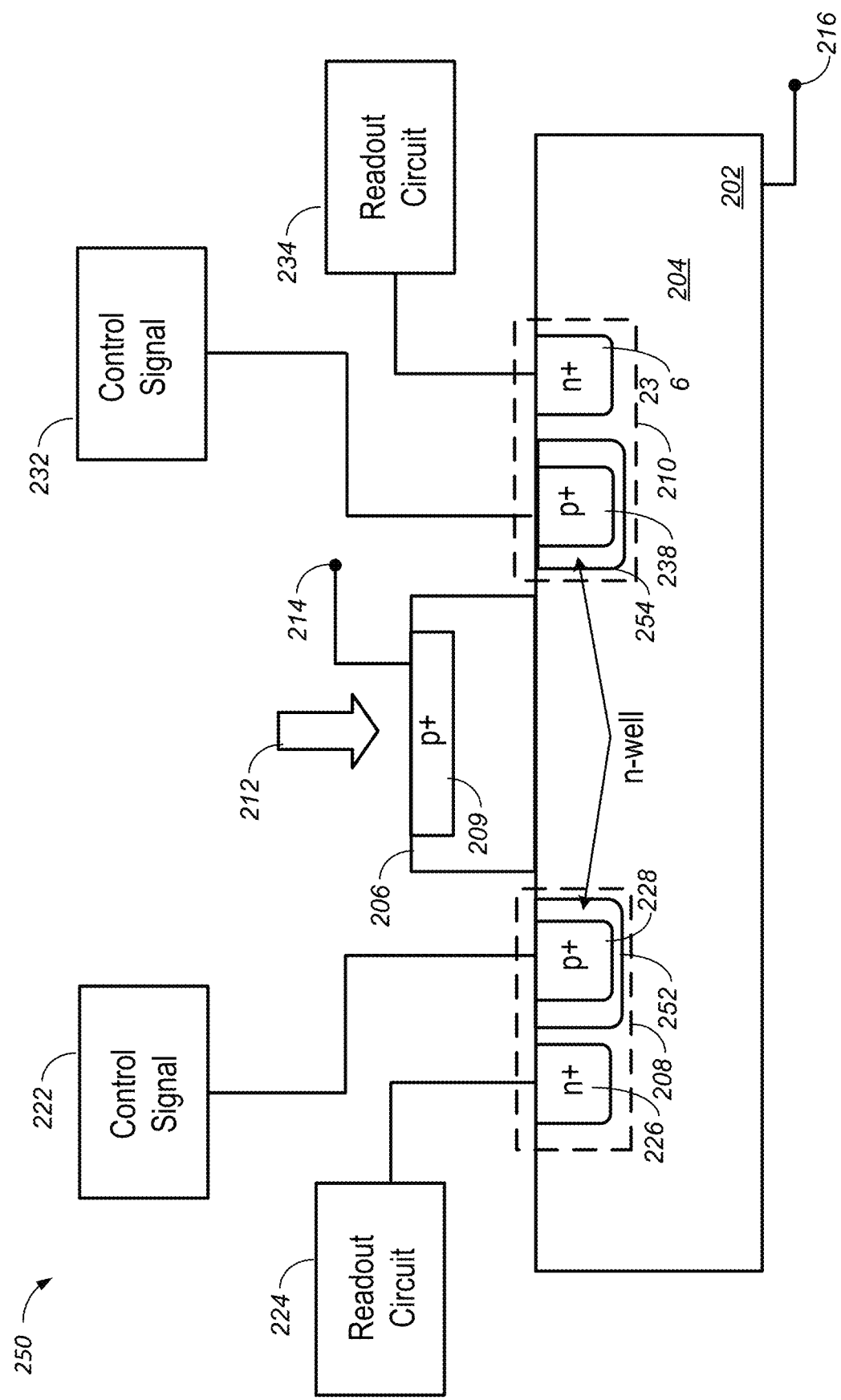

FIG. 2B is an example switched photodetector 250 for converting an optical signal to an electrical signal. The switched photodetector 250 is similar to the switched photodetector 200 in FIG. 2A, but that the first switch 208 and the second switch 210 further includes an n-well region 252 and an n-well region 254, respectively. In addition, the absorption layer 206 may be a p-doped region and the substrate 202 may be a p-doped substrate. In some implementations, the doping level of the n-well regions 252 and 254 may range from $10^{15}$ cm$^{-3}$ to $10^{17}$ cm$^{-3}$. The doping level of the absorption layer 206 and the substrate 202 may range from $10^{14}$ cm$^{-3}$ to $10^{16}$ cm$^{-3}$.

The arrangement of the p-doped region 228, the n-well region 252, the p-doped substrate 202, the n-well region 254, and the p-doped region 238 forms a PNPNP junction structure. In general, the PNPNP junction structure reduces a leakage current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224.

In some implementations, the p-doped region 228 is formed entirely within the n-well region 252. In some other implementations, the p-doped region 228 is partially formed in the n-well region 252. For example, a portion of the p-doped region 228 may be formed by implanting the p-dopants in the n-well region 252, while another portion of the p-doped region 228 may be formed by implanting the p-dopants in the substrate 202. Similarly, in some implementations, the p-doped region 238 is formed entirely within the n-well region 254. In some other implementations, the p-doped region 238 is partially formed in the n-well region 254. In some implementations, the depth of the n-well regions 252 and 254 is shallower than the p-doped regions 228 and 238.

Figure 2C:
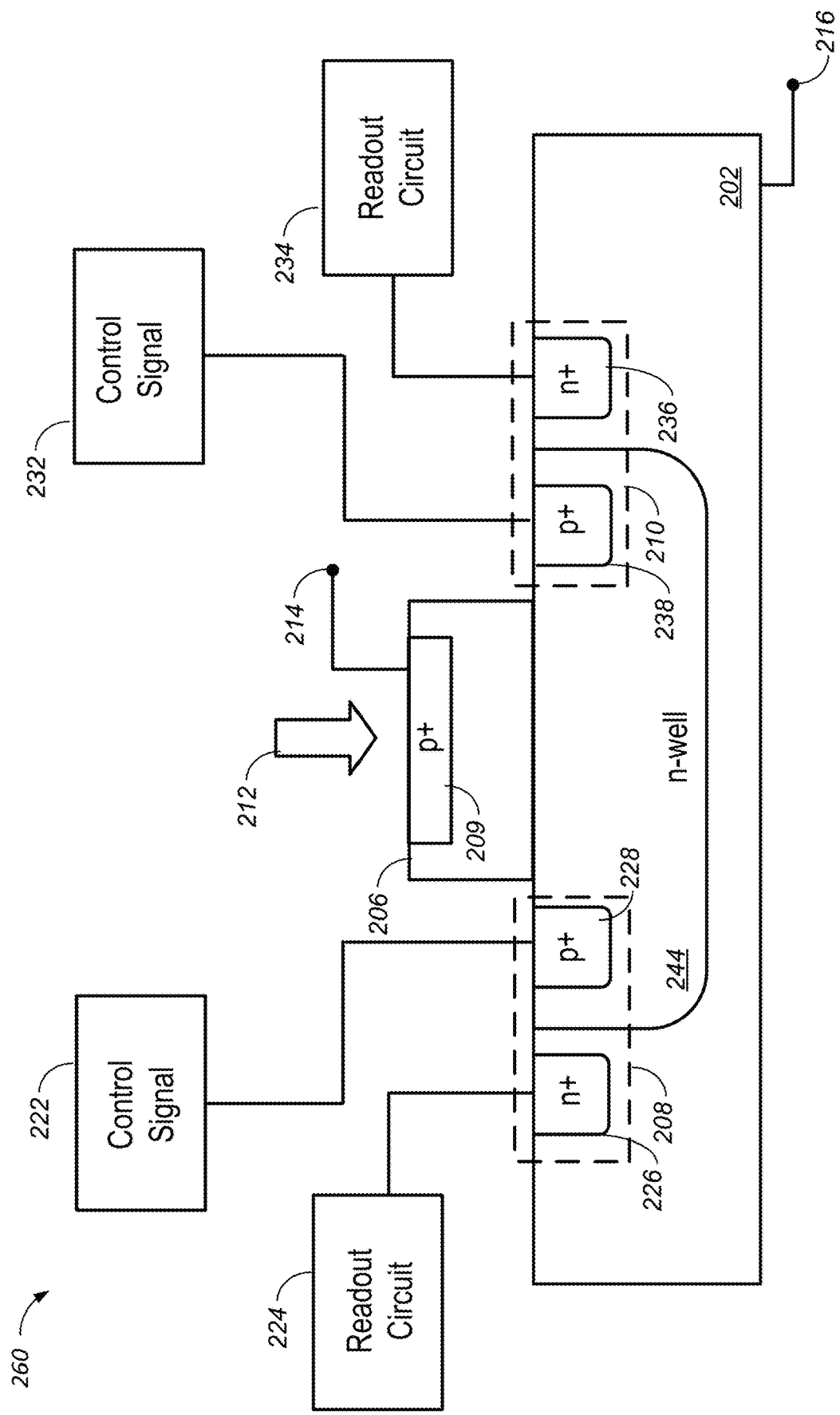

FIG. 2C is an example switched photodetector 260 for converting an optical signal to an electrical signal. The switched photodetector 260 is similar to the switched photodetector 200 in FIG. 2A, but that the substrate 202 further includes an n-well region 244. In addition, the absorption layer 206 may be a p-doped region and the substrate 202 may be a p-doped substrate. In some implementations, the doping level of the n-well region 244 may range from $10^{15}$ cm$^{-3}$ to $10^{17}$ cm$^{-3}$. The doping level of the absorption layer 206 and the substrate 202 may range from $10^{14}$ cm$^{-3}$ to $10^{16}$ cm$^{-3}$.

The arrangement of the p-doped region 228, the n-well region 244, and the p-doped region 238 forms a PNP junction structure. In general, the PNP junction structure reduces a leakage current from the first control signal 222 to the second control signal 232, or alternatively from the second control signal 232 to the first control signal 222. The arrangement of the n-doped region 226, the p-doped substrate 202, and the n-doped region 236 forms an NPN junction structure. In general, the NPN junction structure reduces a charge coupling from the first readout circuit 224 to the second readout circuit 234, or alternatively from the second readout circuit 234 to the first readout circuit 224. In some implementations, if the depth of the n-well 244 is deep, the arrangement of the n-doped region 226, the p-doped substrate 202, the n-well region 244, the p-doped substrate 202, and the n-doped region 236 forms an NPNPN junction structure, which further reduces a charge coupling from the first readout circuit 224 to the second readout circuit 234, or alternatively from the second readout circuit 234 to the first readout circuit 224. In some implementations, the n-well region 244 also effectively reduces the potential energy barrier perceived by the electrons flowing from the absorption layer 206 to the substrate 202.

In some implementations, the p-doped regions 228 and 238 are formed entirely within the n-well region 244. In some other implementations, the p-doped regions 228 and 238 are partially formed in the n-well region 244. For example, a portion of the p-doped region 228 may be formed by implanting the p-dopants in the n-well region 244, while another portion of the p-doped region 228 may be formed by implanting the p-dopants in the substrate 202. In some implementations, the depth of the n-well region 244 is shallower than the p-doped regions 228 and 238.

Figure 2D:
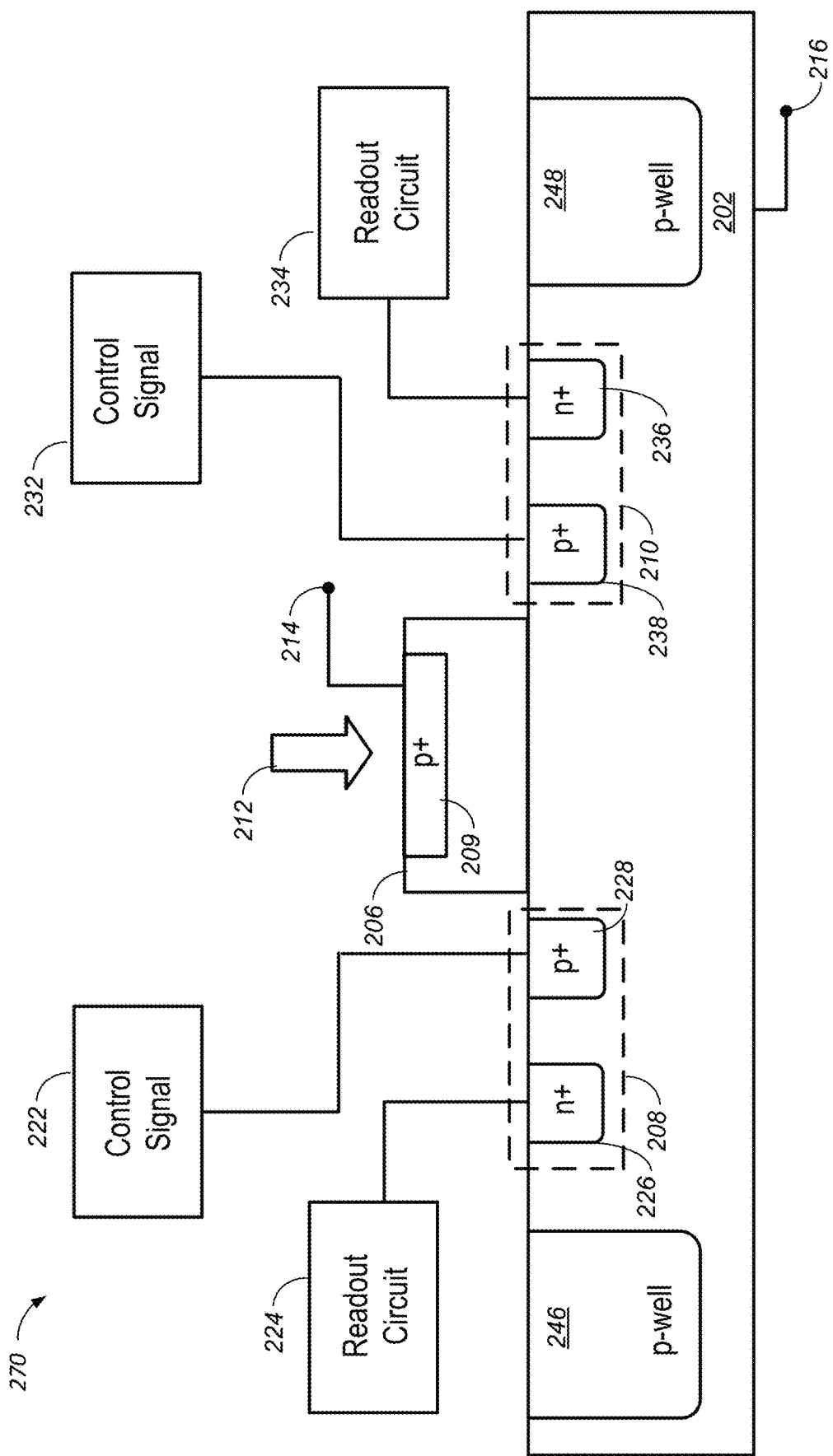

FIG. 2D is an example switched photodetector 270 for converting an optical signal to an electrical signal. The switched photodetector 270 is similar to the switched photodetector 200 in FIG. 2A, but that the switched photodetector 270 further includes one or more p-well regions 246 and one or more p-well regions 248. In some implementations, the one or more p-well regions 246 and the one or more p-well regions 248 may be part of a ring structure that surrounds the first switch 208 and the second switch 210. In some implementations, the doping level of the one or more p-well regions 246 and 248 may range from $10^{15}$ cm$^{-3}$ to $10^{20}$ cm$^{-3}$. The one or more p-well regions 246 and 248 may be used as an isolation of photo-electrons from the neighboring pixels.

Although not shown in FIG. 2A-2D, in some implementations, an optical signal may reach to the switched photodetector from the backside of the substrate 202. One or more optical components (e.g., microlens or lightguide) may be fabricated on the backside of the substrate 202 to focus, collimate, defocus, filter, or otherwise manipulate the optical signal.

Although not shown in FIG. 2A-2D, in some other implementations, the first switch 208 and the second switch 210 may alternatively be fabricated to collect holes instead of electrons. In this case, the p-doped region 228, the p-doped region 238, and the p-doped region 209 would be replaced by n-doped regions, and the n-doped region 226 and the n-doped region 236 would be replaced by p-doped regions. The n-well regions 252, 254, and 244 would be replaced by p-well regions. The p-well regions 246 and 248 would be replaced by n-well regions.

Although not shown in FIG. 2A-2D, in some implementations, the absorption layer 206 may be bonded to a substrate after the fabrication of the switched photodetector 200, 250, 260, and 270. The carrier substrate may be any material that allows the transmission of the optical signal 212 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 212.

Although not shown in FIGS. 2A-2D, in some implementations, the switched photodetector 200, 250, 260, and 270 may be bonded (e.g., metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 202. Adding such a mirror like metal layer may increase the absorption efficiency (quantum efficiency) of the absorption layer 206. For example, the absorption efficiency of photodetectors operating at a longer NIR wavelength between 1.0 μm and 1.6 μm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 208 and 210 can be added for interfacing control signals/readout circuits.

Although not shown in FIG. 2A-2D, in some implementations, the absorption layer 206 may be partially or fully embedded/recessed in the substrate 202 to relieve the surface topography and so ease the fabrication process. An example of the embedment technique is described in U.S. Patent Publication No. US20170040362 A1.

Figure 3A:
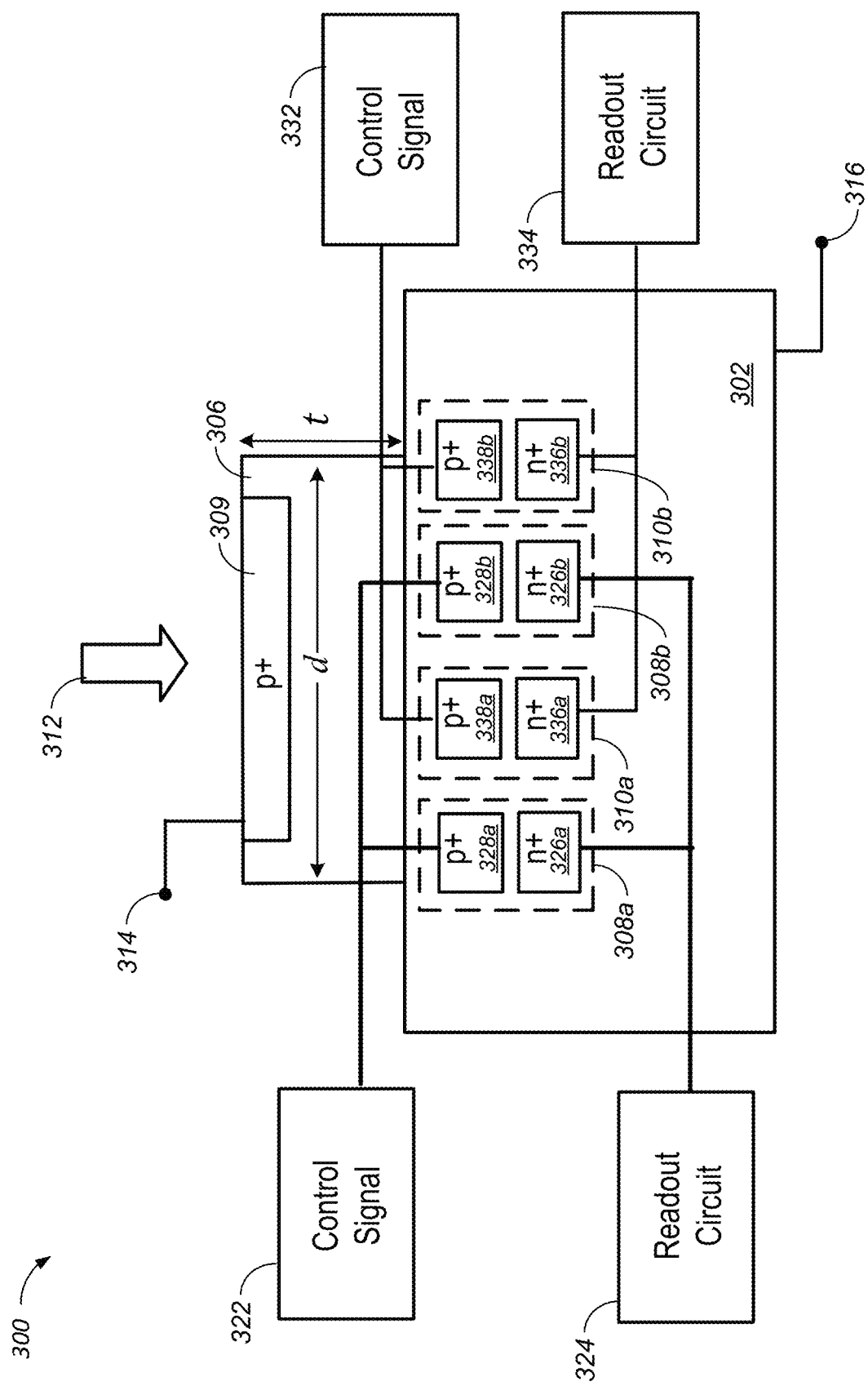
FIGS. 3A, 3B, 3C, and 3D are examples of a switched photodetector.

FIG. 3A is an example switched photodetector 300 for converting an optical signal to an electrical signal, where first switches 308a and 308b, and second switch 310a and 310b are fabricated in a vertical arrangement on a substrate 302. One characteristic with the switched photodetector 100 or the switched photodetector 200 is that the larger the optical window size d, the longer the photo-electron transit time required for an electron drifts or diffuses from one switch to the other switch. The operation speed of the photodetector may therefore be affected. The switched photodetector 300 may further improve the operation speed by arranging the p-doped regions and the n-doped regions of the switches in a vertical arrangement. Using this vertical arrangement, the photo-electron transit distance is limited mostly by the thickness t (e.g., ~1 μm) of the absorption layer instead of the window size d (e.g., ~10 μm) of the absorption layer. The switched photodetector 300 includes an absorption layer 306 fabricated on a substrate 302. The substrate 302 may be any suitable substrate where semiconductor devices can be fabricated on. For example, the substrate 302 may be a silicon substrate.

In general, the absorption layer 306 receives an optical signal 312 and converts the optical signal 312 into electrical signals. The absorption layer 306 is similar to the absorption layer 206. The absorption layer 306 may be intrinsic, p-type, or n-type. In some implementations, the absorption layer 306 may be formed from a p-type GeSi material. In some implementations, the absorption layer 306 may include a p-doped region 309. The p-doped region 309 is similar to the p-doped region 209.

First switches 308a and 308b, and second switches 310a and 310b have been fabricated in the substrate 302. Notably, although FIG. 3A only shows two first switches 308a and 308b and two second switches 310a and 310b, the number of first switches and second switches may be more or less. The first switches 308a and 308b are coupled to a first control signal 322 and a first readout circuit 324. The second switches 310a and 310b are coupled to a second control signal 332 and a second readout circuit 334.

In general, the first control signal 322 and the second control signal 332 control whether the electrons or the holes generated by the absorbed photons are collected by the first readout circuit 324 or the second readout circuit 334. The first control signal 322 is similar to the first control signal 122. The second control signal 332 is similar to the second control signal 132. The first readout circuit 324 is similar to the first readout circuit 124. The second readout circuit 334 is similar to the second readout circuit 134. In some implementations, the first switches 308a and 308b, and the second switches 310a and 310b may be fabricated to collect electrons generated by the absorption layer 306. In this case, the first switches 308a and 308b include p-doped regions 328a and 328b, and n-doped regions 326a and 326b, respectively. For example, the p-doped regions 328a and 328b may have a p+ doping, where the activated dopant concentration may be as high as a fabrication process may achieve, e.g., the peak concentration may be about $2\times10^{20}$ cm$^{-3}$ when the substrate 302 is silicon and doped with boron. In some implementation, the doping concentration of the p-doped regions 328a and 328b may be lower than $2 \times 10^{20}$ cm$^{-3}$ to ease the fabrication complexity at the expense of an increased contact resistance. The n-doped regions 326a and 326b may have an n+ doping, where the activated dopant concentration may be as high as a fabrication process may achieve, e.g., the peak concentration may be about $5 \times 10^{20}$ cm$^{-3}$ when the substrate 302 is silicon and doped with phosphorous. In some implementation, the doping concentration of the n-doped regions 326a and 326b may be lower than $5 \times 10^{20}$ cm$^{-3}$ to ease the fabrication complexity at the expense of an increased contact resistance. The distance between the p-doped region 328a and the n-doped region 326a may be designed based on fabrication process design rules. For example, the distance between the p-doped region 328a and the n-doped region 326a may be controlled by the energies associated with the dopant implants. In general, the closer the distance between the p-doped regions 328a/328b and the n-doped regions 326a/326b, the higher the switching efficiency of the generated photo-carriers. The second switches 310a and 310b includes p-doped regions 338a and 338b, and n-doped regions 336a and 336b, respectively. The p-doped regions 338a/338b are similar to the p-doped regions 328a/328b, and the n-doped regions 336a/336b are similar to the n-doped region 326a/326b.

In some implementations, the p-doped regions 328a and 328b are coupled to the first control signal 322. The n-doped regions 326a and 326b are coupled to the readout circuit 324. The p-doped regions 338a and 338b are coupled to the second control signal 332. The n-doped regions 336a and 336b are coupled to the readout circuit 334. The first control signal 322 and the second control signal 332 are used to control the collection of electrons generated by the absorbed photons. For example, when the absorption layer 306 absorbs photons in the optical signal 312, electron-hole pairs are generated and drift or diffuse into the substrate 302. When voltages are used, if the first control signal 322 is biased against the second control signal 332, electric fields are created between the p-doped region 309 and the p-doped regions 328a/328b or the p-doped regions 338a/338b, and free electrons from the absorption layer 306 drift towards the p-doped regions 328a/328b or the p-doped regions 338a/338b depending on the directions of the electric fields. In some implementations, the first control signal 322 may be fixed at a voltage value $V_i$, and the second control signal 332 may alternate between voltage values $V_i \pm \Delta V$. The direction of the bias value determines the drift direction of the electrons. Accordingly, when one group of switches (e.g., first switches 308a and 308b) are switched "on" (i.e., the electrons drift towards the p-doped regions 328a and 328b), the other group of switches (e.g., the second switches 310a and 310b) are switched "off" (i.e., the electrons are blocked from the p-doped regions 338a and 338b). In some implementations, the first control signal 322 and the second control signal 332 may be voltages that are differential to each other.

In each of the first switches 308a/308b, an electric field is created between the p-doped region 328a/328b and the n-doped region 326a/326b. Similarly, in each of the second switches 310a/310b, an electric field is created between the p-doped region 338a/338b and the n-doped region 336a/336b. When the first switches 308a and 308b are switched "on" and the second switches 310a and 310b are switched "off", the electrons drift toward the p-doped regions 328a and 328b, and the electric field between the p-doped region 328a and the n-doped region 326a further carries the electrons to the n-doped region 326a. Similarly, the electric field between the p-doped region 328b and the n-doped region 326b further carries the electrons to the n-doped region 326b. The readout circuit 324 may then be enabled to process the charges collected by the n-doped regions 326a and 326b. On the other hand, when the second switches 310a and 310b are switched "on" and the first switches 308a and 308b are switched "off", the electrons drift toward the p-doped regions 338a and 338b, and the electric field between the p-doped region 338a and the n-doped region 336a further carries the electrons to the n-doped region 336a. Similarly, the electric field between the p-doped region 338b and the n-doped region 336b further carries the electrons to the n-doped region 336b. The readout circuit 334 may then be enabled to process the amount of charges collected by the n-doped regions 336a and 336b.

In some implementations, a voltage may be applied between the p-doped and the n-doped regions of a switch to operate the switch in an avalanche regime to increase the sensitivity of the switched photodetector 300. For example, in the case of a substrate 302 including GeSi, when the distance between the p-doped region 328a and the n-doped region 326a is about 100 nm, it is possible to apply a voltage that is less than 7 V to create an avalanche gain between the p-doped region 328a and the n-doped region 326a.

In some implementations, the p-doped region 309 may be coupled to an external control 314. For example, the p-doped region 309 may be coupled to ground. In some implementations, the p-doped region 309 may be floated and not coupled to any external control. In some implementations, the substrate 302 may be coupled to an external control 316. For example, the substrate 302 may be coupled to an electric ground, or a preset voltage less than the voltages at the n-doped regions 326 and 336. In some other implementations, the substrate 302 may be floated and not coupled to any external control.

Figure 3B:
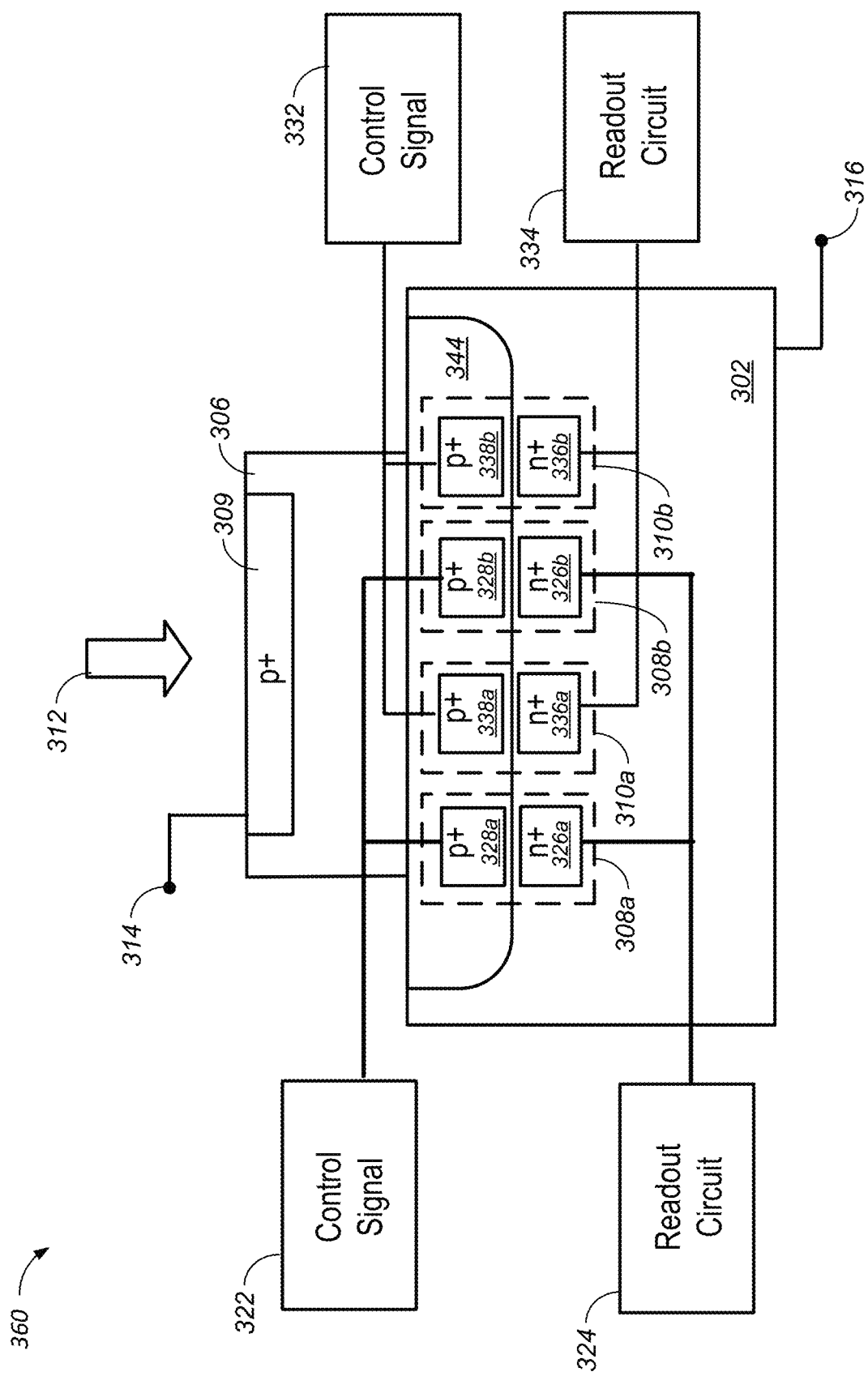

FIG. 3B is an example switched photodetector 360 for converting an optical signal to an electrical signal. The switched photodetector 360 is similar to the switched photodetector 300 in FIG. 3A, but that the switched photodetector 360 further includes an n-well region 344. In addition, the absorption layer 360 may be a p-doped region and the substrate 302 may be a p-doped substrate. In some implementations, the doping level of the n-well region 344 may range from $10^{15}$ cm$^{-3}$ to $10^{17}$ cm$^{-3}$. The doping level of the absorption layer 360 and the substrate 302 may range from $10^{14}$ cm$^{-3}$ to $10^{16}$ cm$^{-3}$.

The arrangement of the p-doped region 328a, the n-well region 344, and the p-doped region 338a forms a PNP junction structure. Similarly, the arrangement of the p-doped region 328b, the n-well region 344, and the p-doped region 338b forms another PNP junction structure. In general, the PNP junction structure reduces a leakage current from the first control signal 322 to the second control signal 332, or alternatively from the second control signal 332 to the first control signal 322. The arrangement of the n-doped region 326a, the p-doped substrate 302, and the n-doped region 336a forms an NPN junction structure. Similarly, the arrangement of the n-doped region 326b, the p-doped substrate 302, and the n-doped region 336b forms an NPN junction structure. In general, the NPN junction structure reduces a charge coupling from the first readout circuit 324 to the second readout circuit 334, or alternatively from the second readout circuit 334 to the first readout circuit 324. In some implementations, the n-well region 344 also effectively reduces the potential energy barrier perceived by the electrons flowing from the absorption layer 306 to the substrate 302.

In some implementations, the p-doped regions 328a, 338a, 328b, and 338b are formed entirely within the n-well region 344. In some other implementations, the p-doped regions 328a, 338a, 328b, and 338b are partially formed in the n-well region 344. For example, a portion of the p-doped region 328a may be formed by implanting the p-dopants in the n-well region 344, while another portion of the p-doped region 328a may be formed by implanting the p-dopants in the substrate 302. In some implementations, the depth of the n-well region 344 is shallower than the p-doped regions 328a, 338a, 328b, and 338b.

Figure 3C:
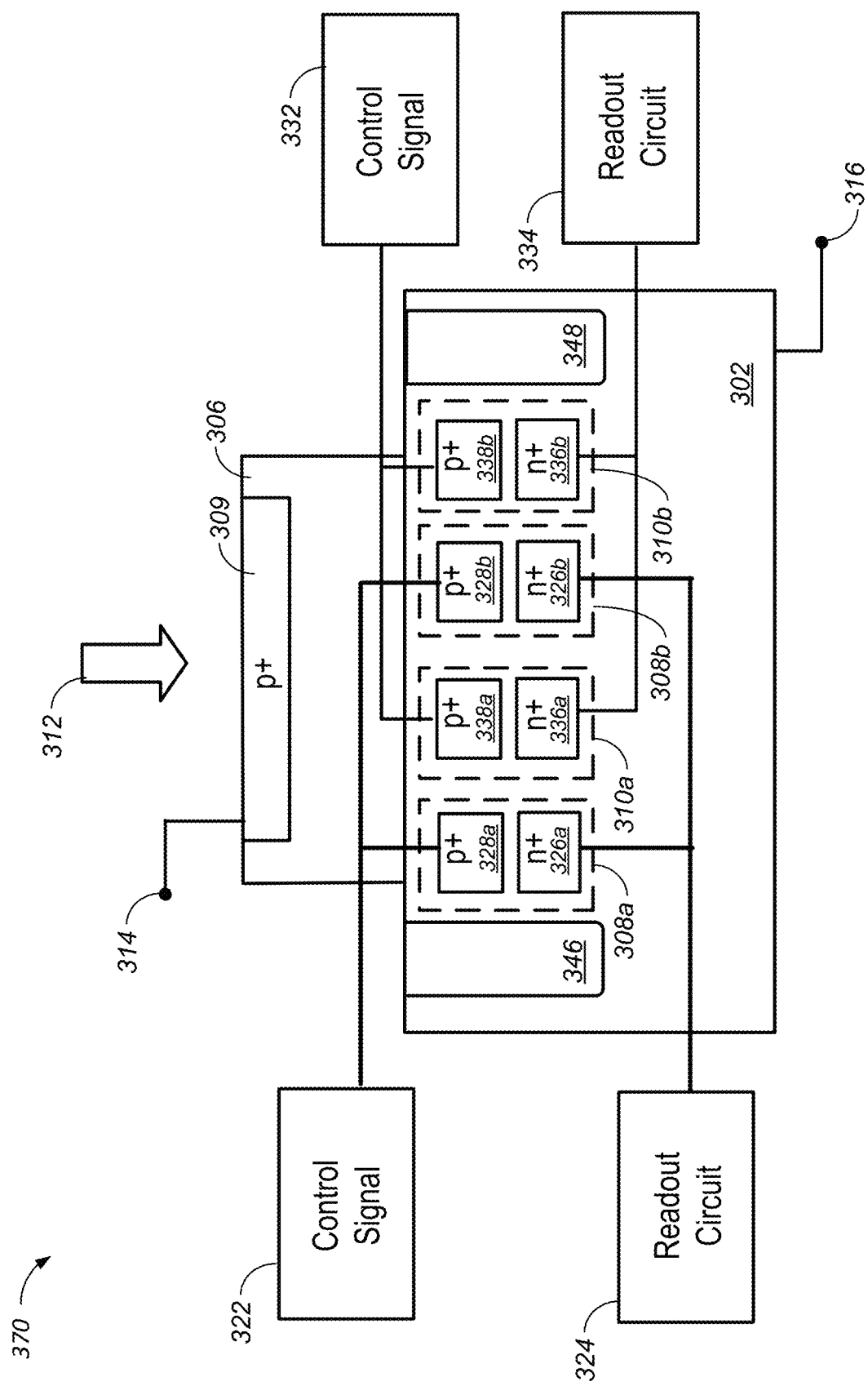

FIG. 3C is an example switched photodetector 370 for converting an optical signal to an electrical signal. The switched photodetector 370 is similar to the switched photodetector 300 in FIG. 3A, but that the switched photodetector 370 further includes one or more p-well regions 346 and one or more p-well regions 348. In some implementations, the one or more p well regions 346 and the one or more p-well regions 348 may be part of a ring structure that surrounds the first switches 308a and 308b, and the second switches 310a and 310b. In some implementations, the doping level of the one or more p-well regions may range from $10^{15}$ cm$^{-3}$ to $10^{20}$ cm$^{-3}$. The one or more p-well regions 346 and 348 may be used as an isolation of photoelectrons from the neighboring pixels.

Figure 3D:
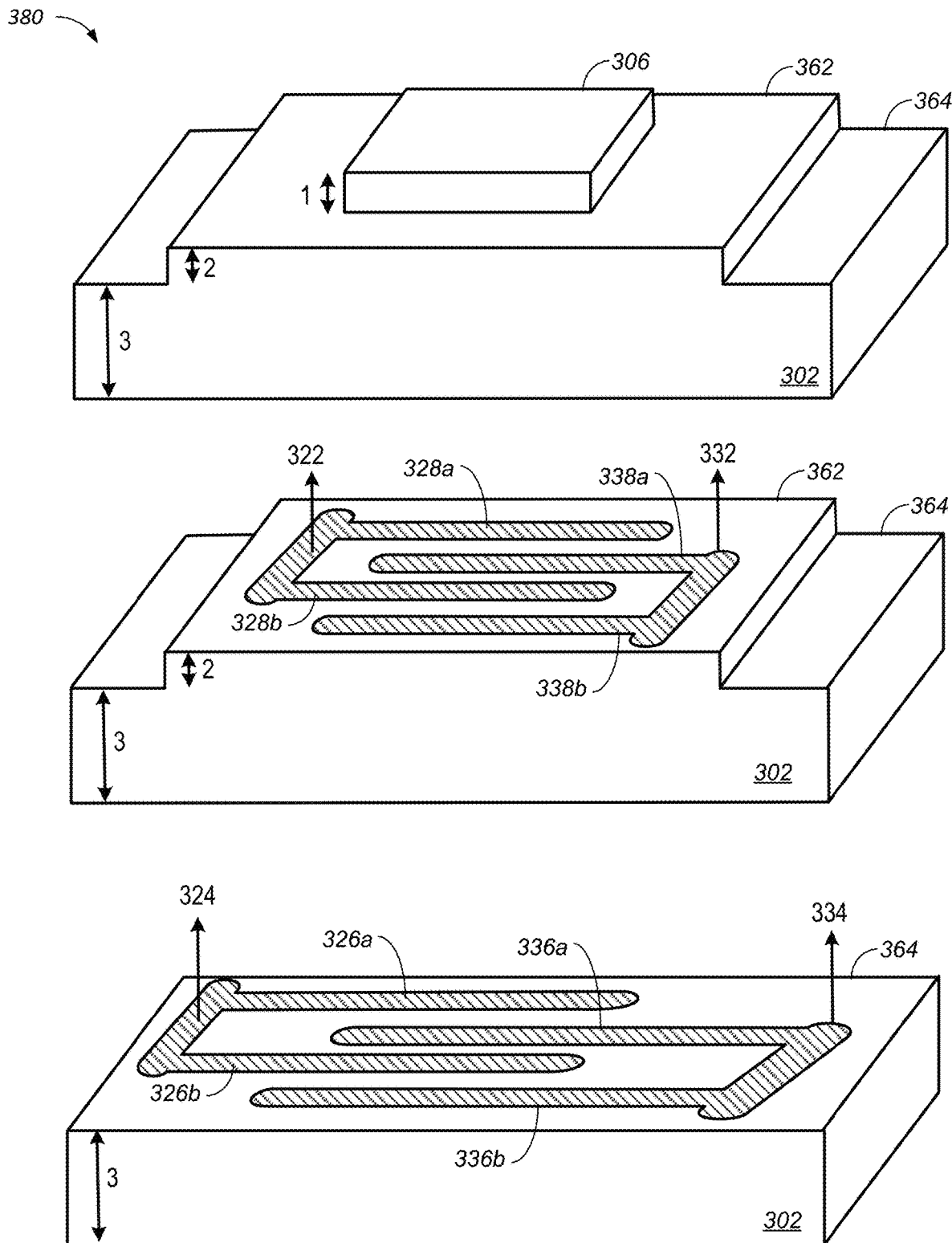

FIG. 3D shows cross-sectional views of the example switched photodetector 380. FIG. 3D shows that the p-doped regions 328a and 328b of the first switches 308a and 308b, and the p-doped regions 338a and 338b of the second switches 310a and 310b may be arranged on a first plane 362 of the substrate 302 in an interdigitated arrangement. FIG. 3D further shows that the n-doped regions 326a and 326b of the first switches 308a and 308b, and the n-doped regions 336a and 336b of the second switches 310a and 310b may be arranged on a second plane 364 of the substrate 302 in an interdigitated arrangement.

Although not shown in FIG. 3A-3D, in some implementations, an optical signal may reach to the switched photodetector from the backside of the substrate 302. One or more optical components (e.g., microlens or lightguide) may be fabricated on the backside of the substrate 302 to focus, collimate, defocus, filter, or otherwise manipulate the optical signal.

Although not shown in FIG. 3A-3D, in some other implementations, the first switches 308a and 308b, and the second switches 310a and 310b may alternatively be fabricated to collect holes instead of electrons. In this case, the p-doped regions 328a and 328b, the p-doped regions 338a and 338b, and the p-doped region 309 would be replaced by n-doped regions, and the n-doped regions 326a and 326b, and the n-doped regions 336a and 336b would be replaced by p-doped regions. The n-well region 344 would be replaced by a p-well region. The p-well regions 346 and 348 would be replaced by n-well regions.

Although not shown in FIG. 3A-3D, in some implementations, the absorption layer 306 may be bonded to a substrate after the fabrication of the switched photodetector 300, 360, 370, and 380. The substrate may be any material that allows the transmission of the optical signal 312 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 312.

Although not shown in FIGS. 3A-3D, in some implementations, the switched photodetector 300, 360, 370, and 380 may be bonded (ex: metal to metal bonding, oxide to oxide bonding, hybrid bonding) to a second substrate with circuits including control signals, and/or readout circuits, and/or phase lock loop (PLL), and/or analog to digital converter (ADC). A metal layer may be deposited on top of the switched photodetector that may be used as a reflector to reflect the optical signal incident from the backside of the substrate 302. Adding such a mirror like metal layer may increase the absorption efficiency (quantum efficiency) of the absorption layer 306. For example, the absorption efficiency of photodetectors operating at a longer NIR wavelength between 1.0 μm and 1.6 μm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 308a (or 308b) and 310a (or 310b) can be added for interfacing control signals/readout circuits.

Although not shown in FIG. 3A-3D, in some implementations, the absorption layer 306 may be partially or fully embedded/recessed in the substrate 302 to relieve the surface topography and so ease the fabrication process. An example of the embedment technique is described in U.S. Patent Publication No. US20170040362 A1.

Figure 4A:
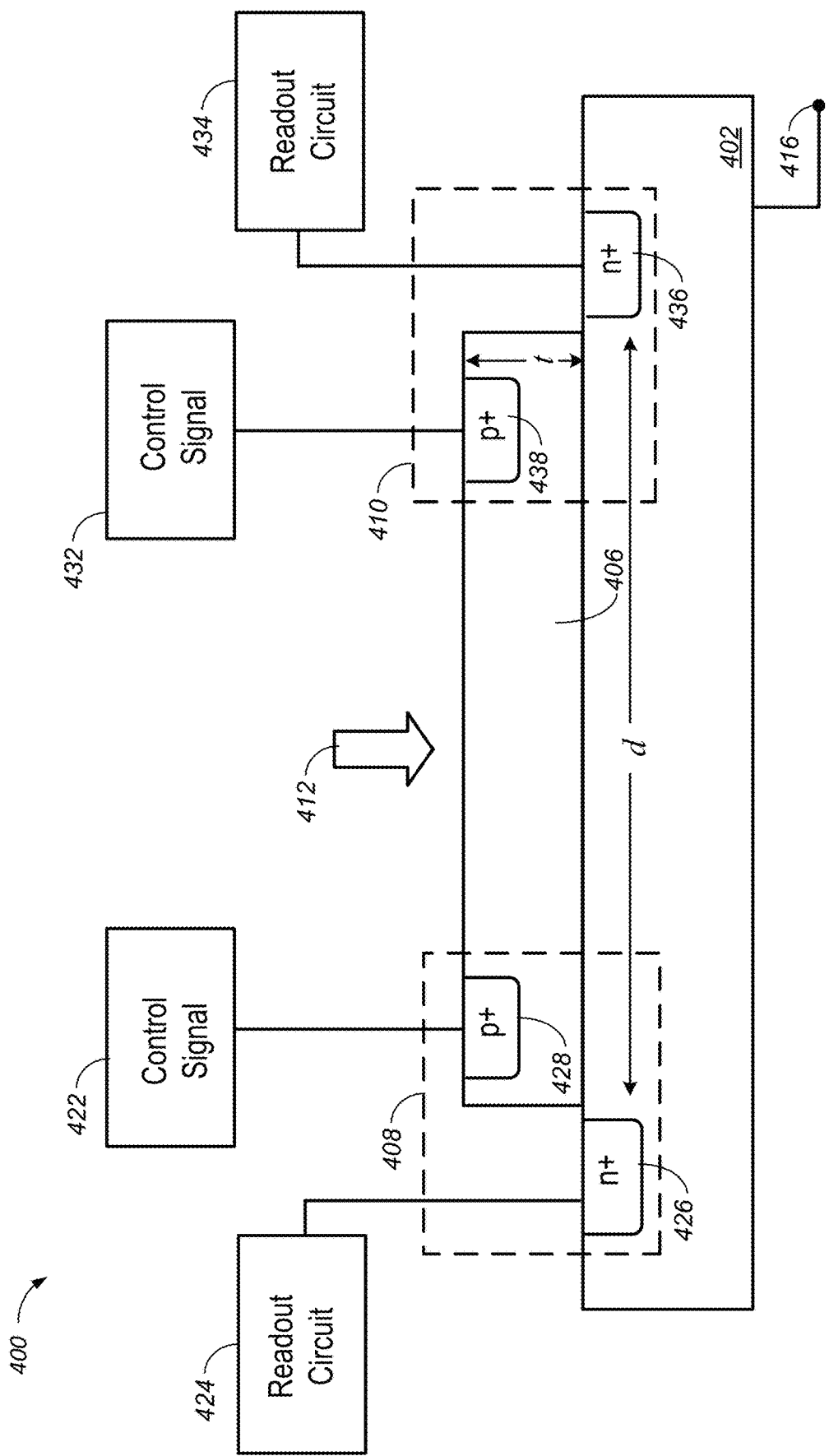
FIGS. 4A, 4B, 4C, 4D, and 4E are examples of a switched photodetector.

FIG. 4A is an example switched photodetector 400 for converting an optical signal to an electrical signal. The switched photodetector 400 includes an absorption layer 406 fabricated on a substrate 402. The substrate 402 may be any suitable substrate where semiconductor devices can be fabricated on. For example, the substrate 402 may be a silicon substrate. The absorption layer 406 includes a first switch 408 and a second switch 410.

In general, the absorption layer 406 receives an optical signal 412 and converts the optical signal 412 into electrical signals. The absorption layer 406 may be intrinsic, p-type, or n-type. In some implementations, the absorption layer 406 may be formed from a p-type GeSi material. The absorption layer 406 is selected to have a high absorption coefficient at the desired wavelength range. For NIR wavelengths, the absorption layer 406 may be a GeSi mesa, where the GeSi absorbs photons in the optical signal 412 and generates electron-hole pairs. The material composition of germanium and silicon in the GeSi mesa may be selected for specific processes or applications. In some implementations, the absorption layer 406 is designed to have a thickness t. For example, for 850 nm or 940 nm wavelength, the thickness of the GeSi mesa may be approximately 1 μm to have a substantial quantum efficiency. In some implementations, the surface of the absorption layer 406 is designed to have a specific shape. For example, the GeSi mesa may be circular, square, or rectangular depending on the spatial profile of the optical signal 412 on the surface of the GeSi mesa. In some implementations, the absorption layer 406 is designed to have a lateral dimension d for receiving the optical signal 412. For example, the GeSi mesa may have a circular or a rectangular shape, where d can range from 1 μm to 50 μm.

A first switch 408 and a second switch 410 have been fabricated in the absorption layer 406 and the substrate 402. The first switch 408 is coupled to a first control signal 422 and a first readout circuit 424. The second switch 410 is coupled to a second control signal 432 and a second readout circuit 434. In general, the first control signal 422 and the second control signal 432 control whether the electrons or the holes generated by the absorbed photons are collected by the first readout circuit 424 or the second readout circuit 434.

In some implementations, the first switch 408 and the second switch 410 may be fabricated to collect electrons. In this case, the first switch 408 includes a p-doped region 428 implanted in the absorption layer 406 and an n-doped region 426 implanted in the substrate 402. For example, the p-doped region 428 may have a p+ doping, where the activated dopant concentration may be as high as a fabrication process may achieve, e.g., the peak concentration may be about $5 \times 10^{20}$ cm$^{-3}$ when the absorption layer 106 is germanium and doped with boron. In some implementation, the doping concentration of the p-doped region 428 may be lower than $5 \times 10^{20}$ cm$^{-3}$ to ease the fabrication complexity at the expense of an increased contact resistance. The n-doped region 426 may have an n+ doping, where the activated dopant concentration may be as high as a fabrication process may achieve, e.g., e.g., the peak concentration may be about $5 \times 10^{20}$ cm$^{-3}$ when the substrate 402 is silicon and doped with phosphorous. In some implementation, the doping concentration of the n-doped region 426 may be lower than $5 \times 10^{20}$ cm$^{-3}$ to ease the fabrication complexity at the expense of an increased contact resistance. The distance between the p-doped region 428 and the n-doped region 426 may be designed based on fabrication process design rules. In general, the closer the distance between the p-doped region 428 and the n-doped region 426, the higher the switching efficiency of the generated photo-carriers. The second switch 410 includes a p-doped region 438 and an n-doped region 436. The p-doped region 438 is similar to the p-doped region 428, and the n-doped region 436 is similar to the n-doped region 426.

In some implementations, the p-doped region 428 is coupled to the first control signal 422. For example, the p-doped region 428 may be coupled to a voltage source, where the first control signal 422 may be an AC voltage signal from the voltage source. In some implementations, the n-doped region 426 is coupled to the readout circuit 424. The readout circuit 424 may be in a three-transistor configuration consisting of a reset gate, a source-follower, and a selection gate, a circuit including four or more transistors, or any suitable circuitry for processing charges. In some implementations, the readout circuit 424 may be fabricated on the substrate 402. In some other implementations, the readout circuit 424 may be fabricated on another substrate and integrated/co-packaged with the switched photodetector 400 via die/wafer bonding or stacking.

The p-doped region 438 is coupled to the second control signal 432. For example, the p-doped region 438 may be coupled to a voltage source, where the second control signal 432 may be an AC voltage signal having an opposite phase from the first control signal 422. In some implementations, the n-doped region 436 is coupled to the readout circuit 434. The readout circuit 434 may be similar to the readout circuit 424.

The first control signal 422 and the second control signal 432 are used to control the collection of electrons generated by the absorbed photons. For example, when voltages are used, if the first control signal 422 is biased against the second control signal 432, an electric field is created between the p-doped region 428 and the p-doped region 438, and free electrons drift towards the p-doped region 428 or the p-doped region 438 depending on the direction of the electric field. In some implementations, the first control signal 422 may be fixed at a voltage value $V_i$, and the second control signal 432 may alternate between voltage values $V_i \pm \Delta V$. The direction of the bias value determines the drift direction of the electrons. Accordingly, when one switch (e.g., the first switch 408) is switched "on" (i.e., the electrons drift towards the p-doped region 428), the other switch (e.g., the second switch 410) is switched "off" (i.e. the electrons are blocked from the p-doped region 438). In some implementations, the first control signal 422 and the second control signal 432 may be voltages that are differential to each other.

In general, a difference (before equilibrium) between the Fermi level of a p-doped region and the Fermi level of an n-doped region creates an electric field between the two regions. In the first switch 408, an electric field is created between the p-doped region 428 and the n-doped region 426. Similarly, in the second switch 410, an electric field is created between the p-doped region 438 and the n-doped region 436. When the first switch 408 is switched "on" and the second switch 410 is switched "off", the electrons drift toward the p-doped region 428, and the electric field between the p-doped region 428 and the n-doped region 426 further carries the electrons to the n-doped region 426. The readout circuit 424 may then be enabled to process the charges collected by the n-doped region 426. On the other hand, when the second switch 410 is switched "on" and the first switch 408 is switched "off", the electrons drift toward the p-doped region 438, and the electric field between the p-doped region 438 and the n-doped region 436 further carries the electrons to the n-doped region 436. The readout circuit 434 may then be enabled to process the charges collected by the n-doped region 436.

In some implementations, the substrate 402 may be coupled to an external control 416. For example, the substrate 402 may be coupled to an electrical ground, or a preset voltage less than the voltages at the n-doped regions 426 and 436. In some other implementations, the substrate 402 may be floated and not coupled to any external control.

Figure 4B:
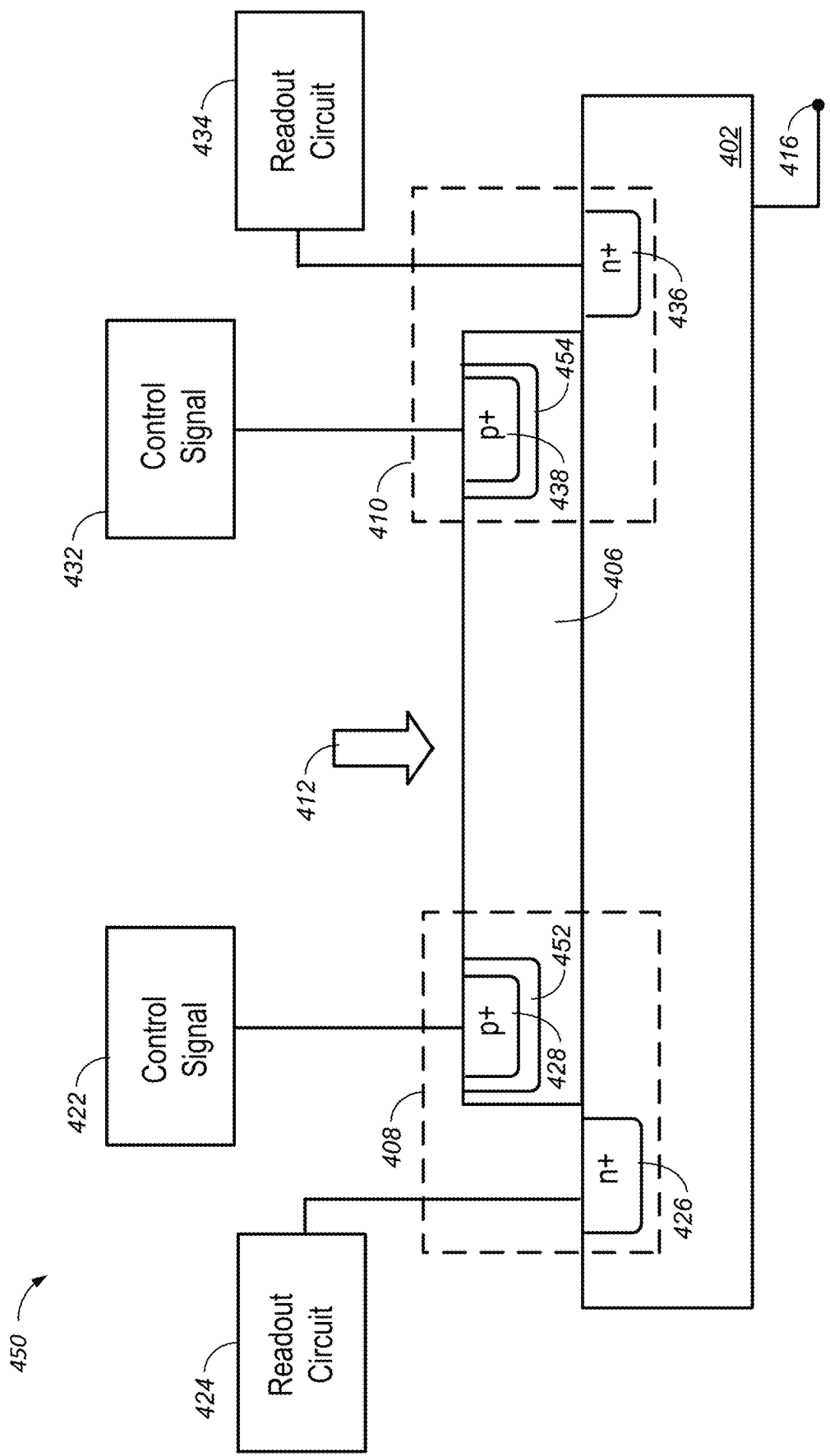

FIG. 4B is an example switched photodetector 450 for converting an optical signal to an electrical signal. The switched photodetector 450 is similar to the switched photodetector 400 in FIG. 4A, but that the first switch 408 and the second switch 410 further includes an n-well region 452 and an n-well region 454, respectively. In addition, the absorption layer 406 may be a p-doped layer and the substrate 402 may be a p-doped substrate. In some implementations, the doping level of the n-well regions 452 and 454 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 452, the absorption layer 406, the n-well region 454, and the p-doped region 438 forms a PNPNP junction structure. In general, the PNPNP junction structure reduces a leakage current from the first control signal 422 to the second control signal 432, or alternatively from the second control signal 432 to the first control signal 422.

The arrangement of the n-doped region 426, the p-doped substrate 402, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped region 428 is formed entirely within the n-well region 452. In some other implementations, the p-doped region 428 is partially formed in the n-well region 452. For example, a portion of the p-doped region 428 may be formed by implanting the p-dopants in the n-well region 452, while another portion of the p-doped region 428 may be formed by implanting the p-dopants in the absorption layer 406. Similarly, in some implementations, the p-doped region 438 is formed entirely within the n-well region 454. In some other implementations, the p-doped region 438 is partially formed in the n-well region 454. In some implementations, the depth of the n-well regions 452 and 454 is shallower than the p-doped regions 428 and 438.

Figure 4C:
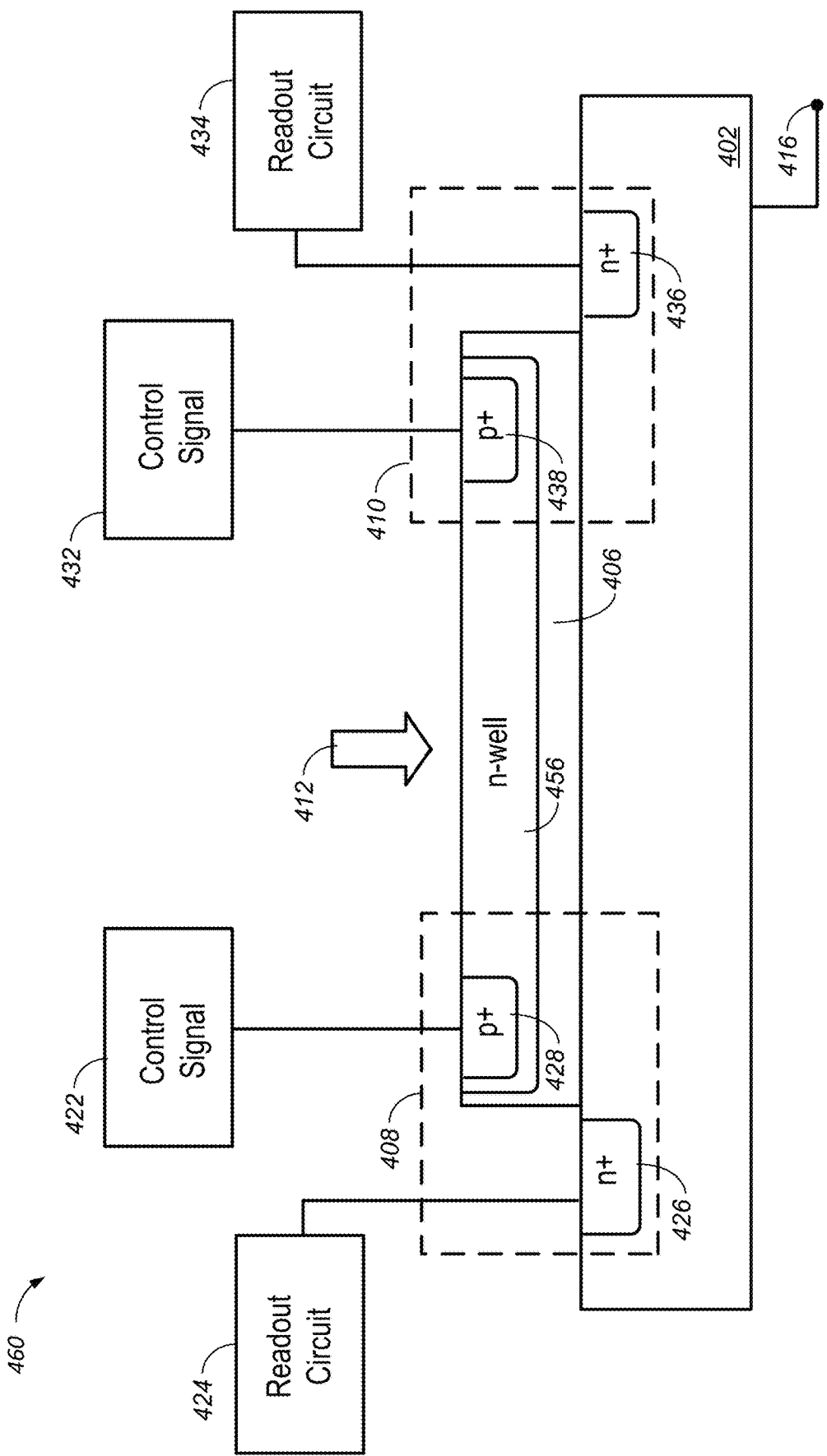

FIG. 4C is an example switched photodetector 460 for converting an optical signal to an electrical signal. The switched photodetector 460 is similar to the switched photodetector 400 in FIG. 4A, but that the absorption layer 406 further includes an n-well region 456. In addition, the absorption layer 406 may be a p-doped region and the substrate 402 may be a p-doped substrate. In some implementations, the doping level of the n-well region 456 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 456, and the p-doped region 438 forms a PNP junction structure. In general, the PNP junction structure reduces a leakage current from the first control signal 422 to the second control signal 432, or alternatively from the second control signal 432 to the first control signal 422.

The arrangement of the n-doped region 426, the p-doped absorption layer 406, and the n-doped region 436 forms an NPN junction structure. In general, the NPN junction structure reduces a charge coupling from the first readout circuit 424 to the second readout circuit 434, or alternatively from the second readout circuit 434 to the first readout circuit 424.

In some implementations, the p-doped regions 428 and 438 are formed entirely within the n-well region 456. In some other implementations, the p-doped regions 428 and 438 are partially formed in the n-well region 456. For example, a portion of the p-doped region 428 may be formed by implanting the p-dopants in the n-well region 456, while another portion of the p-doped region 428 may be formed by implanting the p-dopants in the absorption layer 406. In some implementations, the depth of the n-well region 456 is shallower than the p-doped regions 428 and 438.

Figure 4D:
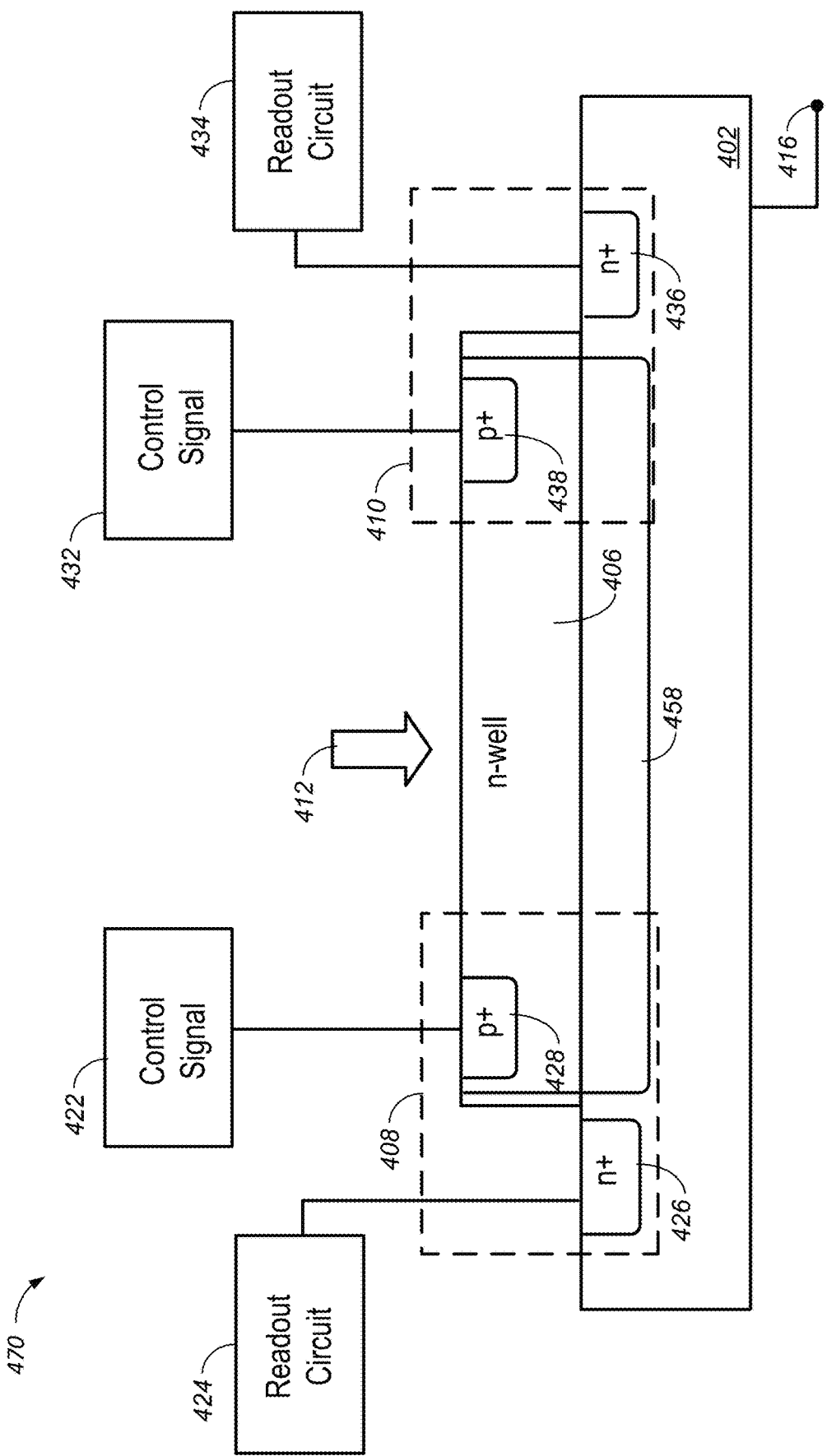

FIG. 4D is an example switched photodetector 470 for converting an optical signal to an electrical signal. The switched photodetector 470 is similar to the switched photodetector 460 in FIG. 4C, but that the n-well region 458 is formed to extend from the absorption layer 406 into the substrate 202. In addition, the absorption layer 406 may be a p-doped region and the substrate 402 may be a p-doped substrate. In some implementations, the doping level of the n-well region 456 may range from $10^{15}$ cm$^{-3}$ to $10^{17}$ cm$^{-3}$. The doping level of the absorption layer 406 and the substrate 402 may range from $10^{14}$ cm$^{-3}$ to $10^{16}$ cm$^{-3}$.

The arrangement of the p-doped region 428, the n-well region 458, and the p-doped region 438 forms a PNP junction structure, which further reduces a leakage current from the first control signal 422 to the second control signal 432, or alternatively from the second control signal 432 to the first control signal 422. The arrangement of the n-doped region 426, the p-doped substrate 402, the n-well region 458, the p-doped substrate 402, and the n-doped region 436 forms an NPNPN junction structure, which further reduces a charge coupling from the first readout circuit 424 to the second readout circuit 434, or alternatively from the second readout circuit 434 to the first readout circuit 424. In some implementations, the n-well region 458 also effectively reduces the potential energy barrier perceived by the electrons flowing from the absorption layer 406 to the substrate 402.

Figure 4E:
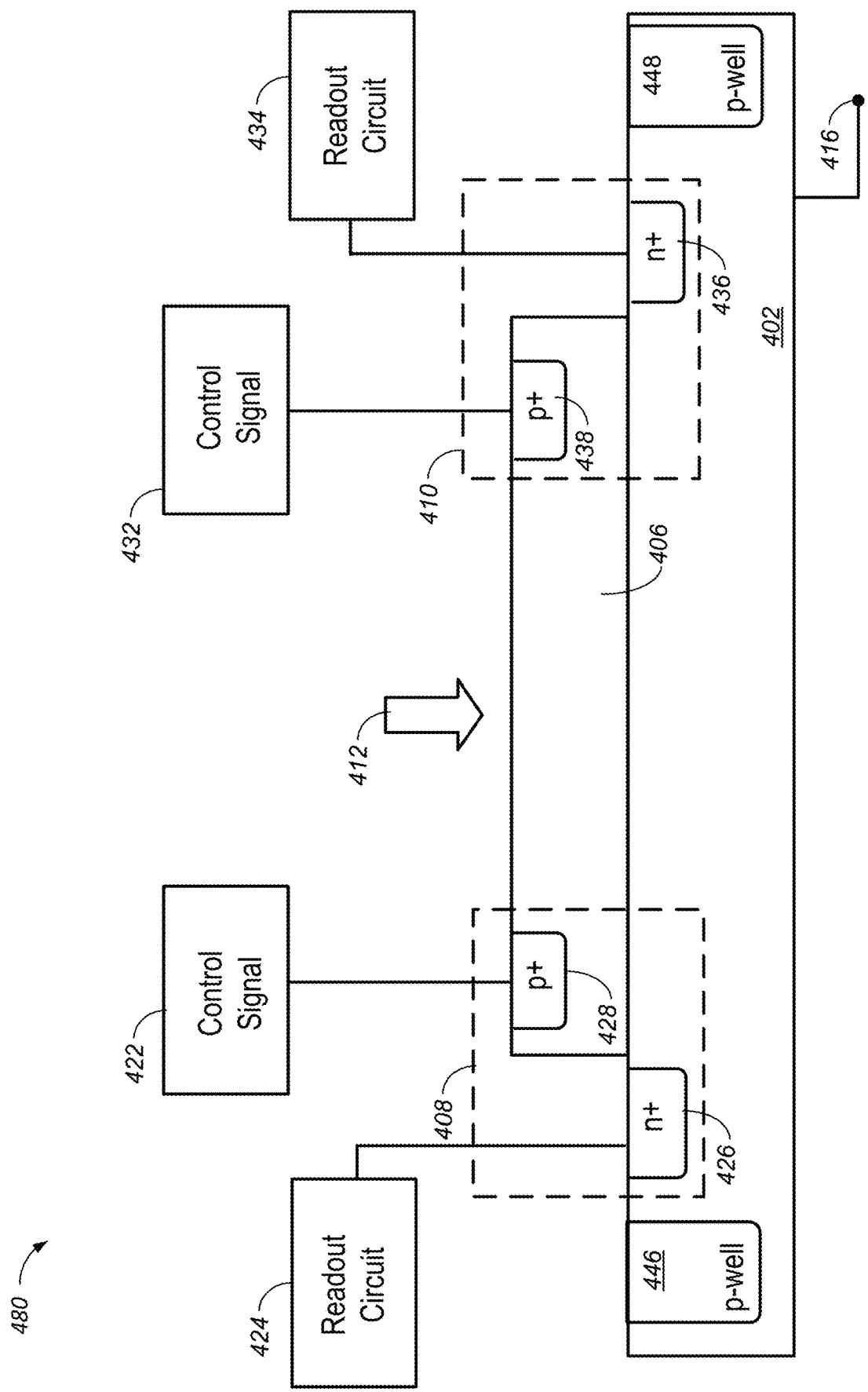

FIG. 4E is an example switched photodetector 480 for converting an optical signal to an electrical signal. The switched photodetector 480 is similar to the switched photodetector 400 in FIG. 4A, but that the switched photodetector 480 further includes one or more p-well regions 446 and one or more p-well regions 448. In some implementations, the one or more p-well regions 446 and the one or more p-well regions 448 may be part of a ring structure that surrounds the first switch 408 and the second switch 410. In some implementations, the doping level of the one or more p-well regions 446 and 448 may range from $10^{15}$ cm$^{-3}$ to $10^{20}$ cm$^{-3}$. The one or more p-well regions 446 and 448 may be used as an isolation of photo-electrons from the neighboring pixels.

Although not shown in FIG. 4A-4E, in some implementations, an optical signal may reach to the switched photodetector from the backside of the substrate 402. One or more optical components (e.g., microlens or lightguide) may be fabricated on the backside of the substrate 402 to focus, collimate, defocus, filter, or otherwise manipulate the optical signal.

Although not shown in FIG. 4A-4E, in some other implementations, the first switch 408 and the second switch 410 may alternatively be fabricated to collect holes instead of electrons. In this case, the p-doped region 428 and the p-doped region 438 would be replaced by n-doped regions, and the n-doped region 426 and the n-doped region 436 would be replaced by p-doped regions. The n-well regions 452, 454, 456, and 458 would be replaced by p-well regions. The p-well regions 446 and 448 would be replaced by n-well regions.

Although not shown in FIG. 4A-4E, in some implementations, the absorption layer 406 may be bonded to a substrate after the fabrication of the switched photodetector 400, 450, 460, 470, and 480. The substrate may be any material that allows the transmission of the optical signal 412 to reach to the switched photodetector. For example, the substrate may be polymer or glass. In some implementations, one or more optical components (e.g., microlens or lightguide) may be fabricated on the carrier substrate to focus, collimate, defocus, filter, or otherwise manipulate the optical signal 412.

Although not shown in FIGS. 4A-4E, in some implementations, the switched photodetector 400, 450, 460, 470, and 480 may be bonded (ex: metal to metal bonding, oxide to oxide bonding, hybrid bonding) to a second substrate with circuits including control signals, and/or, readout circuits, and/or phase lock loop (PLL), and/or analog to digital converter (ADC). A metal layer may be deposited on top of the switched photodetector that may be used as a reflector to reflect the optical signal incident from the backside of the substrate 402. Adding such a mirror like metal layer may increase the absorption efficiency (quantum efficiency) of the absorption layer 406. For example, the absorption efficiency of photodetectors operating at a longer NIR wavelength between 1.0 μm and 1.6 μm may be significantly improved by addition of a reflecting metal layer. An oxide layer may be included between the metal layer and the absorptive layer to increase the reflectivity. The metal layer may also be used as the bonding layer for the wafer-bonding process. In some implementations, one or more switches similar to 408 and 410 can be added for interfacing control signals/readout circuits.

Although not shown in FIG. 4A-4E, in some implementations, the absorption layer 406 may be partially or fully embedded/recessed in the substrate 402 to relieve the surface topography and so ease the fabrication process. An example of the embedment technique is described in U.S. Patent Publication No. US20170040362 A1.

Figure 5A:
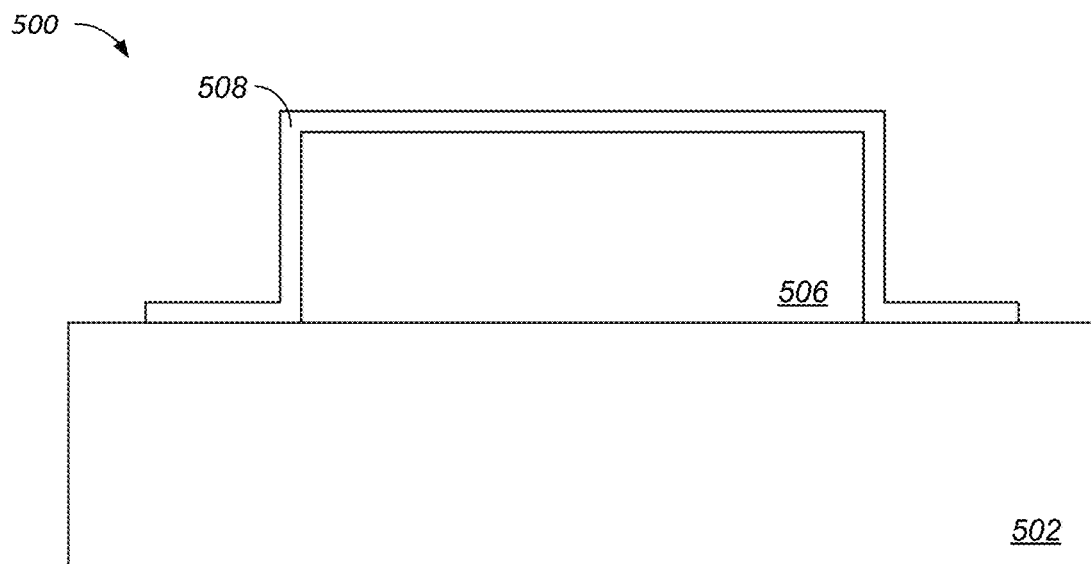
FIGS. 5A-5C are examples of a photodetector.

FIG. 5A shows an example photodetector 500 for converting an optical signal to an electrical signal. The photodetector 500 includes an absorption layer 506 fabricated on a substrate 502, and a first layer 508 formed on top of the absorption layer 506 and the substrate 502. The substrates 502 may be similar to the substrate 102 described previously, and the absorption layers 506 may be similar to the absorption layer 106 described previously, and may be formed, for example, from Ge or GeSi with Ge concentration ranging from 1-99%. The background doping polarity and doping level of the Ge or GeSi absorption layer 506 may be p-type and range from $10^{14}$ cm$^{-3}$ to $10^{16}$ cm$^{-3}$. The background doping level may be due to, for example, explicit incorporation of doping, or due to material defects introduced during formation of the absorption layer 506. The absorption layer 506 of the photodetector 500 has a mesa structure and is supported by the substrate 502, and while a vertical sidewall has been shown, the shape and sidewall profile of the mesa structure may depend on the specifics of the growth and fabrication process for the absorption layer 506.

The first layer 508 covers an upper surface and side surfaces of the absorption layer 506, and covers a portion of an upper surface of the substrate 502 on which the absorption layer 506 is formed. The first layer 508 may be formed from a Complementary Metal-Oxide-Semiconductor (CMOS) process compatible material (CPCM), such as amorphous silicon, polysilicon, epitaxial silicon, aluminum oxide family (e.g., $Al_2O_3$), silicon oxide family (e.g., $SiO_2$), Ge oxide family (e.g., $GeO_2$), germanium-silicon family (e.g., $Ge_{0.4}Si_{0.6}$), silicon nitride family (e.g., $Si_3N_4$), high-k materials (e.g. HfOx, ZnOx, LaOx, LaSiOx), and any combination thereof. The presence of the first layer 508 over the surfaces of the absorption layer 506 may have various effects. For example, the first layer 508 may act as a surface passivation layer to the absorption layer 506, which may reduce dark current or leakage current generated by defects present at the surface of the absorption layer 506. In the case of a germanium (Ge) or a germanium-silicon (GeSi) absorption layer 506, the surface defects may be a significant source of dark current or leakage current, which contributes to an increased noise level of the photocurrent generated by the photodetector 500. By forming the first layer 508 over the surfaces of the absorption layer 506, the dark current or leakage current may be reduced, thereby reducing the noise level of the photodetector 500. As another example, the first layer 508 may modulate a Schottky barrier level between a contact formed on the photodetector 500 and the absorption layer 506 and/or the substrate 502. This barrier modulation effect will be described at a later paragraph.

Figure 5B:
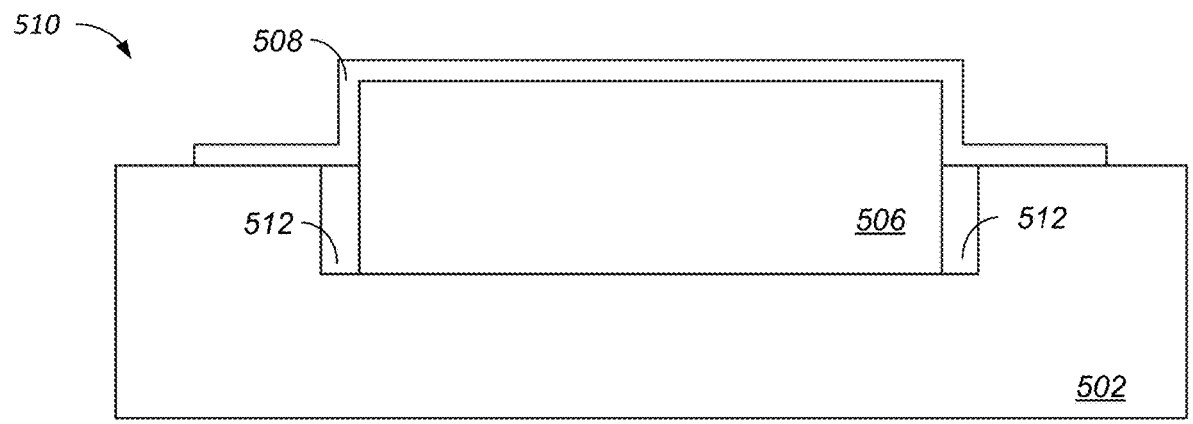

FIG. 5B shows an example photodetector 510 for converting an optical signal to an electrical signal. The photodetector 510 is similar to the photodetector 500 in FIG. 5A, but differs in that the absorption layer 506 is partially embedded in a recess formed on the substrate 502, and the photodetector 510 further includes spacers 512. The spacers 512 may be a dielectric material such as various oxides and nitrides that separates the sidewalls of the absorption layer 506 from the substrate 502. In some implementations, the spaces 512 may be omitted, and the embedded portion of the absorption layer 506 may be in direct contact with a surface of the recess formed in the substrate 502, such as a [110] sidewall of a silicon substrate. An example of the embedment technique is described in U.S. Patent Publication No. US20170040362 A1.

Figure 5C:
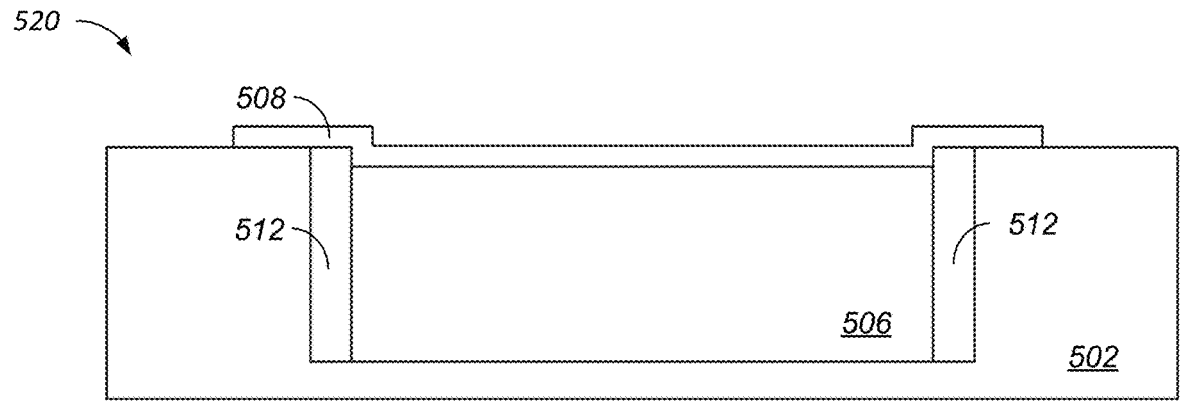

FIG. 5C shows an example photodetector 520 for converting an optical signal to an electrical signal. The photodetector 520 is similar to the photodetector 510 in FIG. 5B, but differs in that the absorption layer 506 is fully embedded in the recess formed on the substrate 502. An example of the embedment technique is described in U.S. Patent Publication No. US20170040362 A1.

Figure 5D:
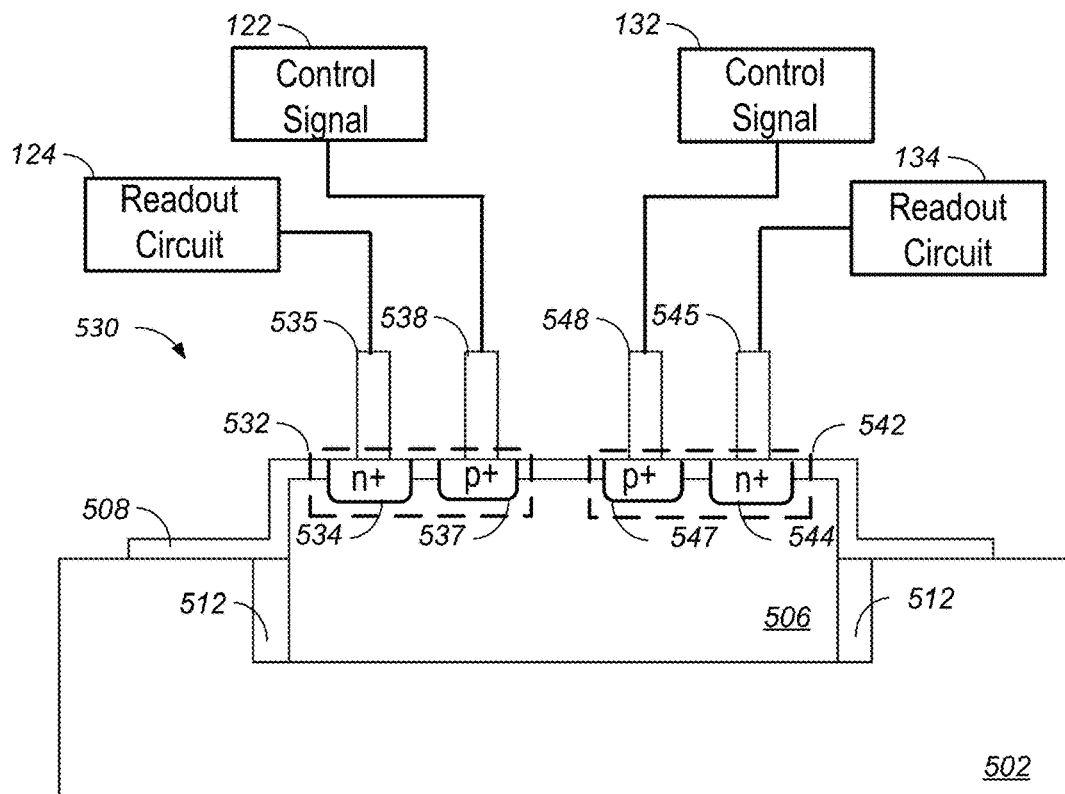
FIGS. 5D-5K are examples of a switched photodetector.

FIG. 5D shows an example switched photodetector 530 for converting an optical signal to an electrical signal. The switched photodetector 530 is similar to the photodetector 510 in FIG. 5B, but differs in that a first switch 532 and a second switch 542 have been fabricated in the absorption layer 506 and the first layer 508. The first switch 532 may be similar to the first switch 108 in FIG. 1A, but further includes a first readout contact 535 coupled to a first n-doped region 534 and a first control contact 538 coupled to a first p-doped region 537. Similarly, the second switch 542 may be similar to the second switch 110 in FIG. 1A, but further includes a second readout contact 545 coupled to a second n-doped region 544 and a second control contact 548 coupled to a second p-doped region 547. The first and second p-doped regions 537 and 547 may be control regions, and the first and second n-doped regions 534 and 544 may be readout regions. The first and second readout contacts 535 and 545 are connected to respective readout circuits similar to readout circuits 124 and 134 shown in FIG. 1A. The first and second control contacts 538 and 548 are connected to respective control signals, such as the control signals 122 and 132 shown in FIG. 1A.

The contacts 535, 538, 545, and 548 provide electrical contacts to the respective doped regions, and may be formed from various electrically conducting materials. Examples of contact materials include various silicides, Ta—TaN—Cu stack, Ti—TiN—W stack, aluminum, and various combinations of such materials. In some implementations, the readout contacts 535 and 545 may be formed from different materials than the control contacts 538 and 548. The contacts 535, 538, 545, and 548 may have various physical configurations. The dimensions of the contacts may range from being as small as 10's of nanometers in diameter or width. While a single contact 535, 538, 545, or 548 are shown to be coupled to each of the doped regions, two or more contacts may be coupled to the doped regions to, for example, reduce contact resistance or improve reliability, as is customary in semiconductor device manufacturing process.

Figure 5E:
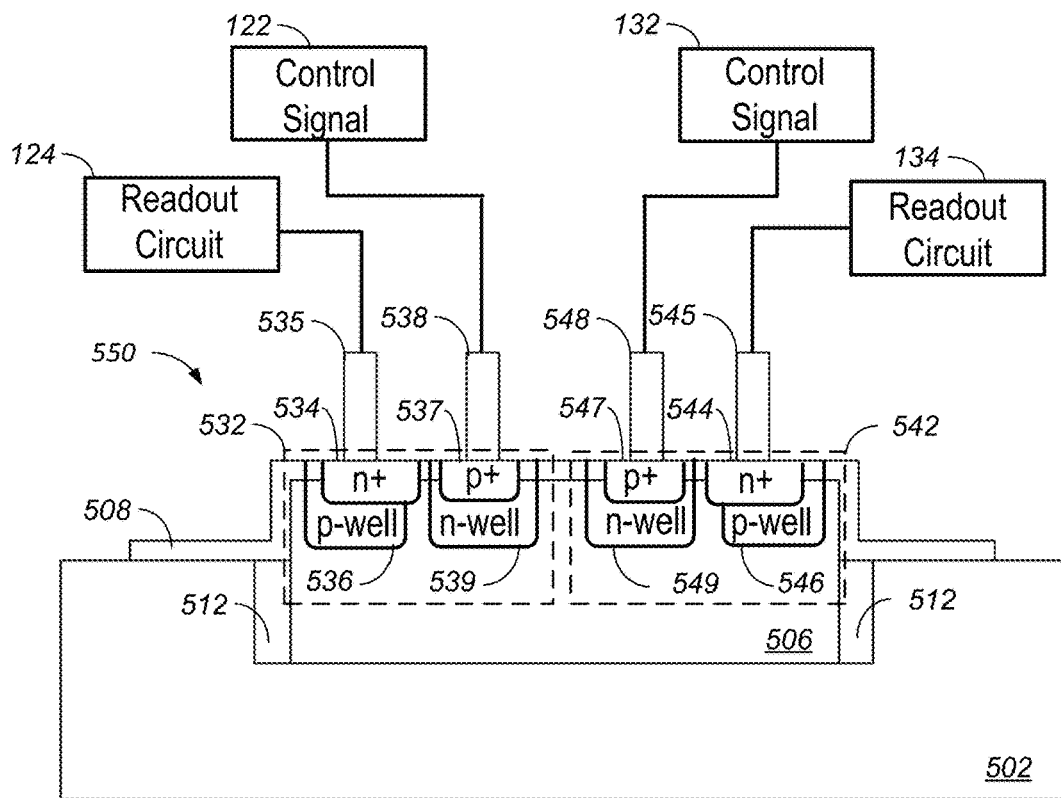

FIG. 5E shows an example switched photodetector 550 for converting an optical signal to an electrical signal. The switched photodetector 550 is similar to the switched photodetector 530 in FIG. 5D, but differs in that the first switch 532 and the second switch 542 further include n-well regions 539 and 549, respectively, and p-well regions 536 and 546, respectively. Additions of the n-well regions and the p-well regions may modify the electrical and/or optical properties of the photodetector 550. In some implementations, the doping level of the n-well regions 539 and 549 and p-well regions 536 and 546 may range from $10^{15}$ cm$^{-3}$ to $10^{17}$ cm$^{-3}$.

The arrangement of the p-doped region 537, the n-well region 539, a p-type absorption layer 506, the n-well region 549, and the p-doped region 547 forms a PNPNP junction structure. In general, the PNPNP junction structure reduces a flow of leakage current from the first control signal 122 to the second control signal 132, or alternatively from the second control signal 132 to the first control signal 122. The arrangement of the n-doped region 534, the p-well region 536, the p-type absorption layer 506, the p-well region 546, and the n-doped region 544 forms an NPN junction structure. In general, the NPN junction structure reduces a charge coupling from the first readout circuit 124 to the second readout circuit 134, or alternatively from the second readout circuit 134 to the first readout circuit 124.

In some implementations, the p-doped region 537 is formed entirely within the n-well region 539. In some other implementations, the p-doped region 537 is partially formed in the n-well region 539. For example, a portion of the p-doped region 537 may be formed by implanting the p-dopants in the n-well region 539, while another portion of the p-doped region 537 may be formed by implanting the p-dopants in the absorption layer 506. Similarly, in some implementations, the p-doped region 547 is formed entirely within the n-well region 549. In some other implementations, the p-doped region 547 is partially formed in the n-well region 549. In some implementations, the n-well regions 539 and 549 form a continuous n-well region that includes at least a portion of both the p-doped regions 537 and 547.

In some implementations, the n-doped region 534 is formed entirely outside the p-well region 536. In some other implementations, the n-doped region 534 is partially formed in the p-well region 536. For example, a portion of the n-doped region 534 may be formed by implanting the n-dopants in the p-well region 536, while another portion of the n-doped region 534 may be formed by implanting the n-dopants in the absorption layer 506. Similarly, in some implementations, the n-doped region 544 is formed entirely outside the p-well region 546. In some other implementations, the n-doped region 544 is partially formed in the p-well region 546.

While FIGS. 5D and 5E show switched photodetectors with a partially embedded absorption region 506, the same construction can be applied to photodetector 500 having non-embedded absorption layer 506, and to photodetector 520 having a fully-embedded absorption layer 506 to achieve analogous effects.

While n-well regions 539 and 549, and p-well regions 536 and 546 have been illustrated in combination for the purpose of illustration, the wells may be individually implemented, or implemented in any combination.

Figure 5F:
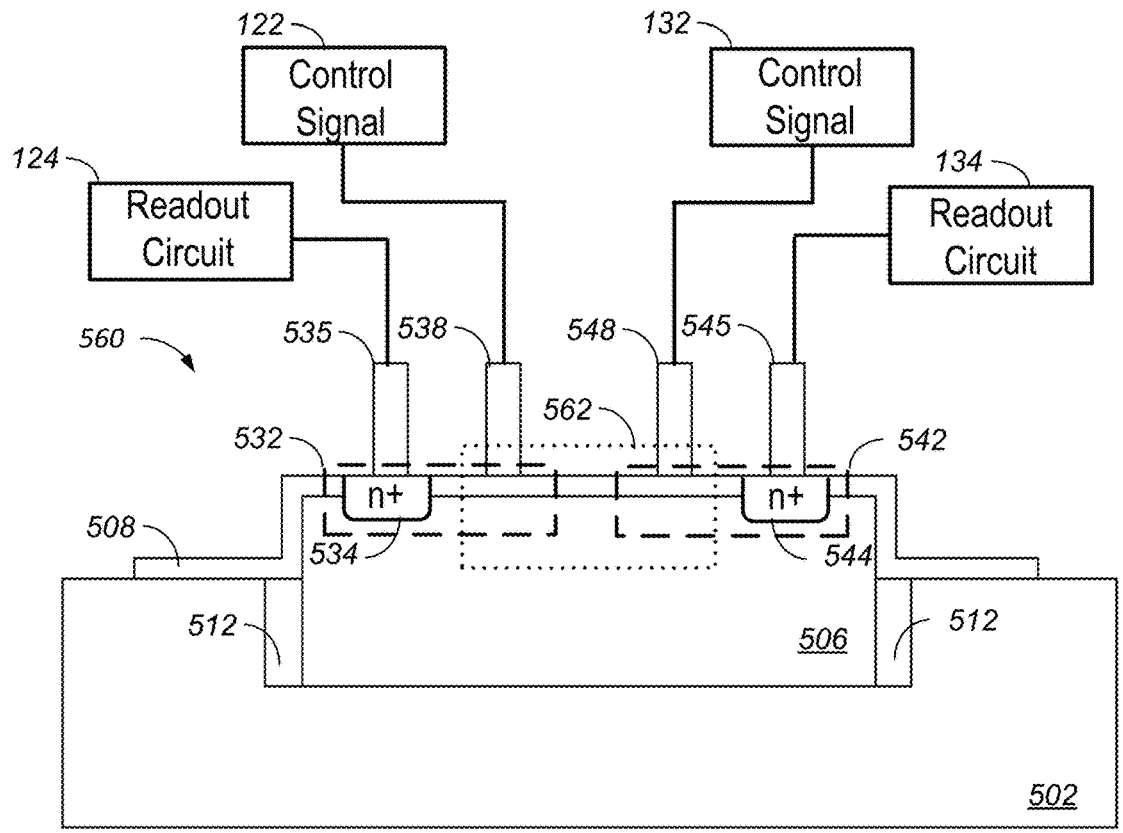

FIG. 5F shows an example switched photodetector 560 for converting an optical signal to an electrical signal. The switched photodetector 560 is similar to the switched photodetector 530 in FIG. 5D, but differs in that the respective p-doped regions 537 and 547 of switches 532 and 542 have been omitted. As a result, the first and second control contacts 538 and 548 form Schottky junctions to the first layer 508. Schottky junction is an electrical junction formed between a metal and a semiconductor, when the semiconductor is not intentionally doped or doped to a moderate dopant concentration, such as below approximately $1 \times 10^{15}$ $cm^{-3}$. A region 562 marks a leakage path between the first control contact 538 and the second control contact 548 through the first layer 508 and the absorption layer 506, which will be described in more detail in relation to FIG. 5G.

Figure 5G:
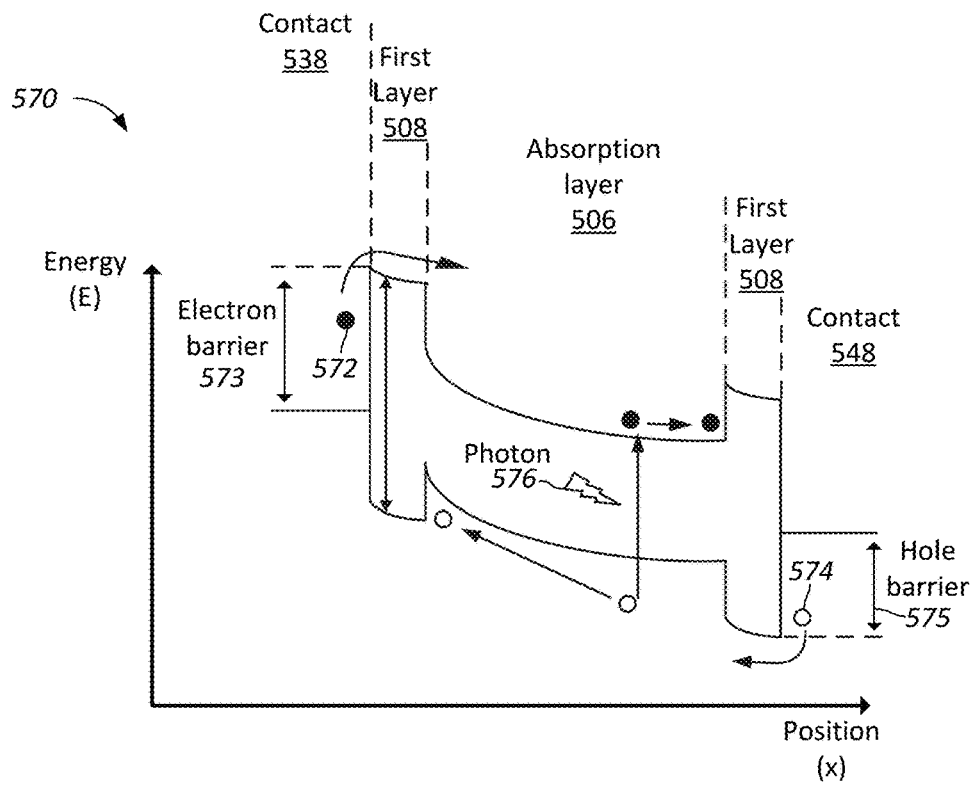

FIG. 5G shows an example band diagram 570 of the leakage path formed between the control contacts 538 and 548. The band diagram 570 illustrates various energy levels that charge carriers such as an electron 572 and a hole 574 experiences at various locations along a leakage path. The vertical axis corresponds to an energy level E, and the horizontal axis corresponds to a position x along the leakage path formed between the control contacts 538 and 548. An example scenario where the electrical potential energy of the first control contact 538 is higher than that of the second control contact 548 (e.g., first control signal 122 has a lower voltage than the second control signal 132) is shown. The potential difference manifests as a downward slope of the overall band diagram from the first control contact 538 to the second control contact 548. The energy levels and positions as shown are for illustration purposes, and may not represent actual values.

An electron barrier 573 and a hole barrier 575 are examples of a Schottky barrier. A Schottky junction is characterized by presence of a Schottky barrier, which is a potential energy barrier that needs to be overcome by the electron 572 and hole 574 in order for those carriers to flow across the Schottky junction. The value of the barriers 573 and 575 can vary depending on a work function of the material of contacts 538 and 548, and the material of the first layer 508. As such, by selecting an appropriate combination of contact material and first layer material, a desired level of electron barrier 573 and hole barrier 575 may be set.

The electron 572 must overcome the electron barrier 573 between the first control contact 538 and the first layer 508. By providing a sufficiently high electron barrier 573, the voltage potential of the control signal 122 applied to the first control contact may be unable to overcome the barrier 573. As such, the electron barrier 573 may block the electron 572 from flowing into the absorption layer 506. In cases where the electron 572 does overcome the electron barrier 573, which may be due to statistical fluctuation of a thermal energy of the electron 572 ("thermionic emission") or quantum tunneling, the electron 572 may flow across the absorption layer 506 to the first layer 508 adjacent to the second control contact 548. Another electron barrier is presented by a junction formed between the absorption layer 506 and the first layer 508, which may further block electron 572 from flowing into the second control contact 548, thereby reducing a leakage current of electrons from the first control contact 538 to the second control contact 548.

Similarly, the hole 574 must overcome the hole barrier 575 between the second control contact 548 and the first layer 508. By providing a sufficiently high hole barrier 575, the voltage potential of the control signal 132 applied to the second control contact may be unable to overcome the barrier 575. As such, the hole barrier 575 may block the hole 574 from flowing into the absorption layer 506. In cases where the hole 574 does overcome the hole barrier 575, which may be due to statistical fluctuation of a thermal energy of the hole 574 ("thermionic emission") or quantum tunneling, the hole 574 may flow across the absorption layer 506 to the first layer 508 adjacent to the first control contact 538. Another hole barrier is presented by a junction formed between the absorption layer 506 and the first layer 508, which may further block hole 574 from flowing into the first control contact 538, thereby reducing a leakage current of holes from the second control contact 548 to the first control contact 538.

When light is being illuminated to the absorption layer 506, the photon 576 of the light may be absorbed by an electron in a valence band of the absorption layer 506 and, resulting in creation of an electron-hole as indicated by the vertical arrow adjacent to the photon 576. The electron of this electron-hole pair forms a photocurrent that is to be captured by the readout circuits 124 and/or 134 through the respective readout contacts 535 and/or 545, and should not flow into the control contacts 538 and 548. In this case, the barriers formed by the interface between the first layer 508 and the absorption layer 506 may prevent such a flow, thereby improving photocurrent collection efficiency of the readout circuits.

When the first layer 508, such as amorphous silicon or polysilicon or crystalline silicon or germanium-silicon, is inserted between the control contacts 538 and 548 and the absorption layer 506, such as a GeSi mesa, the Schottky barrier of the Metal-Semiconductor (MS) junction is modified, resulting in partial blocking of the electrons or holes injected into the first layer 508 by the contacts 538 and 548 as explained above. The power consumption of a ToF pixel such as the switched photodetectors described herein is partially determined by a leakage current flowing between the two control contacts 538 and 548 connected to the two control circuits. As such, by partially blocking the electrons or holes injected by the contacts 538 and 548, the power consumption of the ToF pixel can be significantly reduced.

Figure 5H:
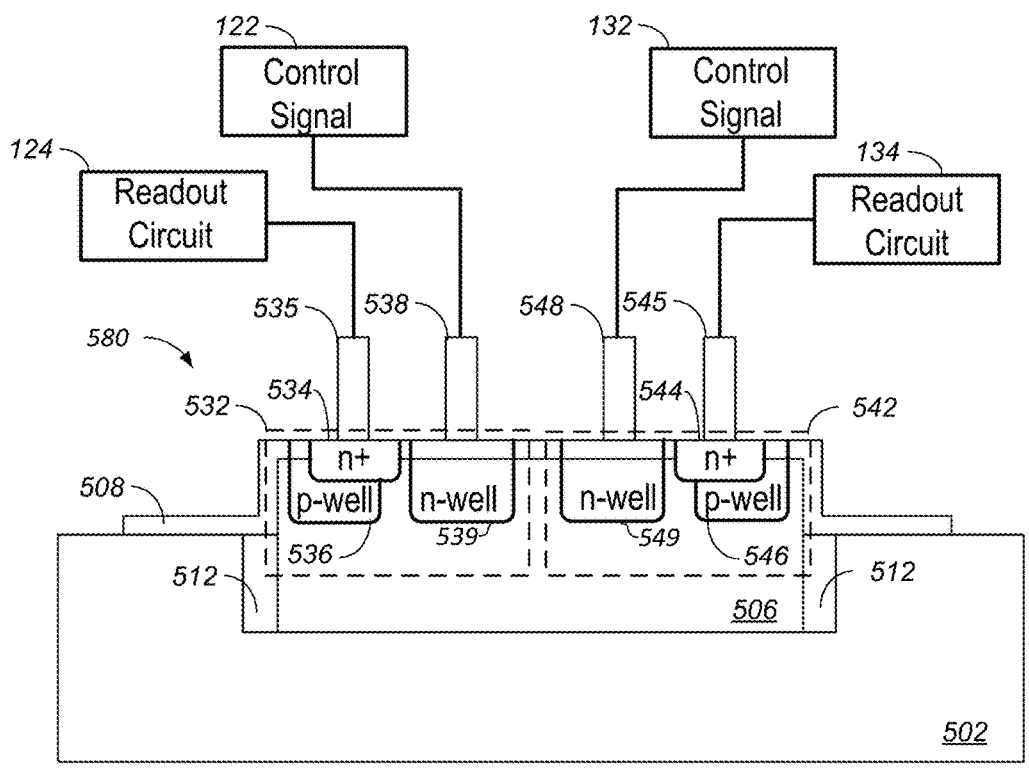

FIG. 5H shows an example switched photodetector 580 for converting an optical signal to an electrical signal. The switched photodetector 580 is similar to the switched photodetector 560 in FIG. 5F, but differs in that the photodetector 580 further includes the n-well regions 539 and 549, and the p-well regions 536 and 546. The structures and effects of the n-well regions 539 and 549, and the p-well regions 536 and 546 have been described in relation to FIG. 5E. In addition, the n-well regions 539 and 549 overlap with at least a portion of the first layer 508 beneath the control contacts 538 and 548, which can contribute to an enhancement in the voltage drop inside the absorption layer 506. Enhancement in the voltage drop inside the absorption layer 506 increases the magnitude of electric field established within the absorption layer 506, which may improve capturing efficiency of the photo-generated electrons by the readout circuits 124 and/or 134 through the respective readout contacts 535 and/or 545.

Figure 5I:
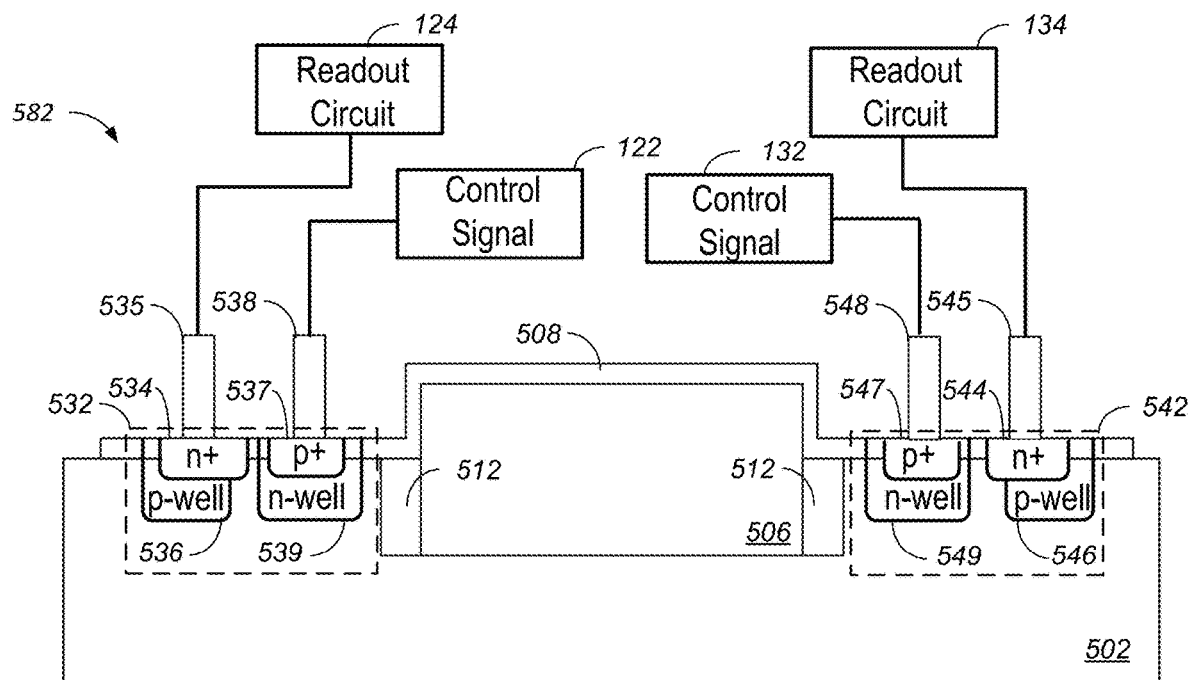

FIG. 5I shows an example switched photodetector 582 for converting an optical signal to an electrical signal. The switched photodetector 582 is similar to the switched photodetector 550 in FIG. 5E, but differs in that the first switch 532 is now located on the substrate 502 and adjacent to the absorption region 506 on the left side, and the second switch 542 are now located on the substrate 502 and adjacent to the absorption region 506 on the right side. The operations of the switched photodetector 582 is analogous to that of previously described switched photodetectors. However, as electrical contacts formed between contacts such as readout contacts 535 and 545 or control contacts 538 and 548 and silicon substrate 502 generally have a lower dark current or leakage current than electrical contacts formed between contacts and Ge or GeSi absorption layer 506 (e.g., due to the substrate 502 having less material defects compared to the absorption layer 506), the overall dark current or leakage current may be lowered in comparison to the configuration of photodetector 550 shown in FIG. 5E. Further, as a result of the switches being placed on the substrate 502, the photo-generated carriers from the light absorbed by the absorption region 506 now flows from the absorption region 506 to the substrate 502 before reaching the readout circuits 124 and 134. Depending on the specific geometry of the absorption region 506 and the spacer 512 and their material, the photo-carriers may conduct through the spacer 512, flow around the spacer 512, or combination thereof.

In some implementations, the p-doped regions 537 and 547 may be omitted in a configuration analogous to the configuration shown in FIG. 5F. While n-well regions 539 and 549, and p-well regions 536 and 546 have been illustrated in combination for the purpose of illustration, the wells may be omitted, be individually implemented, or implemented in any combination.

Figure 5J:
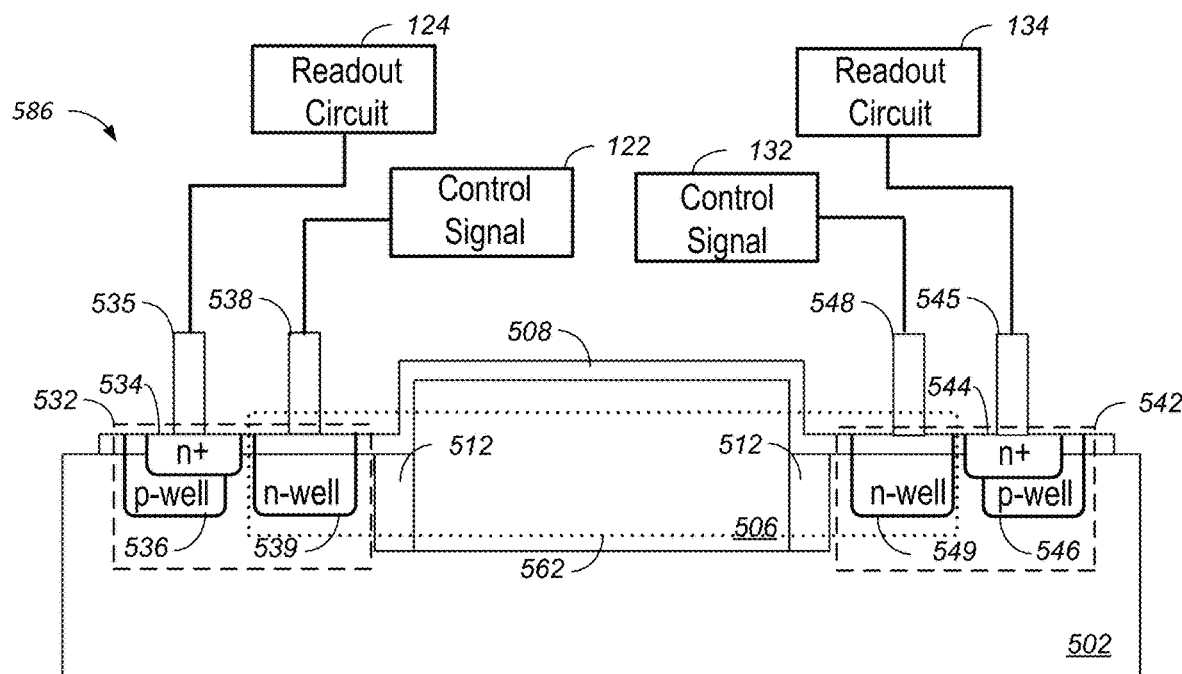

FIG. 5J shows an example switched photodetector 586 for converting an optical signal to an electrical signal. The switched photodetector 586 is similar to the switched photodetector 582 in FIG. 5I, but differs in that the respective p-doped regions 537 and 547 of switches 532 and 542 have been omitted. As a result, the first and second control contacts 538 and 548 form Schottky junctions to the first layer 508. The effects of the Schottky junctions have been described in relation to FIGS. 5F-H. The band diagram 570 of FIG. 5G remain applicable to the region 562 of the photodetector 586, with the barriers formed by to the first layer 508 now corresponding to barriers formed by the first layer 508, the substrate 502, and the spacer 512 due to the modified geometry of photodetector 586 relative to photodetector 506.

While the n-well regions 539 and 549, and the p-well regions 536 and 546 have been illustrated in combination for the purpose of illustration, the wells may be omitted, be individually implemented, or implemented in any combination.

Figure 5K:
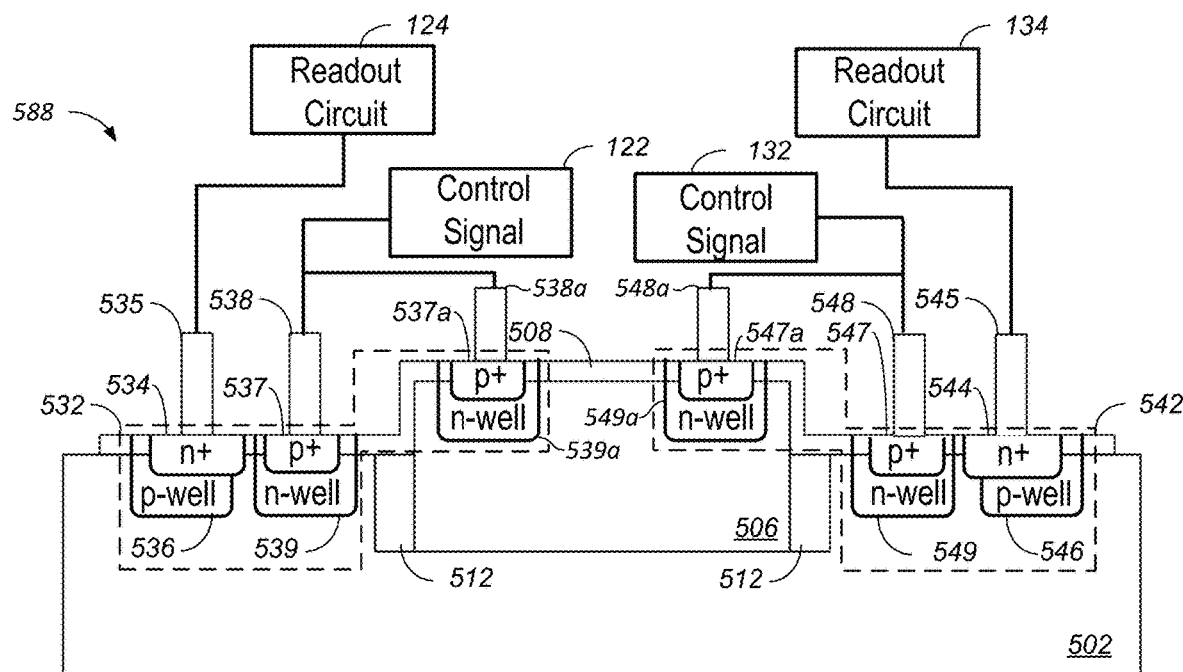

FIG. 5K shows an example switched photodetector 588 for converting an optical signal to an electrical signal. The switched photodetector 588 is similar to the switched photodetector 582 in FIG. 5I, but differs in that the first switch 532 further includes a second p-doped region 537a, a third control contact 538a coupled to the second p-doped region 537a, and a second n-well region 539a in contact with the second p-doped region 537a, and the second switch 542 further includes a second p-doped region 547a, a fourth control contact 548a coupled to the second p-doped region 547a, and a second n-well region 549a in contact with the second p-doped region 547a. The second p-doped regions 537a and 537b are similar to second p-doped regions 537 and 547, respectively. The second n-well regions 539a and 549a are similar to second n-well regions 539 and 549, respectively. The third control contact 538a is similar to the first control contact 538, and the fourth control contact 548a is similar to the second control contact 548. The third control contact 538a is connected to the first control signal 122, and the fourth control contact 548a is connected to the second control signal 132.

As the first control contact 538 and the associated doped regions are not in direct contact with the absorption region 506, the electric field generated within the absorption region 506 by application of the first control signal 122 to the first control contact 538 may be relatively weak in comparison to a configuration where the first control contact 538 is in direct contact with the absorption layer 506, such as in the configuration of the photodetector 550 in FIG. 5E. By adding the third and fourth control contacts 538a and 548a and associated doped regions, the carrier collection control efficiency of the photodetector 586 may be improved over that of the photodetector 582 of FIG. 5I to be comparable to the carrier collection control efficiency of the photodetector 550 in FIG. 5E, while at least partially retaining the benefit of reduced dark current or leakage current by moving the contacts to the substrate 502. Furthermore, as larger electric field within the absorption region can lead to increased photodetector bandwidth, faster switching between the first switch 532 and the second switch 542, the additional control contacts 538a and 548a may also contribute to an improvement in operational speed of the photodetector 584.

While the third control contact 538a and the fourth control contact 548a are shown to share the respective control signal 122 and 132 for the first control contact 538 and the second control contact 548, in some implementations, the contacts 538a and 548a may have independent control signals that may be different from first and second control signals 122 and 132. For example, the control signal for the third control contact 538a may be smaller than the first control signal 122 for the first control contact 538, as the control signal applied to the third control contact 538a may be have a greater effect on the photo-generated carriers than the first control signal 122 applied to the first control contact 538 due to the proximity of the second p-doped region 537a to the carriers being generated in the absorption region 506, and the same applies to the control signal for the fourth control contact 548a.

In some implementations, the second p-doped regions 537a and 547a may be omitted to form Schottky junctions, the effects of which have been previously described in relation to FIGS. 5F-5H. While the n-well regions 539 and 549, and the p-well regions 536 and 546 have been illustrated in combination for the purpose of illustration, the wells may be omitted, be individually implemented, or implemented in any combination.

While various configurations of the switched photodetectors having a partially embedded absorption layer 506 have been described in FIGS. 5D-5K, the described configurations can be applied to switched photodetectors having a fully protruding absorption layer 506 such as the configuration shown in FIG. 5A, and to switched photodetectors having a fully embedded absorption layer 506 such as the configuration shown in FIG. 5C and achieve analogous effects.

The photodetectors described in FIGS. 5A-5K may be incorporated into a front-side illumination (FSI) image sensor, or a back-side illumination image sensor (BSI). In the FSI configuration, the light enters the photodetectors from the top through the first layer 508. In the BSI configuration, the light enters the photodetectors from the bottom through the substrate 502.

The control regions (e.g., p-doped regions 537 and 547) and the readout regions (e.g., n-doped regions 534 and 544) may be at different heights. For example, in the case of photodetectors 530, 550, 560, and 580, and any configurations in which the control regions and the readout regions are both located on the absorption region 506, a portion of the absorption region 506 corresponding to the readout region or the control region may be etched, and the readout region or the control region may be formed on the etched portion, resulting in a vertical offset between the control region and the readout region. Similarly, in the case of photodetectors 582, 586, and 588, and any configurations in which the control regions and the readout regions are both located on the substrate 502, a portion of the substrate 502 corresponding to the readout region or the control region may be etched, and the readout region or the control region may be formed on the etched portion, resulting in a vertical offset between the control region and the readout region In some implementations, lens may be placed on an optical path of light incident on the photodetectors. The lens may be, for example, a micro ball lens or a Fresnel Zone Plate (FZP) lens. As another example, for a silicon substrate 502, the lens may be formed directly on the substrate 502 by etching of the substrate 502. Details regarding configurations of the lens will be provided in relation to FIGS. 7A-7C.

In some implementations, the interface between the absorption layer 506 and the spacers 512 may be doped with n- or p-type dopants to improve electrical isolation for holes and electrons, respectively. In some implementations, the interface between the absorption layer 506 and the substrate 502 (e.g., the bottom interface) may be doped with n- or p-type dopants to improve electrical isolation for holes and electrons, respectively.

Figure 6A:
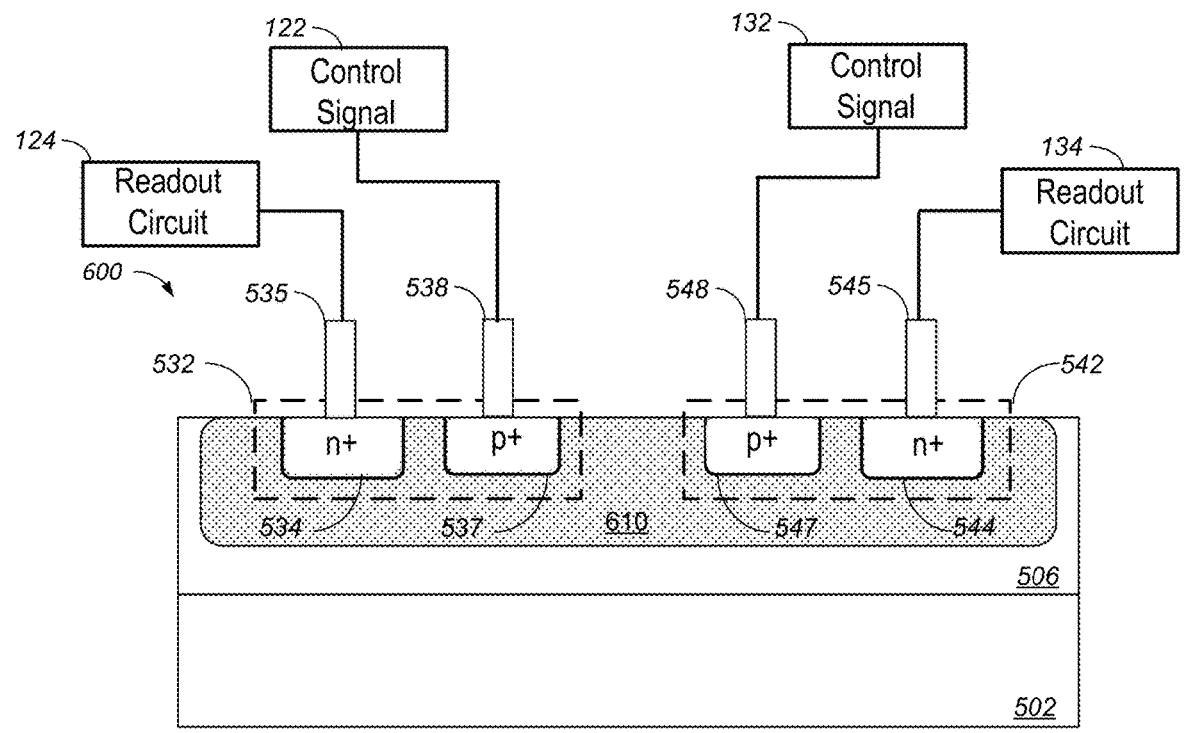
FIGS. 6A-6B are examples of a switched photodetector.

FIG. 6A shows an example switched photodetector 600 for converting an optical signal to an electrical signal. The switched photodetector 600 includes the substrate 502, the absorption region 506, the first switch 532, the second switch 542, and a counter-doped region 610. The counter-doped region 610 is arranged within the absorption region 506. The first and second switches 532 and 542 are arranged on the absorption layer 506. The substrate 502, the absorption region 506, and first and second switches 532 and 542 have been previously described in relation to FIG. 5D.

The counter-doped region 610 is a portion of the absorption region 506 that has been doped with a dopant specie to reduce a net carrier concentration of the absorption region 506. An undoped semiconductor material has a certain concentration of charge carriers that may contribute to current conduction even in absence of dopants, which is referred to as the intrinsic carrier concentration of the semiconductor. The absorption region 506 is typically formed from semiconductor materials, such as Silicon, Germanium, or an alloy of the two, and has an associated intrinsic carrier concentration. This intrinsic carrier concentration may vary depending on various factors, such as the material preparation method and defect level (defect concentration). Examples of the material preparation method include epitaxial growth, chemical vapor deposition (CVD), metal organic CVD (MOCVD), and physical vapor deposition (PVD), and materials prepared using different methods may be different material defect levels. Typically, higher number of material defects correlates to higher level of intrinsic carrier concentration level. For example, bulk crystalline Germanium may have an intrinsic p-type like carrier concentration of approximately $2*10^{13}$ cm$^{-3}$ at room temperature, while an epitaxially grown Germanium may have an intrinsic p-type like carrier concentration that is an order of magnitude higher at approximately $5*10^{14}$ cm$^{-3}$. Depending on the material type and the nature of the defects, the semiconductor material may be p-type or n-type like.

Reducing a leakage current of switched photodetectors, such as the photodetector 600, is important for reducing a power consumption of a Time-Of-Flight pixel. One of the contributors to the leakage current of switched photodetectors is a leakage current flowing between the control regions, e.g. the current flow between the p-doped regions 537 and 547. One approach to reducing such current flow is by reducing a net carrier concentration of the absorption region 506 between the two p-doped regions 537 and 547. The net carrier concentration is the concentration of carriers available for conducting the current, and may be determined by combining the contributions of the intrinsic carrier concentration with extrinsic carrier concentration contributed by the dopants. By appropriately selecting the electrical type, species, and concentration of the dopants, the intrinsic carrier concentration may be compensated, or "counter-doped," by the dopants, resulting in a lower net carrier concentration for the semiconductor material. Typically, the leakage current between the control regions is proportional to the net carrier concentration when the intrinsic and net carriers have the same polarity, i.e., both are p-type like or n-type like.

The type of dopants to be used for the counter-doped region 610 may be selected based on various factors, such as the material forming the absorption region 506 and the nature of defects present in the absorption region 506. For example, epitaxially grown Ge on Si substrate 502 is typically a p-type material. In such a case, an n-type dopant specie such a P, As, Sb, or F may be used to dope the counter-doped region 610. The doping may be performed in various ways, including implantation, diffusion, and in-situ doping during growth of the material. In some cases, dopants such as fluorine may passivate the defects. The passivated defects may stop acting as sources of charge carriers and therefore the net carrier concentration of the Fluorine-doped absorption region 506 may be reduced and become more intrinsic.

The concentration of dopants to be used for the counter-doped region 610 may be selected based on the intrinsic carrier concentration of the absorption region 506. For example, an epitaxially grown Germanium having an intrinsic carrier concentration of approximately $5*10^{14}$ cm$^{-3}$ may be doped with a counter-dopant concentration of approximately $5*10^{14}$ cm$^{-3}$ to reduce the intrinsic carrier concentration toward that of the bulk crystalline Ge of approximately $2*10^{13}$ cm$^{-3}$. In general, the counter-doping concentration may range from $1*10^{13}$ cm$^{-3}$ to $1*10^{16}$ cm$^{-3}$. In some implementations, the counter-doped region 610 may have variable dopant concentrations across the region. For example, regions that are closer to material interfaces, such as the bottom of the absorber 506, may have a higher intrinsic carrier concentration due to increased defect level, which may be better compensated by a correspondingly high counter-doping level. In some implementations, the counter-dopant concentration may be greater than the intrinsic carrier concentration of the absorption region 506. In such cases, the polarity of the absorption region 506 may be changed from p-type to n-type or vice versa.

While the counter-doped region 610 is shown to completely cover the n-doped regions 534 and 544, and the p-doped regions 537 and 547, in general, the counter-doped region 610 may cover just the p-doped regions 537 and 547 or the n-doped regions 534 and 544. Additionally, while the counter-doped region 610 is shown to be a continuous region, in general, it may be two or more separate regions. Furthermore, while the counter-doped region 610 is shown to be only a portion of the absorption region 506, in general, the counter-doped region 610 may be formed across the entire absorption region 506.

In some implementations, the counter-doped region 610 may function as a dopant diffusion suppressor, which may contribute to formation of an abrupt junction profile. Formation of an abrupt junction profile between the counter-doped region 610 and the p-doped regions 537 and 547 may lead to a lower leakage current and thereby reduce the power consumption of ToF pixels. For example, in the case of a Ge absorption region 506, Fluorine doping may suppress diffusion of Phosphorous dopants in the n-doped region 534.

In general, the counter-doped region 610 may be implemented in various implementations of the switched photodetectors to reduce the leakage current between control regions.

In some implementations, the p-doped regions 537 and 547 may be omitted, resulting in formation of Schottky junctions, the effects of which have been described in relation to FIGS. 5F-5H.

Figure 6B:
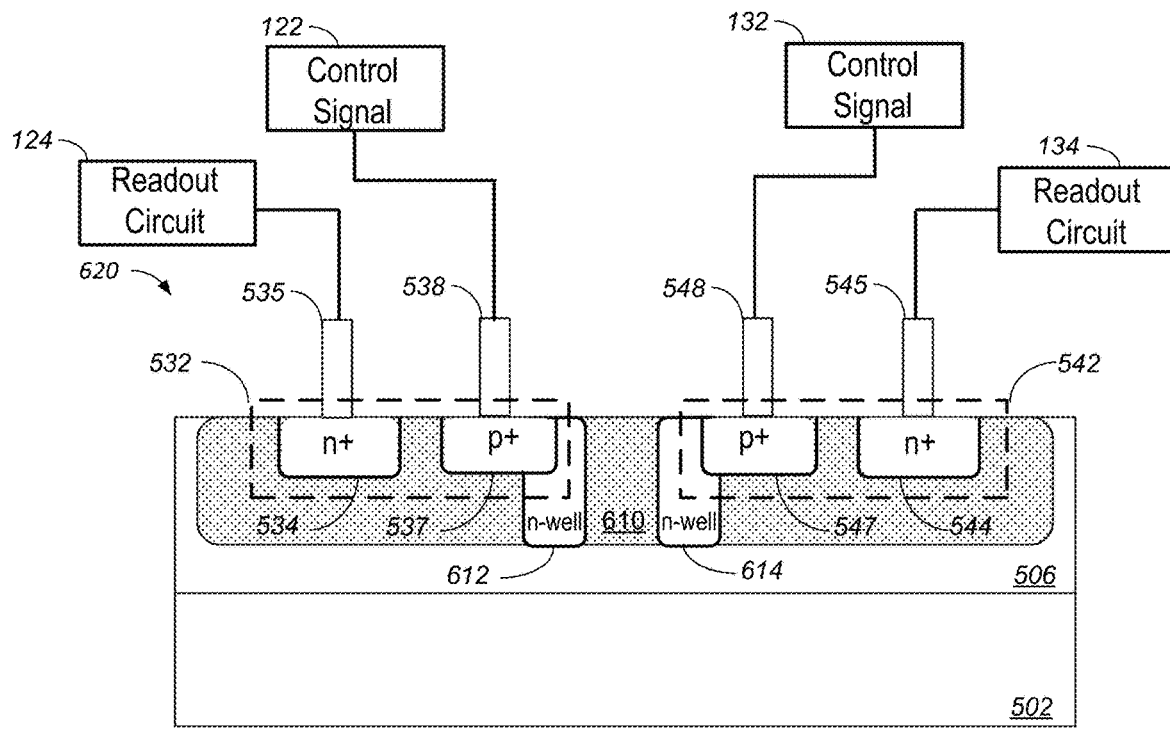

FIG. 6B shows an example switched photodetector 620 for converting an optical signal to an electrical signal. The switched photodetector 620 is similar to the photodetector 600 in FIG. 6A but differs in that the first switch 532 and the second switch 542 further include n-well regions 612 and 614, respectively. Additions of the n-well regions may modify the electrical and/or optical properties of the photodetector 620. In some implementations, the doping level of the n-well regions 612 and 614 may range from $10^{15}$ cm$^{-3}$ to $10^{17}$ cm$^{-3}$. In some implementations, the n-well regions 612 and 614 may extend from the upper surface of the absorption region 506 to the lower surface of the counter-doped region 610 or to the interface between the absorption layer 506 and the substrate 502.

The arrangement of the p-doped region 537, the n-well region 612, the counter-doped region 610, the n-well region 614, and the p-doped region 547 forms a PNINP junction structure. In general, the PNINP junction structure reduces a flow of leakage current from the first control signal 122 to the second control signal 132, or alternatively from the second control signal 132 to the first control signal 122.

In some implementations, the p-doped region 537 is formed entirely within the n-well region 612. In some other implementations, the p-doped region 537 is partially formed in the n-well region 612. For example, a portion of the p-doped region 537 may be formed by implanting the p-dopants in the n-well region 612, while another portion of the p-doped region 537 may be formed by implanting the p-dopants in the counter-doped region 610. Similarly, in some implementations, the p-doped region 547 is formed entirely within the n-well region 614. In some other implementations, the p-doped region 547 is partially formed in the n-well region 614. In some implementations, the n-well regions 612 and 614 form a continuous n-well region that includes at least a portion of both the p-doped regions 537 and 547.

Operation speed or bandwidth of a photodetector can be an important performance parameter for applications that benefit from high speed detection of light, such as ToF detection. Among characteristics that can affect bandwidth of a photodetector is the physical size of the photodetector, such as the area of the photodetector through which light is received. Reducing the area of the photodetector, for example, can lead to a reduction in device capacitance, carrier transit time, or a combination of both, which typically results in an increase in photodetector bandwidth. However, a reduction in the detection area of a photodetector can lead to a reduction in the amount of light (i.e., number of photons) detected by the photodetector. For example, for a given intensity of light per unit area, the reduction in the area of the detector leads to a reduction in detected light.

For applications that benefit from both high bandwidth and high detection efficiency, such as ToF detection, addition of a microlens before the photodetector may be beneficial. The microlens can focus the incident light onto the photodetector, allowing a small-area photodetector to detect light incident over an area larger than itself. For example, a properly designed combination of a microlens and a spacer layer (SL) that separates the microlens from the photodetector by an effective focal length of the microlens can allow focusing of the incident light to a diffraction-limited spot that is on the order of the square of the optical wavelength of the incident light. Such a scheme can allow reduction of photodetector area while mitigating the potential downsides of the photodetector area reduction.

Figure 7A:
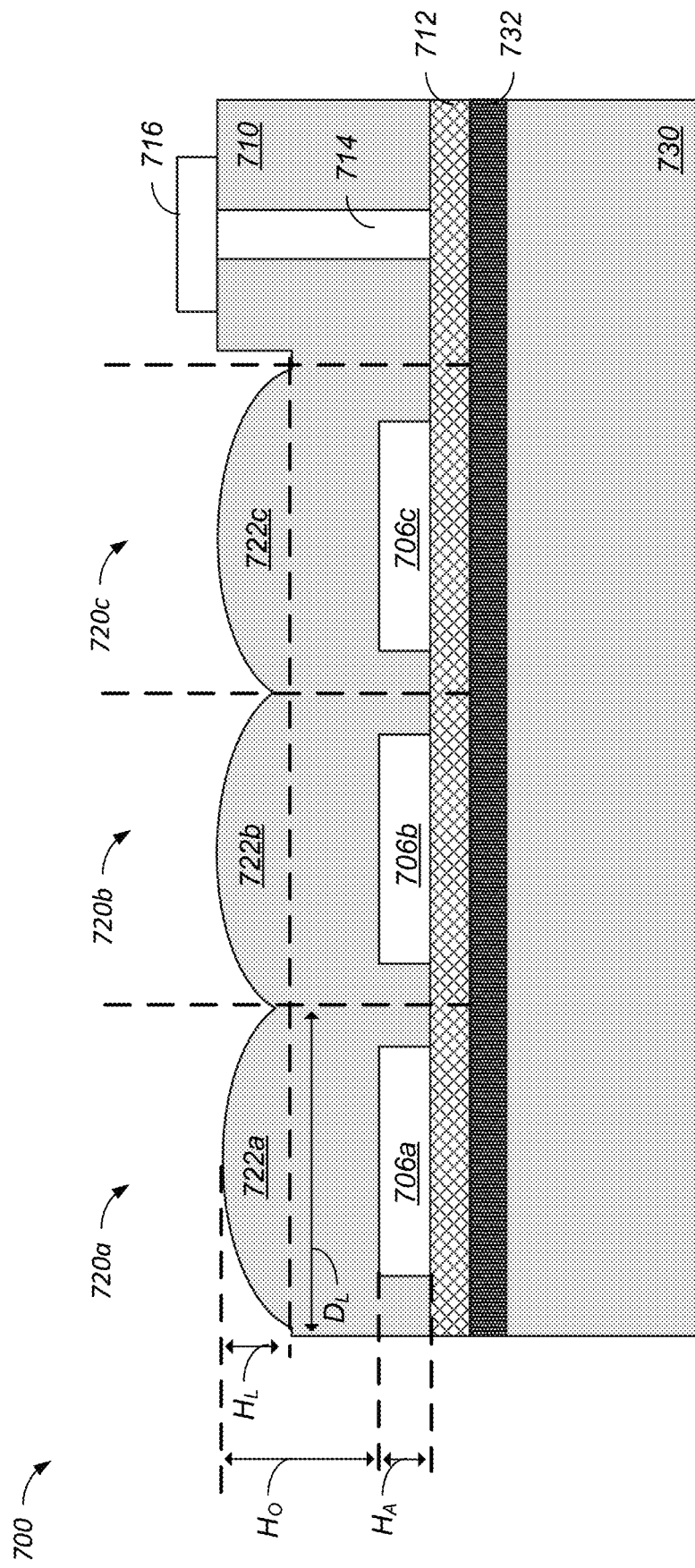
FIGS. 7A-7B are cross-sectional views of example configurations of microlenses integrated with photodetectors.

FIG. 7A shows a cross-sectional view of an example configuration 700 of silicon lenses integrated with photodetectors. The configuration 700 includes a donor wafer 710 and a carrier wafer 730. The donor wafer 710 includes multiple pixels 720a through 720c (collectively referred to as pixels 720), via 714, metal pad 716, and a first bonding layer 712. The carrier wafer 730 includes a second bonding layer 732. The donor wafer 710 and the carrier wafer 730 are bonded to each other through the first bonding layer 712 and the second bonding layer 732. The substrate 710 may be similar to substrate 502 of FIG. 5A. The absorption region 706 may be similar to the absorption region 506 of FIGS. 5A-5L.

The pixels 720a through 730c include absorption regions 706a through 706c, respectively, and microlenses 722a through 722c (collected referred to as microlenses 722), respectively. The microlenses 722 are convex lenses that are integrated into or on the donor wafer 710. In applications that benefit from high light collection efficiency, such as ToF detection, addition of microlenses 722 may be beneficial. The convex configuration of the microlens 722 can cause light incident on the microlens 722 to be focused toward the absorption region 706, which may improve light collection efficiency of the pixels 720, leading to improved pixel performance. The arrangement of the pixel 720 with the microlens 722 on a backside of the donor wafer 710 may be referred to as backside illumination.

The microlens 722 has various characteristics that affect its performance, including geometrical parameters and material from which it is formed. The microlens 722 is typically implemented in a plano-convex configuration, with one surface facing the incident light and being convex with a radius of curvature, and the other surface being a planar surface interfacing with the donor wafer 710 in or on which the microlens 722 is formed. The plano-convex configuration of the microlens 722 may lend itself to fabrication through standard semiconductor processing techniques. The microlens 722 may have a height HL and a diameter DL, and may be separated from a lens-facing surface of the absorption region 706 by a height Ho. In some implementations, HL may range from 1 to 4 µm, Ho may range from 8 to 12 µm, HA may range from 1 to 1.5 µm, and DL may range from 5 to 15 µm. In some implementations, for a spherical-type microlens 722, its radius of curvature may be set such that the focal length of the microlens 722 is approximately equal to Ho to achieve optimal focusing of light onto the absorption region 706. The determination of the focal length and the radius of curvature may be performed using various simulation techniques such as beam propagation method (BPM) and finite difference time domain (FDTD) technique. In some implementations, the microlens 722 is an aspheric lens.

The microlens 722 can be formed from various materials and fabricated in various ways. In general, various materials that are transparent for the wavelengths to be detected by the pixels 720 may be used. For example, the microlens 722 may be fabricated from materials having moderate to high index of refraction (e.g., >1.5), such as crystalline silicon, polysilicon, amorphous silicon, silicon nitride, polymer, or combination thereof. For visible wavelengths, polymer materials may be used. For NIR wavelengths, silicon may be used as silicon is relatively transparent in the NIR, and has a relatively high index of refraction (approximately 3.5 at 1000 nm), making it well suited as a lens material in the NIR. Furthermore, as silicon is strongly absorbing in the visible wavelengths (e.g., <800 nm), a silicon microlens may block a substantial portion of visible light from reaching the absorption region 706, which may be beneficial for applications where selective detection of NIR wavelengths is desired (e.g., ToF detection). A crystalline silicon microlens 722 may be fabricated by patterning and etching a surface of the donor wafer 710, which is typically a crystalline silicon wafer. As another example, polysilicon or amorphous silicon may be deposited on the surface of the donor wafer 710, which may then be patterned and etched in similar fashion. The formation of microlens 722 through etching of the crystalline silicon donor wafer 710 or by etching of the polysilicon or amorphous silicon deposited on the donor wafer 710 is an example method of integrally forming the microlens 722 on the donor wafer 710.

The patterning of the microlens 722 may be performed using, for example, grayscale lithography techniques. In grayscale lithography, a feature to be patterned, such as the microlens, is exposed using a local gradation in the exposure dose, which translates into a gradation in the thickness of the resulting photoresist mask that has been developed. For example, the photoresist mask can be patterned to have a similar shape as the microlens 722. The photoresist mask is then transferred onto the material underneath, such as the crystalline silicon donor wafer 710, by semiconductor etching techniques such as plasma-based directional etching techniques, completing the fabrication of the microlens 722. In some implementations, the local gradation in the exposure dose may be achieved, for example, by varying a fill-factor of sub-wavelength features on a photomask The absorption regions 706 may be similar to absorption region 506 described in relation to FIG. 5A. The carrier wafer 730 may include various electronic circuits that are coupled to the pixels 720. For example, the electronic circuits may be coupled through structures such as the via 714. The via 714 may be coupled to a metal pad 716 to interface with external electronics through, for example, a wire bond.

The carrier wafer 730 and the donor wafer 710 may be bonded or mechanically attached to one another through various techniques. For example, the first and second bonding layers 712 and 732 may be oxides (e.g., silicon dioxide), and the bonding may be an oxide-to-oxide bonding. As another example, the first and second bonding layers 712 and 732 may be metals (e.g., copper), and the bonding may be a metal-to-metal bonding. As yet another example, the first and second bonding layers 712 and 732 may be a combination of oxide and metals (e.g., silicon dioxide and copper), and the bonding may be a hybrid bonding.

Figure 7B:
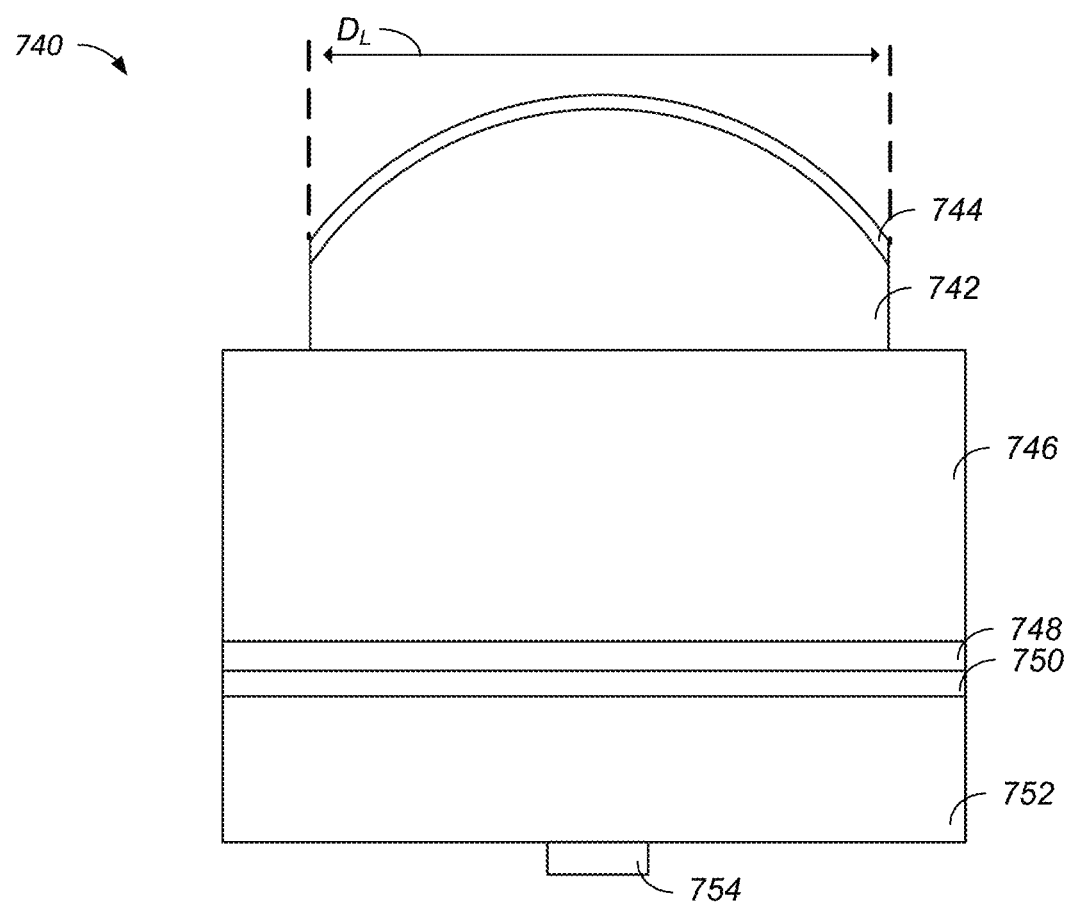

FIG. 7B shows a cross-sectional view of an example configuration 740 of a microlens integrated with a photodetector. The configuration 740 includes a microlens 742, an anti-reflection coating (ARC) layer 744, a spacer layer 746, a first layer 748, a second layer 750, a silicon layer 752 and a photodetector 754. The ARC layer 744 is supported by the microlens 742. The microlens 742 is supported by the spacer layer 746. The photodetector 754 may be supported by the silicon layer 752 or be formed within the silicon layer 752. The first layer 748 and the second layer 750 may be intermediate layers between the silicon layer 752 and the spacer layer 746.

The ARC layer 744 is provided to reduce a reflection of light incident on the microlens 742. The ARC layer 744, for example, may be designed to have a refractive index that is the square root of the index of the microlens 742, and have a thickness corresponding to a quarter of the incident wavelength. In some implementation, the ARC layer 744 may be formed from silicon dioxide. In some implementations, the ARC layer 744 may include multiple layers to form a multi-layer ARC.

The configuration 740 may correspond to an integration of microlens 742 in a back-side illuminated (BSI) image sensor configuration. For example, the silicon layer 752 can be a silicon substrate, such as the substrate 710 of FIG. 7A or substrate 502 of FIG. 5D, and the photodetector 754 may be, for example, the switched photodetector 530 of FIG. 5D. The interface between the silicon layer 752 and the second layer 750 may correspond to the bottom surface of the substrate 502 opposite to the absorption region 506 of FIG. 5D. In such a BSI configuration, the second layer 750 formed on the silicon layer 752, e.g., the backside of the substrate 502, can include various structures and layers typical in fabrication of a BSI illuminated sensor wafer. Examples of such structures and layers include an ARC layer for reducing light reflection at the interface of the silicon layer 752, and a metal grid, such as a tungsten grid, for blocking light into the silicon layer 752 other than regions for receiving light, such as the regions underneath the microlens 742. The first layer 748 may be a thin layer of material that promotes adhesion of the spacer layer 746 to the second layer 750 for improving, among others, manufacturability and reliability of the configuration 740. The material for the first layer 748 may be, for example, various dielectric materials (e.g., $SiO_2$, SiON, and SiN) or polymers. In some implementation, the first layer 748 can be omitted depending on the interaction between the second layer 750 and the spacer layer 746 (e.g., in the case where the spacer layer 746 has good adhesion with the second layer 750).

The configuration 740 may be fabricated by providing a sensor wafer including the silicon layer 752, the photodetector 754, and the second layer 750, and depositing the first layer 748, the spacer layer 746, the microlens 742, and the ARC layer 744 in the order given, and then patterning and etching to expose metal pads similar to the metal pad 716 shown in FIG. 7A. The microlens 742 may be patterned and etched using techniques described in relation to fabrication of the microlens 722 of FIG. 7A. While the ARC layer 744 is shown to be limited to the surface of the microlens 742, in general, the ARC layer 744 may extend to other surfaces, such as the side surface of the microlens 742 and the upper surface of the spacer layer 746.

Various characteristics of the components of a particular implementation of the configuration 740 configured for operational wavelength of 940 nm are given as an example. The microlens 742 has a refractive index of 1.5316, a radius of curvature of 6 μm, a height of 4 μm, and a diameter DL of 10 μm. The ARC layer 744 is formed from $SiO_2$, which has a refractive index of 1.46 at 940 nm and a thickness of 160.96 nm. The spacer layer 746 has a refractive index of 1.5604, and a thickness of 10 μm. The first layer 748 has a refractive index 1.5507 and a thickness of 60 nm. The second layer 750 includes an ARC layer for the silicon layer 752 and a tungsten grid. While specific characteristics have been provided, the characteristics may be modified to adapt the configuration 740, for example, for different operational wavelengths, materials, and size of the photodetector 754.

In some implementations, the second layer 750, which may be referred to as the "top layer" formed on top of the backside of a silicon substrate of a BSI image sensor, may be modified to improve the overall optical performance of configuration 740. The second layer 750, as previously described, typically includes metal grid embedded in a dielectric layer, such as tungsten grid embedded in a layer of $SiO_2$. This layer of $SiO_2$ may serve as an ARC layer if the light was entering the silicon layer 752 directly from air. However, due to the addition of the microlens 742, the spacer layer 746 and the first layer 748 which all have refractive indices that are significantly higher than that of air (approximately 1.0), the $SiO_2$ layer may not function effectively in reducing the optical reflection at the interface between the silicon layer 752 and the stacking of the first layer 748 and/or spacer layer 746.

Table 1 shows simulation parameters and calculated transmission of an implementation of configuration 740. The layers and the thicknesses have been adapted and/or approximated for the purpose of performing a simulation that approximate the expected transmission of different implementations of the configuration 740.

TABLE 1

| LAYERS | | REFRACTIVE INDEX | THICKNESS (μm) | |
|---|---|---|---|---|
| | | | Case 1 | Case 2 |
| ARC layer 744 | | 1.249 | 0.188 | |
| Spacer layer 746 | | 1.560 | 10 | |
| First layer 748 | | 1.551 | 0.06 | |
| Second layer 750 | $SiO_2$ | 1.451 | 0.8 | |
| | $Si_3N_4$ | 1.949 | 0 | 0.120 |
| Silicon layer 752 | | 3.599 + 0.00135i | 1 | |
| Transmission (%) | | | 78.95 | 97.62 |

Referring to Table 1, case 1 corresponds to a second layer 750 that includes a standard single layer of $SiO_2$, which results in a simulated transmission of approximately 79%. For applications where it is important to detect as much of the incident light as possible, such 21% loss of the incident light may not be acceptable. Such a drop in transmission can be mitigated by including a $Si_3N_4$ layer in the second layer 750 under the $SiO_2$ layer as an intermediate layer between the $SiO_2$ layer and the silicon layer 752. By including approximately 121 nm of $Si_3N_4$, the transmission can be improved to approximately 97.6%. As such, the intermediate layer may be referred to as an anti-reflection layer. In general, various optically transparent material with a refractive index greater than $SiO_2$ may be used in place of $Si_3N_4$. Example materials include SiON, SiN, $Al_2O_3$, $HfO_2$, $ZrO_2$, and $La_2O_3$, and high-k materials (e.g., materials with high dielectric constant) that are compatible with CMOS manufacturing processes. Suitable material may have a refractive index greater than, for example, 1.6, 1.7, 1.8, 1.9, or 2.0. Thickness of the material should be adapted to be an odd multiple of a quarter of the wavelength of light within the material.

The addition of $Si_3N_4$ or high-k material layer directly on top of the silicon layer 752 may result in an increase of a dark current of the photodetector 754 due to, for example, increased surface defect at the Silicon-$Si_3N_4$ interface relative to Silicon-$SiO_2$ interface. To mitigate such increase in dark current, in some implementations, a second layer of $SiO_2$ can be inserted between the $Si_3N_4$ layer and the silicon layer 752. Inserting the second layer of $SiO_2$ of thickness ranging from 10 nm to 50 nm results in a transmission ranging from approximately 97.1% to 85%, respectively. As such, inserting a thin layer of $SiO_2$, such as 10 nm, may be beneficial for mitigating the increase in dark current while maintaining high optical transmission.

Low leakage current flowing across control regions of a switched photodetector, as previously described, is an important performance parameter, as it contributes to lowering power consumption of apparatuses including the photodetector. Another important aspect performance parameter is dark current flowing between a readout region and the control region of a switched photodetector, as the dark current contributes to the noise of a signal detected by the switched photodetector, degrading the signal-to-noise ratio (SNR) of a measure ToF signal.

Figure 8A:
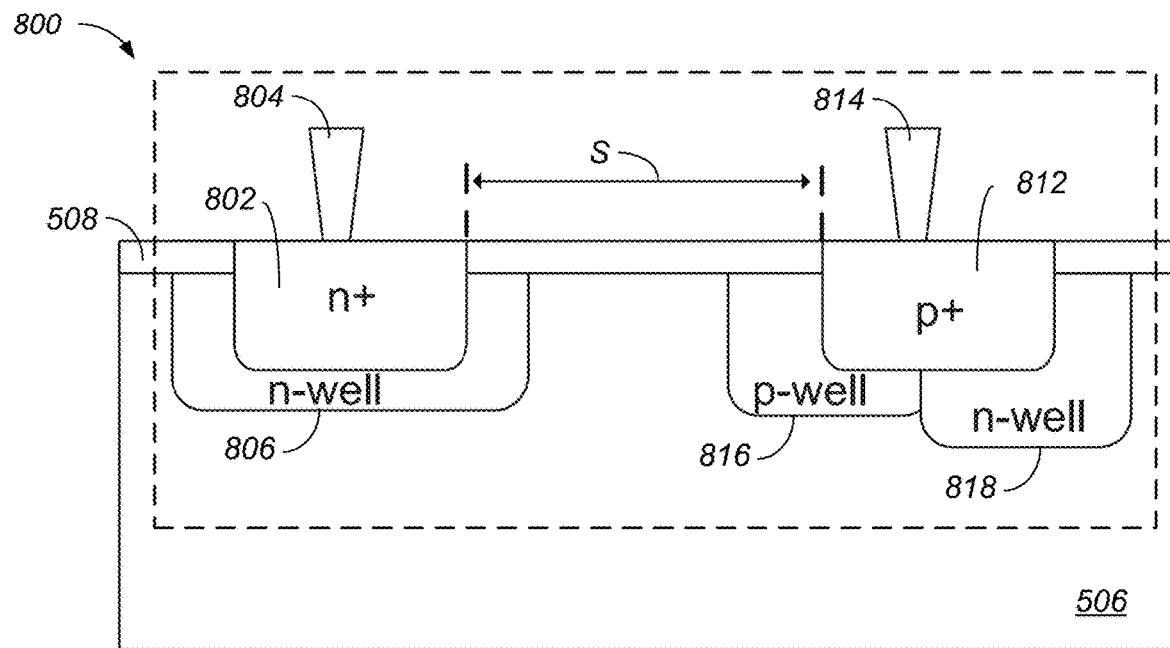
FIGS. 8A-8C are examples of a switch for a switched photodetector.

FIG. 8A shows an example switch 800 for a switched photodetector. The switch 800 may be used as a first or second switch in various switched photodetectors described in the present specification. The switch 800 is formed in the absorption region 506 having the first layer 508, which have been described previously described in relation to FIG. 5A. The switch 800 includes an n-doped region 802, a readout contact 804 coupled to the n-doped region 802, a lightly doped n-well region 806, a p-doped region 812, a control contact 814 coupled to the p-doped region 812, a lightly doped p-well region 816, and an n-well region 818. The edges of the n-doped region 802 and the p-doped region 812 are separated by a distance S. The n-doped region 802 and the p-doped region 812 may be similar to the first n-doped region 534 and the first p-doped region 537 of FIG. 5E. The n-well region 818 may be similar to the n-well region 539 in FIG. 5E. The readout contact 804 and the control contact 814 may be similar to the first readout contact 535 and the first control contact 538 in FIG. 5E. The p-doped region 812 may be a control region, and the n-doped regions 802 may be a readout region.

Origins of the dark current in a lateral PIN diode formed by the control region (p-doped region 812), the absorption region 506 (undoped/intrinsic), and a readout region (n-doped region 802) include Shockley-Read-Hall (SRH) generation and band-to-band tunneling. SRH generation may be influenced by presence of surface defects at the surface of the absorption region 506. The addition of the first layer 508 partially reduces the surface defect, which can reduce the dark current due to SRH generation. Increasing the distance S between the n-doped region 802 and the p-doped region 812 can also reduce the dark current due to, for example, lowering of the electrical field between the n-doped region 802 and the p-doped region 812, which in turn decreases the SRH generation rate between the said regions. For example, the distance S should be kept at above 400 nm. However, increasing the distance S can lead to a reduction in bandwidth of the photodetector due to, for example, an increase in carrier transit time. Addition of the lightly doped n-well region 806, the lightly doped p-well region 816, or combinations thereof may help overcome such tradeoff.

The respective lightly doped regions 806 and 816 have dopant concentrations that are lower than the respective n-doped region 802 and the p-doped region 812. For example, the lightly doped regions 806 and 816 can have dopant concentrations on the order of $1*10^{17}$ cm$^{-3}$, which are lower than that of the n-doped region 802 and the p-doped region 812 which can have dopant concentrations on the order of $1*10^{19}$ cm$^{-3}$. The presence of the lightly doped regions reduces discontinuity in the dopant concentrations between the doped regions 802 and 812 and the absorption region 506, which may have dopant concentrations on the order of $1*10^{15}$ cm$^{-3}$ or lower, by providing a region of intermediate dopant concentration, which results in a reduction in the electric field values at the edges of the doped regions 802 and 812. By reducing the electric field values, band-to-band tunneling may also be reduced, which leads to lowering of the dark current between the two doped regions 802 and 812. In addition, contributions from SRH generation may be reduced. In general, the doping concentration of the lightly doped regions 806 and 816 may be set based on various factors such a geometry of the switch, doping concentration of the doped regions 802 and 812, and doping concentration of the absorption region 506.

Figure 8B:
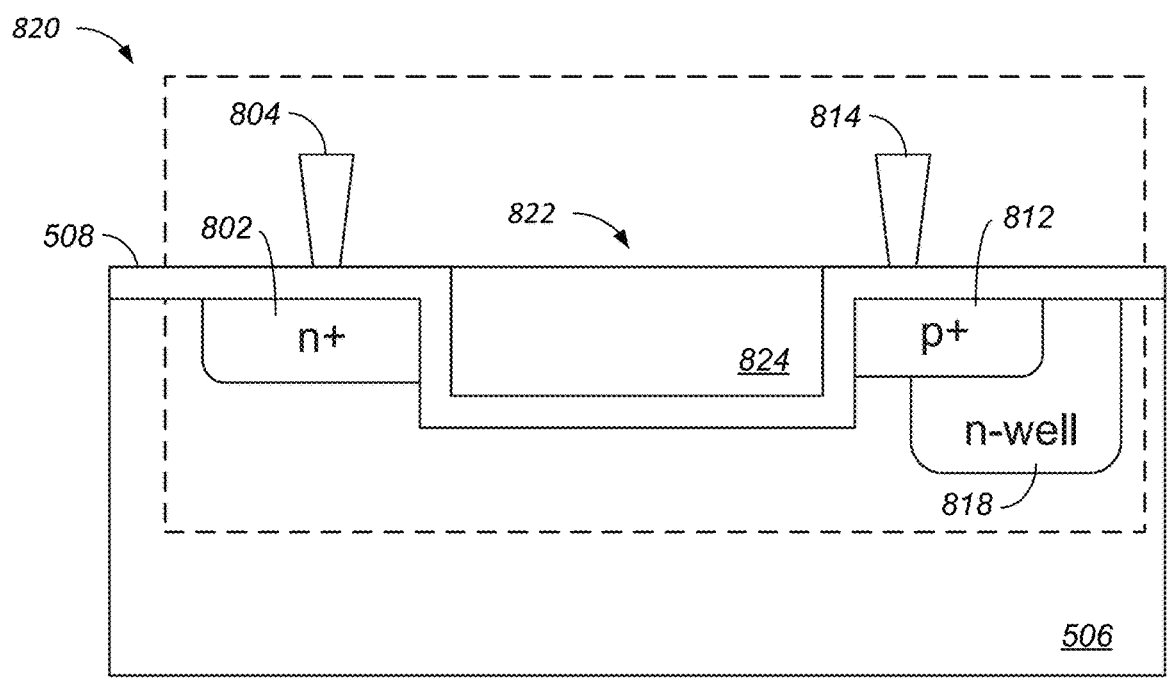

FIG. 8B shows an example switch 820 for a switched photodetector. Switch 820 is similar to the switch 800 in FIG. 8A, but differs in that instead of the lightly doped regions 806 and 816, a trench 822 is formed in the absorption region 506, which is filled by a dielectric fill 824. The trench 822 filled with the dielectric fill 824 can contribute to a reduction in the dark current.

The dielectric fill 824 is typically an electrically insulating material with a dielectric constant lower than that of the surrounding absorption region 506. Electric field is able to penetrate further into a region of low dielectric constant compared to region of high dielectric constant. By placing the dielectric-filled trench 822 in proximity to the doped regions 802 and 812, some of the high electric field regions formed around the doped regions 802 and 812 and in depletion regions ("space charge region") surrounding the doped regions 802 and 812 are pulled into the dielectric fill 824. Accordingly, SRH generation and/or band-to-band tunneling in the absorption region 506 is reduced. Furthermore, unlike the germanium absorption region 506, the dielectric fill 824 such as $SiO_2$ is an insulator and does not contribute to SRH generation and/or band-to-band tunneling. Therefore, dark current generation through SRH generation and/or band-to-band tunneling that is caused by high electric field regions at the edges of the doped regions 802 and 812 may be reduced.

The trench 822 may be formed by etching the absorption region through dry (e.g., plasma etching) or wet (e.g., liquid chemical bath) etching techniques. The trench 822 may be etched to a depth similar to the depth of the doped regions 802 and 812 (e.g., 10-200 nm). The trench 822 should overlap with at least a portion of high electric field regions surrounding at least one of the n-doped region 802 or the p-doped region 812. In some implementations, the trench 822 cuts into the doped regions 802 and 812, removing a portion of the n-doped region 802 and the p-doped region 812. Once the trench 822 is formed, the first layer 508 may be deposited over the trench 822 to passivate the defects present on the surface of the trench 822. In the case of a germanium absorption region 806, the first layer 508 may be, for example, amorphous silicon, polysilicon, germanium-silicon, or a combination thereof. Then, the trench 822 is filled with the dielectric fill 824, which may be, for example, $SiO_2$. The dielectric fill 824 should be clean without significant concentration of impurities to avoid generation of dark current.

In some implementations, the depth of the trench may be deeper than the depth of the doped regions 802 and 812. For example, for doped regions 802 and 812 that are approximately 100 nm deep, a trench depth of 200 nm may further reduce SRH generation and/or band-to-band tunneling. In some implementations, greater than 50% reduction in SRH generation and/or band-to-band tunneling around the doped regions 802 and 812 may be observed.

Figure 8C:
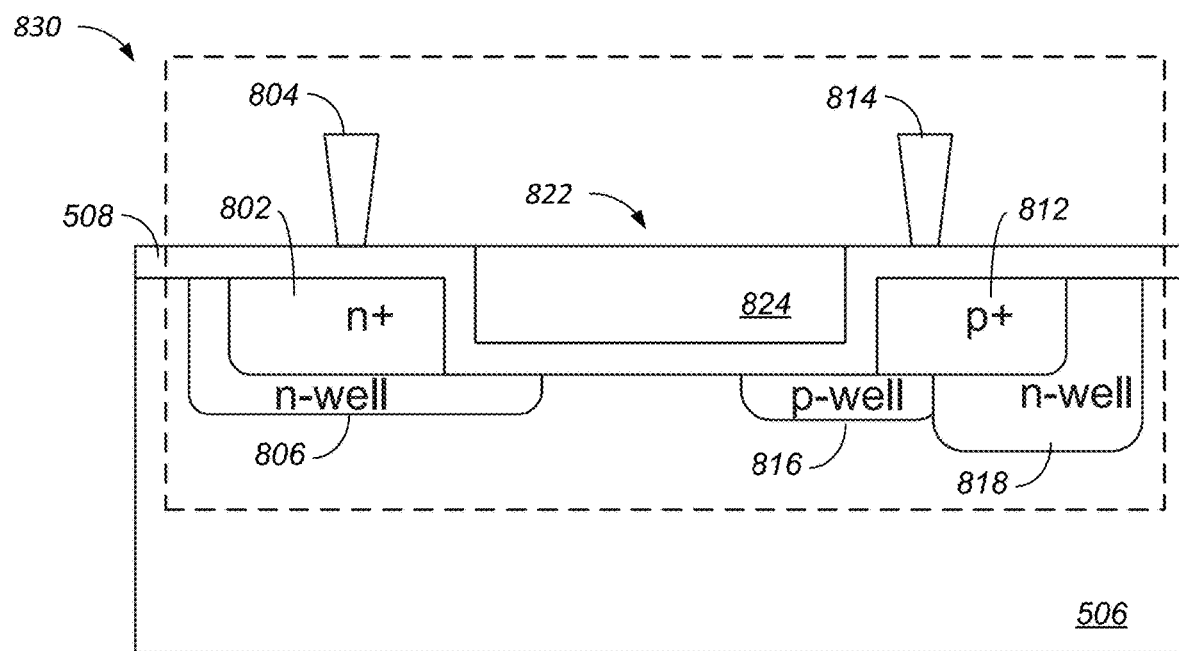

FIG. 8C shows an example switch 830 for a switched photodetector. The switch 830 is similar to the switch 800 of FIG. 8A, but further includes the trench 822 and dielectric fill 824 of FIG. 8B. By simultaneously implementing the lightly-doped regions 806 and 816 and the trench 822, the band-to-band tunneling, the SRH recombination, or combination thereof may be further reduced over individually implementing either the lightly-doped regions 806 and 816 or the trench 822 in isolation.

In general, the reduction in dark current through the use of lightly doped regions 806 and 816 or the trenches 822 depends on the specific design of the switch and the overall design of the switched photodetector that includes the switch. As such, while the implementation shown in FIG. 8C includes both the lightly doped regions 806 and 816 and the trenches 822, a decision to implement the lightly doped regions, the trench, or combination of the two may be based on the specific design of the switched photodetector in which the switch is to be included. Furthermore, while a single trench 822 is shown, in general, the trench 822 may be split into two or more trenches.

While the first layer 508 and the n-well 818 is included in the implementations shown in FIGS. 8A-8D, the first layer 508, the n-well 818, or both may be omitted in some implementations.

So far, various implementations of switched photodetectors and switches for the switched photodetectors have been described. Now, details of the various structures and components of switched photodetectors will be described.

A switched photodetector is typically fabricated on a substrate, such as substrate 102, 202, 302, 402, and 502. The substrate is a carrier material on which the switched photodetector is fabricated. A semiconductor wafer is an example of a substrate. The substrate may be part of the switched photodetector, but in general, the substrate may simply provide a mechanical platform on which the switched photodetector is fabricated. The substrate may be formed from different materials, such as Silicon, Germanium, compound semiconductors (e.g., III-V, II-VI), Silicon Carbide, glass, and sapphire. The substrate may include various layers within. For example, a Silicon-on-Insulator (SOI) substrate includes a base layer of silicon, an insulator layer (e.g., $SiO_2$) on the base layer of silicon, and a device layer of silicon on the layer of insulator. The SOI may include additional device layer-insulator layer pairs. For example, a dual-SOI (DSOI) wafer includes two device layer-insulator layer pairs.

A switched photodetector includes an absorption region configured to absorb incident light and convert the absorbed light into charge carriers. Absorption layers 106, 206, 306, and 406, and absorption regions 506 and 706 are examples of the absorption region. The absorption region may be formed from various absorber materials that absorb the light at the operational wavelengths of the switched photodetector. Example materials for the absorption region include Silicon, Germanium, IV-IV semiconductor alloy (e.g., GeSn, GeSi), III-V compound semiconductors (e.g., GaAs, InGaAs, InP, InAlAs, InGaAlAs), and other materials in the group III, IV, and V of the periodic table. In some implementations, absorption region may be a region within the substrate. For example, a region of a silicon substrate may be used as an absorption region for visible light.

In some implementations, the absorption region may be defined within a light-absorbing material by a change in material composition (e.g., different GeSi composition), by doping a region within the absorbing material (e.g., counter doped region), or by forming an optical window to pass through light (e.g., tungsten grid openings in a BSI image sensor).

The absorber material may be deposited on the substrate. For example, absorber material may be blanket-deposited on the substrate. In some implementations, the absorber material may be deposited on an intermediate layer formed on the substrate. In general, the intermediate layer may be selected based on the absorber material, the substrate, or both. Such intermediate layer may improve device manufacturability and/or improve device performance. Example materials for the intermediate layer include silicon, graded germanium-silicon compound material, graded III-V material, germanium, GaN, and SiC. Graded material refers to a material that has a varying material composition along at least one direction. For example, a graded GeSi material may have a composition that varies from 1% Germanium on one end of the material to 99% Germanium of the other end of the material. In general, the starting and ending composition may be set, for example, based on the substrate composition and the absorber material composition.

In some implementations, the absorber material can be epitaxially grown on the intermediate layer in two or more steps. For example, the absorber material (e.g., Ge, GeSi) may be deposited on a dielectric layer with openings to underlying substrate (e.g., crystalline Silicon substrate). Such multi-step growth procedure may improve material quality (e.g., reduced number of material defects) when the absorber material is deposited on a substrate having mismatched lattice constants. Examples of such multi-step growth procedure is described in U.S. Pat. No. 9,786,715 titled "High Efficiency Wide Spectrum Sensor," which is fully incorporated by reference herein.

Figure 9A:
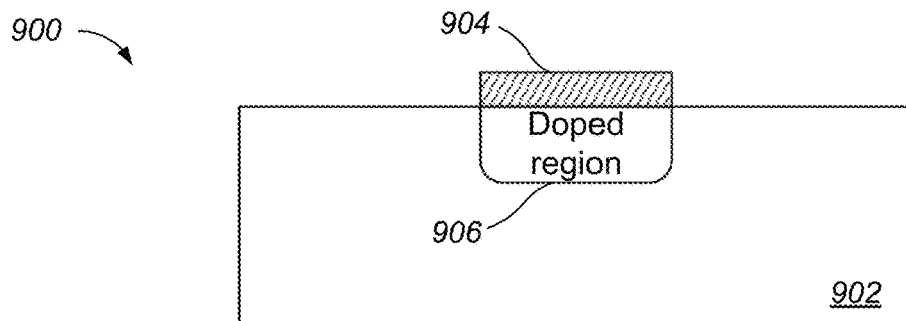
FIGS. 9A-9E are examples of an electrical terminal for a switched photodetector.

FIGS. 9A-9D show example electrical terminals for use in switched photodetectors. Referring to FIG. 9A, an electrical terminal 900 include a region 902, and a contact metal 904, and a doped region 906. The region 902 is a material on which the electrical terminal 900 is formed, and may correspond to an absorption region, such as the absorption region 506, or a substrate, such as the substrate 502. The doped region 906 may be a p-type (acceptor) doped region or an n-type (donor) doped region depending on the type of dopant. The doped region 906 is typically doped to a high doping concentration (e.g., between $1*10^{19}$ to $5*10^{20}$ cm$^{-3}$) to allow an Ohmic contact to be formed between the contact metal 904 and the region 902. Such level of doping concentration may be referred to as "degenerate doping."

The contact metal 904 is a metallic material that is in contact with the region 902 through the doped region 906. The contact metal may be selected from various metals and alloys based on the material of the region 902 and dopants of the doped region 906. Examples include Al, Cu, W, Ti, Ta—TaN—Cu stack, Ti—TiN—W stack, and various silicides.

Figure 9B:
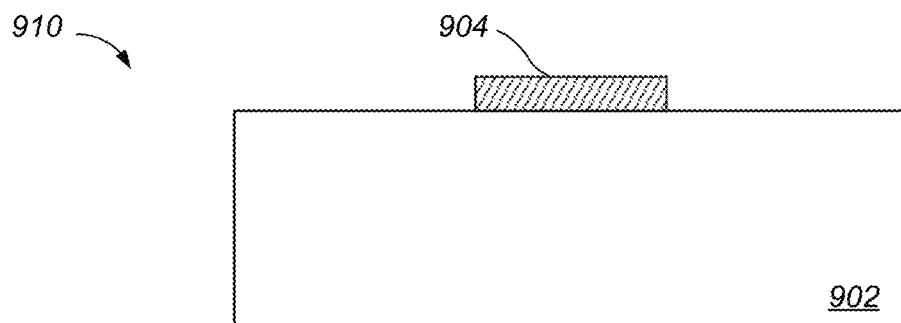

Referring to FIG. 9B, an electrical terminal 910 is similar to the electrical terminal 900 of FIG. 9A, but differs in that the doped region 906 is omitted. The direct placement of the contact metal 904 on the region 902 without the doped region 906 may lead to formation of a Schottky contact, an Ohmic contact, or a combination thereof having an intermediate characteristic between the two, depending on various factors including the material of the region 902, the contact metal 904, and the impurity or defect level of the region 902.

Figure 9C:
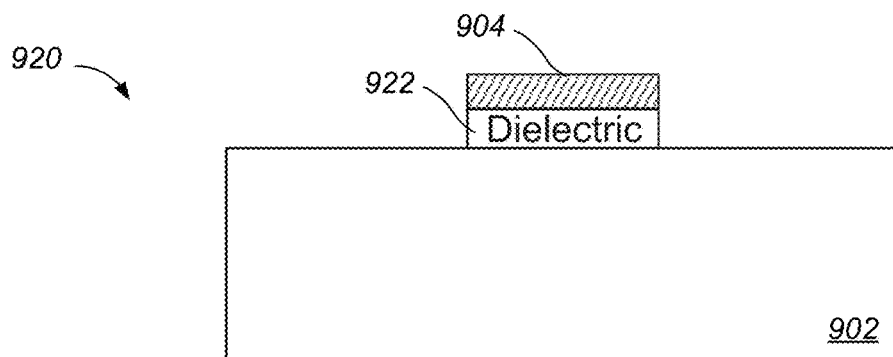

Referring to FIG. 9C, an electrical terminal 920 is similar to the electrical terminal 910 of FIG. 9B, but differs in that a dielectric layer 922 is inserted between the contact metal 904 and the region 902. For example, for a (crystalline) germanium region 902, the dielectric layer 922 may be amorphous silicon, polysilicon, or germanium-silicon. As another example, for a (crystalline) silicon region 902, the dielectric layer 922 may be amorphous silicon, polysilicon, or germanium-silicon. The insertion of the dielectric layer 922 may lead to formation of a Schottky contact, an Ohmic contact, or a combination thereof having an intermediate characteristic between the two.

Figure 9D:
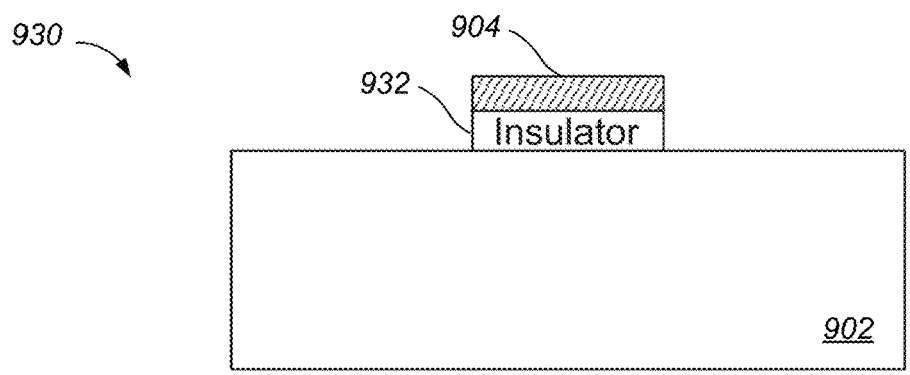

Referring to FIG. 9D, an electrical terminal 930 is similar to the electrical terminal 910 of FIG. 9B, but differs in that an insulating layer 932 is inserted between the contact metal 904 and the region 902. The insulating layer 932 prevents direct current conduction from the contact metal 904 to the region 902, but allows an electric field to be established within the region 902 in response to an application of a voltage to the contact metal 904. The established electric field may attract or repel charge carriers within the region 902. The insulating layer 932 may be $SiO_2$, $Si_3N_4$, or high-k material.

A switch, such as the switch first switch 532 of FIG. 5D, of a switched photodetector includes a carrier control terminal and a carrier collection (readout) terminal. A carrier control terminal is a terminal configured to direct photo-generated carriers within the region 902 in a certain direction (e.g., toward the carrier collection terminal) by application of a control voltage through, for example, an external bias circuitry. The operation of the carrier control terminal has been described in relation to the control signals 122 and 132 of FIG. 1A. Different types of electrical terminals may be used to implement the carrier control terminal. For example, the electrical terminals 900, 910, 920, and 930 may be used to implement the carrier control terminal.

A carrier collection terminal is a terminal configured to collect the photo-generated carriers in the region 902. The carrier collection terminal may be configured to collect electrons (e.g., n-type doped region 906) or holes (e.g., p-type doped region 906). The operation of the carrier collection terminal has been described in relation to the readout circuits 124 and 134 of FIG. 1A. Different types of electrical terminals may be used to implement the carrier collection terminal. For example, the electrical terminals 900, 910, and 920 may be used to implement the carrier collection terminal.

The number of carrier control and carrier collection terminals may be varied based on a variety of considerations, such as target device performance. As examples, a switched photodetector may have the following exemplary configurations: 2 carrier control terminals and 2 carrier collection terminals; 2 carrier control terminals and 1 carrier collection terminal; 4 carrier control terminals and 2 carrier collection terminals; and 4 carrier control terminals and 4 carrier collection terminals. In general, a switched photodetector can have any number of carrier control terminals and carrier collection terminals greater than 1.

When more two or more control terminals are implemented within a switched photodetector, various combinations of the previously described electrical terminals may be used. For example, a combination of Ohmic and Schottky/Ohmic terminals (e.g., terminals 900 and 920), Ohmic and insulating (e.g., terminals 900 and 930), insulating and Schottky/Ohmic (e.g., terminals 930 and 920), and Ohmic and Schottky/Ohmic, and insulating (e.g., terminals 900, 920, and 930) may be used.

When more two or more carrier collection terminals are implemented within a switched photodetector, a combination of Ohmic and Schottky/Ohmic terminals (e.g., terminals 900 and 920) may be used.

Figure 9E:
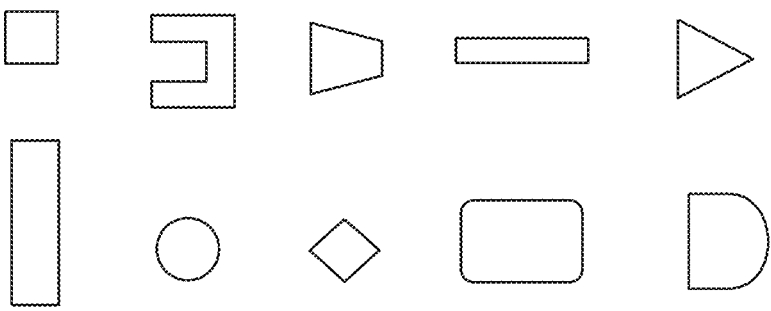

The electrical terminals can have various shapes based on a variety of considerations, such as manufacturability and device performance. FIG. 9E shows an example top view of various shapes of an electrical terminal. The terminals 940 may have rectangular, triangular, circular, polygonal, or may be a combination of such shapes. The corners of the terminals may be sharp, or may be rounded. The shapes can be defined using doping region, metal silicide, contact metal or any combination thereof.

The absorption region and the substrate may be arranged in various configurations, and the absorption region may take on various shapes based on various considerations, such as manufacturability and device performance. Referring to FIGS. 10A-10I, example configurations of an absorption region and a substrate are shown. Specifically, referring to FIG. 10A, a configuration 1000 includes a substrate 1002 and an absorption region 1004 protruding from an upper surface of the substrate 1002. The substrate 1002 may be similar to substrate 502 described in relation to FIG. 5D, and the absorption region 1004 may be similar to absorption region 506 described in relation to FIG. 5D. The configuration 1000 may be fabricated by depositing the absorption region 1004 on the substrate 1002, and etching the absorption region 1004 into the protruding structure.

Figure 10A:
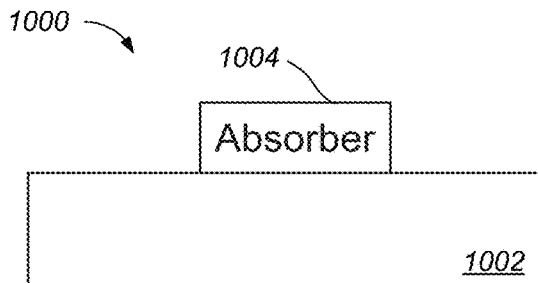
FIGS. 10A-10I are example configurations of a photodetector with an absorption region and a substrate.
Figure 10B:
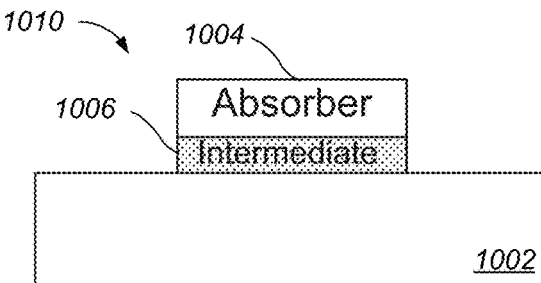

Referring to FIG. 10B, a configuration 1010 is similar to the configuration 1000 in FIG. 10A, but now includes an intermediate layer 1006 between the absorption region 1004 and the substrate 1002. The intermediate layer may be a buffer layer that facilitates the growth of the absorption region 1004 over the substrate 1002. The configuration 1010 may be fabricated by depositing an intermediate layer 1006 on the substrate 1002, depositing the absorption region 1004 on the intermediate layer 1006, and etching the absorption region 1004 and the intermediate layer 1006 into the protruding structure.

Figure 10C:
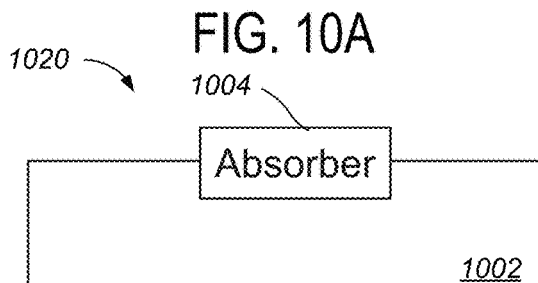

Referring to FIG. 10C, a configuration 1020 is similar to the configuration 1000 in FIG. 10A, but now the absorption region 1004 is partially embedded in the substrate 1002. The configuration 1020 may be fabricated by forming a recess on the substrate 1002, and selectively depositing the absorption region 1004 in the formed recess. Alternatively, the configuration 1020 may be fabricated by depositing a sacrificial layer over the substrate 1002, etching through the deposited sacrificial layer to form the recess on the substrate 1002, selectively depositing the absorbing material, removing the absorbing material deposited outside of the recess by performing a planarizing step such as a chemical-mechanical polishing (CMP) step, and removing the sacrificial layer through a selective etch, such as a wet chemical etch.

Figure 10D:
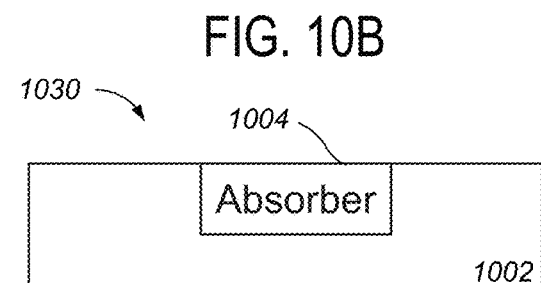

Referring to FIG. 10D, a configuration 1030 is similar to the configuration 1020 in FIG. 10C, but now the absorption region 1004 is fully embedded in the substrate 1002. The configuration 1030 may be fabricated by forming a recess on the substrate 1002, depositing a selective layer of absorbing material over the substrate 1002, and removing the absorbing material deposited outside of the recess by performing a planarizing step, such as a chemical-mechanical polishing (CMP) step.

Figure 10E:
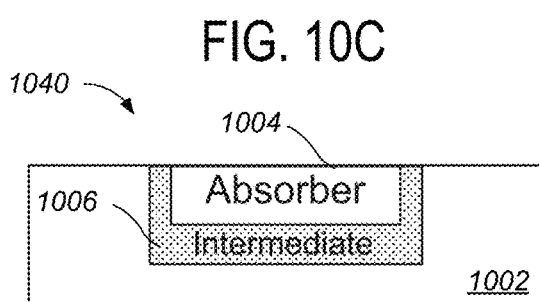

Referring to FIG. 10E, a configuration 1040 is similar to the configuration 1030 in FIG. 10D, but now the intermediate layer 1006 is inserted between, in the recess, the absorption region 1004 and the substrate 1002. The configuration 1040 may be fabricated by forming a recess on the substrate 1002, depositing a conformal layer of the intermediate layer 1006, depositing a blanket layer of absorbing material over the intermediate layer 1006, and removing the absorbing material and the intermediate layer deposited outside of the recess by performing a planarizing step, such as a chemical-mechanical polishing (CMP) step.

Figure 10F:
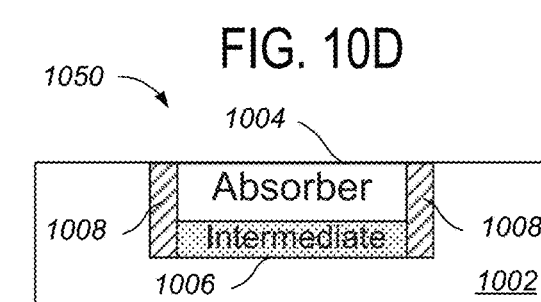

Referring to FIG. 10F, a configuration 1050 is similar to the configuration 1040 in FIG. 10E, but now a second intermediate layer 1008 replaces the first intermediate layer 1006 at the interface between a sidewall of the absorption region 1004 and the sidewall of the recess of the substrate 1002. The configuration 1050 may be fabricated by forming a recess on the substrate 1002, depositing a conformal layer of the second intermediate layer 1008, performing an anisotropic blanket etching to remove the second intermediate layer 1008 along vertical surfaces, depositing a conformal layer of the first intermediate layer 1006, performing an anisotropic blanket etching to remove the first intermediate layer 1006 along non-vertical surfaces, depositing a selective layer of absorbing material, and removing the absorbing material and the first intermediate layer deposited outside of the recess by performing a planarizing step, such as a chemical-mechanical polishing (CMP) step. In an exemplary implementation, the first intermediate layer 1006 may be formed from $SiO_2$, and the second intermediate layer 1008 may be formed from GeSi.

Figure 10G:
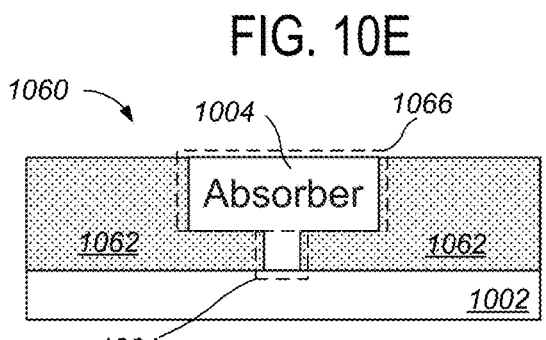

Referring to FIG. 10G, a configuration 1060 is similar to the configuration 1000 in FIG. 10A, but now includes a tiered intermediate layer 1062 in which the absorption region 1004 is embedded. The tiered intermediate layer 1062 includes an opening 1064 to the substrate 1002, and a recess 1066 in which the absorption region 1004 is embedded. The absorption region 1004 contacts the substrate 1002 through the opening 1064. The configuration 1060 may be fabricated by depositing an intermediate layer on the substrate 1002, etching the opening 1064 throughout the entire thickness of the deposited intermediate layer, etching the recess 1066 in the deposited intermediate layer, depositing the absorption region 1004 on the tiered intermediate layer 1062, and removing the absorbing material deposited outside of the recess 1066 by performing a planarizing step, such as a chemical-mechanical polishing (CMP) step.

Figure 10H:
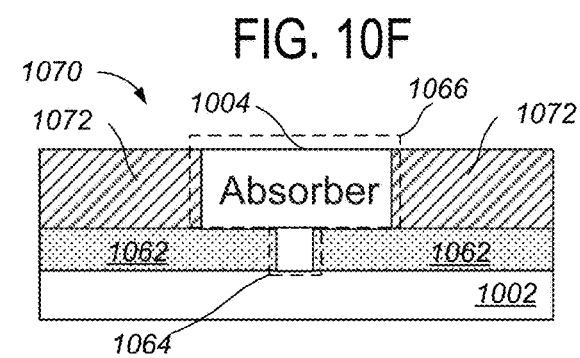

Referring to FIG. 10H, a configuration 1070 is similar to the configuration 1060 in FIG. 10G, but now includes a second intermediate layer 1072 in which the recess 1066 is formed. The configuration 1070 may be fabricated by depositing the first intermediate layer 1062 on the substrate 1002, depositing the second intermediate layer 1072, etching the opening 1064 through the first intermediate layer 1062 and the second intermediate layer 1072, etching the recess 1066 in the second intermediate layer 1072, depositing the absorption region 1004, and removing the absorbing material deposited outside of the recess 1066 by performing a planarizing step, such as a chemical-mechanical polishing (CMP) step.

Figure 10I:
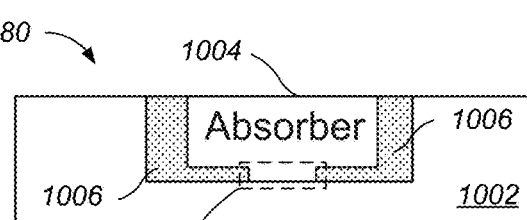

Referring to FIG. 10I, a configuration 1080 is similar to the configuration 1040 in FIG. 10E, but now includes an opening 1084 formed on the intermediate layer 1006. The absorption region 1004 contacts the substrate 1002 through the opening 1084. The configuration 1080 may be fabricated by forming a recess on the substrate 1002, depositing a conformal layer of the intermediate layer 1006, etching the opening 1084, depositing a blanket layer of absorbing material over the intermediate layer 1006, and removing the absorbing material and the intermediate layer deposited outside of the recess by performing a planarizing step, such as a chemical-mechanical polishing (CMP) step.

Figure 11A:
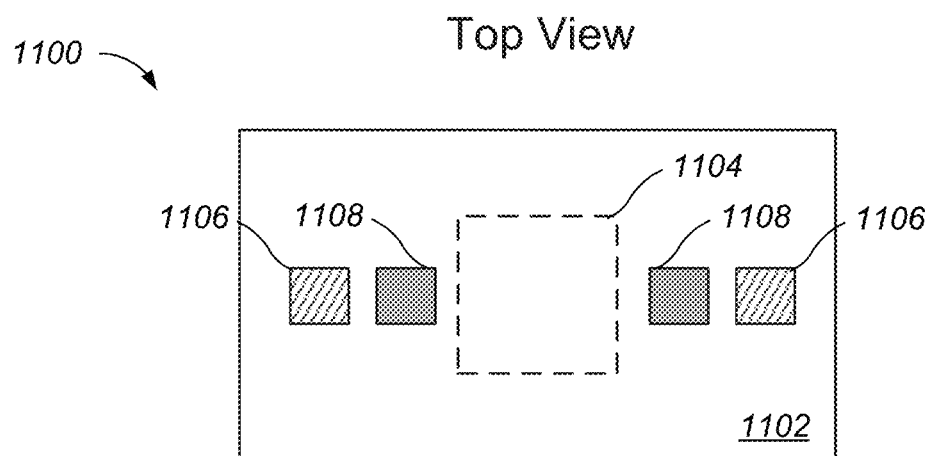
FIGS. 11A-11F are top and side views of examples of switched photodetectors.
Figure 11B:
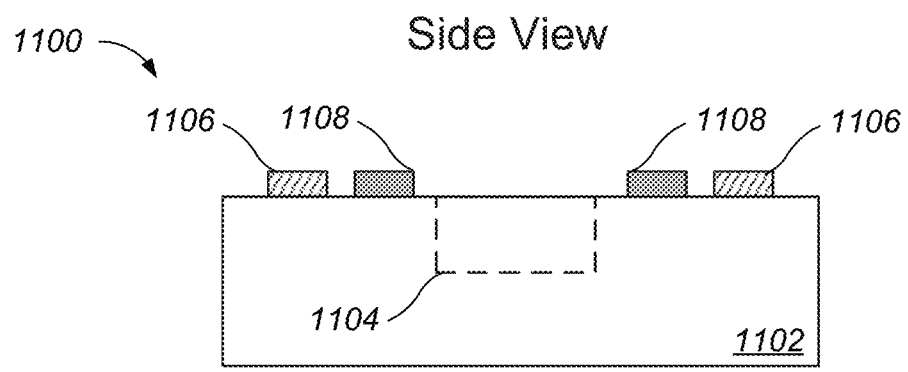

The absorption region, the carrier control terminals, and the carrier collection terminals may be arranged in various configurations based on a variety of considerations, such as manufacturability and device performance. FIGS. 11A-11B show a top view and a side view of an example switched photodetector 1100 in which the carrier control terminals and the carrier collection terminals are placed on the substrate, and a portion of the substrate is the absorption region. In this example, the switched photodetector 1100 includes a substrate 1102, an absorption region 1104, carrier collection terminals 1106, and carrier control terminals 1108. The absorption region 1104 is a region within the substrate 1102. For example, for a silicon substrate 1102, the absorption region 1104 is formed in silicon, and the absorption region 1104 may absorb visible light. The absorption region 1104 may have various shapes, e.g., a square shape in a top view of the photodetector 1100. The absorption region 1104 may extend from an upper surface of the substrate 1102 and into a desired depth below the upper surface. For example, the absorption region 1104 may extend 1 µm, 2 µm, 3 µm, 5 µm, or 10 µm below the upper surface of the substrate 1102. Adjacent pairs of the carrier collection terminal 1106 and the carrier control terminal 1108 forms a switch. The absorption region 1104 is arranged between the adjacent pairs of carrier collection terminal 1106 and the carrier control terminal 1108. In some implementations, the adjacent pairs of carrier collection terminal and carrier control terminal are arranged symmetrically about the absorption region 1104 (e.g., on opposite sides or on the four sides of the absorption region 1104). Such symmetric placement may improve matching of carrier control and collection performance of the two switches formed by the pairs.

Figure 11C:
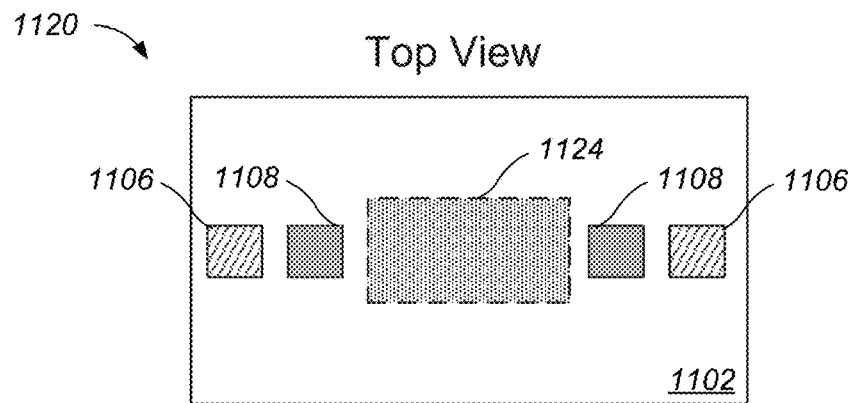
Figure 11D:
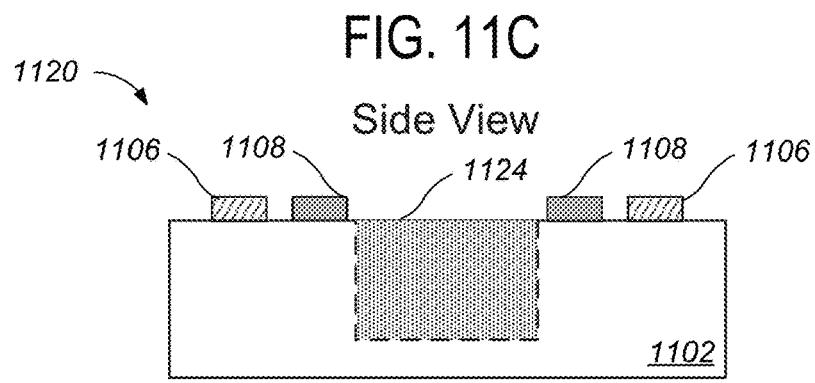

FIGS. 11C-11F show a top view and side views of example switched photodetectors in which the absorption regions are formed from a material different than the substrate. Referring to FIGS. 11C-11D, the switched photodetector 1120 includes the substrate 1102, an absorption region 1124, the carrier collection terminals 1106, and the carrier control terminals 1108. FIG. 11C shows a top view of the switched photodetector 1120, and FIG. 11D shows a side view of the switched photodetector 1120. The switched photodetector 1120 is similar to the switched photodetector 1100 of FIGS. 11A-11B, but differs in that the absorption region 1124 of the switched photodetector 1120 is formed from a material different than the substrate 1102. For example, the absorption region 1124 may be formed from germanium, and the substrate 1102 may be a silicon substrate. The absorption region 1124 is fully embedded in a recess formed in the substrate 1102. While specifics of the embedded structure are not shown, the embedded absorption region 1124 may be implemented, for example, as described in relation to FIGS. 10D-10F and FIG. 5C.

Figure 11E:
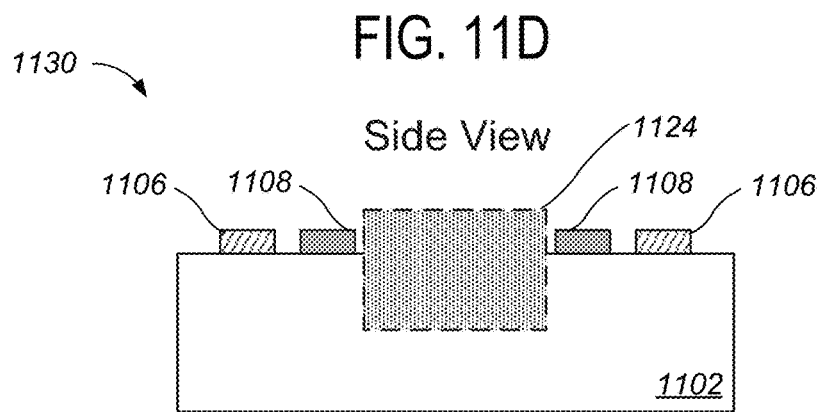

Referring to FIG. 11E, a switched photodetector 1130 is similar to the switched photodetector 1120 of FIGS. 11C-11D, but differs in that the absorption region 1124 is now partially embedded in the substrate 1102. While specifics of the partially embedded structure are not shown, the partially embedded absorption region 1124 may be implemented, for example, as described in relation to FIG. 10C and FIG. 5B.

Figure 11F:
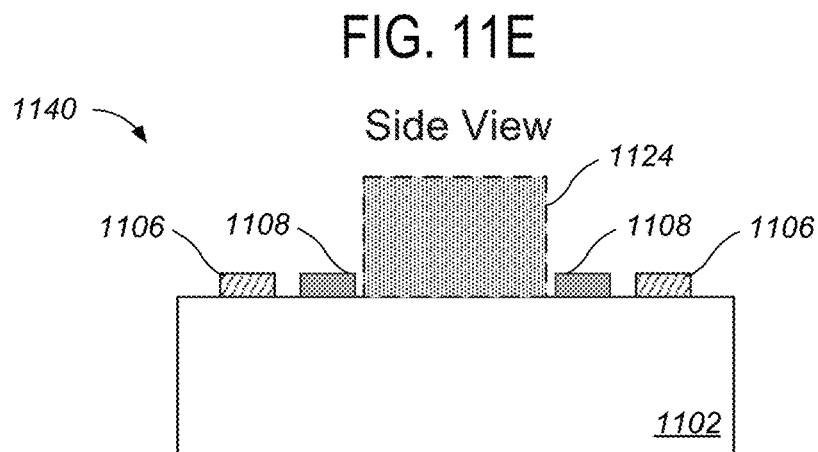

Referring to FIG. 11F, a switched photodetector 1140 is similar to the switched photodetector 1120 of FIGS. 11C-11D, but differs in that the absorption region 1124 is now fully protruding on the substrate 1102. While specifics of the fully protruding structure are not shown, the full protruding absorption region 1124 may be implemented, for example, as described in relation to FIGS. 10A-10B and FIG. 5A.

Figure 12A:
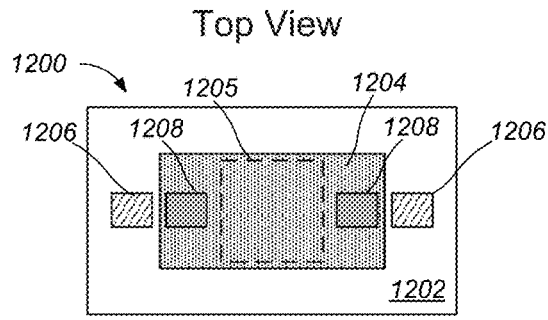
FIGS. 12A-12H are top and side views of examples of switched photodetectors.

In some configurations of the switched photodetectors, the carrier collection terminals, the carrier control terminals, or both may be placed on an absorption region. Descriptions of the implementation details of the substrate, the absorption region, the carrier control terminals, and the carrier collection terminals will be omitted for brevity. FIGS. 12A-12B show a top view and a side view of an example switched photodetector 1200 in which the carrier collection terminals are placed on the substrate, and the carrier control terminals are placed on an absorption region. The switched photodetector 1200 includes a substrate 1202, an absorption region 1204, a light receiving region 1205, carrier collection terminals 1206, and carrier control terminals 1208. The light receiving region 1205 may indicate a portion of the absorption region 1204 on which input light is incident, and may be physically indistinguishable from the remaining portion of the absorption region 1204. For example, a combination of a light shield (e.g., tungsten grid) and a microlens may block and focus the incident light onto the light receiving region 1205. The carrier collection terminals 1206 are placed on the substrate 1202, and the carrier control terminals 1208 are placed on the absorption region 1204 on a location that does not overlap with the light receiving region 1205. For the switched photodetector 1200, the absorption region 1204 is fully protruding. The absorption region 1204 may be partially embedded as shown in FIG. 12C for a switched photodetector 1220, or fully embedded as shown in FIG. 12D for a switched photodetector 1230.

Figure 12E:
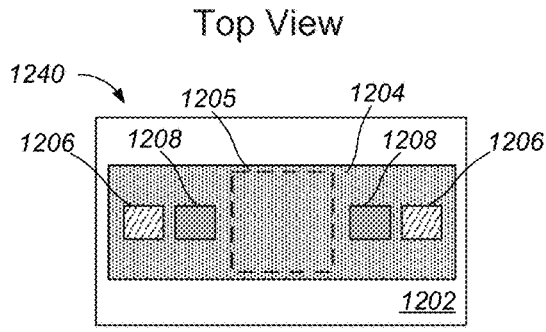
Figure 12B:
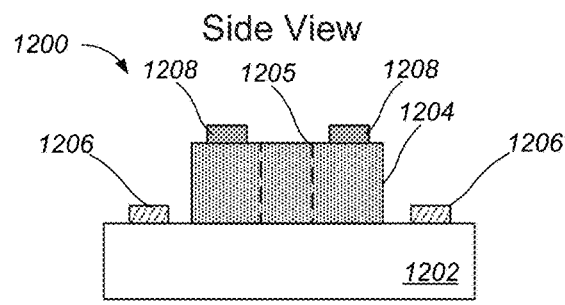
Figure 12F:
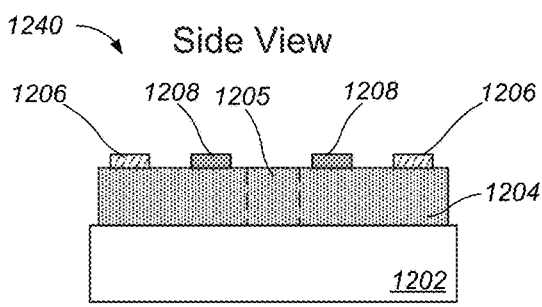
Figure 12C:
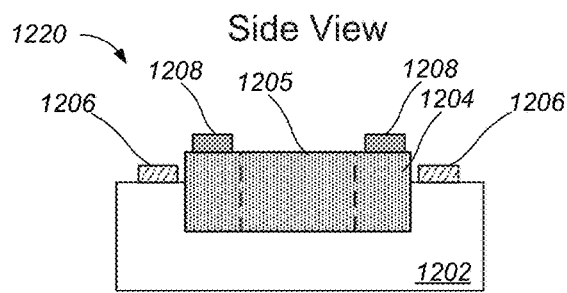
Figure 12G:
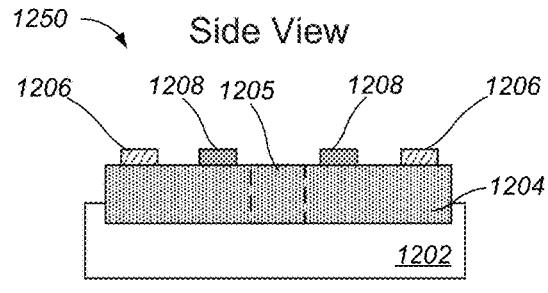
Figure 12D:
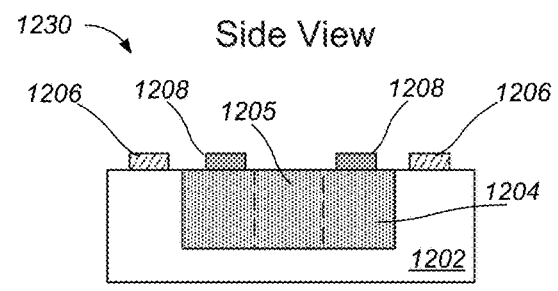
Figure 12H:
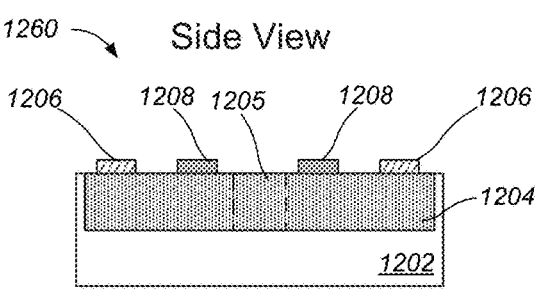

FIGS. 12E-12F show a top view and a side view of an example switched photodetector 1240 in which both the carrier collection terminals and the carrier control terminals are placed on the absorption region. The switched photodetector 1240 is similar to the switched photodetector 1200 of FIGS. 12A-12B, but differs in that the carrier collection terminals 1206 are now placed on the absorption region 1204 on a location that does not overlap with the light receiving region 1205. For the switched photodetector 1240, the absorption region 1204 is fully protruding. The absorption region 1204 may be partially embedded as shown in FIG. 12G for a switched photodetector 1250, or fully embedded as shown in FIG. 12H for a switched photodetector 1260.

While light receiving regions 1205 in FIGS. 12A-12H are shown to not overlap with the carrier collection terminals or the carrier control terminals, in general, the light receiving regions 1205 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

Figure 13A:
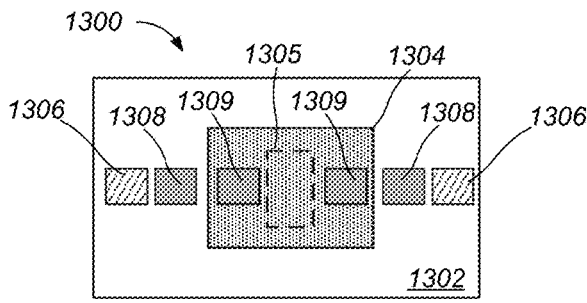
FIGS. 13A-13G are top and side views of examples of switched photodetectors.

In some configurations of the switched photodetectors, each switch may include more than one carrier collection terminals, more than one carrier control terminals, or more than one of both. Descriptions of the implementation details of the substrate, the absorption region, the light receiving region, the carrier control terminals, and the carrier collection terminals will be omitted for brevity. FIGS. 13A-13G show top views of example switched photodetectors having switches that include multiple carrier control terminals or multiple carrier collection terminals. Referring to FIG. 13A, the switched photodetector 1300 includes a substrate 1302, an absorption region 1304, a light receiving region 1305, substrate carrier collection terminals 1306, substrate carrier control terminals 1308, and absorber carrier control terminals 1309. The substrate carrier collection terminals 1306 are carrier collection terminals placed on a substrate, such as the substrate 1302. The substrate carrier control terminals 1308 are carrier control terminals placed on a substrate, such as the substrate 1302. The absorber carrier control terminals 1309 are carrier control terminals placed on an absorption region, such as the absorption region 1304. The effects and implementation details of the absorber carrier control terminals 1309 in combination with the substrate carrier control terminal 1308 have been described in relation to FIG. 5K. In some implementations, the illustrated arrangement of the substrate carrier collection terminals 1306, the substrate carrier control terminals 1308, and the absorber carrier control terminals 1309 may be repeated in a second row as shown in FIG. 13B.

Referring to FIG. 13B, the switched photodetector 1310 is similar to the switched photodetector 1300 of FIG. 13A, but differs in that the substrate carrier control terminals 1308 has been omitted, and a second row of pairs of terminals 1306 and 1309 has been added. The second pairs of control and collection terminals may function independent of, or function in combination with the first pairs of control and collection terminals that are adjacent to the second pairs of terminals.

Figure 13D:
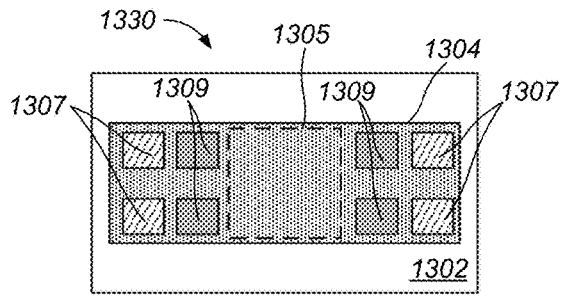
Figure 13B:
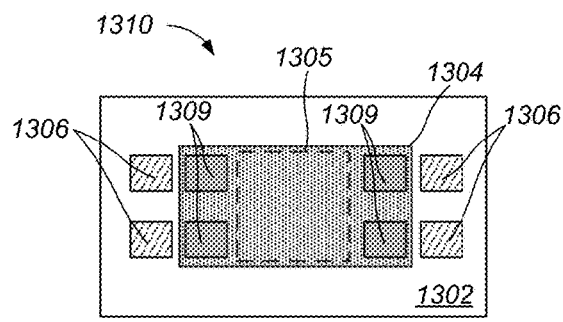
Figure 13E:
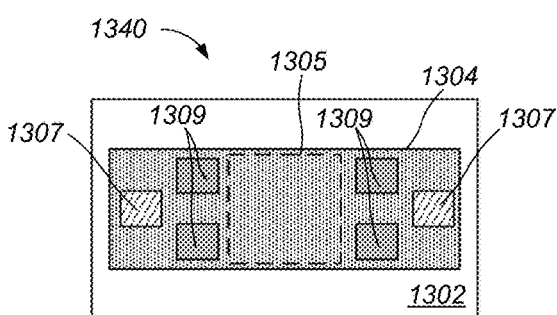
Figure 13C:
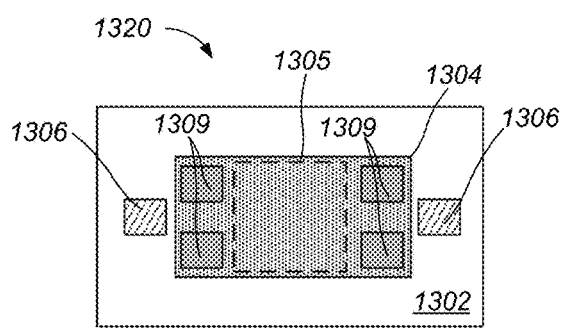

Referring to FIG. 13C, the switched photodetector 1320 is similar to the switched photodetector 1310 of FIG. 13B, but differs in that one of the substrate carrier collection terminals 1306 has been removed from each side of the light receiving region 1305. The pairs of absorber carrier control terminals 1309 on each side of the light receiving region 1305 in combination with respective substrate carrier collection terminals 1306 may function as a switch.

Referring to FIG. 13D, the switched photodetector 1330 is similar to the switched photodetector 1310 of FIG. 13B, but differs in that the substrate carrier collection terminals 1306 have been moved onto the absorption region 1304 as absorber carrier collection terminals 1307.

Referring to FIG. 13E, the switched photodetector 1340 is similar to the switched photodetector 1330 of FIG. 13D, but differs in that one of the absorber carrier collection terminals 1307 has been removed from each side of the light receiving region 1305. The pairs of absorber carrier control terminals 1309 on each side of the light receiving region 1305 in combination with respective absorber carrier collection terminals 1307 may function as a switch.

Figure 13F:
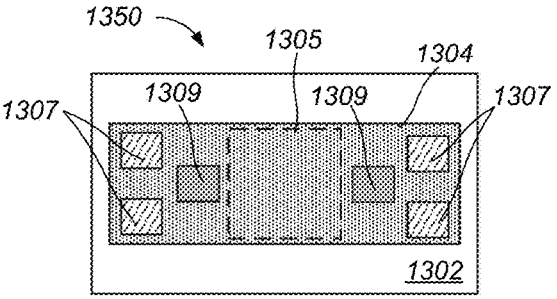

Referring to FIG. 13F, the switched photodetector 1350 is similar to the switched photodetector 1330 of FIG. 13D, but differs in that one of the absorber carrier control terminals 1309 has been removed from each side of the light receiving region 1305. The pairs of absorber carrier collection terminals 1307 on each side of the light receiving region 1305 in combination with respective absorber carrier control terminals 1309 may function as a switch.

Figure 13G:
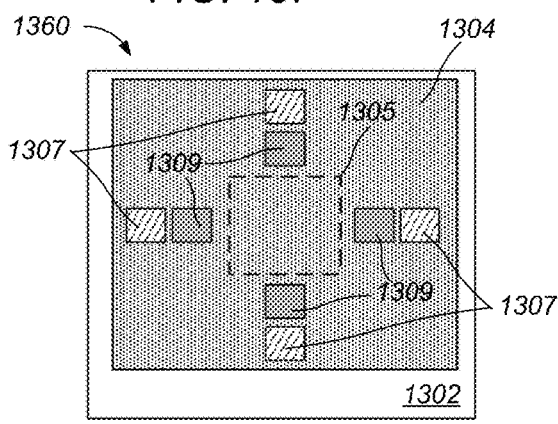

Referring to FIG. 13G, the switched photodetector 1360 is similar to the switched photodetector 1330 of FIG. 13D, but differs in that four pairs of absorber carrier collection and control terminals 1307 and 1309 are now symmetrically arranged about the light receiving region 1305. Each pair of terminals 1307 and 1309 may function as a switch. Each switch may function independently, or function in tandem with another switch. For example, east and west switches may be controlled as a first switch and north and south switches may be controlled as a second switch. As another example, the east and south switches may be controlled as a first switch and west and north switches may be controlled as a second switch.

While light receiving regions 1305 in FIGS. 13A-13G are shown to not overlap with the carrier collection terminals or the carrier control terminals, in general, the light receiving regions 1305 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

Figure 14A:
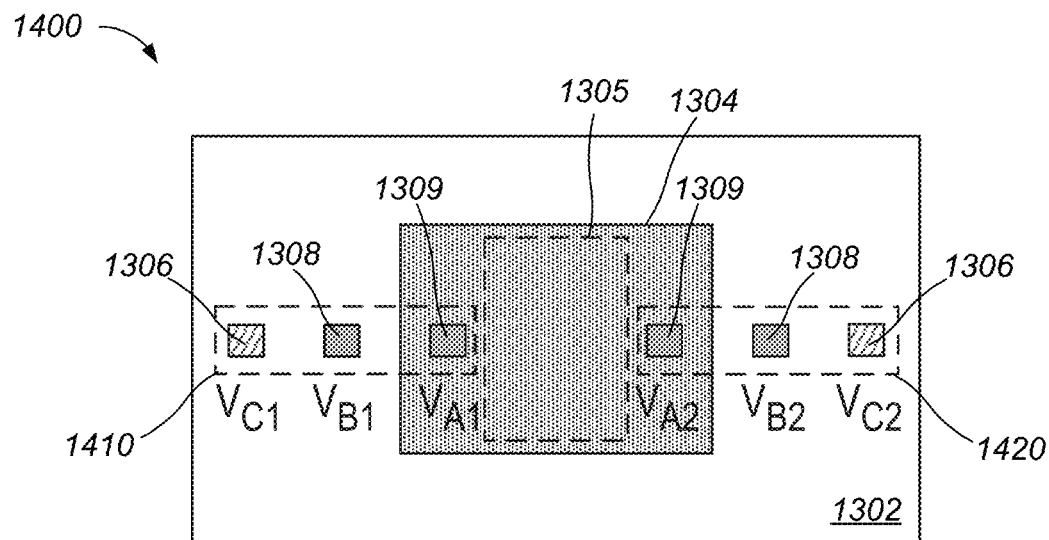
FIGS. 14A-14B are top views of examples of switched photodetectors.
Figure 14B:
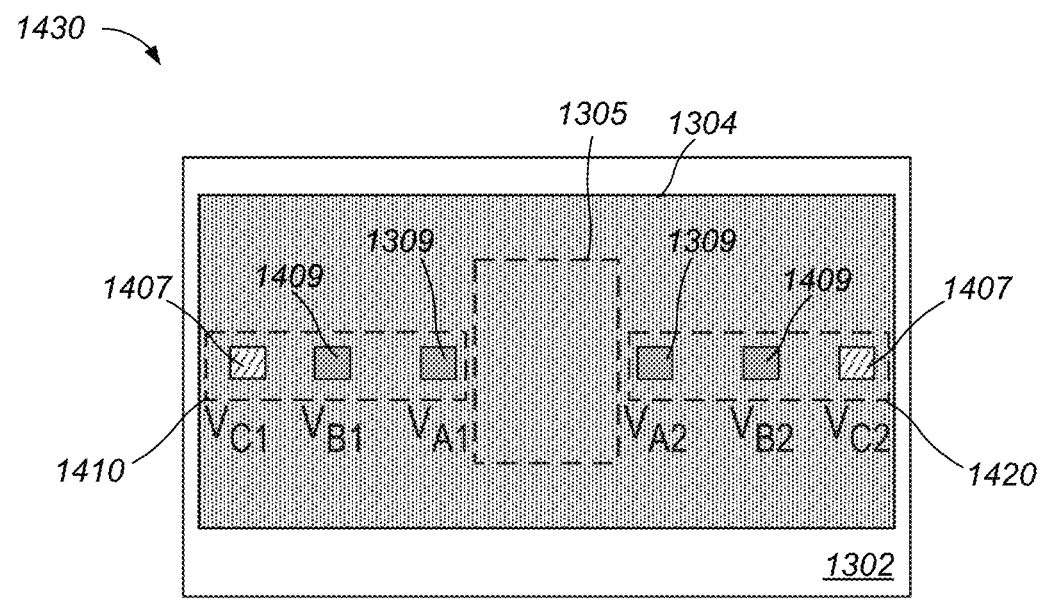

For switches having two or more carrier control terminals, the carrier control terminals may be biased independently with independently controlled bias voltages, or the carrier control terminals may be shorted together and biased with a single bias voltage. FIGS. 14A-14B show top views of example switched photodetectors having switches that include multiple carrier control terminals. Referring to FIG. 14A, the switched photodetector 1400 is similar to the switched photodetector 1300 of FIG. 13A. The substrate carrier collection terminal 1306, the substrate carrier control terminal 1308, and the absorber carrier control terminal 1309 on the left side of the light receiving region 1305 forms a first switch 1410. The substrate carrier collection terminal 1306, the substrate carrier control terminal 1308, and the absorber carrier control terminal 1309 on the right side of the light receiving region 1305 forms a second switch 1420.

Within the switches 1410 and 1420, the substrate carrier control terminal 1308 and the absorber carrier control terminal 1309 may be shorted together and biased with a single bias voltage, or biased with independently controlled bias voltages. For example, the substrate carrier control terminal 1308 of the first switch 1410 is biased with voltage $V_{B1}$ and the absorber carrier control terminal 1309 is biased with voltage $V_{A1}$. Similarly, the substrate carrier control terminal 1308 of the second switch 1420 is biased with voltage $V_{B2}$ and the absorber carrier control terminal 1309 is biased with voltage $V_{A2}$. In some implementations, the control terminals closer to the light receiving region 1305, such as the absorber carrier control terminals 1309, may be biased to respective control voltages $V_{A1}$ and $V_{A2}$ to direct the photo-generated carriers in the light receiving region 1305 toward the substrate carrier collection terminals 1306 that are biased to voltages $V_{c1}$ $_{and}$ $V_{c2}$ as shown. Simultaneously, the substrate control terminals 1308 may be biased to voltages $V_{b1}$ $_{and}$ $V_{b2}$ to establish a high electric field between the substrate control terminals 1308 and the substrate carrier collection terminals 1306. With sufficiently high electric field between the terminals 1308 and 1306, a region of avalanche multiplication may be established between the terminals 1308 and 1306, providing an avalanche gain to the photo-generated carriers that have been directed toward the substrate carrier collection terminal 1306 by the absorber carrier control terminal 1309. As a result, the photo-generated carrier may be multiplied by an avalanche gain, which may increase the photocurrent signal generated by the switched photodetector 1400.

Referring to FIG. 14B, the switched photodetector 1430 is similar to the switched photodetector 1400 of FIG. 14A, but differs in that the substrate carrier collection terminals 1306 have been relocated onto the absorption region 1304 as absorber carrier collection terminals 1407, and the substrate carrier control terminals 1308 have been relocated onto the absorption region 1304 as absorber carrier control terminals 1409. The effects of the different biases to the terminals are analogous to the effects described in relation to FIG. 14A.

While light receiving regions 1305 in FIGS. 14A-14B are shown to not overlap with the carrier collection terminals or the carrier control terminals, in general, the light receiving regions 1305 may overlap with at least a portion of the carrier control terminals, at least a portion of the carrier collection terminals, and at least a portion of the various n-doped regions or p-doped regions. For example, such overlap may be present for a pixel that is used in both FSI and BSI configurations.

In typical implementations of an image sensor, multiple sensor pixels (e.g., photodetectors) are arranged in an array to allow the image sensor to capture images having multiple image pixels. To allow high integration density, multiple sensor pixels are typically arranged in close proximity to each other on a common substrate. For a semiconducting substrate, such as p-doped silicon substrates, the proximity of the sensor pixels to each other may cause electrical and/or optical crosstalk between the sensor pixels, which may, for example, decrease a signal to noise ratio of the sensor pixels. As such, various isolation structures may be implemented to improve electrical isolation between the sensor pixels.

Figure 15A:
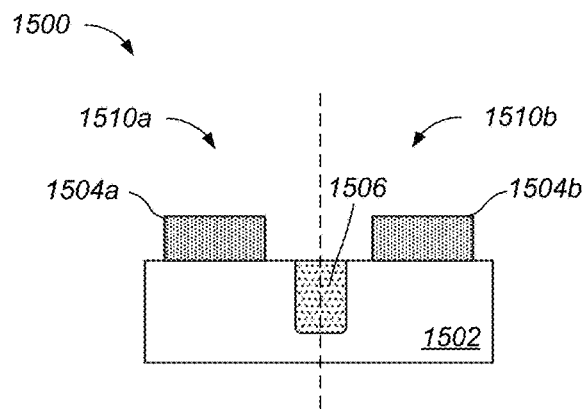
FIGS. 15A-15G are cross-sectional views of example configurations of sensor pixel isolation.

FIGS. 15A-15G show cross-sectional views of example configurations of sensor pixel isolation. Referring to FIG. 15A, an example configuration 1500 includes a substrate 1502, sensor pixels 1510a and 1510b (collectively referred to as sensor pixels 1510), and an isolation structure 1506. The sensor pixels 1510a and 1510b include respective absorption regions 1504a and 1504b. Each sensor pixels 1510 may be a switched photodetector, such as the switched photodetectors of FIGS. 5A-5L. Details of the sensor pixels 1510 has been omitted for clarity.

The isolation structure 1506 may increase the electrical isolation between the sensor pixels 1510a and 1510b. In configuration 1500, the isolation structure extends from an upper surface of the substrate 1502 and extends into a predetermined depth from the upper surface. In some implementations, the isolation structure 1506 is a doped region that has been doped with p-type dopants or n-type dopants. The doping of the isolation structure 1506 may create a bandgap offset-induced potential energy barrier that impedes a flow of current across the isolation structure 1506 and improving electrical isolation between the pixels 1510a and 1510b. In some implementations, the isolation structure 1506 is a trench filled with a semiconductor material that is different from the substrate 1502. An interface between two different semiconductors formed between the substrate 1502 and the isolation structure 1506 may create a bandgap offset-induced energy barrier that impedes a flow of current across the isolation structure 1506 and improving electrical isolation between the pixels 1510a and 1510b.

In some implementations, the isolation structure 1506 is a trench filled with a dielectric or an insulator. The isolation structure 1506 filled with a low conductivity dielectric or insulator may provide a region of high electrical resistance between the sensors pixels 1510a and 1510b, impeding a flow of current across the isolation structure 1506 and improving electrical isolation between the pixels 1510a and 1510b.

While a single isolation structure 1506 has been shown, in general, there may be multiple isolation structures 1506 arranged between each neighboring pairs of sensor pixels 1510. For example, in a 2D array of sensor pixels 1510, a single sensor pixel 1510 may be surrounded by four nearest-neighbor sensor pixels 1510. In such a case, the isolation structure 1506 may be placed along the four nearest-neighbor interfaces. In some implementations, the isolation structure 1506 may be a continuous structure that surround the sensor pixel 1510. The isolation structure 1506 may be shared at the interfaces between the pixels 1510.

Figure 15B:
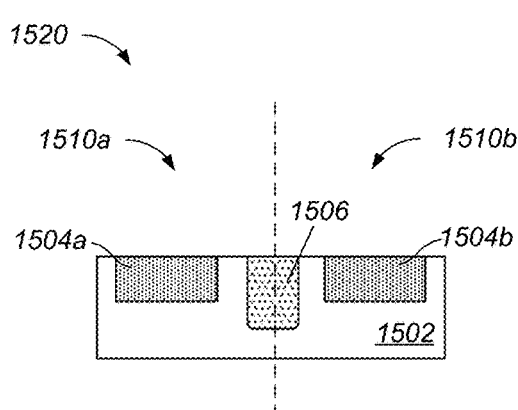

Referring to FIG. 15B, an example configuration 1520 is similar to the configuration 1500 of FIG. 15A, but differs in that the absorption regions 1504a and 1504b are fully embedded in the substrate 1502.

Figure 15C:
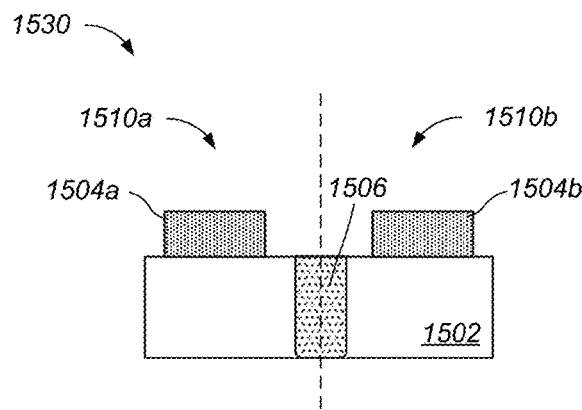

Referring to FIG. 15C, an example configuration 1530 is similar to the configuration 1500 of FIG. 15A, but differs in that the isolation structure 1506 extends from the upper surface of the substrate 1502 to the lower surface of the substrate 1502 through the entire depth of the substrate 1502. Configuration 1530 may remove alternative conduction paths between the sensor pixels 1510 that diverts the isolation structure 1506, and may improve electrical isolation between the sensor pixels 1510.

Figure 15D:
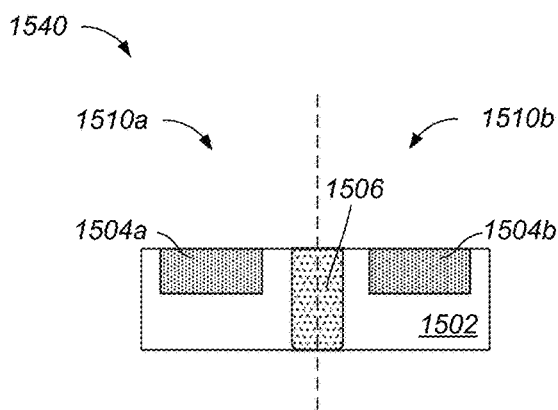

Referring to FIG. 15D, an example configuration 1540 is similar to the configuration 1530 of FIG. 15C, but differs in that the absorption regions 1504a and 1504b are fully embedded in the substrate 1502.

Figure 15E:
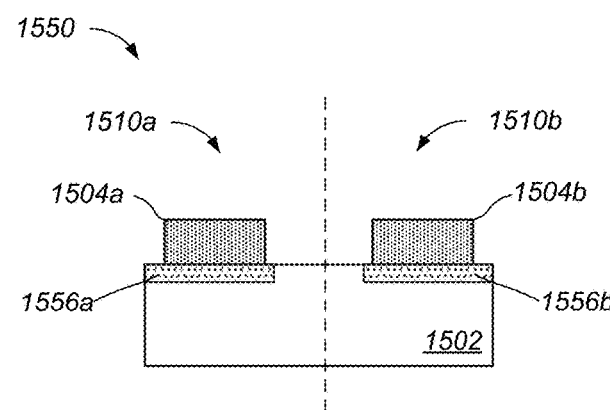

Referring to FIG. 15E, an example configuration 1550 includes the substrate 1502, the sensor pixels 1510a and 1510b (collectively referred to as sensor pixels 1510), and isolation structures 1556a and 1556b (collectively referred to as isolation structures 1556). The isolation structures 1556a and 1556b is similar to the isolation structure 1506 described in relation to FIG. 15A, but differs in that the isolation structures 1556 are arranged on a portion of the substrate 1502 immediately below the respective absorption regions 1504. Such arrangement of the isolation structures 1556 between the absorption region 1504 and the substrate 1502 may help confine the photo-generated carriers to the absorption region 1504 and help reduce the leakage of the photo-generated carriers into the substrate 1502. For example, the sensor pixels 1510a and 1510b may be implemented as the switched photodetector 530 of FIG. 5D, which has all the electrical terminals placed on the absorption region 1504. In such a case, the electrical isolation provided by the isolation structure 1556 (e.g., a thin p-doped layer) may improve photocurrent collection efficiency and/or bandwidth of the sensor pixels 1510.

Figure 15F:
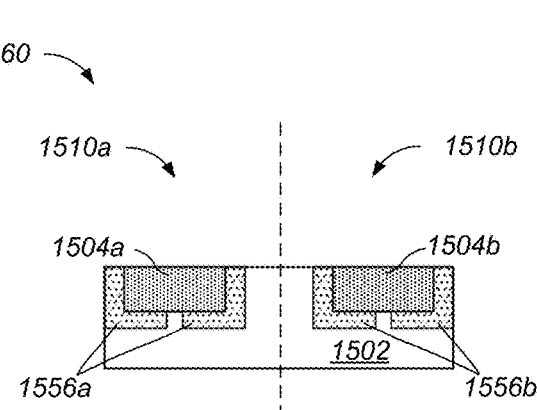

Referring to FIG. 15F, an example configuration 1560 is similar to the configuration 1550 of FIG. 15E, but differs in that the absorption regions 1504a and 1504b are fully embedded in the substrate 1502, and the isolation structures 1556 partially or fully surrounds the absorption regions 1504. For isolation structures 1556 that are formed from insulator or dielectric, the isolation structures 1556 may include an opening below the absorber and partially surround the embedded absorption regions 1504. For isolation structures 1556 that are doped regions, the isolation structures 1556 may be a continuous structure that fully surrounds the embedded absorption regions 1504 without the opening.

Figure 15G:
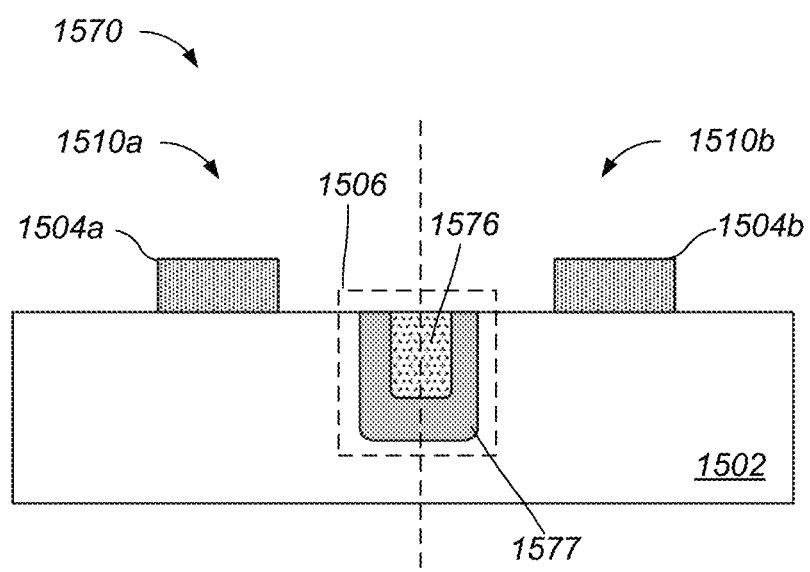

While isolation structures that are doped regions, dielectric material, or insulator have been described, in general, the isolation structure may be a combination of such implementations. Referring to FIG. 15G, an example configuration 1570 is similar to the configuration 1500 of FIG. 15A, but differ in that the isolation structure 1506 includes a first isolation structure 1576 and a second isolation structure 1577. The first isolation structure 1576 may be a trench filled with a semiconductor material that is different from the substrate 1502 or a trench filled with a dielectric or an insulator. The second isolation structure 1577 may be a doped region that has been doped with p-type dopants or n-type dopants. The isolation structure 1504 that implements both different materials and doped regions may further improve electrical isolation between the sensor pixels 1510 over isolation structures that implement one in isolation. In some implementations, a doping isolation may be used to form the second isolation structure 1577 while a material isolation through trench fill may be used to form the first isolation structure 1576 in which the doping isolation is shallower than the material isolation.

Figure 16A:
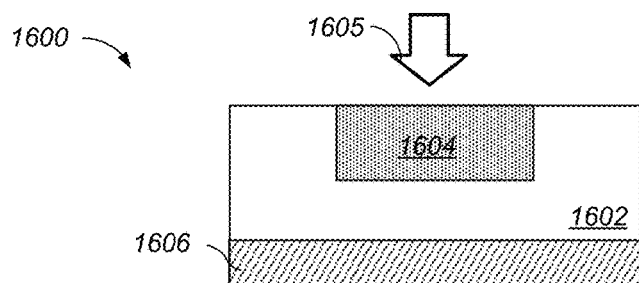
FIGS. 16A-16J are cross-sectional views of example configurations of photodetectors.

Light detection efficiency of a photodetector, such as a switched photodetector, may be enhanced by addition of various structures that modify optical characteristics of the photodetector. For example, mirrors, dielectric layers, and anti-reflection coating (ARC) layers can be added alone or in combination to achieve various effects including increased absorption of light by an absorption region, creation of an optical resonance cavity, and/or alteration of the spectral response of the photodetector. FIGS. 16A-16J show cross-sectional views of example configurations for improving detection efficiency of a photodetector. Referring to FIG. 16A, an example configuration 1600 includes a substrate 1602, an absorption region 1604, and a metal mirror 1606. The absorption region 1604 forms a photodetector. The metal mirror 1606 reflects incident light.

An optical signal 1605 is incident on the absorption region 1604 from the top as shown, which may be referred to as a front-side illumination (FSI) configuration. In such configurations, in some cases, the optical signal 1605 may not be fully absorbed by the absorption region 1604, and a portion of the optical signal 1605 may pass through the absorption region 1604. Such light that passes through the absorption region 1604 without being absorbed may reduce detection efficiency of the photodetector. By placing the metal mirror 1606 on a lower surface of the substrate 1602 to reflect the passed-through portion of the optical signal 1605, the passed-through portion may be reflected back toward the absorption region 1604 for a second pass through the absorption region 1604, improving detection efficiency.

The portion of the optical signal 1605 that gets absorbed by the absorption region 1604 may be a function of optical absorption coefficient of the absorption region 1604, the thickness of the absorption region 1604 along the direction of light incidence (e.g., along the vertical direction), and the wavelength of the optical signal 1605.

The metal mirror 1606 may be formed from various optically reflective metals, such as copper, aluminum, gold, and platinum. The metal mirror 1606 may have reflectivity greater than 50%, 60%, 70%, 80%, 90%, or 95% at the operation wavelength of the photodetector of the configuration 1600. The thickness of the metal mirror 1606 may be greater than a skin-depth of the metal. For example, the metal mirror 1606 may have a thickness ranging from 50 nm to 500 nm.

Figure 16E:
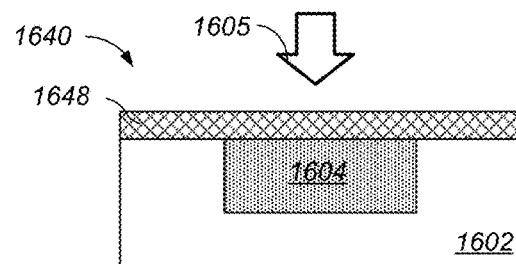
Figure 16B:
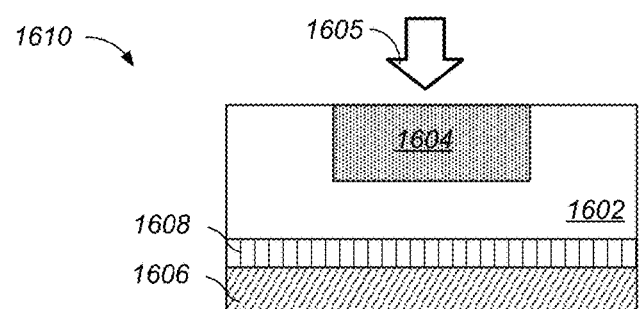

Referring to FIG. 16B, an example configuration 1610 is similar to the configuration 1600 of FIG. 16A, but differs in that the example configuration 1610 further includes a dielectric layer 1608 arranged between the substrate 1602 and the metal mirror 1606. The dielectric layer 1608 may alter an optical reflection spectrum of the metal mirror 1608. For example, by thin film interference caused by the dielectric layer 1608 (e.g., a SiO2 layer), the reflection of the light incident on the metal mirror 1606 (e.g., an Al layer) may be enhanced (e.g., a reflectivity enhanced from <90% to >97%) at certain wavelengths and decreased at some other wavelengths.

Figure 16C:
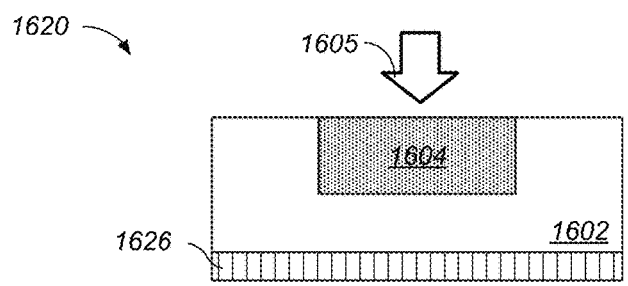

Referring to FIG. 16C, an example configuration 1620 is similar to the configuration 1600 of FIG. 16A, but differs in that the metal mirror 1606 of configuration 1600 has been replaced with a dielectric mirror 1626. The dielectric mirror may be a single layer of dielectric film or a stack of various dielectric films. The dielectric mirror 1626 may be formed from various dielectric materials, such as SiO2, Si3N4, SiON, and Si. The dielectric mirror 1626 may have reflectivity greater than 50%, 60%, 70%, 80%, 90%, or 95% at the operation wavelength of the photodetector of the configuration 1620. The thickness of the dielectric mirror 1626 may have a thickness ranging from 50 nm to 4000 nm.

Figure 16D:
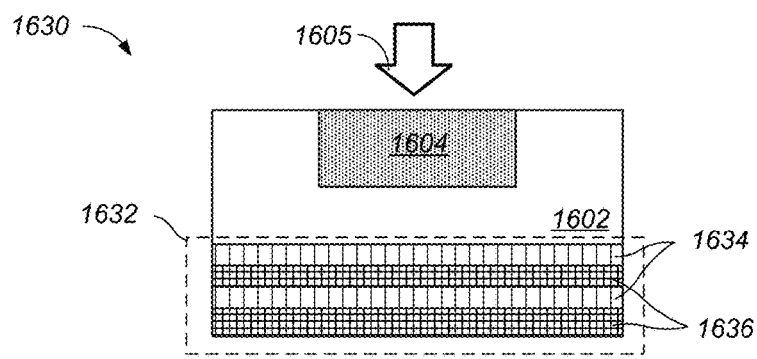

Referring to FIG. 16D, an example configuration 1630 is similar to the configuration 1620 of FIG. 16C, but differs in that the dielectric mirror 1626 of configuration 1620 has been replaced with a Distributed Bragg Reflector (DBR) mirror 1632. The DBR mirror includes multiple first dielectric layers 1634 and multiple second dielectric layers 1636 that are stacked on top of each other in an alternating fashion. The second dielectric layers 1636 have an index of refraction that is different from that of the first dielectric layers 1634. The first layers 1634 and the second layers 1636 may have a thickness that corresponds to a quarter of the operation wavelength in the respective dielectric materials. The reflectivity and the reflection bandwidth may depend on the thicknesses, the refractive indices of the first layers 1634 and the second layers 1636, and the number of first-second layer pairs.

Referring to FIG. 16E, an example configuration 1640 includes the substrate 1602, the absorption region 1604, and an anti-reflection coating (ARC) layer 1648. The ARC layer 1648 may reduce a reflection of the optical signal 1605 incident on the absorption region 1604. The ARC layer 1648 may be similar to ARC layer 744 of FIG. 7B.

Figure 16F:
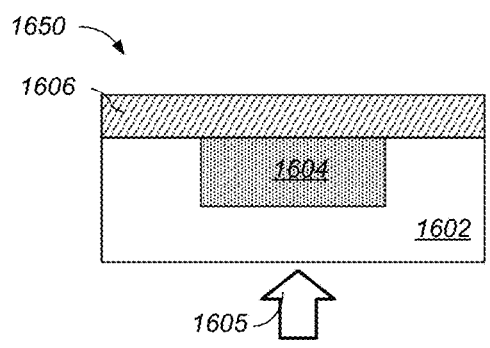

Referring to FIG. 16F, an example configuration 1650 is similar to the configuration 1600 of FIG. 16A, but differs in that the metal mirror 1606 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the metal mirror 1606 is analogous to the descriptions in relation to FIG. 16A.

Figure 16I:
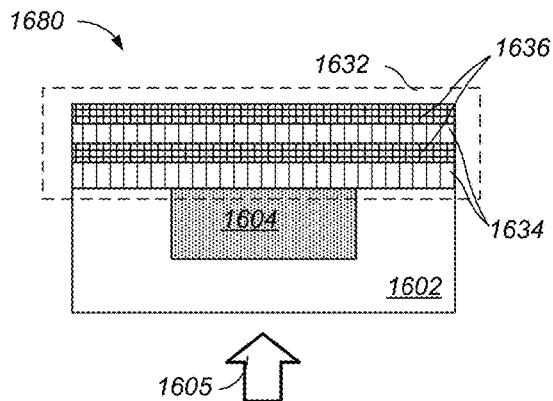
Figure 16G:
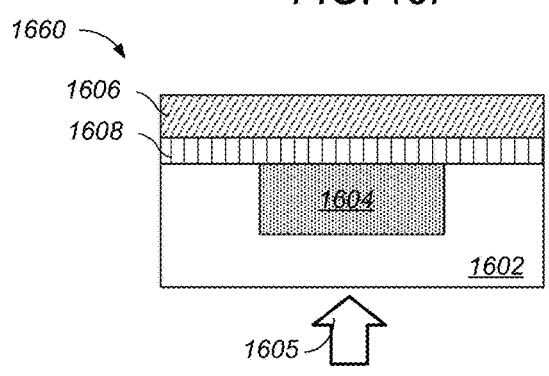

Referring to FIG. 16G, an example configuration 1660 is similar to the configuration 1610 of FIG. 16B, but differs in that the dielectric layer 1608 and the metal mirror 1606 are now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the dielectric layer 1608 and the metal mirror 1606 is analogous to the descriptions in relation to FIG. 16B.

Figure 16J:
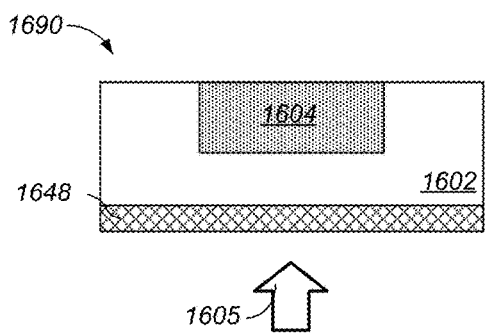
Figure 16H:
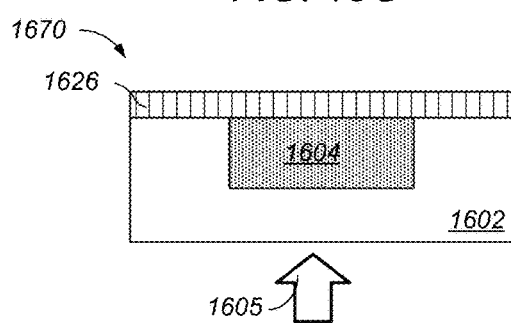

Referring to FIG. 16H, an example configuration 1670 is similar to the configuration 1620 of FIG. 16C, but differs in that the dielectric mirror 1626 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the dielectric mirror 1626 is analogous to the descriptions in relation to FIG. 16C.

Referring to FIG. 16I, an example configuration 1680 is similar to the configuration 1630 of FIG. 16D, but differs in that the DBR mirror 1632 is now placed on the upper surface of the substrate 1602, on the side of the absorption region 1604. The optical signal 1605 is now incident on the absorption region 1604 through the lower surface of the substrate 1602, which may be referred to as a back-side illumination (BSI) configuration. The effect of the DBR mirror 1632 is analogous to the descriptions in relation to FIG. 16D.

Referring to FIG. 16J, an example configuration 1690 is similar to the configuration 1640 of FIG. 16E, but differs in that the ARC layer 1648 is now placed on the lower surface of the substrate 1602, on the side of the substrate 1602 opposite to the absorption region 1604. The optical signal 1605 is now incident on the absorption region 1604 through the lower surface of the substrate 1602, which may be referred to as a back-side illumination (BSI) configuration. The effect of the ARC layer 1648 is analogous to the descriptions in relation to FIG. 16E.

In general, the mirror structures, such as metal mirror 1606, the dielectric layer 1608, the dielectric mirror 1626, and the DBR mirror 1632 may be fabricated in various ways. For example, the mirror structures may be deposited directly onto the substrate 1602. Alternatively, or additionally, the mirror structures may be fabricated on a separate substrate and bonded to the substrate 1602 through wafer bonding techniques.

While individual implementations having metal mirror 1606, the dielectric layer 1608, the dielectric mirror 1626, and the DBR mirror 1632 on the lower surface or the upper surface of the substrate 1602 are shown, in general, the described structures may be implemented on both sides of the substrate 1602. For example, the DBR mirror 1632 may be implemented on both sides of the substrate 1602, which may create an optical resonance cavity around the absorption region 1604, modifying the spectral response of the photodetector. As another example, the ARC layer 1648 may be implemented on the upper surface of the substrate 1602 in combination with a mirror structure on the lower surface of the substrate 1602 (e.g., configurations 1600, 1610, 1620, and 1630) to further enhance detection efficiency of the photodetector. In general, mirrors such as the metal mirror 1606, the dielectric layer 1608, the dielectric mirror 1626, and the DBR mirror 1632 may be partially reflecting and partially transmitting.

Surface of the absorption regions may be modified in various ways to modify various performance characteristics of a photodetector. Examples of modification of the surface of the absorption regions include: addition of doping regions; introduction of foreign elements; variation of material composition; introduction of topographies onto the surface of the absorption region; and deposition of dielectric or semiconductor materials. Examples of performance characteristics include: light absorption efficiency; optical absorption spectrum; carrier collection efficiency; dark current or leakage current; photodetector operation power; and photodetector bandwidth.

Figure 17A:
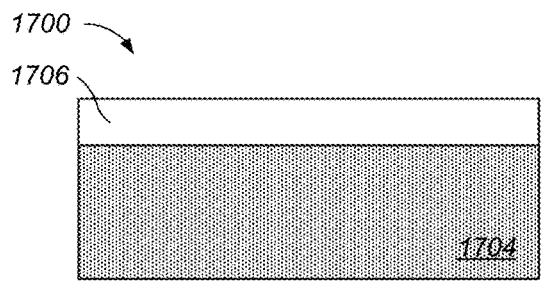
FIGS. 17A-17E are cross-sectional views of example configurations of absorption region surface modification.

FIGS. 17A-17E show cross-sectional views of example configurations of absorption region surface modification. Referring to FIG. 17A, a surface-modified absorption region 1700 includes a germanium-silicon based absorption region 1704 and a surface modification layer 1706. The germanium-silicon based absorption region 1704 may be an absorption region of a switched photodetector such as the switched photodetector 530 of FIG. 5D.

The GeSi-based absorption region 1704 may be a $Si_xGe_{1-x}$ compound with varying composition (X). For example, the composition (X) may vary from 0.01, at which point the GeSi-based absorption region 1704 may have a characteristic closer to Ge, to 0.99, at which point the GeSi-based absorption region 1704 may be have a characteristic closer to Si. The composition of the GeSi-based absorption region may affect the optical absorption efficiency for a given wavelength, and also affect the overall optical absorption spectrum. For example, a composition with a lower (X), corresponding to higher Ge concentration, may absorb more strongly in the near infrared wavelengths (e.g., >1 µm) compared to a composition with a higher (X), corresponding to a higher Si composition.

The surface modification layer 1706 may modify the optical and/or electrical properties of the GeSi-based absorption region 1704 and the photodetector including the absorption region 1704. The surface modification layer may be formed from various materials, such as amorphous silicon, polysilicon, epitaxial silicon, $Si_yGe_{1-y}$ compound with varying composition (Y), $Ge_zSn_{1-z}$ compound with varying composition (Z), and any combination thereof.

In some implementations, for a GeSi-based absorption region 1704 having a $Si_xGe_{1-x}$ composition, the surface modification layer 1706 may be a $Si_yGe_{1-y}$ layer where the compositions (X) and (Y) are different. For example, by having a composition (X) that is larger than composition (Y), the surface modification layer 1706 may have a higher absorption coefficient at a longer wavelength than the GeSi-based absorption region 1704. As such, incident light at a longer wavelength may be strongly absorbed by the surface modification layer 1706 without penetrating deep into the GeSi-based absorption region 1704. By absorbing the incident light closer to the surface of the GeSi-based absorption region 1704, bandwidth of the photodetector including the absorption region 1704 may improve due to reduced diffusion of the photo-generated carriers within the absorption region 1704. In some implementations, for a pure germanium absorption region 1704 (i.e., X=0), the surface modification layer 1706 may be a $Si_YGe_{1-Y}$ layer. In some implementations, the composition of the surface modification layer 1706 and the GeSi-based absorption region 1704 may vary along a direction, such as the vertical direction, forming a graded GeSi absorption region 1704. The grading of the GeSi composition may further improve bandwidth of the photodetector. In some implementations, the surface modification layer 1706 may be multi-layered. For example, a GeSi layer may be deposited on top of a GeSi-based absorption region 1704 for passivation, and another Si layer may be deposited on top of the GeSi layer for further passivation.

In some implementations, the surface modification layer 1706 may be a Germanium-Tin alloy $Ge_ZSn_{1-Z}$ with varying composition (Z). The addition of Tin to the surface modification layer 1706 may improve optical absorption efficiency at longer wavelengths, such as beyond the bandgap of germanium (approximately 1.55 μm), beyond which point the absorption efficiency of pure germanium decreases significantly.

Figure 17B:
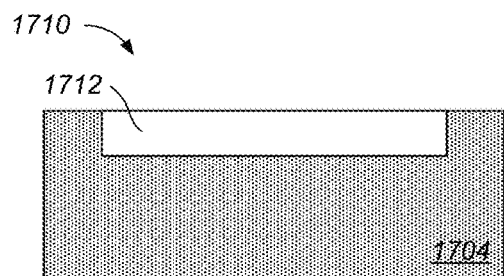

Referring to FIG. 17B, a surface-modified absorption region 1710 includes the germanium-silicon based absorption region 1704 and first doped region 1712. In some implementations, the first doped region 1712 may be doped with p-type or n-type dopants. P-type or n-type dopants may modify the electrical properties of the absorption region 1704. For example, the photo-generated electrons (or holes) may be repelled away from the surface due to the first doped region 1712, thereby avoiding surface recombination, which results into a higher collection efficiency when first doped region 1712 is doped with p-type (or n-type) dopants. In some implementations, the first doped region 1712 may be doped with impurities that modifies the optical property of the absorption region 1704, such as silicon and tin.

Figure 17C:
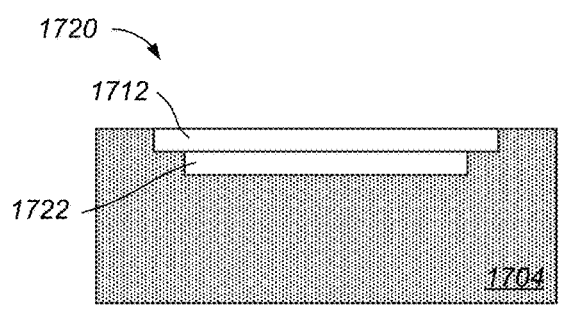

Referring to FIG. 17C, a surface-modified absorption region 1720 is similar to the surface-modified absorption region 1710, but differs in that it further includes a second doped region 1722. The second doped region 1722 may be similar to the first doped region 1712 or may have a different polarity, depth, and width such that the photo-generated carriers are attracted by the second doped region 1722 and repelled by the first doped region 1712.

Figure 17D:
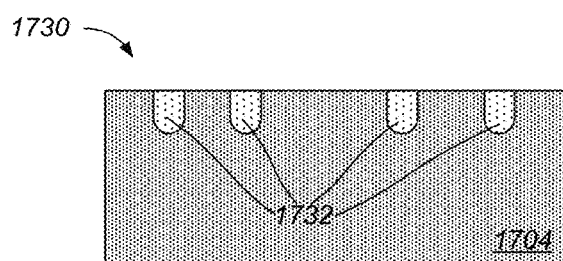

Referring to FIG. 17D, a surface-modified absorption region 1730 includes the germanium-silicon based absorption region 1704 and dielectric wells 1732. The dielectric wells 1732 may be filled with various dielectric materials, such as $SiO_2$, $Si_3N_4$, and high-k material. The dielectric well may contribute to reduction of dark current or leakage current, reduction of photodetector operation power, and/or improvement of photodetector bandwidth, when it is placed, for example, inside a PN junction or in-between surface electrical terminals.

Figure 17E:
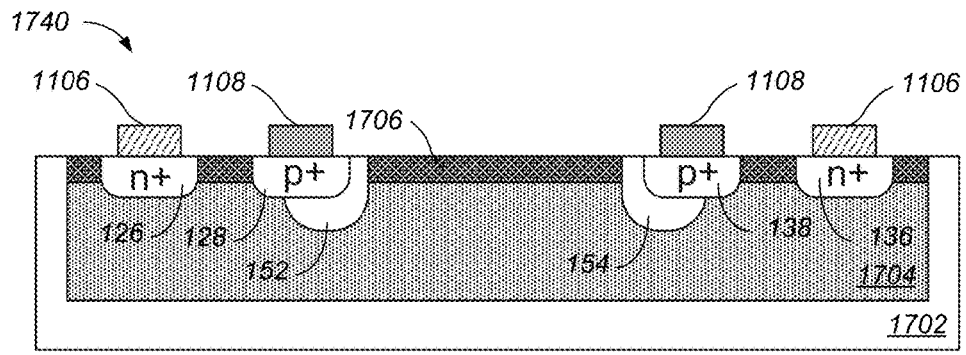

Referring to FIG. 17E, a switched photodetector 1740 includes a surface modified Ge-absorption region 1710 of FIG. 17B. The switched photodetector 1740 is similar to the switched photodetector 160 of FIG. 1B, but differs in that it further includes the surface modification layer 1706, and the carrier collection terminals 1106 and carrier control terminals 1108 of FIG. 11A. The addition of the surface modification layer 1706 may contribute to improvements in various performance characteristics of the switched photodetector 1740, such as: light absorption efficiency; optical absorption spectrum; carrier collection efficiency; dark current or leakage current; photodetector operation power; and photodetector bandwidth.

While individual implementations of surface modification of the absorption region are shown, in general, the described surface modification can be implemented in various combinations to achieve desired effects. For example, the surface modification layer 1706 may be implemented in combination with the first doped region 1712 and/or the second doped region 1722. As another example, the surface modification layer 1706 may be implemented in combination with the dielectric wells 1732. As yet another example, the surface modification layer 1706 may be implemented in combination with the first doped region 1712 and/or the second doped region 1722, and the dielectric wells 1732.

Various doped regions and wells, such as p-doped regions and wells, and n-doped regions and wells, may be arranged in various locations of the absorption region, the substrate, or intermediate layers to modify device performance characteristics. Examples of performance characteristics include: light absorption efficiency; optical absorption spectrum; carrier collection efficiency; dark current or leakage current; photodetector operation power; and photodetector bandwidth.

The depth of the doping regions and wells may be determined based on a variety of considerations, such as manufacturability and device performance. One or more doping wells and regions may be connected to a voltage or current sources. One or more doping wells and regions may not be connected to a voltage or current sources (i.e., floating), and/or be connected to each other (i.e., shorted).

Figure 18A:
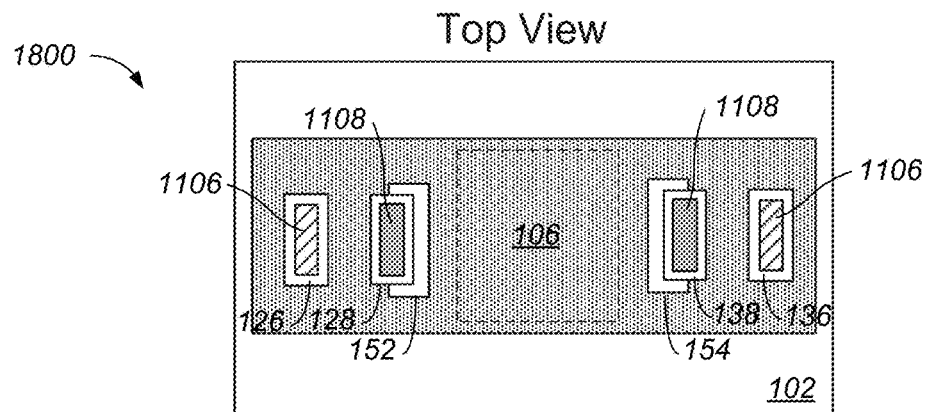
FIGS. 18A-18G show top and side views of example switched photodetectors.
Figure 18B:
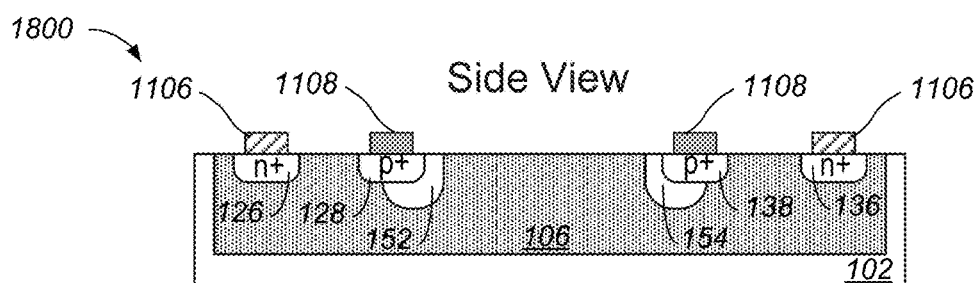

FIGS. 18A-18B show top and side views of an example switched photodetector 1800. The switched photodetector 1800 is similar to the switched photodetector 160 of FIG. 1B, and further includes the carrier collection terminals 1106 and carrier control terminals 1108 of FIG. 11A. As previous described in relation to FIG. 1B, the n-well regions 152 and 154 may reduce a leakage current from the first control signal 122 to the second control signal 132, and may reduce a charge coupling between the n-doped regions 126 and 136. Reduction of the leakage current contributes to reduction of operation power of the switched photodetector 1800.

Figure 18C:
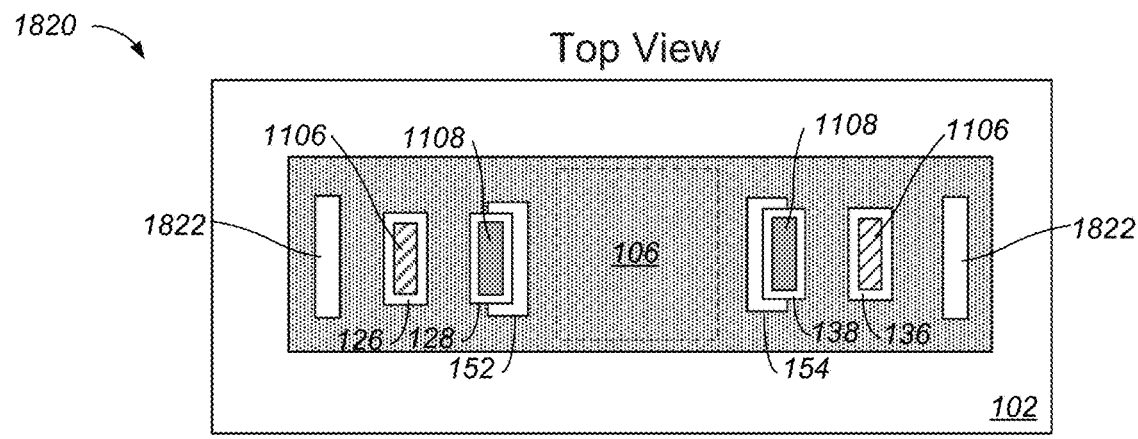
Figure 18D:
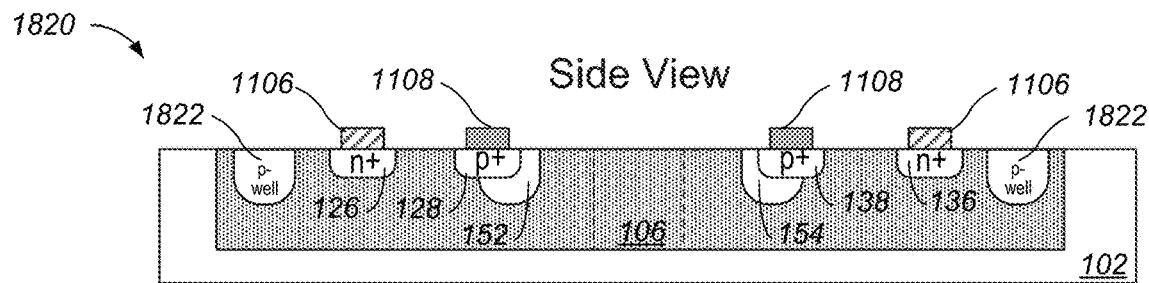

FIGS. 18C-18D show top and side views of an example switched photodetector 1820. The switched photodetector 1800 is similar to the switched photodetector 1800 of FIGS. 18A-18B, and further includes p-well regions 1822. The p-well regions 1822 may be similar to the p-well regions 246 and 248 of FIG. 2D. The p-well regions 1822 may increase the collection efficiency of photo-generated electrons of the switched photodetector 1820 relative to the switched photodetector 1800.

In some cases, the photo-generated carriers in the absorption region 106 may not be completely collected by the n-doped regions 126 and 136. In such cases, the photo-generated carriers may reach the material interface between the substrate 102 and the absorption region 106, where material defects may be present. The material defects may capture the photo-generated carriers and release the carriers after some period of time, which may be collected by n-doped regions 126 and 136. Such capture and release of the carriers by the material defects at the interface and subsequent collection by the n-doped regions 126 and 136 may reduce the bandwidth of the switched photodetector 1800 due to the time delay caused by the capturing and releasing of the carriers. As such, such bandwidth-reduction may be mitigated by adding the p-well regions 1822, which may block photo-generated carriers not collected by the n-doped regions 126 and 136 from reaching the interface between the absorption region 106 and the substrate 102.

Figure 18E:
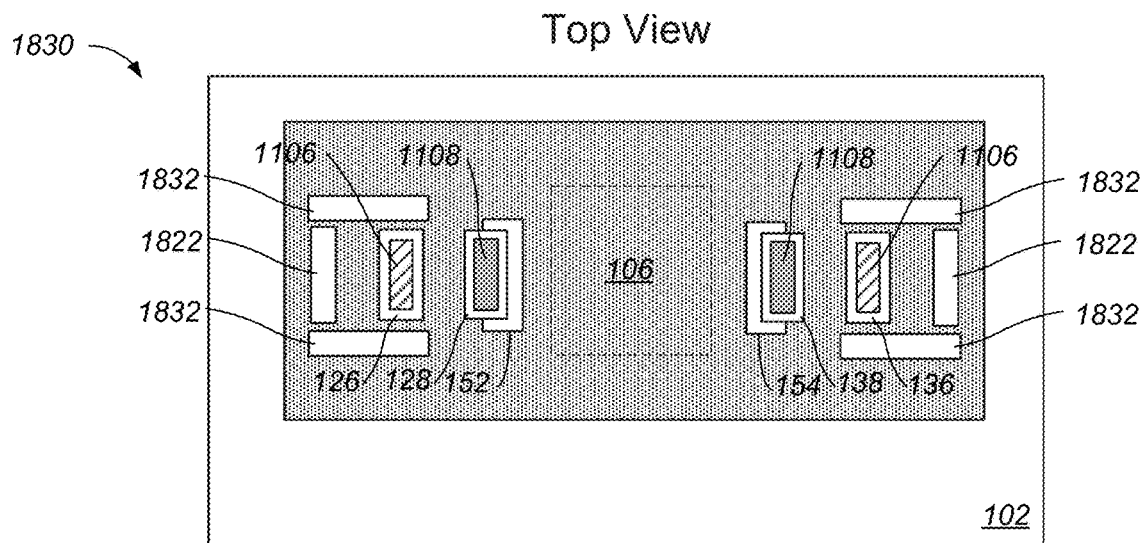

FIG. 18E shows a top view of an example switched photodetector 1830. The switched photodetector 1830 is similar to the switched photodetector 1820 of FIGS. 18C-18D, and further includes p-well regions 1832. The p-well regions 1832 are similar to the p-well regions 1822. The combination of p-well regions 1822 and 1832 surrounds the respective n-doped regions 126 and 136, which may further block photo-generated carriers not collected by the n-doped regions 126 and 136 from reaching the interface between the absorption region 106 and the substrate 102. While shown as separate p-well regions 1822 and 1832, the p-well regions 1822 and 1832 may be joined into respective "C" shaped region that surrounds the respective n-doped regions 126 and 136.

Figure 18F:
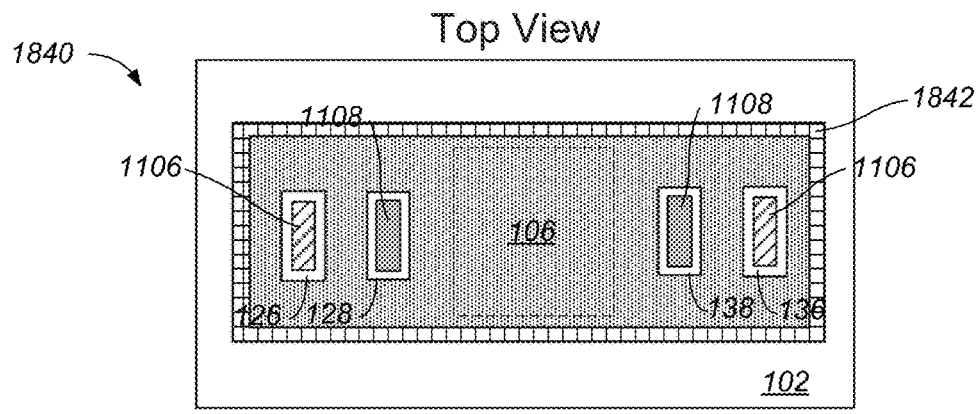
Figure 18G:
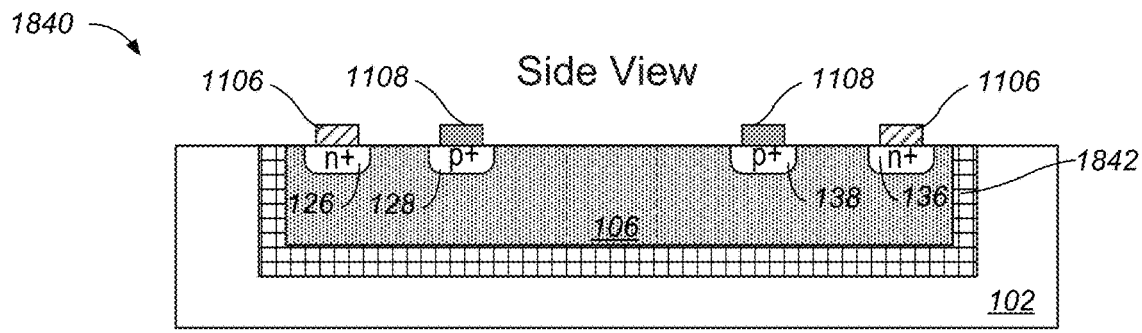

FIGS. 18F-18G show top and side views of an example switched photodetector 1840. The switched photodetector 1840 is similar to the switched photodetector 1800 of FIGS. 18A-18B, but differs in that it omits the n-well regions 152 and 154, and includes p-well region 1842. The p-well region 1842 may be similar to the p-well regions 246 and 248 of FIG. 2D. The p-well region 1842 surrounds the absorption region 106 embedded within the substrate 102. The p-well region 1842 may block photo-generated electrons in the absorption region 106 from reaching the substrate 102. Such blocking may increase the collection efficiency of photo-generated carriers of the switched photodetector 1840 relative to the switched photodetector 1800. The p-well region 1842 may be formed in the absorption region 106, the substrate 102, an intermediate layer between the absorption region 106 and the substrate 102, or combination thereof.

While individual implementations of n-well regions 152 and 154 and p-well regions 1822, 1832, and 1842 have been shown, in general, the described n-well and p-well regions can be implemented in various combinations to achieve desired effects.

So far, various implementations of the elements of the switched photodetectors, and various arrangements of the elements have been described. Now, various exemplary combinations of the previously described elements and their arrangements will be described. The described combinations are not intended to be a complete list of all combination.

FIGS. 19A-B show top and side views of an example switched photodetector 1900. The switched photodetector 1900 is similar to the switched photodetector 100 of FIG. 1A, but differs in that the absorption region 106 of the photodetector 1900 is fully embedded in the substrate 102, and further includes the carrier collection terminals 1106 and carrier control terminals 1108 of FIG. 11A. The light receiving region 1205 is described in relation to FIGS. 12A-12B. The presence of the p-doped regions 128 and 138 results in formation of an Ohmic contact at the interfaces between the carrier control terminal 1108 and the absorption region 106.

FIGS. 19C-D show top and side views of an example switched photodetector 1910. The switched photodetector 1910 is similar to the switched photodetector 1900 of FIG. 19A-B, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 19E-F show top and side views of an example switched photodetector 1920. The switched photodetector 1910 is similar to the switched photodetector 1900 of FIG. 19A-B, but differs in that additional p-doped regions 128 and 138, and carrier control terminals 1108 have been added on each sides of the light receiving region 1205.

FIGS. 19G-H show top and side views of an example switched photodetector 1930. The switched photodetector 1930 is similar to the switched photodetector 1920 of FIG. 19E-F, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 20A-B show top and side views of an example switched photodetector 2000. The switched photodetector 2000 is similar to the switched photodetector 1900 of FIG. 19A-B, but differs in that the intermediate layer 1006 of FIG. 10I has been added. As previously described in relation to FIG. 10I, the intermediate layer 1006 has an opening to the substrate 102, and the absorption region 106 fills the opening to the substrate 102 and the opening formed by the intermediate layer 1006. In some implementations, the intermediate layer 1006 may be $SiO_2$, SiNx, AlOx, or any oxide or nitride-based insulators.

FIGS. 20C-D show top and side views of an example switched photodetector 2010. The switched photodetector 2010 is similar to the switched photodetector 2000 of FIG. 19A-B, but differs in that the intermediate layer 1006 of FIGS. 20A-B has been replaced with an intermediate layer 2012. The intermediate layer 2012 is similar to the intermediate layer 1006 in its material, but differs in that intermediate layer 2012 is a uniform layer that extends across the upper surface of the substrate 102, with openings to the substrate 102. The absorption region 106 is embedded in the opening of the intermediate layer 2012. In some implementations, the intermediate layer 2012 may be $SiO_2$, SiNx, AlOx, or any oxide or nitride-based insulators.

FIGS. 20E-F show top and side views of an example switched photodetector 2020. The switched photodetector 2020 is similar to the switched photodetector 2010 of FIGS. 20C-D, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 20G-H show top and side views of an example switched photodetector 2030. The switched photodetector 2030 is similar to the switched photodetector 2010 of FIGS. 20C-D, but differs in that the intermediate layer 2012 of FIGS. 20C-D has been replaced with an intermediate layer 2032. The intermediate layer 2032 is similar to the intermediate layer 2012 of FIGS. 20C-D, but differs in that the intermediate layer 2032 has a first opening 2034 to the substrate 102, and a second opening 2036 that is larger than the first opening 2034 that opens up toward the upper surface of the intermediate layer 2032.

FIGS. 20I-J show top and side views of an example switched photodetector 2040. The switched photodetector 2040 is similar to the switched photodetector 2030 of FIGS. 20G-H, but differs in that the p-doped regions 128 and 138 have been omitted. The omission of the p-doped regions 128 and 138 results in formation of a Schottky junction at the interfaces between the carrier control terminal 1108 and the absorption region 106.

Figures 20K, 20L:
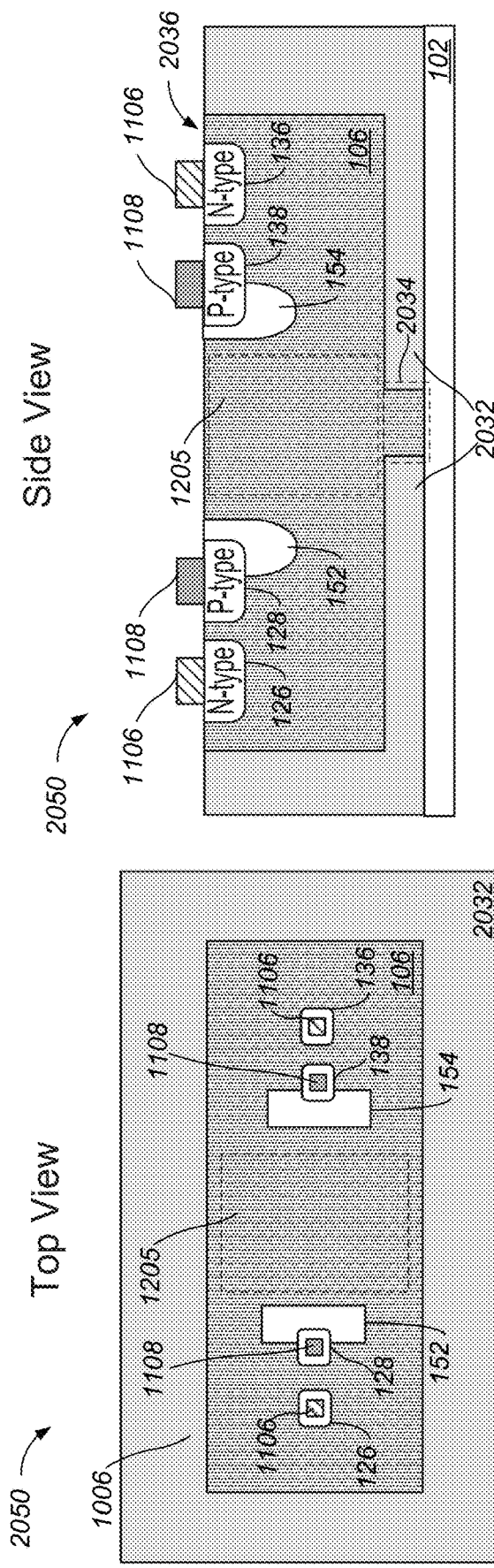

FIGS. 20K-L show top and side views of an example switched photodetector 2050. The switched photodetector 2050 is similar to the switched photodetector 2030 of FIGS. 20G-H, but differs in that the n-well regions 152 and 154 have been added. The n-well regions 152 and 154 have been described in relation to FIG. 1B.

FIGS. 21A-B show top and side views of an example switched photodetector 2100. The switched photodetector 2100 is similar to the switched photodetector 1900 of FIGS. 19A-B, but differs in that the n-doped regions 126 and 136, the p-doped regions 128 and 138, the carrier collection terminals 1106, and the carrier control terminals 1108 have been moved from the absorption region 106 to the substrate 102. Such terminals 1106 and 1108 may be referred to as substrate carrier collection terminals and substrate carrier control terminals.

FIGS. 21C-D show top and side views of an example switched photodetector 2110. The switched photodetector 2110 is similar to the switched photodetector 2100 of FIGS. 21A-B, but differs in that absorber p-doped regions 2128 and 2138, and absorber carrier control terminals 2108 have been placed on the absorption region 106. The substrate carrier collection terminals 1106, the substrate carrier control terminals 1108, and the absorber carrier control terminals 2108 may be similar to the substrate carrier collection terminal 1306, the substrate carrier control terminal 1308, and the absorber carrier control terminal 1309 described in relation to FIG. 14A, and have similar effects.

FIGS. 21E-F show top and side views of an example switched photodetector 2120. The switched photodetector 2120 is similar to the switched photodetector 2110 of FIGS. 21C-D, but differs in that the absorber p-doped regions 2128 and 2138 have been omitted. The omission of the absorber p-doped regions 2128 and 2138 results in formation of a Schottky junction at the interfaces between the absorber carrier control terminal 2108 and the absorption region 106.

FIGS. 22A-B show top and side views of an example switched photodetector 2200. The switched photodetector 2200 is similar to the switched photodetector 1840 of FIGS. 18F-G, but differs in that the n-well regions 152 and 154 of FIGS. 18A-B have been added.

FIGS. 22C-D show top and side views of an example switched photodetector 2210. The switched photodetector 2210 is similar to the switched photodetector 2110 of FIGS. 21C-D, but differs in that the n-well regions 152 and 154 of FIGS. 18A-B have been added.

Figure 23A:
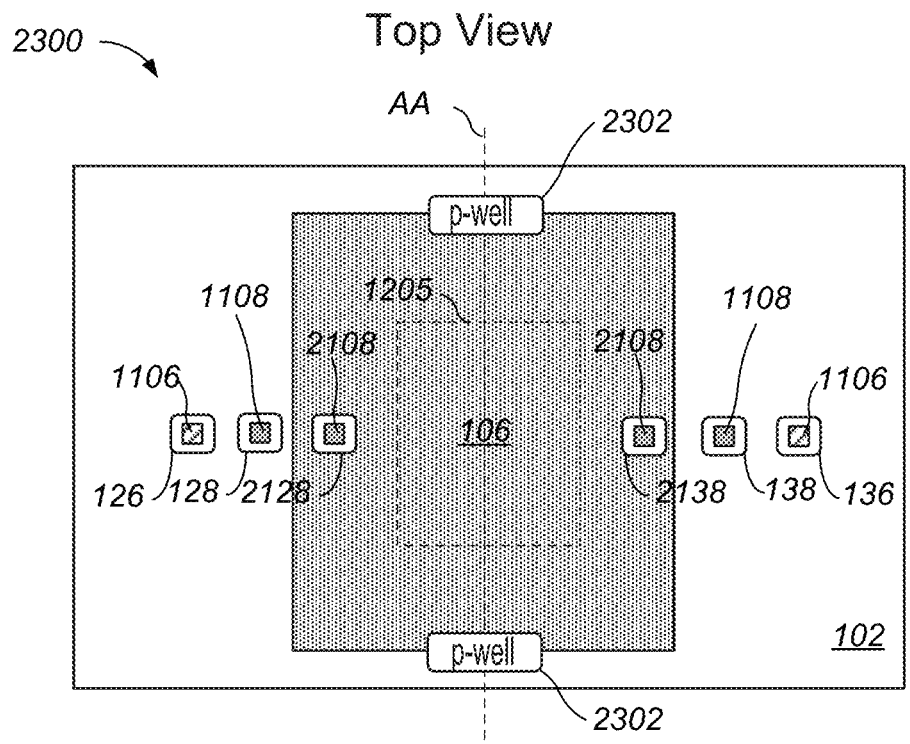
FIGS. 23A-23B show top and side views of an example switched photodetector.
Figure 23B:
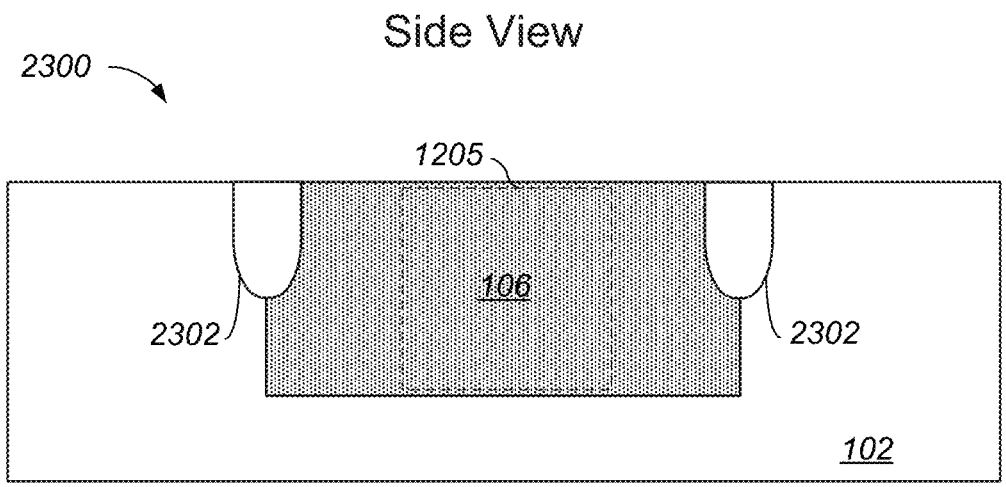

FIG. 23A show a top view of an example switched photodetector 2300, and FIG. 23B shows a side view of the example switched photodetector 2300 along a line AA. The switched photodetector 2300 is similar to the switched photodetector 2110 of FIGS. 21C-D, but differs in that the p-well regions 2302 have been added at the interface between the absorption region 106 and the substrate 102. The p-well regions 2302 may help mitigate carrier trapping and releasing at the interface between the absorption region 106 and the substrate 102, which has been described in relation to FIG. 18C-D.

Figure 24A:
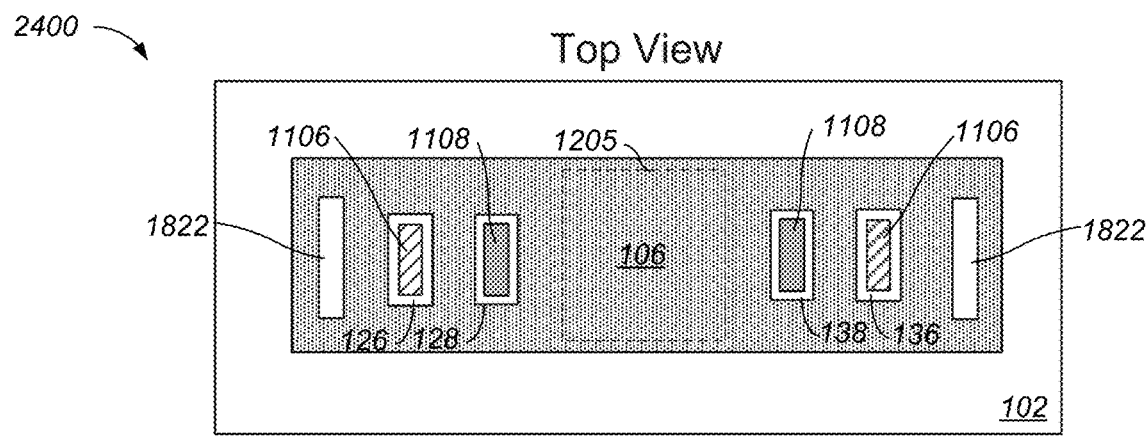
FIGS. 24A-24G show top and side views of example switched photodetectors.
Figure 24B:
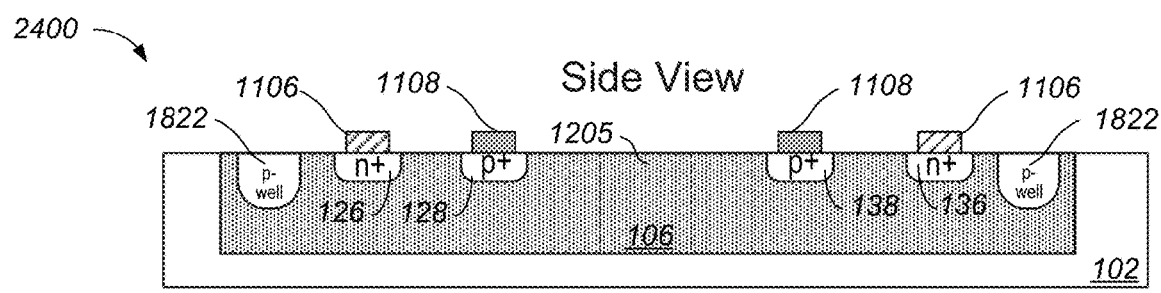

FIGS. 24A-B show top and side views of an example switched photodetector 2400. The switched photodetector 2400 is similar to the switched photodetector 1820 of FIGS. 18C-D, but differs in that the n-well regions 152 and 154 of have been omitted.

Figure 24C:
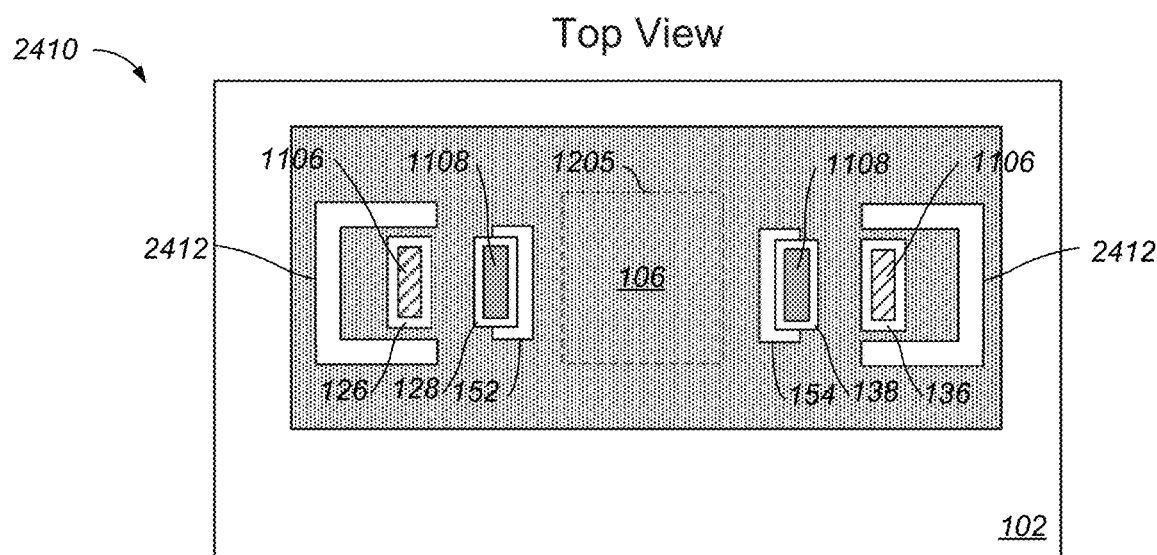

FIG. 24C shows a top view of an example switched photodetector 2410. The switched photodetector 2410 is similar to the switched photodetector 1830 of FIG. 18E, but differs in that the p-well regions 1822 and 1832 of FIG. 18E have been merged into continuous p-well regions 2412.

Figure 24D:
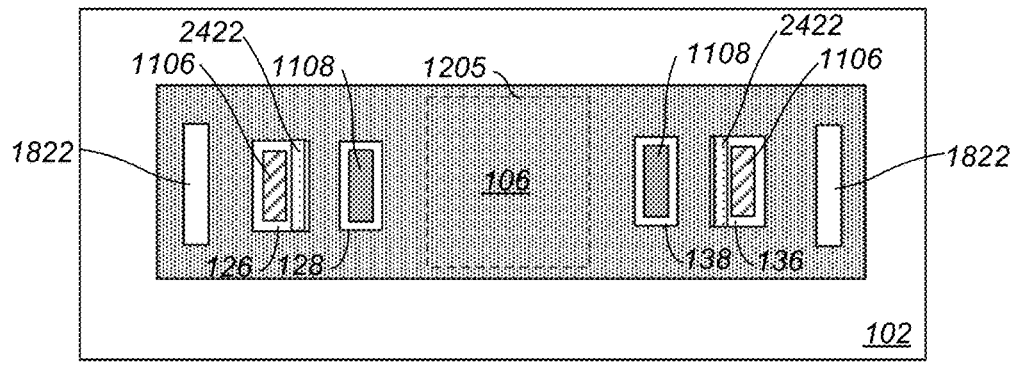
Figure 24E:
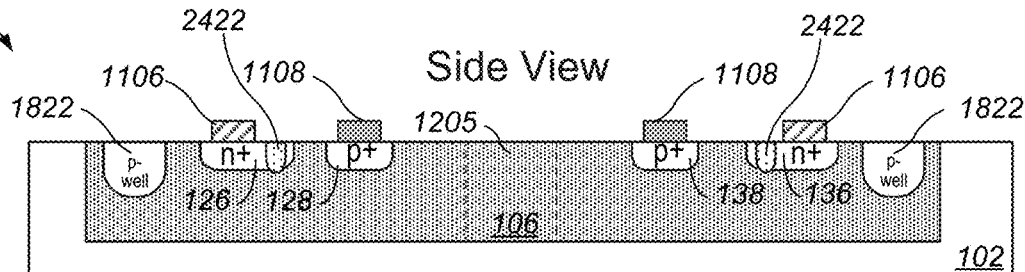

FIGS. 24D-E show top and side views of an example switched photodetector 2420. The switched photodetector 2420 is similar to the switched photodetector 2400 of FIGS. 24A-B, but differs in that dielectric wells 2422 have been added in the n-doped regions 126 and 136. The dielectric wells 2422 is similar to the dielectric wells 1732 of FIG. 17D. The dielectric well 2422 are arranged in a portion of the n-doped region 126 between carrier collection terminal 1106 and the carrier control terminal 1108. The dielectric well 2422 may reduce a dark current between the carrier collection terminal 1106 and the carrier control terminal 1108. The depth of the dielectric well 2422 may be less than, equal to, or greater than the depth of the n-doped region 126.

Figure 24F:
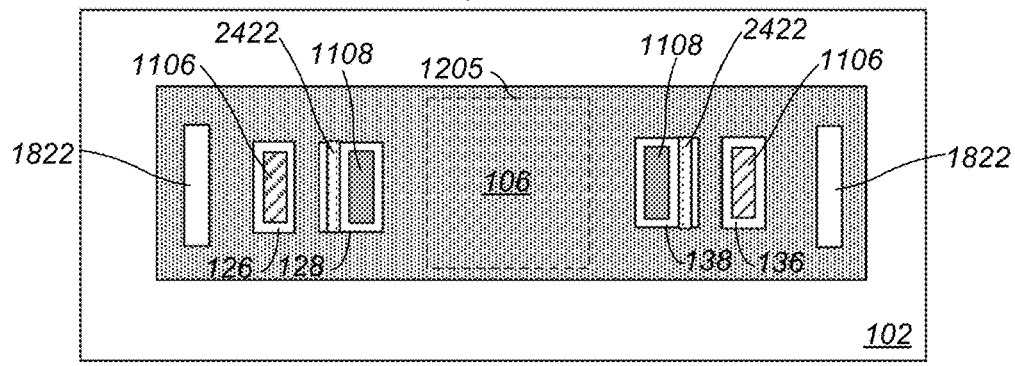
Figure 24G:
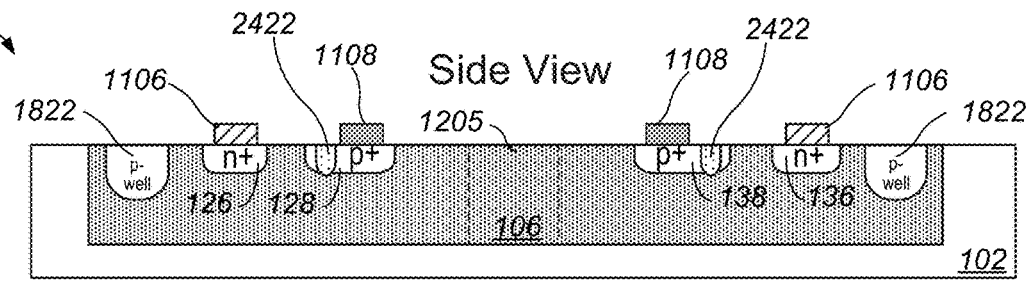

FIGS. 24F-G show top and side views of an example switched photodetector 2430. The switched photodetector 2430 is similar to the switched photodetector 2420 of FIGS. 24D-E, but differs in that dielectric wells 2422 have been moved from the n-doped regions 126 and 136 to the p-doped regions 128 and 138. The depth of the dielectric well 2422 may be less than, equal to, or greater than the depth of the p-doped region 128. In general, the dielectric well 2422 may be placed anywhere in between the n-doped region 126 and the p-doped region 128, and between the n-doped region 136 and the p-doped region 138.

FIGS. 25A-B show top and side views of an example switched photodetector 2500. The switched photodetector 2500 is similar to the switched photodetector 1900 of FIGS. 19A-B, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

FIGS. 25C-D show top and side views of an example switched photodetector 2510. The switched photodetector 2510 is similar to the switched photodetector 2500 of FIGS. 25A-B, but differs in that the p-doped regions 128 and 138 have been omitted. The omission of the p-doped regions 128 and 138 results in formation of a Schottky junction at the interfaces between the carrier control terminal 1108 and the absorption region 106.

FIGS. 25E-F show top and side views of an example switched photodetector 2520. The switched photodetector 2520 is similar to the switched photodetector 2050 of FIGS. 20K-L, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

FIGS. 25G-H show top and side views of an example switched photodetector 2530. The switched photodetector 2530 is similar to the switched photodetector 1840 of FIGS. 18F-G, but differs in that the metal mirror 1606 of FIG. 16F has been added as a metal mirror 2502 on an upper surface of the absorption region 106, the surface on which the carrier collection terminals 1106 and carrier control terminals 1108 are located. The metal mirror 2502 may be placed above the light receiving region 1205. In some implementations, the metal mirror 2502 may be implemented by the first metal layer (M1) or the second metal layer (M2) process in CMOS fabrication or a combination of thereof.

In typical implementations of an image sensor, multiple sensor pixels (e.g., switched photodetectors) are arranged in an array to allow the image sensor to capture images having multiple image pixels. Square-shaped sensor pixels having equal dimensions on the two sides when seen from the top allows for simple 2D array. However, for certain applications such as ToF, some sensor pixels may have non-square shapes, such as a rectangular shape. For example, referring back to FIG. 1B, the switched photodetector 160 has two carrier control terminals (e.g., p-doped regions 128 and 138) and two carrier collection terminals (e.g., n-doped regions 126 and 136). These four terminals are typically arranged along a line, which leads to a rectangular sensor pixel shape that is longer along the line on which the terminals line up (e.g., switched photodetector 1800 of FIG. 18A).

Figure 26:
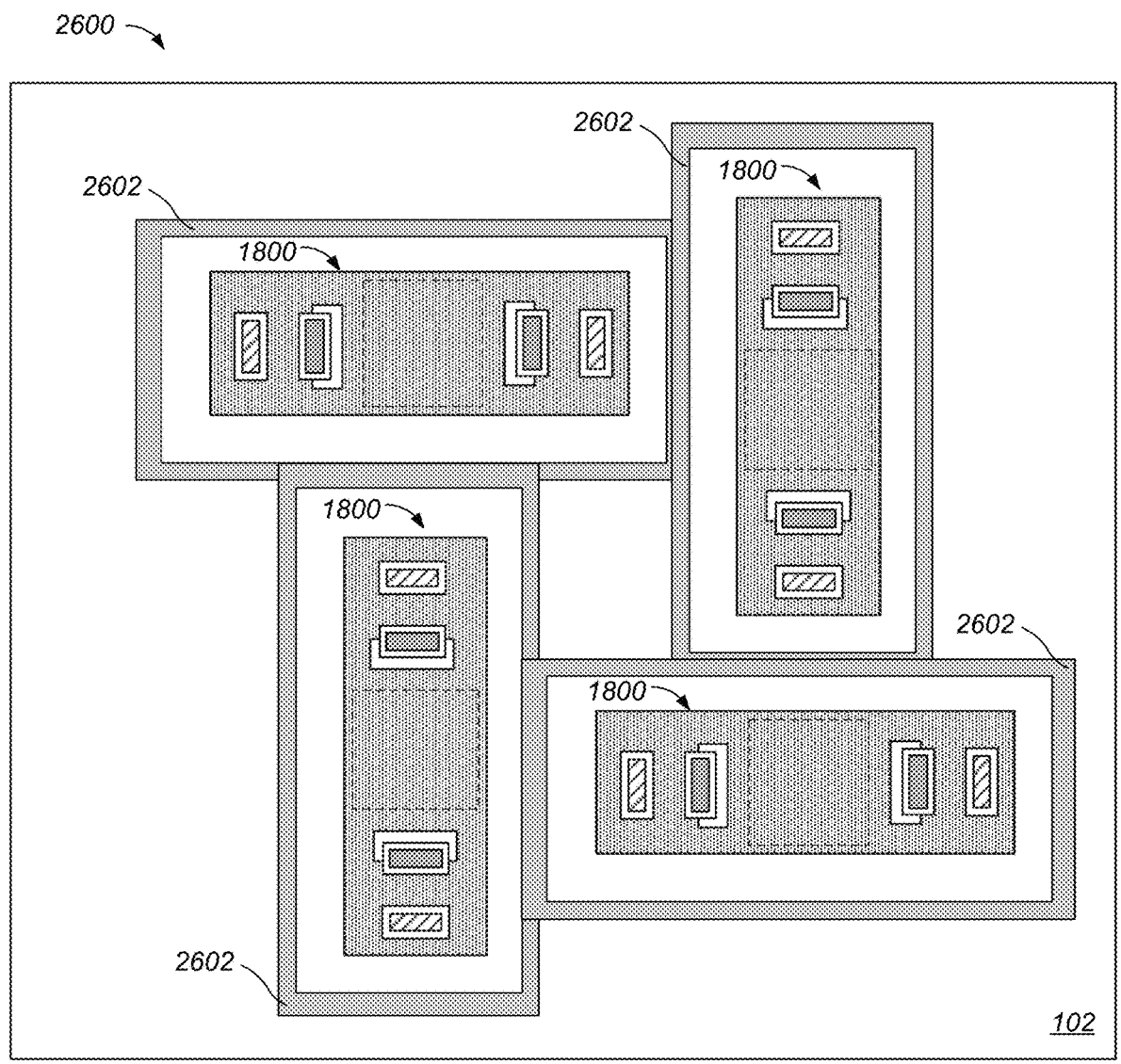
FIG. 26 is an example unit cell of rectangular photodetectors.

Such rectangular sensor pixels may present challenges in efficient arraying of the pixels due to, for example, design rules associated with semiconductor fabrication in a foundry. Design rules may impose various minimum separations of features such as doped regions, doped wells, dielectric wells, and germanium absorption regions. One approach to improving compactness and symmetry is by creating a unit cell of photodetectors that include four rectangular photodetectors. FIG. 26 show an example unit cell of rectangular photodetectors. A unit cell 2600 includes four switched photodetectors 1800 of FIG. 18A and four isolation structures 2602 that surround each of the switched photodetectors 1800. The isolation structures 2602 have been described in relation to FIGS. 15A-D. The unit cell 2600 may improve sensor pixel compactness and symmetry over the rectangular unit cell.

Figure 27:
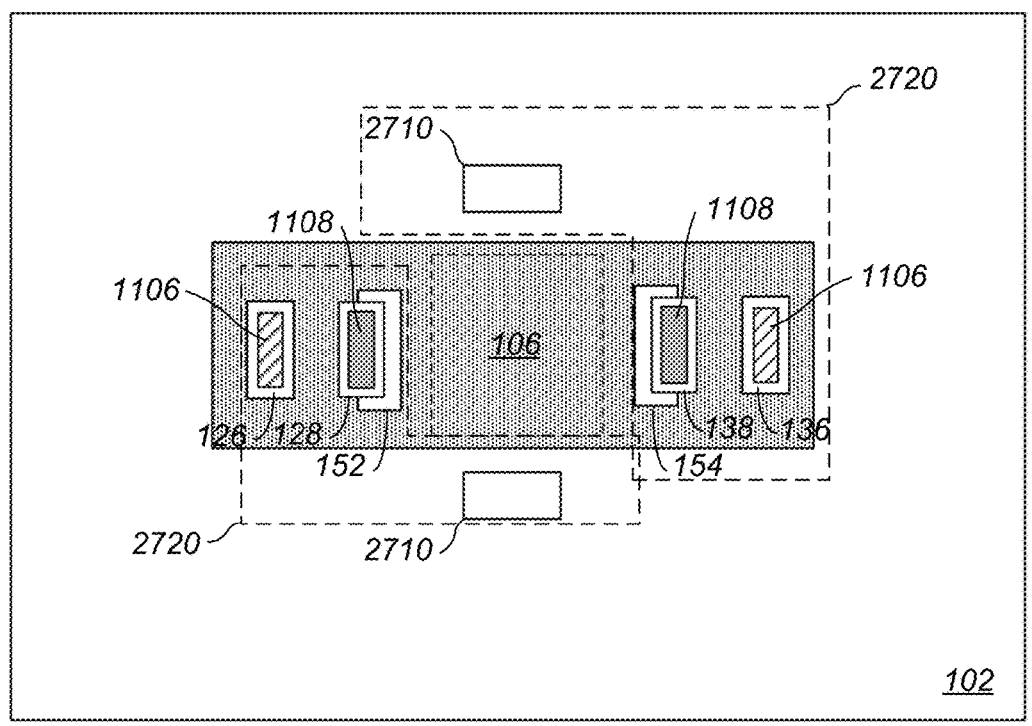
FIG. 27 is an example rectangular switched photodetector with photo-transistor gain.

FIG. 27 shows a top view of an example rectangular switched photodetector 2700 with photo-transistor gain. The switched photodetector 2700 is similar to the switched photodetector 1800 of FIG. 18A, but differs in that electron emitters 2710 have been added on to the substrate 102. The electron emitter 2710 may be similar to the n-doped regions 126 and 136. The rectangular shape of the switched photodetector 1800 allows coupling of a photocurrent integration capacitor (e.g., a floating diffusion capacitor) to a bipolar junction transistor (BJT) 2720 formed by the n-doped regions 126 and 136, the p-doped regions 128 and 138, and the electron emitter 2710, resulting in an NPN BJT. The BJT 2720, when biased appropriately, may provide a photo-transistor gain in response to incident optical signal, which may improve a light to photocurrent conversion efficiency of the photodetector 2700. For example, the BJT 2720 may be biased as follows: bias the n-doped regions 126 and 136 between 1V and 3V, bias the p-doped regions 128 and 138 between 0V and 1V, and bias the electron emitter 2710 to be lower than the bias of the respective n-doped regions 126 and 136.

In general, the electron emitter 2710 and/or the n-doped regions 126 and 136 should be biased to an external voltage or be shorted with a p-doped region through a metal connection to allow electrons to be emitted by the electron emitter 2710.

While various implementations of switched photodetectors with a particular combination and arrangement of n-type and p-type regions and wells have been described, in general, the polarity of the doped regions and wells may be reversed and achieve analogous operation and functionality. For example, all instances of a p-well and p-doped regions may be converted to n-well and n-doped regions, respectively, and all instance of n-well and n-doped regions may be converted to p-well and p-doped regions, receptively.

Figure 28A:
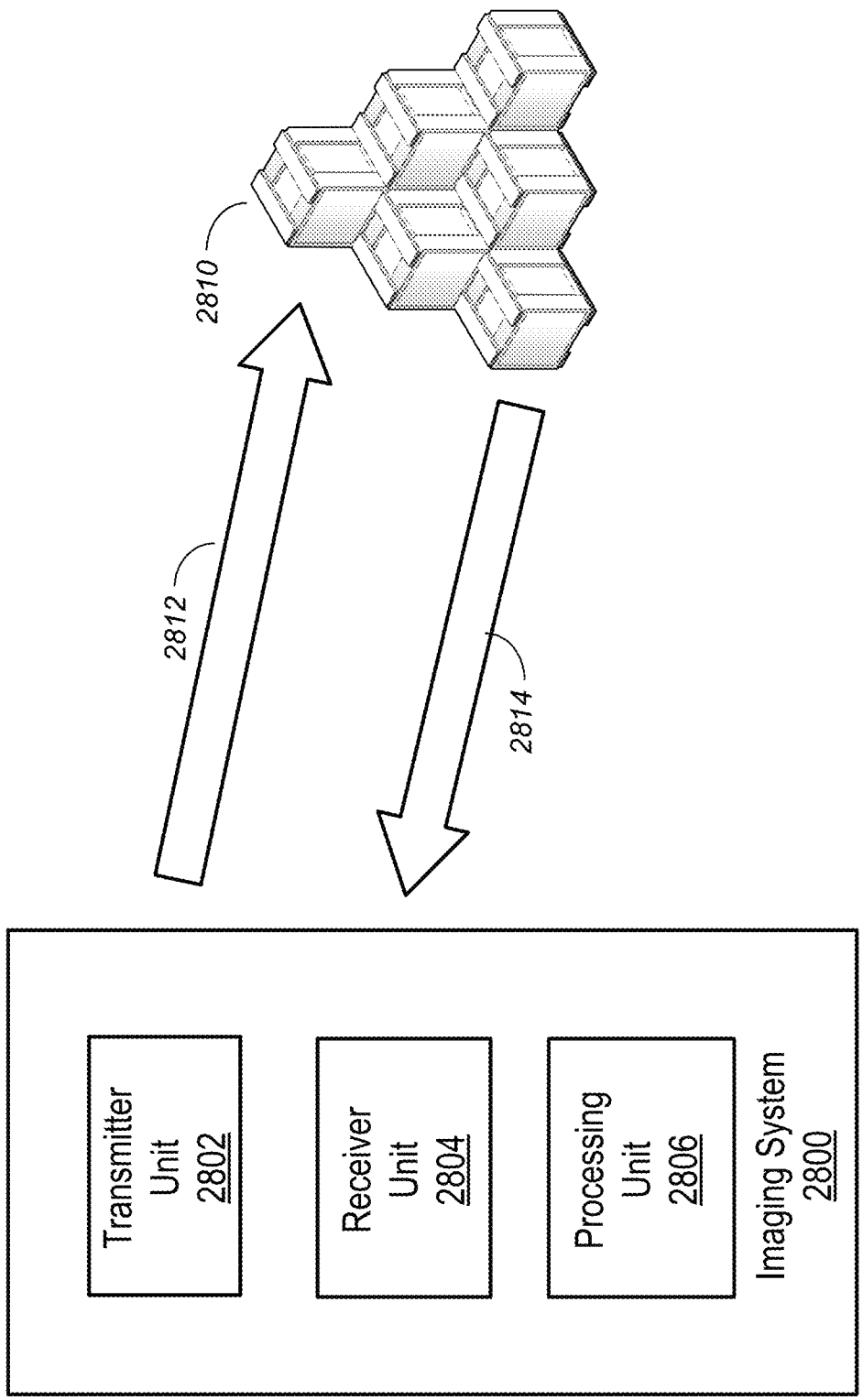
FIG. 28A is a block diagram of an example of an imaging system.

FIG. 28A shows an example imaging system 2800 for determining characteristics of a target object 2810. The target object 2810 may be a three-dimensional object. The imaging system 2800 may include a transmitter unit 2802, a receiver unit 2804, and a processing unit 2806. In general, the transmitter unit 2802 emits light 2812 towards the target object 2810. The transmitter unit 2802 may include one or more light sources, control circuitry, and/or optical elements. For example, the transmitter unit 2802 may include one or more NIR LEDs or lasers, where the emitted light 2812 may be collimated by a collimating lens to propagate in free space.

In general, the receiver unit 2804 receives the reflected light 2814 that is reflected from the target object 2810. The receiver unit 2804 may include one or more photodetectors, control circuitry, and/or optical elements. For example, the receiver unit 2804 may include an image sensor, where the image sensor includes multiple pixels fabricated on a semiconductor substrate. Each pixel may include one or more switched photodetectors for detecting the reflected light 2814, where the reflected light 2814 may be focused to the switched photodetectors. Each switched photodetector may be a switched photodetector disclosed in this application.

In general, the processing unit 2806 processes the photo-carriers generated by the receiver unit 2804 and determines characteristics of the target object 2810. The processing unit 2806 may include control circuitry, one or more processors, and/or computer storage medium that may store instructions for determining the characteristics of the target object 2810. For example, the processing unit 2806 may include readout circuits and processors that can process information associated with the collected photo-carriers to determine the characteristics of the target object 2810. In some implementations, the characteristics of the target object 2810 may be depth information of the target object 2810. In some implementations, the characteristics of the target object 2810 may be material compositions of the target object 2810.

Figure 28B:
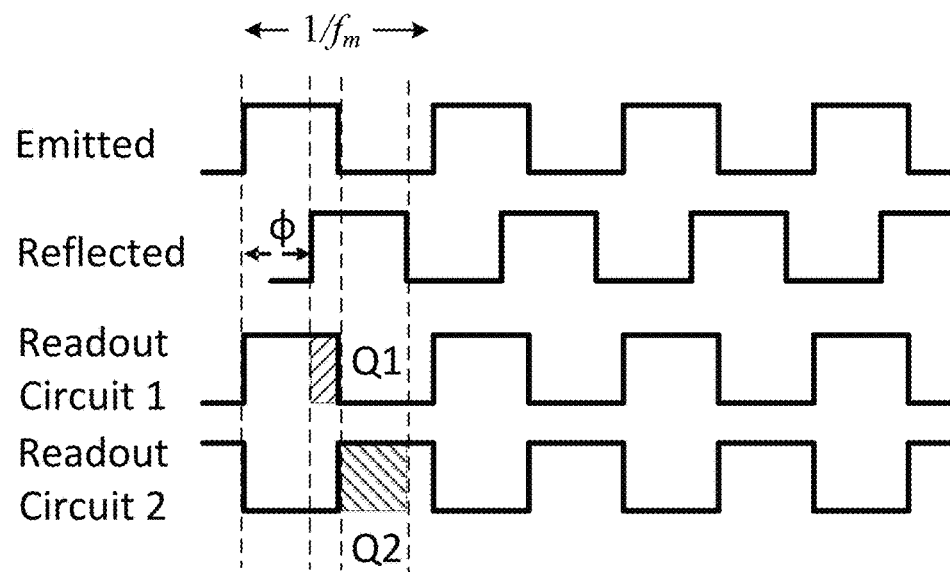
FIGS. 28B-28C show examples of techniques for determining characteristics of an object using an imaging system.

FIG. 28B shows one example technique for determining characteristics of the target object 2810. The transmitter unit 2802 may emit light pulses 2812 modulated at a frequency $f_m$ with a duty cycle of 50%. The receiver unit 2804 may receive reflected light pulses 2814 having a phase shift of Φ. The switched photodetectors are controlled such that the readout circuit 1 reads the collected charges $Q_1$ in a phase synchronized with the emitted light pulses, and the readout circuit 2 reads the collected charges $Q_2$ in an opposite phase with the emitted light pulses. In some implementations, the distance, D, between the imaging system 2800 and the target object 2810 may be derived using the equation $$D = \frac{c}{4f_m} \frac{Q_2}{Q_1 + Q_2}, \tag{1}$$

where c is the speed of light.

Figure 28C:
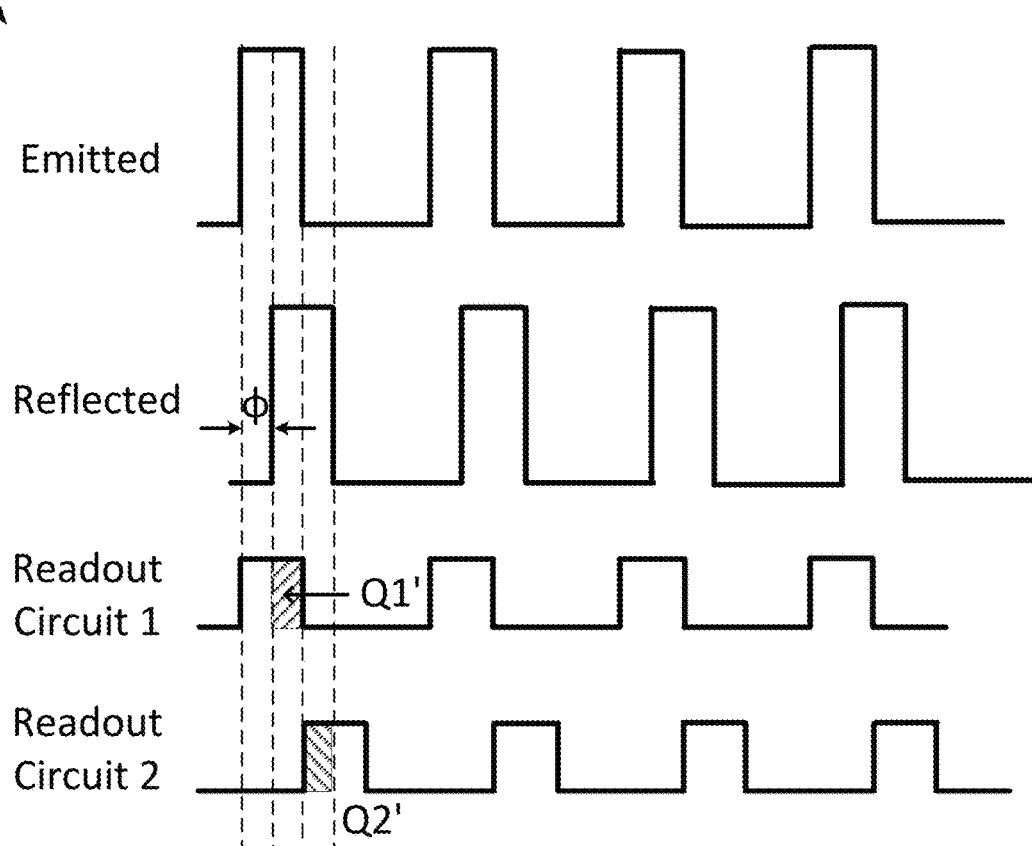

FIG. 28C shows another example technique for determining characteristics of the target object 2810. The transmitter unit 2802 may emit light pulses 2812 modulated at a frequency $f_m$ with a duty cycle of less than 50%. By reducing the duty cycle of the optical pulses by a factor of N, but increasing the intensity of the optical pulses by a factor of N at the same time, the signal-to-noise ratio of the received reflected light pulses 2814 may be improved while maintaining substantially the same power consumption for the imaging system 2800. This is made possible when the device bandwidth is increased so that the duty cycle of the optical pulses can be decreased without distorting the pulse shape. The receiver unit 2804 may receive reflected light pulses 2814 having a phase shift of Φ. The multi-gate photodetectors are controlled such that a readout circuit 1 reads the collected charges $Q_1'$ in a phase synchronized with the emitted light pulses, and a readout circuit 2 reads the collected charges $Q_2'$ in a delayed phase with the emitted light pulses. In some implementations, the distance, D, between the imaging system 2800 and the target object 2810 may be derived using the equation $$D = \frac{c}{4Nf_m} \frac{Q_2'}{Q_1' + Q_2'}. \quad (2)$$

Figure 29:
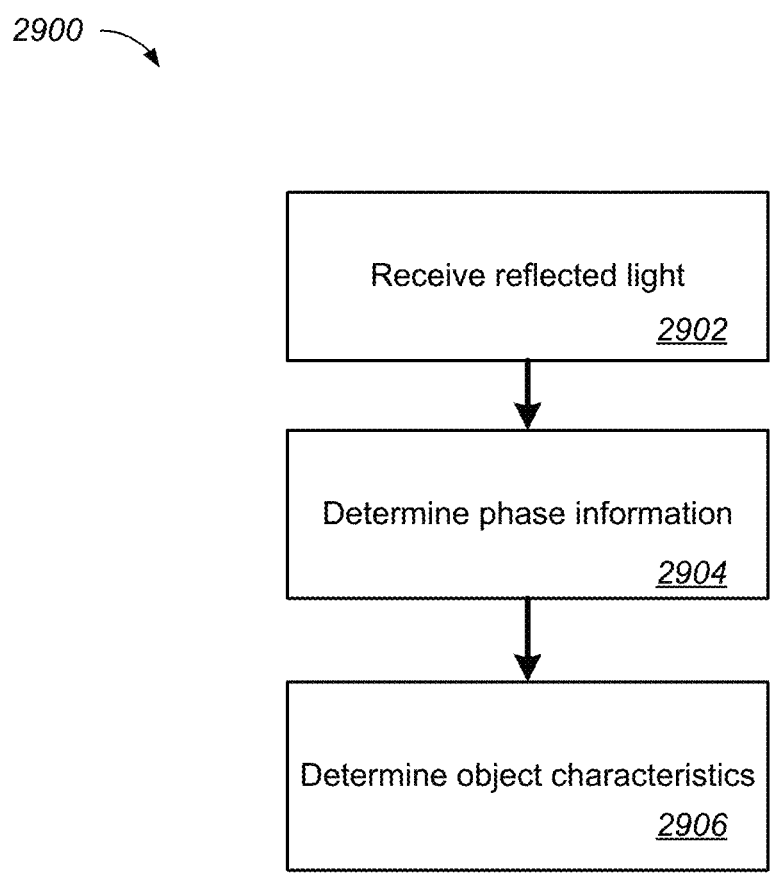
FIG. 29 shows an example of a flow diagram for determining characteristics of an object using an imaging system.

FIG. 29 shows an example of a flow diagram 2900 for determining characteristics of an object using an imaging system. The process 2900 may be performed by a system such as the imaging system 2800.

The system receives reflected light (2902). For example, the transmitter unit 2802 may emit NIR light pulses 2812 towards the target object 2810. The receiver unit 2804 may receive the reflected NIR light pulses 2814 that is reflected from the target object 2810.

The system determines phase information (2904). For example, the receiver unit 2804 may include an image sensor, where the image sensor includes multiple pixels fabricated on a semiconductor substrate. Each pixel may include one or more switched photodetectors for detecting the reflected light pulses 2814. The type of switched photodetectors may be a switched photodetector disclosed in this application, where the phase information may be determined using techniques described in reference to FIG. 28B or FIG. 28C.

The system determines object characteristics (2906). For example, the processing unit 2806 may determine depth information of the object 2810 based on the phase information using techniques described in reference to FIG. 28B or FIG. 28C.

In some implementations, an image sensor includes multiple pixels are fabricated on a semiconductor substrate, where each pixel may include one or more switched photodetectors 100, 160, 170, 180, 200, 250, 260, 270, 300, 360, 370, 380, 400, 450, 460, 470, and 480 for detecting the reflected light as illustrated in FIGS. 28A and 28B. The isolation between these pixels may be implemented based on an insulator isolation such as using an oxide or nitride layer, or based on an implant isolation such as using p-type or n-type region to block signal electrons or holes, or based on an intrinsic built-in energy barrier such as a using the germanium-silicon heterojunction interface.

A number of implementations have been described. Nevertheless, it will be understood that various modifications may be made without departing from the spirit and scope of the disclosure. For example, various forms of the flows shown above may be used, with steps re-ordered, added, or removed.

Various implementations may have been discussed using two-dimensional cross-sections for easy description and illustration purpose. Nevertheless, the three-dimensional variations and derivations should also be included within the scope of the disclosure as long as there are corresponding two-dimensional cross-sections in the three-dimensional structures.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments have been described. Other embodiments are within the scope of the following claims. For example, the actions recited in the claims may be performed in a different order and still achieve desirable results.

What is claimed is:

1. An optical apparatus comprising:
   a semiconductor substrate;
   a first light absorption region supported by the semiconductor substrate, the first light absorption region configured to absorb photons and to generate photo-carriers from the absorbed photons;
   one or more first switches controlled by a first control signal, the one or more first switches configured to collect at least a portion of the photo-carriers based on the first control signal; and
   one or more second switches controlled by a second control signal, the one or more second switches configured to collect at least a portion of the photo-carriers based on the second control signal, wherein the second control signal is different from the first control signal,
   wherein the one or more first switches comprise:
      a first p-doped region in the first light absorption region, wherein the first p-doped region is controlled by the first control signal and has a first p-dopant concentration;
      a second p-doped region in the first light absorption region and in contact with at least a first portion of the first p-doped region, wherein the second p-doped region has a second p-dopant concentration lower than the first p-dopant concentration;
      a first n-doped region in the first light absorption region, wherein the first n-doped region is coupled to a first readout integrated circuit and has a first n-dopant concentration and
      a third n-doped region in the first light absorption region and in contact with at least a portion of the first n-doped region, wherein the third n-doped region has a third n-dopant concentration lower than the first n-dopant concentration; and
   wherein the one or more second switches comprise:
      a third p-doped region in the first light absorption region, wherein the third p-doped region is controlled by the second control signal and has a third p-dopant concentration;

a fourth p-doped region in the first light absorption region and in contact with at least a first portion of the third p-doped region, wherein the fourth p-doped region has a fourth p-dopant concentration lower than the third p-dopant concentration;

a second n-doped region in the first light absorption region, wherein the second n-doped region is coupled to a second readout integrated circuit and has a second n-dopant concentration; and a fourth n-doped region in the first light absorption region and in contact with at least a portion of the second n-doped region, wherein the fourth n-doped region has a fourth n-dopant concentration lower than the second n-dopant concentration.

2. The optical apparatus of claim 1, wherein during operation, the second p-doped region reduces a first dark current flowing between the first p-doped region and the first n-doped region, and the fourth p-doped region reduces a second dark current flowing between the third p-doped region and the second n-doped region relative to a comparable optical apparatus without the second and fourth p-doped regions.

3. The optical apparatus of claim 1, wherein during operation, the third n-doped region reduces a first dark current flowing between the first p-doped region and the first n-doped region, and the fourth n-doped region reduces a second dark current flowing between the third p-doped region and the second n-doped region relative to a comparable optical apparatus without the third and fourth n-doped regions.

4. The optical apparatus of claim 1, wherein the first light absorption region comprises germanium or germanium-silicon.

5. The optical apparatus of claim 4, further comprising:
a first layer supported by the first light absorption region, the first layer being different from the first light absorption region.

6. The optical apparatus of claim 5, wherein the one or more first switches further comprise:
a fifth n-doped region in contact with a second portion of the first p-doped region, and
wherein the one or more second switches further comprise:
a sixth n-doped region in contact with a second portion the third p-doped region.

7. An optical apparatus comprising:
a semiconductor substrate;
a first light absorption region supported by the semiconductor substrate, the first light absorption region configured to absorb photons and to generate photo-carriers from the absorbed photons;
one or more first switches controlled by a first control signal, the one or more first switches configured to collect at least a portion of the photo-carriers based on the first control signal; and
one or more second switches controlled by a second control signal, the one or more second switches configured to collect at least a portion of the photo-carriers based on the second control signal, wherein the second control signal is different from the first control signal,
wherein the one or more first switches comprise:
a first p-doped region in the first light absorption region, wherein the first p-doped region is controlled by the first control signal and has a first p-dopant concentration;
a first n-doped region in the first light absorption region, wherein the first n-doped region is coupled to a first readout integrated circuit and has a first n-dopant concentration; and
a first trench located between the first p-doped region and the first n-doped region,
wherein the one or more second switches comprise:
a second p-doped region in the first light absorption region, wherein the second p-doped region is controlled by the second control signal and has a second p-dopant concentration;
a second n-doped region in the first light absorption region, wherein the second n-doped region is coupled to a second readout integrated circuit and has a second n-dopant concentration; and
a second trench located between the second p-doped region and the second n-doped region.

8. The optical apparatus of claim 7, wherein during operation, the first trench reduces a first dark current flowing between the first p-doped region and the first n-doped region, and the second trench reduces a second dark current flowing between the second p-doped region and the second n-doped region relative to a comparable optical apparatus without the first and second trenches.

9. The optical apparatus of claim 7, wherein the first light absorption region comprises germanium or germanium-silicon.

10. The optical apparatus of claim 9, further comprising:
a first layer supported by the first light absorption region, the first layer being different from the first light absorption region and covering the first trench and the second trench.

11. The optical apparatus of claim 10, wherein the one or more first switches further comprise:
a fifth n-doped region in contact with a second portion of the first p-doped region; and
wherein the one or more second switches further comprise:
a sixth n-doped region in contact with a second portion the second p-doped region.

12. The optical apparatus of claim 7, wherein the one or more first switches further comprise:
a third p-doped region in the first light absorption region and in contact with at least a first portion of the first p-doped region, wherein the third p-doped region has a third p-dopant concentration lower than the first p-dopant concentration; and
a third n-doped region in the first light absorption region and in contact with at least a portion of the first n-doped region, wherein the third n-doped region has a third n-dopant concentration lower than the first n-dopant concentration, and
wherein the one or more second switches further comprise:
a fourth p-doped region in the first light absorption region and in contact with at least a first portion of the second p-doped region, wherein the fourth p-doped region has a fourth p-dopant concentration lower than the second p-dopant concentration; and
a fourth n-doped region in the first light absorption region and in contact with at least a portion of the second n-doped region, wherein the fourth n-doped region has a fourth n-dopant concentration lower than the second n-dopant concentration.

13. The optical apparatus of claim 12, wherein during operation, the third n-doped region and the third p-doped region reduces a first dark current flowing between the first p-doped region and the first n-doped region, and the fourth n-doped region and the fourth p-doped region reduces a second dark current flowing between the second p-doped region and the second n-doped region relative to a comparable optical apparatus without the third and fourth n-doped regions and the third and fourth p-doped regions.

14. The optical apparatus of claim 7, wherein the first trench and the second trench are at least partially filled with a dielectric material.

* * * * *